(12) United States Patent
Kii

(10) Patent No.: US 8,494,415 B2
(45) Date of Patent: Jul. 23, 2013

(54) LIGHT EMITTING ELEMENT ARRAY, LIGHT EMITTING DEVICE, AND IMAGE FORMING APPARATUS

(75) Inventor: Hironori Kii, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 715 days.

(21) Appl. No.: 12/280,143

(22) PCT Filed: Feb. 20, 2007

(86) PCT No.: PCT/JP2007/053113
§ 371 (c)(1),
(2), (4) Date: Jun. 8, 2010

(87) PCT Pub. No.: WO2007/097347
PCT Pub. Date: Aug. 30, 2007

(65) Prior Publication Data
US 2011/0164103 A1      Jul. 7, 2011

(30) Foreign Application Priority Data

Feb. 20, 2006  (JP) ................................. 2006-043069
Mar. 29, 2006  (JP) ................................. 2006-092486
Dec. 21, 2006  (JP) ................................. 2006-344928
Dec. 26, 2006  (JP) ................................. 2006-350683

(51) Int. Cl.
| | |
|---|---|
| G03G 15/04 | (2006.01) |
| G03G 15/043 | (2006.01) |
| G03G 15/30 | (2006.01) |
| G03G 21/14 | (2006.01) |
| G02B 13/24 | (2006.01) |

(52) U.S. Cl.
USPC ........... 399/220; 347/129; 347/130; 347/237; 347/238

(58) Field of Classification Search
USPC ...... 399/220; 347/129, 130, 237, 238; 257/88
See application file for complete search history.

(56) References Cited

U.S. PATENT DOCUMENTS 5,969,744 A   10/1999  Sakashita et al.
6,008,833 A   12/1999  Ohtsubo et al.
(Continued)

FOREIGN PATENT DOCUMENTS

| EP | 1316430 A1 | 6/2003 |
| JP | 60091440 U | 6/1985 |

(Continued)

OTHER PUBLICATIONS

Japanese language office action dated Dec. 6, 2011 and its partial English translation issued in corresponding Japanese application 2007040065 cites the foreign patent documents above.

(Continued)

Primary Examiner — Evan Pert
(74) Attorney, Agent, or Firm — DLA Piper LLP (US)

(57) ABSTRACT

A light emitting element array that can perform a time-division driving operation with a small number of driving ICs is provided. A light emitting element array chip (1) includes n switch thyristors (S) (wherein n is an integer equal to or greater than 2), n signal transmission lines (GH) connected to N-gate electrodes (d) of the switch thyristors (S) individually, a plurality of light emitting thyristors (T) having N-gate electrodes (b) connected to one of the n signal transmission lines (GH). Anodes (e) of selection thyristors (U) are connected to the N-gate electrodes (d) of the n switch thyristors (S), and N-gate electrodes (f) of the selection thyristors (U) are connected to a common selection signal transmission line (CSL).

35 Claims, 45 Drawing Sheets

U.S. PATENT DOCUMENTS

| | | | |
|---|---|---|---|
| 6,025,858 | A | 2/2000 | Tanioka et al. |
| 6,108,018 | A * | 8/2000 | Narita et al. ............... 347/132 |
| 6,392,615 | B1 * | 5/2002 | Shiraishi et al. ............ 345/60 |
| 6,498,356 | B1 | 12/2002 | Sekiya |
| 6,624,838 | B2 * | 9/2003 | Sekiya et al. ............ 347/237 |
| 6,703,790 | B2 * | 3/2004 | Ohno ....................... 315/169.3 |
| 2002/0180370 | A1 | 12/2002 | Ohno et al. |
| 2003/0071274 | A1 | 4/2003 | Ohno et al. |
| 2004/0046976 | A1 | 3/2004 | Ohno et al. |
| 2007/0296803 | A1 | 12/2007 | Ohno et al. |

FOREIGN PATENT DOCUMENTS

| | | |
|---|---|---|
| JP | 03-194978 | 8/1991 |
| JP | 06-177431 | 6/1994 |
| JP | 08316530 A | 11/1996 |
| JP | 09-099582 | 4/1997 |
| JP | 09-240057 | 9/1997 |
| JP | 09-283801 | 10/1997 |
| JP | 10-114101 | 5/1998 |
| JP | 10-211732 | 8/1998 |
| JP | 11-301020 | 11/1999 |
| JP | 2001-217457 | 8/2001 |
| JP | 2001217459 A | 8/2001 |
| JP | 2001217460 A | 8/2001 |
| JP | 2001219592 A | 8/2001 |
| JP | 2001326383 A | 11/2001 |
| JP | 2003069078 A | 3/2003 |
| JP | 2004-195796 | 7/2004 |
| JP | 2005-026617 | 1/2005 |
| JP | 2006-339248 | 12/2006 |

OTHER PUBLICATIONS

Japanese language office action dated Mar. 13, 2012 and its partial English language translation issued in corresponding Japanese application 2007040065.

European search report dated Apr. 27, 2012 issued in corresponding European application 07714613.2 cites the U.S. patent and foreign patent document above.

European office action dated May 14, 2012 issued in corresponding European application 077146112 cites the U.S. patent and foreign patent document above.

* cited by examiner

LIGHT EMITTING ELEMENT ARRAY, LIGHT EMITTING DEVICE, AND IMAGE FORMING APPARATUS

CROSS-REFERENCE TO THE RELATED APPLICATIONS

This application is a national stage of international application No. PCT/JP2007/053113, filed on Feb. 20, 2007, and claims the benefit of priority under 35 USC 119 to Japanese Patent Application No. 2006-043069, filed Feb. 20, 2006, Japanese Patent Application No. 2006-092486, filed Mar. 29, 2006, Japanese Patent Application No. 2006-344928, filed Dec. 21, 2006 and Japanese Patent Application No. 2006-350683, filed Dec. 26, 2006, the entire contents of all of which are incorporated herein by reference.

TECHNICAL FIELD

The present invention relates to a light emitting element array including a plurality of light emitting elements, a light emitting device having the light emitting element array, and an image forming apparatus having the light emitting device.

BACKGROUND ART

There has been known an LED array having a plurality of light emitting diodes (abbreviated as LED) arranged therein as a light emitting device which is applied to an optical printer head of an electrophotographic printer. The LED array includes a plurality of bonding pads to individually connect the light emitting diodes to a driving circuit. For example, in the case where an electrophotographic printer is configured with the specification of A3 size and 600 dpi (dot per inch) and anodes or cathodes of the LEDs are made to be a common electrode realized by a conductive substrate, the same number of connecting portions between bonding pads and circuit wiring lines as the number of light emitting elements is required, which amounts to about 7,300 portions. Accordingly, a very long time is required for bonding the both by a wire bonding method, which makes it difficult to improve the productivity. Furthermore, a larger area than that required for forming the light emitting elements is required to form the bonding pads and the number of light emitting elements per unit length in the scanning direction increases as an image to be formed by the electrophotographic printer increases in precision, which causes an increase of the number of bonding pads.

There is known as a first conventional technique for reducing the number of bonding pads, a light emitting element array employing a dynamic (time-division) driving scheme. In the technique, an LED array is divided into $n_1$ groups including $m_1$ LEDs (wherein $n_1$ is a positive integer and $m_1$ is a positive integer), the anodes or cathodes of the LEDs of the groups are formed as a common electrode, and $m_1 \times n_1$ matrix wiring lines are made thereon. In a dynamic (time-division) driving operation, a driving signal applied to the matrix wiring lines is time-divisionally switched to allow the LEDs to emit light. By using the dynamic driving LED array, the number of bonding pads can be reduced to about ¼, compared with the above-mentioned LED array in which the LEDs are connected to the driving circuits, respectively (for example, Japanese Unexamined Patent Publication JP-A 11-268333 (1999)).

There is known as a second conventional technique, a dynamic driving light emitting device for time-divisionally driving a light emitting element array in which field effect transistors are connected to the LEDs, respectively (for example, see Japanese Unexamined Patent Publication JP-A 6-177431 (1994)). In the light emitting device, a driving IC (Integrated Circuit) having switching elements such as NAND gates built therein is connected to the light emitting element array, the switching elements built in the driving IC calculate a logical product of a strobe signal (STB) and a gate signal, and the gate signal is outputted only when the strobe signal has a true value, whereby the light emitting element array can be driven dynamically.

There is known as a third conventional technique, in order to reduce the occupied area of the wiring lines connected to the light emitting elements, a light emitting element array in which an emission thyristor having a PNPN structure is used as the light emitting element, ones of the anodes and the cathodes are formed of a conductive substrate in common, and the other of the anodes and the cathodes is connected to the gate electrodes in a matrix (for example, see Japanese Examined Patent Publication JP-B2 2807910 and Japanese Unexamined Patent Publication JP-A 2001-217457). By connecting the gate electrodes, in which current hardly flows, all over the light emitting element array by the use of electrode wiring lines, it is possible to reduce the line width of the electrode wiring lines and to reduce the area required for forming the electrode wiring lines.

However, in the first conventional technique, since the electrode wiring lines are connected to the anodes or cathodes of the LEDs, main current proportional to the light emission intensity of the LEDs flows in any electrode wiring line. In this case, when the wiring line resistance is high, the power consumption of the driving IC is enhanced or the driving performance is deteriorated due to the wiring line resistance loss. Accordingly, the line width needs to be enhanced to reduce the wiring line resistance. Therefore, there is a problem in that the area required for forming the electrode wiring lines increases and the surface area of a chip having the LED array formed therein also increases.

In the first to third conventional techniques, for example, the dynamic (time-division) driving operation is performed using the $m_2 \times n_2$ matrix wiring lines, $m_2 \times n_2$ electrode wiring lines are required for one light emitting element array (wherein $m_2$ and $n_2$ are positive integers). However, when a light emitting device is configured to include a plurality of $p_2$ light emitting element arrays, $p_2 \times (m_2+n_2)$ electrode wiring lines proportional to the number of light emitting element arrays are required (wherein $p_2$ is an integer equal to or greater than 2). The number of output terminals of the driving IC to drive the light emitting element arrays needs to be enhanced depending on the number of required electrode wiring lines. When the number of terminals of the driving IC is equal to the number of terminals of one light emitting element array, the driving ICs corresponding to the number of light emitting element arrays are required. In this way, when the light emitting device is configured to include the plurality of light emitting element arrays, a lot of driving ICs are required for the conventional techniques and the number of wiring lines to connect the light emitting element arrays to the driving ICs is enhanced, thereby complicating the device or enlarging the device.

When the light emitting elements are arranged with a high density to obtain a high definition image, the number of bonding pads increases accordingly in the conventional techniques. However, since the pad pitch is too small, it is difficult to perform the wire bonding process. As a result, the increase in density of the light emitting elements is restricted.

In the second conventional technique, the driving IC having the switching elements such as NAND gates built therein needs to be connected to the light emitting element array. When a light emitting device is configured to include the plurality of light emitting element arrays, the number of driving ICs connected to the light emitting element arrays increases with the increase of the number of light emitting element arrays, thereby complicating or enlarging the device as a whole.

SUMMARY OF THE INVENTION

An object of the invention is to provide a light emitting element array that can perform a time-division driving operation with a small number of driving ICs and to provide a light emitting element array suitable for densely integrating light emitting elements by reducing the number of bonding pads. Another object of the invention is to provide a small-sized and high-definition light emitting device employing the light emitting elements and an image forming apparatus having the light emitting device.

The invention is directed to a light emitting element array comprising:

(a) one first selection signal transmission line for transmitting a first selection signal;

(b) n switch units connected to the first selection signal transmission line (wherein n is an integer equal to or greater than 2), for outputting a control signal when both a second selection signal and the first selection signal from the first selection signal transmission line are inputted;

(c) n control signal transmission lines connected to the n switch units, respectively, for transmitting the control signal; and (d) a plurality of light emitting elements each connected to any one of the n control signal transmission lines, for emitting light when both a light emission signal and the control signal from the connected control signal transmission line are inputted, wherein each of the control signal transmission lines is connected to at least one of the light emitting elements.

According to the invention, since the n switch units to which the single first selection signal is inputted are electrically connected to the first selection signal transmission line, it is possible to commonly apply the first selection signal to all the switch units included in the light emitting element array.

When the first selection signal is commonly inputted to the switch units of the light emitting element array, the control signal is further outputted to the control signal transmission line connected to the switch unit to which the second selection signal is inputted, and the light emission signal is inputted to the control signal transmission line, the corresponding light emitting element emits light. On the contrary, when the first selection signal is not commonly inputted to the light emitting element array, the switch units do not output the control signal in spite of the input of the second selection signal. Accordingly, even when the light emission signal is inputted to the light emitting element connected to the corresponding switch unit, the light emitting element does not emit light.

Accordingly, when a light emitting device is configured to include the plurality of light emitting element arrays, the light emitting element array and the light emitting element to emit light can be selected by the use of the first selection signal. Hereinafter, it is assumed that the light emitting element array to which the first selection signal is inputted or all the switch units of the light emitting element array are in a selected state. Accordingly, by sequentially applying the first selection signal to the light emitting element arrays of the light emitting device into the selected state, it is possible to perform a time-division driving operation by using the driving ICs to feed the second selection signal and the light emission signal to the light emitting element arrays and the wiring lines between the light emitting elements and the driving ICs in common to the plurality of light emitting element arrays. In this way, when the light emitting device is configured to include the light emitting element array of the invention, the light emitting element arrays can share the driving ICs and the wiring lines, thereby embodying the light emitting device with the small number of driving ICs and wiring lines.

In the light emitting element array of the invention, it is preferable that the light emitting elements are divided into a plurality of light emitting element blocks each of which is composed of n or less light emitting elements, each of the light emitting element blocks has the light emitting elements which are connected to different control signal transmission lines, respectively, and to which a common light emission signal is inputted.

According to the above-mentioned configuration, in order to reduce the wiring lines to feed the light emission signal to the plurality of light emitting elements, the plurality of light emitting elements are grouped into the light emitting element blocks including n or less light emitting elements. In the respective light emitting element blocks including a plurality of light emitting elements, the light emission signal is commonly applied to the light emitting elements, and the different control signals are supplied to the plurality of light emitting elements because the plurality of light emitting elements are connected to the different control signal transmission lines.

Here, when the entire light emitting element array is in the selected state by the first selection signal, by sequentially time-divisionally feeding the second selection signal to the switch units of the light emitting element array, the control signal is transmitted by the control signal transmission lines connected to the switch units and the control signal is sequentially supplied to the light emitting elements in the light emitting element blocks. Accordingly, by commonly feeding the light emission signal to the light emitting element blocks at the timing determined by the control signal, it is possible to embody the time-division driving operation in the light emitting element blocks.

In this way, since the time-division driving operation can be performed by the use of the plurality of light emitting element blocks in the light emitting element array, it is possible to reduce the number of output terminals of the driving IC to feed the light emission signal and the number of wiring lines between the driving IC and the light emitting element array, thereby embodying a small-sized light emitting device with a small number of wiring lines. Since the number of wiring lines of the control signal transmission lines in the light emitting element array and the number of bonding pads to input the light emission signal can be reduced, it is possible to embody a small-sized light emitting element array permitting increase of the degree of integration of the light emitting elements.

In the light emitting element array of the invention, it is preferable that the plurality of light emitting elements are arranged in a line, the respective light emitting element blocks are composed of n−1 light emitting elements (wherein n is an integer equal to or greater than 4), the light emitting element blocks are divided into odd-numbered light emitting element blocks and even-numbered light emitting element blocks, the odd-numbered light emitting element blocks which are numbered according to an order of from one end to the other end in the arrangement direction of the light emitting elements have an $i_1$-th light emitting element which is numbered according to the order of from one end to the other end in the arrangement direction, and is connected to a $j_1$-th control signal transmission line so as to satisfy $i_1=j_1$ (wherein $i_1$ is an integer equal to or greater than 1 and equal to or less than n−1 and $j_1$ is an integer equal to or greater than 1 and equal to or less than n−1), and the even-numbered light emitting element blocks which are numbered according to an order of from one end to the other end in the arrangement direction of the light emitting elements have an $i_2$-th light emitting element which is numbered according to the order of from one end to the other end in the arrangement direction, and is connected to a $j_2$-th control signal transmission line so as to satisfy $i_2+j_2=n+1$ (wherein $i_2$ is an integer equal to or greater than 1 and equal to or less than n−1 and $j_2$ is an integer equal to or greater than 2 and equal to or less than n).

According to the above-mentioned configuration, the respective light emitting element blocks include n−1 light emitting elements smaller by 1 than the number of control signal transmission lines (n is an integer equal to or greater than 4). Here, in a direction (referred to as an $X_1$ direction) from one end in the arrangement direction of the light emitting elements to the other end thereof, the light emitting elements of the respective light emitting element blocks are numbered with first to (n−1)-th numbers in the $X_1$ direction and the n control signal transmission lines are numbered with first to n-th numbers in a predetermined order. According to the configuration, in the odd-numbered light emitting element blocks, the $i_1$-th light emitting element is connected to the $j_1$-th control signal transmission line so as to satisfy $i_1=j_1$ (wherein $1 \leq i_1 \leq n-1$ and $1 \leq j_1 \leq n-1$). In the even-numbered light emitting element blocks, the $i_2$-th light emitting element is connected to the $j_2$-th control signal transmission line so as to satisfy $i_2+j_2=n+1$ (wherein $1 \leq i_2 \leq n-1$ and $2 \leq j_2 \leq n$).

In this case, the light emitting element adjacent to the light emitting element connected to the first control signal transmission line in the arrangement direction is connected to the second control signal transmission line. The light emitting element adjacent to the light emitting element connected to the $j_3$-th control signal transmission line in the arrangement direction (wherein $2 \leq j_3 \leq n-1$) is connected to one of the ($j_3$−1)-th and ($j_3$+1)-th control signal transmission lines. The light emitting element adjacent to the light emitting element connected to the n-th control signal transmission line in the arrangement direction is connected to the (n−1)-th control signal transmission line. Accordingly, when the second selection signal is sequentially inputted to the switch units in the light emitting element array selected by inputting the first selection signal and the control signal is time-divisionally sequentially outputted to the first to n-th control signal transmission lines, the temporal difference in light emission timing between the adjacent light emitting elements can be reduced. Since the adjacent light emitting elements are not connected to the same control signal transmission line, it is possible to prevent the adjacent light emitting elements from concurrently emitting light.

Accordingly, when the light emitting device configured to include the light emitting element array of the invention is used as an exposure device exposing a photoreceptor drum, the great difference in timing when the adjacent light emitting elements emit light is suppressed, whereby a discontinuous point is not generated at the exposure positions on the photoreceptor drum. Since the concurrent light emission of the adjacent light emitting elements is prevented, the difference in light emission of heat is suppressed when the light emitting elements emit light, thereby making constant the light emission characteristic with the variation in temperature of the light emitting elements. Since the interference of light emitted from the adjacent light emitting elements can be prevented, it is possible to expose the photoreceptor drum with high precision. As a result, in the image forming apparatus employing the light emitting element array of the invention, it is possible to obtain an image with high image quality.

In the light emitting element array of the invention, it is preferable that the light emitting element array further comprises a second switch unit connected to the first selection signal transmission line, for outputting an output trigger signal, and outputting a first selection signal to the first selection signal transmission line when both a clock signal and an input trigger signal are inputted.

According to the above-mentioned configuration, paying attention to the signal externally inputted to the light emitting element array, when the clock signal and the input trigger signal are externally inputted to the second switch unit disposed every light emitting element array, the second selection signal is externally inputted to the switch unit connected to the second switch unit through the first selection signal transmission line, and the light emission signal is externally inputted to the light emitting element connected to the switch unit through the control signal transmission line, the light emitting element can be made to emit light. That is, in order to allow a light emitting element to emit light, the clock signal, the input trigger signal, the second selection signal, and the light emission signal should be supplied from the outside, and the light emitting element does not emit light when one thereof is missed.

Accordingly, when the plurality of light emitting element arrays are arranged in a line to configure a light emitting device and the light emitting elements in the respective light emitting element arrays are made to emit light in a predetermined order, the clock signal and the input trigger signal are individually applied to the second switch unit disposed every light emitting element array in the predetermined order. Accordingly, even when the same second selection signal and light emission signal are applied to the plurality of light emitting element array, it is possible to select the light emitting element array to emit light and the light emitting element belonging to the light emitting element array. Hereinafter, it is assumed that the light emitting element array in which the clock signal and the input trigger signal are being inputted to the second switch unit and the first selection signal is being outputted to the first selection signal transmission line or the second switch unit of the light emitting element array is in the selected state. When the light emitting element arrays can be sequentially switched to the selected state, desired light emitting elements can be sequentially made to emit light by feeding the second selection signal to the n switch units in the predetermined order using the wiring lines shared with the light emitting element arrays and feeding the light emission signal to the plurality of light emitting elements in the predetermined order.

Here, since the output trigger signal is outputted from the second switch unit when the clock signal and the input trigger signal are supplied, the light emitting element array of the invention can be configured so that the output trigger signal is sequentially transmitted as an input trigger signal of the adjacent light emitting element. Hereinafter, the input trigger signal and the output trigger signal are called a trigger signal. The direction in which the trigger signal is transmitted is referred to as a trigger transmitting direction.

Specifically, in the light emitting element arrays adjacent to each other in the arrangement direction of the light emitting element arrays, the output trigger signal of the light emitting element array disposed at one end in the arrangement direction is inputted as the input trigger signal of the light emitting element array adjacent thereto close to the other end in the arrangement direction and the initial input trigger signal is externally inputted to the light emitting element array at one end in the arrangement direction. Two or more transmission lines to feed the clock signal are provided and the clock signal is supplied to the adjacent light emitting element arrays at different timing. Then, when the initial input trigger signal and the clock signal are inputted to the light emitting element array at the one end, the output trigger signal is inputted as the input trigger signal to the light emitting element array adjacent in the arrangement direction. When the clock signal is supplied to the adjacent light emitting element array, the output trigger signal is inputted as the input trigger signal to the light emitting element array next adjacent to the light emitting element array in the trigger transmitting direction. In this way, in synchronization with the timing for feeding the clock signal, the trigger signal is sequentially transmitted.

As described above, of the light emitting element array of the invention, by providing one or more input trigger signal driving ICs and two or more clock signal driving ICs, the light emitting element arrays of a light emitting device can be made to sequentially emit light in the predetermined order in the arrangement direction. It is possible to perform the time-division driving operation in which the driving ICs to feed the second selection signal and the light emission signal and the wiring lines between the driving ICs and the light emitting elements are commonly used by the light emitting element arrays. Accordingly, when the light emitting device is configured to include the light emitting element array of the invention, the driving ICs and the wiring lines can be commonly used by the light emitting element arrays by adding the driving ICs and the wiring lines to feed three or more signals, thereby embodying the light emitting device with the small number of driving ICs and wiring lines.

In the configuration, since the time-division driving operation can be carried out in the light emitting element blocks disposed in the light emitting element array, it is possible to reduce the number of output terminals of the driving IC to feed the light emission signal and the number of wiring lines between the driving IC and the light emitting element array, thereby embodying a small-sized light emitting device with the small number of wiring lines. Since the number of control signal transmission lines in the light emitting element array and the number of bonding pads to input the light emission signal can be reduced, it is possible to embody a small-sized light emitting element array permitting increase of the degree of integration of the light emitting elements.

In the light emitting element array of the invention, it is preferable that the light emitting element array further comprises a substrate and bonding pads disposed on one surface of the substrate, the light emitting elements are arranged substantially in a straight line on the one surface of the substrate, and the n control signal transmission lines and the first selection signal transmission line are disposed on the one surface of, the substrate along the arrangement direction of the light emitting elements, the bonding pads are arranged at intervals therebetween along the arrangement direction of the light emitting elements, the bonding pads include:
a first selection signal bonding pad connected to the first selection signal transmission line, for inputting the first selection signal;
second selection signal bonding pads connected to the switch units, respectively, for inputting the second selection signal; and
light emission signal bonding pads connected to the light emitting elements in each of the light emitting element blocks and disposed to feed the light emission signal to each of the light emitting element blocks, a number of the light emission signal bonding pads being smaller than that of the light emitting elements, and the switch units are disposed between the adjacent bonding pads.

According to the above-mentioned configuration, at least first selection signal bonding pads connected to the first selection signal transmission line to input the first selection signal is required for the respective light emitting element arrays. The number of second selection signal bonding pads connected to the switch units, respectively, to feed the second selection signal is at least the same as the number of switch units. At least one light emission signal bonding pad connected to the light emitting elements in the respective light emitting element blocks to individually feed the light emission signal to the light emitting element blocks is required for the respective light emitting element blocks. The total number of light emission signal bonding pads in the light emitting element array is smaller than the number of light emitting elements.

Accordingly, when the number of light emitting element blocks is m and the respective light emitting element blocks include n light emitting elements, the number of light emitting elements is m×n and the number of bonding pads required for the light emitting element array is m+n+1. Accordingly, when a light emitting element array including a plurality of light emitting elements is configured, the number of bonding pads is smaller than the number of light emitting elements and thus spaces are formed between the bonding pads. Therefore, the spaces can be effectively used to arrange the switch units and the second switch unit, and the increase in size of the light emitting element array due to the switch units and the second switch unit can be prevented, thereby embodying a small-sized light emitting element array.

In the light emitting element array of the invention, it is preferable that the light emitting element array further comprises a substrate and bonding pads disposed on one surface of the substrate, the light emitting elements are arranged substantially in a straight line on the one surface of the substrate, the n control signal transmission lines and the first selection signal transmission line are disposed on the one surface of the substrate along the arrangement direction of the light emitting elements, the bonding pads are arranged at intervals therebetween along the arrangement direction of the light emitting elements, the bonding pads include:
an input trigger signal bonding pad connected to the second switch unit, for inputting the input trigger signal;
a clock signal bonding pad connected to the second switch unit, for inputting the clock signal;
an output trigger signal bonding pad connected to the second switch unit, for outputting the output trigger signal;
second selection signal bonding pads connected to the switch units, respectively, for inputting the second selection signal; and
light emission signal bonding pads connected to the light emitting elements in the respective light emitting element blocks and disposed to feed the light emission signal to the respective light emitting element blocks, a number of the light emission signal bonding pads being smaller than that of the light emitting elements, and the switch units and the second switch unit are disposed between the adjacent bonding pads.

According to the above-mentioned configuration, in the light emitting element array further including the second switch unit, at least one input trigger signal bonding pad connected to the second switch unit to input the input trigger signal, at least one clock signal bonding pad connected to the second switch unit to input the clock signal, and at least one output trigger signal bonding pad connected to the second switch unit to output the output trigger signal are required for the respective light emitting element arrays. The number of second selection signal bonding pads connected to the switch units, respectively, to feed the second selection signal is at least the same as the number of switch units. At least one light emission signal bonding pad connected to the light emitting elements in the respective light emitting element blocks to individually feed the light emission signal to the light emitting element blocks is required for the respective light emitting element blocks. The total number of light emission signal bonding pads in the light emitting element array is smaller than the number of light emitting elements.

Accordingly, when the number of light emitting element blocks is m and the respective light emitting element blocks include n light emitting elements, the number of light emitting elements is m×n and the number of bonding pads required for the light emitting element array is m+n+3. Accordingly, when a light emitting element array including a plurality of light emitting elements is configured, the number of bonding pads is smaller than the number of light emitting elements and thus spaces are formed between the bonding pads. Therefore, the spaces can be effectively used to arrange the switch units, and the increase in size of the light emitting element array due to the switch units can be prevented, thereby embodying a small-sized light emitting element array.

In the light emitting element array of the invention, it is preferable that the input trigger signal bonding pad is disposed at one end portion of the substrate along the arrangement direction of the light emitting elements, and the output trigger signal bonding pad is disposed at the other end portion of the substrate along the arrangement direction of the light emitting elements.

According to the above-mentioned configuration, when the plurality of light emitting element arrays are arranged in a line to configure a light emitting device, the adjacent light emitting element arrays are connected so that the output trigger signal of one light emitting element array in the arrangement direction is inputted as the input trigger signal to the other light emitting element array. Accordingly, when the input trigger signal bonding pads are disposed at one end portion of the substrate and the output trigger signal bonding pads are disposed at the other end portion, the wiring line to transmit the trigger signal can be reduced.

In the light emitting element array of the invention, it is preferable that the respective switch units include a diode and a switch thyristor formed of an emission thyristor, and gate electrodes of the switch thyristors of the switch units are individually connected to the control signal transmission lines and are connected to the first selection signal transmission line through the diodes, the respective light emitting elements include a light emitting thyristor formed of an emission thyristor, and a gate electrode of the light emitting thyristor is connected to any one of the control signal transmission lines, ones of anodes and cathodes of the switch thyristor and the light emitting thyristor are grounded in common and the second selection signal and the light emission signal are respectively inputted to the other electrodes of the anodes and the cathodes of the switch thyristor and the light emitting thyristor, and the switch thyristor outputs a voltage between the gate electrode and the ground as the control signal to the control signal transmission line, when the switch thyristor is changed to an ON state with input of the second selection signal in the state where the first selection signal is inputted to the gate electrode to lower a threshold value through the diode which is forwardly biased.

According to the above-mentioned configuration, the anodes or the cathodes of the emission thyristors constituting the switch units and the light emitting elements are used as a common electrode (the voltage of which is Vg=0 V). Here, when the cathodes are used as the common electrode, an N-gate electrode is used as the gate electrodes of the emission thyristors constituting the light emitting element array. When the anodes are used as the common electrode, a P-gate electrode is used as the gate electrodes of the emission thyristors.

A specific circuit structure and operation are described now when the cathode is used as the common electrode.

In the above-mentioned configuration, the potential of the first selection signal transmission line is preferably set to about 0 V when the first selection signal is transmitted by the first selection signal transmission line. The potential of 0 V is used as the first selection signal inputted to the switch units.

In the switch units, the gate electrode of the switch thyristor is individually connected to the corresponding control signal transmission line and the gate electrode of the switch thyristor is connected to the first selection signal transmission line through the diode. Here, a positive voltage is applied to the gate electrode of the switch thyristor, for example, through a pull-up resistor. Then, when the first selection signal is not inputted to the switch unit of the light emitting element array, the voltage of the gate voltage of the switch thyristor is equal to the positive voltage. When the first selection signal is inputted to the switch unit of the light emitting element array, the potential corresponding to the diffusion potential of the diode is applied to the gate electrode of the switch thyristor through a forwardly biased diode. Accordingly, the threshold voltage of the switch thyristor is lowered. However, when the second selection signal is not inputted to the anode of the switch thyristor, that is, when the voltage of the low level is applied to the anode of the switch thyristor, the switch thyristor is maintained in an OFF state. At this time, the potential substantially equal to the diffusion potential is applied to the control signal transmission line connected to the switch thyristor in the OFF state and the potential substantially equal to the diffusion potential is applied to the gate electrode of the light emitting thyristor of which the gate electrode is connected to the control signal transmission line. In this case, the signal level of the light emission signal is determined so that a light emitting thyristor is not changed to the ON state to emit light even when the voltage of the high level is applied to the anode of the light emitting thyristor, that is, even when the light emission signal is supplied to the anode of the light emitting thyristor.

On the other hand, When the second selection signal of the high level is supplied to the anode of a switch thyristor in the state where the threshold voltage of the switch thyristor in a switch unit is lowered with input of the first selection signal to the switch unit of the light emitting element array, the switch thyristor is changed to the ON state. At this time, the potential of the control signal transmission line connected to the gate electrode of the switch thyristor is about 0 V and the potential of the gate electrode of the light emitting thyristor of which the gate electrode is connected to the control signal transmission line is about 0 V. That is, the control signal of about 0 V is outputted from the gate electrode of the switch thyristor, is transmitted by the control signal transmission line, and is inputted to the light emitting thyristor. In this case, when the light emission signal of the high level is inputted to the anode of the light emitting thyristor, the signal level of the light emission signal is determined so that the light emitting thyristor is changed to the ON state to emit light.

As described above, a logic circuit including the switch unit to output the control signal of about 0 V with input of the first selection signal of about 0 V and the second selection signal of the high level and the light emitting element emitting light with input of the control signal of about 0 V and the light emission signal of the high level can be embodied by the emission thyristors. When the anodes of the emission thyristors are used as the common electrode, the same logical circuit can be embodied by reversing the polarity of the emission thyristors and the diodes, reversing the conductive type of the gate electrodes of the emission thyristors, and reversing the polarity of the voltage applied to the gate electrodes. Accordingly, according to the invention, a logical circuit allowing the light emitting elements to emit light can be configured with a simple circuit structure employing emission thyristors without using complex semiconductor devices such as NAND gates or inverters, thereby embodying a light emitting element array with easy design and simple manufacturing processes.

The pull-up resistor connected to the gate electrode of the switch thyristor allows the switch thyristor to stably operate, even when the current flowing in the control signal transmission line varies due to the concurrent light emission of the plurality of light emitting elements.

In the light emitting element array of the invention, it is preferable that the respective switch units further include a resistor, one end of which is connected to the gate electrode of the corresponding switch thyristor, and to the other end of which a constant voltage is applied so that the corresponding diode is forwardly biased.

According to the above-mentioned configuration, the constant voltage is applied to the gate electrode of the switch thyristor through the resistor as the pull-up resistor so that the diode is forwardly biased. Accordingly, the switch thyristor not supplied with the first selection signal is satisfactorily maintained in the OFF state.

In the light emitting element array of the invention, it is preferable that the respective switch units include a selection thyristor formed of an emission thyristor and a switch thyristor formed of an emission thyristor, an anode of the selection thyristor is connected to a gate electrode of the switch thyristor, a gate electrode of the selection thyristor is connected to the first selection signal transmission line, and the gate electrodes of the switch thyristors are respectively connected to the control signal transmission lines, the respective light emitting elements include a light emitting thyristor formed of an emission thyristor, a gate electrode of which is connected to any one of the control signal transmission lines, ones of anodes and cathodes of the selection thyristor, the switch thyristor, and the light emitting thyristor are grounded as a common electrode, the second selection signal and the light emission signal are inputted to the other of the anodes and the cathodes of the switch thyristor and the light emitting thyristor, and a forward voltage is applied as a setting signal to the other electrode of the selection thyristor in synchronization with the first selection signal, and when the switch thyristor is changed to an ON state with input of the second selection signal in the state where the threshold voltage is lowered by inputting to the gate electrode a voltage between the anode and the cathode of the selection thyristor changed to an ON state with input of the first selection signal, the switch thyristor outputs a voltage between the gate electrode and the ground as the control signal to the control signal transmission line.

According to the above-mentioned configuration, the respective switch units include a switch thyristor and a selection thyristor and has a configuration in which the diodes of the switch units having the above-mentioned configuration are replaced with the selection thyristors. The other configuration is similar to that of the above-mentioned light emitting element array. Hereinafter, the difference in operation advantage between the diode and the selection thyristor will be described when the cathodes of the thyristors are used as the common electrode.

Even when the selection thyristors are used instead of the diodes in the switch units, the first selection signal transmission line is connected to the N-gate electrodes of the selection thyristors and the N-gate electrodes of the switch thyristors are connected to the anodes of the selection thyristors. Accordingly, it is similar thereto that the first selection signal transmission line is connected to the gate electrodes of the switch thyristors through one PN-junction diode. Therefore, the selection thyristors basically operate in the same way as the diodes. However, when the emission thyristor is changed to the ON state from the OFF state, the emission thyristor may not be changed to the OFF state but maintains the ON state with the variation in voltage of the gate electrode. In order to change the emission thyristor to the ON state with the variation in voltage of the gate electrode by resetting this state, the potential difference between the anode and the cathode should be reduced. Therefore, the setting signal of a positive voltage is supplied to the anode of the selection thyristor at most time, but the setting signal resetting the potential of the anode to 0 V in synchronization with the clock signal when the clock signal is completely changed from the high level to the low level and from the low level to the high level. Accordingly, similarly to the above-mentioned circuit configuration, a logical circuit allowing the light emitting elements to selective emit light can be configured with a simple circuit configuration using the emission thyristors without using complex semiconductor devices such as NAND gates or inverters, thereby embodying a light emitting element array with easy design and simple manufacturing processes. Since the current flowing in the gate electrode of the selection thyristor is small, it is possible to reduce the line width of the first selection signal transmission line. Accordingly, it is possible to reduce the size of the light emitting element array.

In the light emitting element array of the invention, it is preferable that the switch units further include a resistor, one end of the resistor is connected to the gate electrode of a corresponding switch thyristor, and a setting signal is inputted to the other end of the resistor so as to bias between an anode and a cathode of the corresponding selection thyristor. The function of the resistor as the pull-up resistor does not vary even when the diode of the switch unit is replaced with the selection thyristor.

In the light emitting element array of the invention, when the light emitting element array further includes the second switch unit, it is preferable that the second switch unit includes a clock thyristor formed of a emission thyristor and a trigger thyristor formed of an emission thyristor, and the respective gate electrodes of the thyristors are connected to the first selection signal transmission line, the respective switch units include a diode and a switch thyristor formed of an emission thyristor, gate electrodes of the switch thyristors of the switch units are individually connected to the control signal transmission line and are connected to the first selection signal transmission line through the diodes, the respective light emitting elements include a light emitting thyristor formed of an emission thyristor and a gate electrode of the light emitting thyristor is connected to any one of the control signal transmission lines, ones of anodes and cathodes of the clock thyristor, the trigger thyristor, the switch thyristor and the light emitting thyristor are grounded in common, and the clock signal, a second selection signal and the light emission signal are respectively inputted to the other electrodes of the anodes and the cathodes of the clock thyristor, the switch thyristor, and the light emitting thyristor, the clock thyristor outputs a voltage between the gate electrode and the ground as the first selection signal to the first selection signal transmission line when the clock thyristor is changed to an ON state with input of the clock signal in the state where the threshold voltage is lowered with input of the input trigger signal to the gate electrode thereof, the trigger thyristor outputs a voltage between the anode and the cathode as the output trigger signal when the clock thyristor is in the ON state, and the switch thyristor outputs the voltage between the gate electrode and the ground as the control signal to the control signal transmission line, when the switch thyristor is changed to the ON state with input of the second selection signal in the state where the threshold voltage is lowered with input of the first selection signal to the gate electrode thereof through the forwardly biased diode.

According to the above-mentioned configuration, in the emission thyristor constituting the switch units, the second switch unit, and the light emitting elements, the cathode or the anode is used as a common electrode (the potential of which is Vg=0 V). Here, when the cathode is used as the common electrode, the N-gate electrode is used as the gate electrode of the emission thyristor constituting the light emitting elements. When the anode is used as the common electrode, the P-gate electrode is used as the gate electrode of the emission thyristor.

Hereinafter, the circuit configuration and operation when the cathode is used as the common electrode will be described by the second switch unit associated with the transmission of the trigger signal between the light emitting element arrays constituting the light emitting device, and the switch units and the light emitting elements associated with the time-division driving operation in the respective light emitting element arrays.

First, the second switch unit is described. In the second switch unit, the gate electrodes of the clock thyristors and the trigger thyristors are connected to the first selection signal transmission line. Here, when the voltage of the high level is applied to the anodes of the clock thyristors, it is defined that the clock signal is inputted to the anode of the clock thyristor. When the voltage of the low level is applied to the gate electrodes of the clock thyristors, it is defined that the input trigger signal is inputted to the gate electrode of the clock thyristor.

When the light emitting device is configured to include the plurality of light emitting element arrays, the anodes of the trigger thyristors constituting the second switch unit are connected to the first selection signal transmission line of the light emitting element array adjacent in the trigger transmitting direction so as to transmit the trigger signal. A positive voltage is applied to the first selection signal transmission lines of the light emitting element arrays, for example, through the pull-up resistors. Then, the anode of the trigger thyristor of the light emitting element arrays is connected to the first selection signal transmission line of the light emitting element array adjacent in the trigger transmitting direction, and thus a positive voltage is applied thereto. On the other hand, since the N-gate electrode of the trigger thyristor is connected to the first selection signal transmission line of the light emitting element array having the trigger thyristor, the first selection signal transmission lines of the adjacent light emitting element arrays are connected to each other through the forwardly biased N-junction diode.

The operation of the light emitting device having the above-mentioned configuration will be described in more detail. Here, it is assumed that the clock thyristor of a light emitting element array is changed to ON state with input of the clock signal and the input trigger signal and the potential of the first selection signal transmission line is about 0 V. In this state, it is assumed that the light emitting element array or the second switch unit of the light emitting element array is in the selected state. Here, the light emitting element array in the selected state is described as a light emitting element array (ii), and the light emitting element array adjacent to the light emitting element array (ii) in the trigger transmitting direction is described as a light emitting element array (iii). As described above, since the potential of the first selection signal transmission line of the light emitting element array (ii) is substantially the same as the PN-junction diffusion potential, the potential of the low level corresponding to one diffusion potential is applied to the gate electrode of the clock thyristor of the light emitting element array (ii) and thus the threshold voltage thereof is lowered. In this state, when a voltage of the high level is applied to the anode of the clock thyristor of the light emitting element array (ii), the clock thyristor can be changed to the ON state. That is, when the potential of the first selection signal transmission line of the light emitting element array (ii) is substantially the same as the PN-junction diffusion potential, it means that the input trigger signal is supplied to the gate electrode of the clock thyristor of the light emitting element array (ii). In this state, when the clock signal is supplied to the anode of the clock thyristor of the light emitting element array (ii), the light emitting element array (ii) can be changed to the ON state. When the light emitting element array (ii) is changed to the ON state, the potential of the first selection signal transmission line of the light emitting element array (iii) adjacent to the light emitting element array (ii) in the trigger transmitting direction becomes substantially the same as the PN-junction diffusion potential. That is, the output trigger signal having substantially the same potential PN-junction diffusion potential is outputted from the light emitting element array (ii) and is then inputted as the input trigger signal to the light emitting element array (iii). In this way, by feeding the clock signal at the transmission timing of the trigger signal, the trigger signal can be transmitted to sequentially select the light emitting element arrays.

The specific circuit configuration and operation of the switch units and the light emitting elements will be described now. In the light emitting element array in the selected state, as described above, the clock thyristor is changed to the ON state and the potential of the first selection signal transmission line is about 0 V. The potential of 0 V is used as the first selection signal inputted to the switch units.

In the respective switch units, the gate electrode of the switch thyristor is individually connected to the corresponding control signal transmission line and the gate electrode of the switch thyristor is connected to the first selection signal transmission line through a diode. Here, a positive voltage is applied to the gate electrode of the switch thyristor, for example, through the pull-up resistor. Then, when the second switch unit is not in the selected state, the voltage of the gate electrode of the switch thyristor is equal to the positive voltage.

When the clock signal and the input trigger signal are inputted to the second switch unit into the selected state and the potential of the first selection signal transmission line is about 0 V, the potential substantially corresponding to the diffusion potential of the diode is applied to the gate electrode of the switch thyristor through the forwardly biased diode. Accordingly, the threshold voltage of the switch thyristor is lowered. In this state, when the second selection signal of the high level is not inputted to the anode of the switch thyristor, the switch thyristor is maintained in the OFF state. At this time, substantially the same potential as the diffusion potential is applied to the control signal transmission line connected to the switch thyristor in the OFF state and substantially the same potential as the diffusion potential is applied to the gate electrode of the light emitting thyristor of which the gate electrode is connected to the control signal transmission line. In this case, the signal level of the light emission signal is determined so that the light emitting thyristor is not changed to the ON state to emit light even when the voltage of the high level is applied to the anode of the light emitting thyristor, that is, even when the light emission signal is supplied to the anode of the light emitting thyristor.

On the other hand, when the second selection signal of the high level is supplied to the anode of the switch thyristor in the state where the threshold voltage of the switch thyristor constituting the switch units with input of the first selection signal to the switch units, the switch thyristor is changed to the ON state. At this time, the potential of the control signal transmission line connected to the gate electrode of the switch thyristor is about 0 V and the potential of the gate electrode of the light emitting thyristor of which the gate electrode is connected to the control signal transmission line is about 0 V. That is, the control signal of 0 V is outputted from the gate electrode of the switch thyristor, is transmitted by the control signal transmission line, and is inputted to the light emitting thyristor. In this case, the signal level of the light emission signal is determined so that the light emitting thyristor is changed to the ON state to emit light when the light emission signal of the high level is inputted to the anode of the light emitting thyristor.

As described above, by the use of the emission thyristors, the second switch unit to output the first selection signal of about 0 V and the output trigger signal having substantially the same potential as the diode diffusion potential with input of the clock signal of the high level and the input trigger signal having substantially the same potential as the diode diffusion potential can be embodied, and the second switch unit to output the control signal of about 0 V with input of the first selection signal of about 0 V and the second selection signal of the high level, thereby embodying a light emitting element emitting light with input of the control signal of about 0 V and the light emission signal of the high level. When the anodes of the emission thyristors are used as the common electrode, the same logical circuit can be embodied by reversing the polarity of the emission thyristors and the diodes, reversing the conductive type of the gate electrodes of the emission thyristors, and reversing the polarity of the voltage applied to the gate electrodes. Accordingly, according to the invention, a logical circuit allowing the light emitting elements to emit light can be configured with a simple circuit structure employing emission thyristors without using complex semiconductor devices such as NAND gates or inverters, thereby embodying a light emitting element array with easy design and simple manufacturing processes.

The pull-up resistor connected to the gate electrode of the switch thyristor can allow the switch thyristor to stably operate even with the variation in current flowing in the control signal transmission line when the plurality of light emitting elements are made to emit light at the same time.

In the light emitting element array of the invention, it is preferable that the respective switch units further include a resistor, one end of which is connected to the gate electrode of the switch thyristor, and the other end of which is supplied with a constant voltage so that the diode is forwardly biased, and the second switch unit further includes a second resistor, one end of which is connected to the first selection signal transmission line, and the other end of which is supplied with a positive constant voltage when the cathodes of the respective emission thyristors are grounded in common and with a negative constant voltage when the anodes of the respective emission thyristors are grounded in common.

According to the above-mentioned configuration, a constant voltage is applied to the gate electrodes of the switch thyristors through the resistor as the pull-up resistor so that the diodes are forwardly biased. Accordingly, as described above, the switch thyristor not supplied with the first selection signal is satisfactorily maintained in the OFF state.

A constant voltage is applied to the first selection signal transmission line through the second resistor as the pull-up resistor. Accordingly, when the plurality of light emitting element arrays are connected to configure a light emitting device as described above, the potential of the first selection signal transmission line can be made to be different by the PN-junction diffusion potential between the light emitting element arrays adjacent to each other in the trigger transmitting direction. As a result, in the light emitting element array in the non-selected state where the clock signal and the input trigger signal are not supplied thereto, the clock thyristor is satisfactorily in the OFF state.

In the light emitting element array of the invention, when the light emitting element array further includes the second switch unit, it is preferable that the second switch unit includes a clock thyristor formed of an emission thyristor and a trigger thyristor formed of an emission thyristor and gate electrodes of the thyristors are connected to the first selection signal transmission line, the respective switch units include a selection thyristor formed of an emission thyristor and a switch thyristor formed of an emission thyristor, an anode of the selection thyristor is connected to a gate electrode of the switch thyristor, a gate electrode of the selection thyristor is connected to the first selection signal transmission line, a gate electrode of the switch thyristor is individually connected to the control signal transmission line, the respective light emitting elements include a light emitting thyristor formed of an emission thyristor, a gate electrode of which is connected to any one of the control signal transmission lines, ones of anodes and cathodes of the clock thyristor, the trigger thyristor, the switch thyristor and light emitting thyristor are grounded in common, the clock signal, the second selection signal and the light emission signal are inputted to the other electrodes of the anodes and the cathodes of the clock thyristor, the switch thyristor, and the light emitting thyristor, respectively, and a forward voltage is applied as a setting signal to the other electrode of the selection thyristor in synchronization with the clock signal, the clock thyristor outputs the voltage between the gate electrode and the ground as the first selection signal to the first selection signal transmission line when the clock thyristor is changed to an ON state with input of the clock signal in the state where the threshold voltage is lowered with input of the input trigger signal to the gate electrodes thereof, the trigger thyristors output the voltage between the anode and the cathode as the output trigger signal when the clock thyristors are in the ON state, and the switch thyristors output the voltage between the gate electrode and the ground as the control signal to the control signal transmission line, when the switch thyristors are changed to the ON state with input of the second selection signal in the state where the threshold voltage is lowered with input of voltage between the anode and the cathode of the selection thyristor, which is changed to the ON state with input of the first selection signal, to the gate electrodes thereof.

In this way, in the configuration further including the second switch unit, the switch units can be configured to include the switch thyristor and the selection thyristor.

In the light emitting element array of the invention, it is preferable that the respective switch units further include a resistor, one end of which is connected to the gate electrode of the switch thyristor, the other end of whip is fed with the setting signal so that the voltage between the anode and the cathode of the selection thyristor is forwardly biased, and the second switch unit further includes a second resistor, one end of which is connected to the first selection signal transmission line, and the other end of which is fed with a positive constant voltage when the cathodes of the emission thyristors are grounded in common and with a negative constant voltage when the anodes of the emission thyristors are grounded in common.

The functions of the resistor and the second resistor as the pull-up resistors are not changed even when the diode of the respective switch units is replaced with the selection thyristor.

In the light emitting element array of the invention, it is preferable that the second selection signal inputted to the switch thyristors is fed through a third resistor connected to the anode or cathode of the switch thyristor.

When the light emitting element arrays are used to configure a light emitting device, the clock signal and the input trigger signal may be supplied to the plurality of light emitting element arrays at the same time for the purpose of high speed operation to concurrently select the plurality of light emitting element arrays. At this time, since the plurality of light emitting element arrays in the selected state share the second selection signal, the plurality of switch thyristors are switched at the same time. In general, when an emission thyristor is switched to the ON state, main current flows between the anode and the cathode thereof and thus the output voltage of the driving circuit to feed the second selection signal is lowered. Accordingly, when the input timing of the second selection signal to the anodes of the plurality of switch thyristors is different, the switch thyristor to which the second selection signal is first inputted is switched and the main current flows therein. Then, the switch thyristors to which the second selection signal is lately inputted may not be switched due to the lack of the voltage of the second selection signal. Therefore, according to the above-mentioned configuration, by feeding the second selection signal through the third resistor connected to the anodes or the cathodes of the switch thyristors, it is possible to suppress the decrease in output voltage of the driving circuit and to satisfactorily switch the switch thyristors.

In the light emitting element array of the invention, it is preferable that the respective switch units, the second switch unit, and the respective light emitting elements are constituted by an emission thyristor having the same layer structure.

According to the above-mentioned configuration, since the semiconductor layers constituting the emission thyristors can be formed by the same film forming process at the same time, the manufacturing processes are not complicated with the configuration in which the emission thyristors for switch are provided in addition to the light emitting elements for light emission.

In the light emitting element array of the invention, it is preferable that the light emitting element array further comprises light-blocking means or light-reducing means for blocking or reducing the light emitted from the emission thyristors constituting the switch units and the second switch unit.

According to the above-mentioned configuration, since the light-blocking means or light-reducing means operate so that the light emitted at the time of switching the emission thyristors for switch used in the switch unit and the second switch unit does not enter the emission thyristors for light emission, the variation in threshold voltage of the emission thyristors due to the light can be prevented. Accordingly, when the switch units, the second switch unit, and the light emitting elements are constituted by the emission thyristors, the light emitting element array can be made to stably operate.

In the light emitting element array of the invention, it is preferable that semiconductor films are obtained by stacking a semiconductor layer having one conductive type of P type and N type, a second semiconductor layer having the other conductive type thereof, and a third semiconductor layer having the one conductive type in this order from a side close to the substrate, and the resistor is constituted by the third semiconductor layer.

According to the above-mentioned configuration, since the emission thyristors of the light emitting element array are formed of the first to fourth semiconductor layers stacked in the order of NPNP or PNPN from the substrate using P-type semiconductor and N-type semiconductor, the semiconductor layer for the resistor can be formed on the substrate on which the emission thyristors are formed using the same film forming process. In this case, the resistor is formed by stacking four semiconductor layers of NPNP or PNPN and then etching the uppermost P-type or N-type semiconductor layer. Accordingly, in the configuration having the switch units including the resistor in addition to the plurality of light emitting elements, the manufacturing processes are not complicated.

When the cathodes of the emission thyristors are used as the common electrode, the resistor is formed of the N-type semiconductor layer and a positive constant voltage is applied to the common electrode at one end. When the anodes of the emission thyristors are used as the common electrode, the resistor is formed of the P-type semiconductor layer and a negative constant voltage is applied to the common electrode at one end. That is, since a reverse bias voltage is applied across the third semiconductor layer used as the resistor and the second semiconductor layer adjacent thereto, a depletion layer is enlarged to secure the insulating property from the common electrode. Accordingly, an unnecessary current path is hardly generated and thus the resistor can stably operate.

In the light emitting element array of the invention, it is preferable that light-blocking means or light-reducing means for covering the resistor is provided to block or reduce the light entering the resistor.

According to the above-mentioned configuration, as described above, when the resistor is formed of the third semiconductor layer, a light-blocking film as the light-blocking means or the light-reducing means is provided to suppress the influence of light inputted from the outside. When pairs of electron and hole are generated due to the light entering the boundary of the semiconductor layer having the NPN or PNP structure and constituting the resistor and the semiconductor layer adjacent thereto, similarly to a photo transistor, carriers are accumulated in the second semiconductor layer. Accordingly, the insulating property of the boundary between the second semiconductor layer and the third semiconductor layer is damaged and the operation of the resistor is made to be unstable. Therefore, by providing the light-blocking means or the light-reducing means, the excitation due to the light entering the boundary of the semiconductor layers can be suppressed, thereby stabilizing the operation of the resistor.

In light emitting element array of the invention, it is preferable that semiconductor films are obtained by stacking a semiconductor layer having one conductive type of P type and N type, a second semiconductor layer having the other conductive type thereof, and a third semiconductor layer having the one conductive type in this order from the side close to the substrate, and the second resistors are constituted by the third semiconductor layer. Similarly to the resistor, since the second resistor uses the third semiconductor layer as a sheet resistor, the manufacturing processes are simplified and an unnecessary current path is hardly generated, thereby stabilizing the operation of the resistor.

In the light emitting element array of the invention, it is preferable that light-blocking means or light-reducing means for covering the first and second resistors is provided to block or reduce the light entering the first and second resistors. Similarly to the resistor, by covering the second resistor with the light-blocking film, the excitation due to the light entering the boundary of the semiconductor layers can be suppressed, thereby stabilizing the operation of the resistor.

The invention is directed to a light emitting device comprising:

a light emitting element array group in which a plurality of the light emitting element arrays mentioned above are arranged in a line;

a first selection signal driving circuit connected to the first selection signal transmission line in the respective light emitting element arrays, for individually feeding a first selection signal distinct among the light emitting element arrays;

a second selection signal driving circuit individually connected to the respective switch units of the respective light emitting element arrays, for feeding the second selection signal common to the light emitting element arrays, to the respective switch units; and a light emission signal driving circuit individually connected to the respective light emitting element blocks of the respective light emitting element arrays, for feeding the light emission signal common to the light emitting element arrays, to the respective light emitting element blocks.

According to the light emitting device of the invention, by applying the first selection signal to the plurality of light emitting element arrays of the light emitting device in a predetermined order, the light emitting element arrays can be made in the selected state in the predetermined order. Accordingly, by time-division drive in which the second selection signal driving circuit and the light emission signal driving circuit are commonly used among the plurality of light emitting element arrays, it is possible to allow the light emitting device to stably operate. Therefore, it is possible to reduce the number of driving circuits and the number of layers in the circuit board on which the driving circuits are mounted and to reduce the area of the circuit board on which the light emitting element arrays and the driving circuits are mounted, thereby embodying a small-sized light emitting device which stably operates.

In the light emitting device of the invention, when the light emitting element array further includes the second switch unit, it is preferable that the light emitting device comprises:

a light emitting element array group in which a plurality of the light emitting element arrays mentioned above are arranged in a line;

a plurality of clock signal transmission lines connected to at least one of the light emitting element arrays, for feeding the clock signal;

an input trigger signal driving circuit connected to the second switch unit of a light emitting element array disposed at one end in the arrangement direction of the light emitting element arrays in the light emitting element array group, for feeding the input trigger signal to the second switch unit;

a clock signal driving circuit connected to the plurality of clock signal transmission lines, for individually feeding the clock signal to the clock signal transmission lines;

a second selection signal driving circuit individually connected to the respective switch units of the respective light emitting element arrays, for feeding the second selection signal common to the light emitting element arrays, to the respective switch units; and a light emission signal driving circuit individually connected to the respective light emitting element blocks of the respective light emitting element arrays, for feeding the light emission signal common to the light emitting element arrays, to the respective light emitting element blocks, the output trigger signal of the light emitting element array disposed at the one end in the arrangement direction of the light emitting element arrays in the light emitting element array group is inputted as the input trigger signal to a light emitting element array adjacently disposed on the other end side in the arrangement, and the adjacent light emitting element arrays disposed along the arrangement direction are individually connected to the plurality of clock signal transmission lines.

According to the above-mentioned configuration, by providing at least one input trigger signal driving circuit and two or more clock signal driving circuits, the light emitting element arrays of the light emitting device can be made in the selected state in the predetermined order. As a result, it is possible to allow the light emitting device to stably operate by the time-division drive in which the second selection signal driving circuit and the light emission signal driving circuit are commonly used among the plurality of light emitting element arrays. Therefore, it is possible to reduce the number of driving circuits and the number of layers in the circuit board on which the driving circuits are mounted and to reduce the area of the circuit board on which the light emitting element arrays and the driving circuits are mounted, thereby embodying a small-sized light emitting device which stably operates.

In the light emitting device of the invention, when the light emitting element arrays include a plurality of the switch units having a selection thyristor and a switch thyristor, it is preferable that the light emitting device comprises:

a light emitting element array group in which a plurality of the light emitting element arrays mentioned above are arranged in a line;

a first selection signal driving circuit connected to the first selection signal transmission line in the respective light emitting element arrays, for individually feeding a first selection signal distinct among the light emitting element arrays;

a setting signal driving circuit connected in common to the other electrodes of the anodes and the cathodes of the selection thyristors of the respective switch units of the respective light emitting element arrays, for feeding the setting signal common to the light emitting element arrays;

a second selection signal driving circuit individually connected to the respective switch units of the respective light emitting element arrays, for feeding the second selection signal common to the light emitting element arrays, to the respective switch units; and a light emission signal driving circuit individually connected to the respective light emitting element blocks of the respective light emitting element arrays, for feeding the light emission signal common to the light emitting element arrays, to the respective light emitting element blocks.

According to the above-mentioned configuration, by applying the first selection signal to the plurality of light emitting element arrays of the light emitting device in a predetermined order, the light emitting element arrays can be made in the selected state in the predetermined order. Accordingly, by time-division drive in which the second selection signal driving circuit and the light emission signal driving circuit are commonly used among the plurality of light emitting element arrays, it is possible to allow the light emitting device to stably operate. Therefore, it is possible to reduce the number of driving circuits and the number of layers in the circuit board on which the driving circuits are mounted and to reduce the area of the circuit board on which the light emitting element arrays and the driving circuits are mounted, thereby embodying a small-sized light emitting device which stably operates.

In the light emitting device of the invention, it is preferable that the setting signal driving circuit feeds the setting signal after feeding a signal having substantially a same potential as a potential of the common electrode when the first selection signal driving circuit changes the light emitting element array as a supply destination of the first selection signal, and the second selection signal driving circuit and the light emission signal driving circuit feed the second selection signal and the light emission signal, respectively, after the setting signal driving circuit starts feeding the setting signal.

According to the above-mentioned configuration, it is possible to allow the light emitting elements of the light emitting element arrays to satisfactorily emit light in a predetermined order. If the second selection signal and the light emission signal are supplied before the setting signal is supplied, the control signal transmission lines are about at 0 V and thus the light emitting elements emit light without the feed of the first selection signal, thereby causing a problem.

The invention is directed to an image forming apparatus comprising:

the light emitting device mentioned above;

light concentrating means for concentrating light from the light emitting elements of the light emitting device on a photoreceptor drum;

developer supply means for supplying a developer to the photoreceptor drum on which the light from the light emitting device is concentrated by the light concentrating means so that the photoreceptor is exposed to the light;

transfer means for transferring an image formed on the photoreceptor drum by the developer onto a recording sheet; and fixing means for fixing the developer transferred onto the recording sheet, wherein the first selection signal driving circuit, the second selection signal driving circuit, and the light emission signal driving circuit supply the first selection signal, the second selection signal, and the light emission signal, respectively, based on image information.

According to the image forming apparatus of the invention, in the image forming procedure, first, the light emitting device is driven by the use of the first selection signal driving circuit, the second selection signal driving circuit, and the light emission signal driving circuit on the basis of the image information and the light from the light emitting device is concentrated on the charged photoreceptor drum by the light concentrating means, whereby the photoreceptor drum is exposed to the light and an electrostatic latent image is formed on the surface thereof. Then, when the developer is supplied to the photoreceptor drum having the electrostatic latent image formed thereon by the developer supply means, the developer is attached to the photoreceptor drum to form an image. Finally, the image formed on the photoreceptor drum by the developer is transferred onto the recording sheet by the transfer means and the developer transferred onto the recording sheet is fixed by the fixing means, whereby an image is formed on the recording sheet. Since the light emitting device has a small size and has high reliability for stable operation, it is possible to obtain an image forming apparatus that can stably form an image with excellent image quality.

In the image forming apparatus of the invention, when the light emitting element array further includes the second switch unit, it is preferable that the image forming apparatus comprises:

the light emitting device mentioned above;

light concentrating means for concentrating light from the light emitting elements of the light emitting device on a photoreceptor drum;

developer supply means for supplying a developer to the photoreceptor drum on which the light from the light emitting device is concentrated by the light concentrating means and which is exposed to the light;

transfer means for transferring an image formed on the photoreceptor drum by the developer onto a recording sheet; and fixing means for fixing the developer transferred onto the recording sheet, the input trigger signal driving circuit, the clack signal driving circuit, the second selection signal driving circuit, and the light emission signal driving circuit supply the input trigger signal, the clock signal, the second selection signal, and the light emission signal, respectively, based on image information.

Like the above-mentioned configuration, even when the light emitting element array further includes the second switch unit, the light emitting device has a small size and has high reliability for stable operation and thus it is possible to obtain an image forming apparatus that can stably form an image with excellent image quality.

In the image forming apparatus of the invention, when the light emitting element array further includes a plurality of the switch units having a selection thyristor and a switch thyristor, it is preferable that the image forming apparatus comprises:

the light emitting device mentioned above;

light concentrating means or concentrating light from the light emitting elements of the light emitting device on a photoreceptor drum;

developer supply means for supplying a developer to the photoreceptor drum on which the light from the light emitting device is concentrated by the light concentrating means so that the photoreceptor drum is exposed to the light;

transfer means for transferring an image formed on the photoreceptor drum by the developer onto a recording sheet; and fixing means for fixing the developer transferred onto the recording sheet, the first selection signal driving circuit, the setting signal driving circuit, the second selection signal driving circuit, and the light emission signal driving circuit supply the first selection signal, the setting signal, the second selection signal, and the light emission signal, respectively, based on image information.

Like the above-mentioned configuration, the light emitting element array includes a plurality of the second switch units having a selection thyristor and a switch thyristor, similarly to the above-mentioned image forming apparatus, it is possible to embody an image forming apparatus that can stably form an image with excellent image quality.

The invention is directed to a light emitting element array comprising:

(a) a plurality of first selection signal transmission lines for transmitting a first selection signal;

(b) n switch units connected to any one of the first selection signal transmission lines (wherein n is an integer equal to or greater than 3), for outputting a control signal when both a second selection signal and the first selection signal from the first selection signal transmission line are inputted;

(c) n control signal transmission lines connected to the n switch units, respectively, for transmitting the control signal; and (d) a plurality of light emitting elements connected to one of the n control signal transmission lines, for emitting light when both a light emission signal and the control signal from the connected control signal transmission line are inputted, wherein at least one of the light emitting elements is connected to the respective control signal transmission lines, at least one of the light emitting elements is connected to the respective control signal transmission lines, the n switch units are grouped into a plurality of switch groups each including less than n switch units, switch units of the respective switch groups are individually connected to different first selection signal transmission lines and the second selection signal are commonly inputted to the switch units, at least one switch unit is connected to the first selection signal transmission lines, and at least one of the plurality of first selection signal transmission lines is connected in common to the switch units.

According to another configuration of the light emitting element array of the invention, since the second selection signal is supplied in common to the switch units belonging to one switch group, the number of wiring lines to feed the second selection signal is reduced. On the other hand, in feeding the first selection signal, the first selection signal is individually supplied to the switch units belong to one switch group. Here, in the invention, in order not to enhance the number of first selection signal transmission lines as great as possible, at least one of the plurality of first selection signal transmission lines is connected in common to the plurality of switch units. When the number of first selection signal lines is made to be equal to the maximum number of the switch units of the respective switch groups, the number of first selection signal transmission lines is the minimum.

When a light emitting device is configured to include the plurality of light emitting element arrays, the first selection signal is sequentially supplied to the first selection signal transmission lines of the light emitting element arrays in the time division manner. Then, in the state where the first selection signal is supplied to a first selection signal transmission line of one light emitting element array, the first selection signal is commonly supplied to the plurality of switch units connected to the first selection signal transmission line. Hereinafter, it is assumed that the switch units supplied with the first selection signal is in the selected state. In this state, when the second selection signal is sequentially supplied to the switch groups, the control signal is outputted from the control signal transmission lines from only the switch unit in the selected state in the switch group supplied with the second selection signal. By inputting the light emission signal to the light emitting elements connected to the control signal transmission line supplied with the control signal, it is possible to allow the light emitting elements to selectively emit light.

In this way, in the invention, since the time-division driving operation is carried out by the use of the plurality of switch groups in the light emitting element arrays, it is possible to reduce the number of output terminals of the driving IC to feed the second selection signal and the number of driving ICs and wiring lines of the light emitting element arrays, thereby embodying a small-sized light emitting device. Since the number of bonding pads to input the second selection signal in the light emitting element array can be reduced, it is possible to embody a small-sized light emitting element array permitting increase in degree of integration of the light emitting elements. For example, when only a single first selection signal transmission line is provided by connecting n switch units to a single first selection signal transmission line, the same number of wiring lines and bonding pads to input the second selection signal as the number of switch units is required. However, like the invention, when the number of first selection signal transmission lines is enhanced by 1 into 2, it is possible to reduce the number of wiring lines and bonding pads to input the second selection signal to a half.

In another configuration of the light emitting element array of the invention, it is preferable that the n switch units are grouped into M switch groups (wherein M is an integer equal to or greater than 2), and the respective switch groups include N switch units (wherein N is an integer equal to or greater than 2 and n-M×N).

According to this configuration, in order to reduce the number of wiring lines and bonding pads to feed the first selection signal and the second selection signal to the light emitting element arrays as small as possible, when the n switch units are grouped into M switch groups (wherein M is an integer equal to or greater than 2), the respective switch groups include N switch units (wherein N is an integer equal to or greater than 2 and n=M×N). At this time, at least N first selection signal transmission lines are necessary.

In another configuration of the light emitting element array of the invention, it is preferable that the plurality of light emitting elements are grouped into a plurality of light emitting element blocks including n or less light emitting elements, and the plurality of light emitting elements in the light emitting element blocks are individually connected to the control signal transmission lines, respectively, and the light emission signal is commonly inputted to the plurality of light emitting elements.

Like another configuration of the light emitting element array of the invention, even when the n switch units are grouped into switch groups, the number of wiring lines to feed the light emission signal to the plurality of light emitting elements is reduced and thus the plurality of light emitting elements can be grouped into the light emitting element blocks including n or less light emitting elements.

As a result, since the time-division driving operation can be carried out in the light emitting element blocks disposed in the light emitting element array, it is possible to reduce the number of output terminals of the driving IC to feed the light emission signal and the number of wiring lines between the driving IC and the light emitting element array, thereby embodying a small-sized light emitting device with the small number of wiring lines. Since the number of control signal transmission lines in the light emitting element array and the number of bonding pads to input the light emission signal can be reduced, it is possible to embody a small-sized light emitting element array permitting increase of the degree of integration of the light emitting elements.

In the light emitting element array of the invention, it is preferable that the light emitting element array comprises:

(a) n switch units (wherein n is an integer equal to or greater than 2) each having a first electrode, a second electrode, and a first control electrode to which a control signal is outputted when a first signal is inputted to the first electrode and a second signal is inputted to the second electrode;

(b) n control signal transmission lines individually connected to the first control electrode; and (c) a plurality of light emitting elements each having a third electrode and a second-control electrode connected to one of the n control signal transmission lines, for emitting light when a third signal is inputted to the third electrode and a control signal is inputted to the second control electrode, the second control electrode of at least one light emitting element of the light emitting elements is connected to the respective control signal transmission lines, the first electrodes of the n switch units are connected to each other, the light emitting elements are divided into a plurality of light emitting element blocks each of which is composed of n or less light emitting elements, and the respective second control electrodes of the light emitting elements in the light emitting element blocks are individually connected to the respective control signal transmission lines which are different from each other, and of which respective third electrodes are electrically connected to each other.

In the above-mentioned configuration, the first signal corresponds to the first selection signal, the second signal corresponds to the second selection signal, and the third signal corresponds to the light emission signal.

In the light emitting element array of the invention, it is preferable that the switch units and the light emitting elements are configured to include an emission thyristor in which a cathode or anode is used a common electrode, and the switch units are configured to further include a diode and a resistor, (a) when the cathode is used as the common electrode, an N-gate electrode of the emission thyristor of the respective switch units is connected to the anode of the diode and one end of the resistor, a positive voltage to the common electrode is supplied to the other end of the resistor, the first electrode is a cathode of the diode, the second electrode is an anode of the emission thyristor constituting the switch unit, the third electrode is an anode of the emission thyristor constituting the light emitting elements, the first control electrode is an N-gate electrode of the emission thyristor constituting the switch unit, and the second control electrode is an N-gate electrode of the emission thyristor constituting the light emitting element, and (b) when the anodes are used as the common electrode, the P-gate electrode of the emission thyristor of the respective switch units is connected to the cathode of the diode and one end of the resistor, a negative voltage to the common electrode is supplied to the other end of the resistor, the first electrode is an anode of the diode, the second electrode is a cathode of the emission thyristor constituting the switch unit, the third electrode is a cathode of the emission thyristor constituting the light emitting element, the first control electrode is a P-gate electrode of the emission thyristor constituting the switch unit, and the second control electrode is a P-gate electrode of the emission thyristor constituting the light emitting element.

According to the above-mentioned configuration, the switch units constituting the light emitting element array can be configured to include an emission thyristor, a diode and a resistor, and the light emitting elements can be configured to include an emission thyristor. Here, the emission thyristors constituting the switch units and the light emitting elements use the cathodes or the anodes as a common electrode (the potential of which is $Vg=0$ V).

When the cathodes are used as the common electrode, the N-gate electrode of the emission thyristor in the respective switch units, the anode of the respective diodes, and one end of the respective resistors are connected and the other end of the resistor is supplied with a positive voltage using the potential of the cathodes of the common electrode as a reference potential. In this case, the cathode of the diode corresponds to the first electrode to which the first signal is inputted, the anode of the emission thyristor corresponds to the second electrode to which the second signal is inputted, and the N-gate electrode of the emission thyristor corresponds to the first control electrode to which the control signal is outputted. The light emitting element is formed of an emission thyristor, the third electrode to which the third signal is inputted corresponds to the anode of the emission thyristor, and the control electrode to which the control signal is inputted corresponds to the N-gate electrode of the emission thyristor.

An example of the circuit operation with the circuit configuration will be described.

A signal of the low level (the potential of which is 0 V) is inputted as the first signal. At this time, the diodes are forwardly biased and thus the potential of the anodes of the diodes is substantially equal to the diffusion potential (Vd volt) of the diodes. When the first signal is at the high level and is made to be equal to the positive voltage (Vcc volt) applied to the other end of the resistor, the potential of the anodes of the diodes is substantially equal to Vcc volt.

Here, it is assumed that the switch thyristors as the emission thyristors constituting the switch units and the light emitting thyristors as the emission thyristors constituting the light emitting elements have the same current-voltage characteristic such as a threshold voltage. The voltage of the low level is set to 0 V and the voltage of the high level of the second and third signals is determined to satisfy the following condition. First, the voltage of the high level of the second signal is determined to be higher than the voltage of the high level of the third signal so that the switch thyristor is changed to the ON state when the potential of the N-gate electrode is Vd volt and the second signal is supplied to the anode, but the light emitting thyristor is not changed to the ON state when the potential of the N-gate electrode is Vd volt and the third signal of the high level is inputted to the anode thereof. The voltage of the high level of the third signal is determined so that the light emitting thyristor is changed to the ON state when the potential of the N-gate electrode of the light emitting thyristor is about 0 V and the third signal is inputted to the anode thereof. The voltage of the high level of the second signal is determined so that the switch thyristor is not changed to the ON state when the potential of the N-gate electrode of the switch thyristor is about Vcc volt and the third signal is inputted to the anode thereof. The voltage of the high level of the third signal is determined so that the light emitting thyristor is not changed to the ON state when the potential of the N-gate electrode of the light emitting thyristor is about Vcc volt and the third signal is inputted to the anode thereof.

At this time, when the first signal of the low level and the second signal of the high level are inputted to the switch thyristor, the switch thyristor is changed to the ON state, the N-gate electrode of the switch thyristor is about at 0 volt, and the potential of the N-gate electrode of the light emitting thyristor connected to the N-gate electrode of the switch thyristor through the control signal transmission line is about 0 V. This means that the control signal of the low level (0 volt) is inputted to the gate electrode of the light emitting thyristor from the control signal transmission line from the N-gate electrode of the switch thyristor. When the third signal of the high level is inputted in this state, the light emitting thyristor is changed to the ON state to emit light.

When the first signal of the low level is inputted to the switch thyristor but the second signal of the high level is not inputted thereto, the switch thyristor is not changed to the ON state. At this time, the potential of the N-gate electrode of the light emitting thyristor connected to the N-gate electrode of the switch thyristor through the control signal transmission line is about Vd volt. However, even when the third signal of the high level is inputted to the anode in this state, the light emitting thyristor does not emit light.

In this way, the switch thyristor to which both the first signal of the low level and the second signal of the high level are inputted is changed to the ON state. Accordingly, a logical circuit can be embodied which emits light when the third signal is inputted to the anode of the light emitting thyristor connected to the N-gate electrode of the switch thyristor through the control signal transmission line in this state. The setting of the above-mentioned parameters is only an example, and the device may operate with the same circuit configuration but with other parameters given thereto.

According to the invention, a logical circuit allowing the light emitting elements to selective emit light by feeding the first to third signals can be configured with a simple circuit configuration using the emission thyristors without using complex semiconductor devices such as NAND gates or inverters, thereby embodying a light emitting element array with easy design and simple manufacturing processes. By using the resistor, it is possible to allow the switch units to stably operate with the variation in current flowing through the control signal transmission line when the plurality of light emitting elements are concurrently made to emit light.

When the anodes of the emission thyristors are used as the common electrode, the same logical circuit can be embodied by reversing the polarity of the emission thyristors and the diodes, reversing the conductive type of the gate electrodes of the emission thyristors, and reversing the polarity of the voltage applied to the gate electrodes.

In the light emitting element array of the invention, it is preferable that the switch units each include a switch thyristor formed of an emission thyristor, a selection thyristor formed of an emission thyristor, and a resistor, the light emitting element is formed of an emission thyristor, the switch thyristor uses the cathodes or anodes of the selection thyristors and the light emitting elements as a common electrode, (a) when the cathodes are used as the common electrode, the N-gate electrode of the switch thyristor is connected to the anode of the selection diode and one end of the resistor, the other ends of the respective resistors of the switch units are electrically connected to each other and a positive voltage is supplied as a fourth signal to the common electrode in synchronization with the first signal, the first electrode is an N-gate electrode of the selection thyristor, the second electrode is an anode of the switch thyristor, the third electrode is an anode of the light emitting element, the first control electrode is an N-gate electrode of the switch thyristor, and the second control electrode is an N-gate electrode of the light emitting element, and (b) when the anodes are used as the common electrode, the P-gate electrode of the switch thyristor is connected to the cathode of the selection thyristor and one end of the resistor, the other ends of the resistors disposed in the switch units are electrically connected to each other and a negative voltage is supplied as the fourth signal to the common electrode in synchronization with the first signal, the first electrode is a P-gate electrode of the selection thyristor, the second electrode is a cathode of the switch thyristor, the third electrode is a cathode of the light emitting element, the first control electrode is a P-gate electrode of the switch thyristor, and the second control electrode is a P-gate electrode of the light emitting elements.

Like the above-mentioned configuration, the respective switch units may include a switch thyristor, a selection thyristor, and a resistor and the diodes of the above-mentioned switch units may be replaced with the selection thyristors. In the configuration, the fourth signal corresponds to the setting signal.

BRIEF DESCRIPTION OF DRAWINGS

Other and further objects, features, and advantages of the invention will be more explicit from the following detailed description taken with reference to the drawings.

BEST MODE FOR CARRYING OUT THE INVENTION

Figure 1:
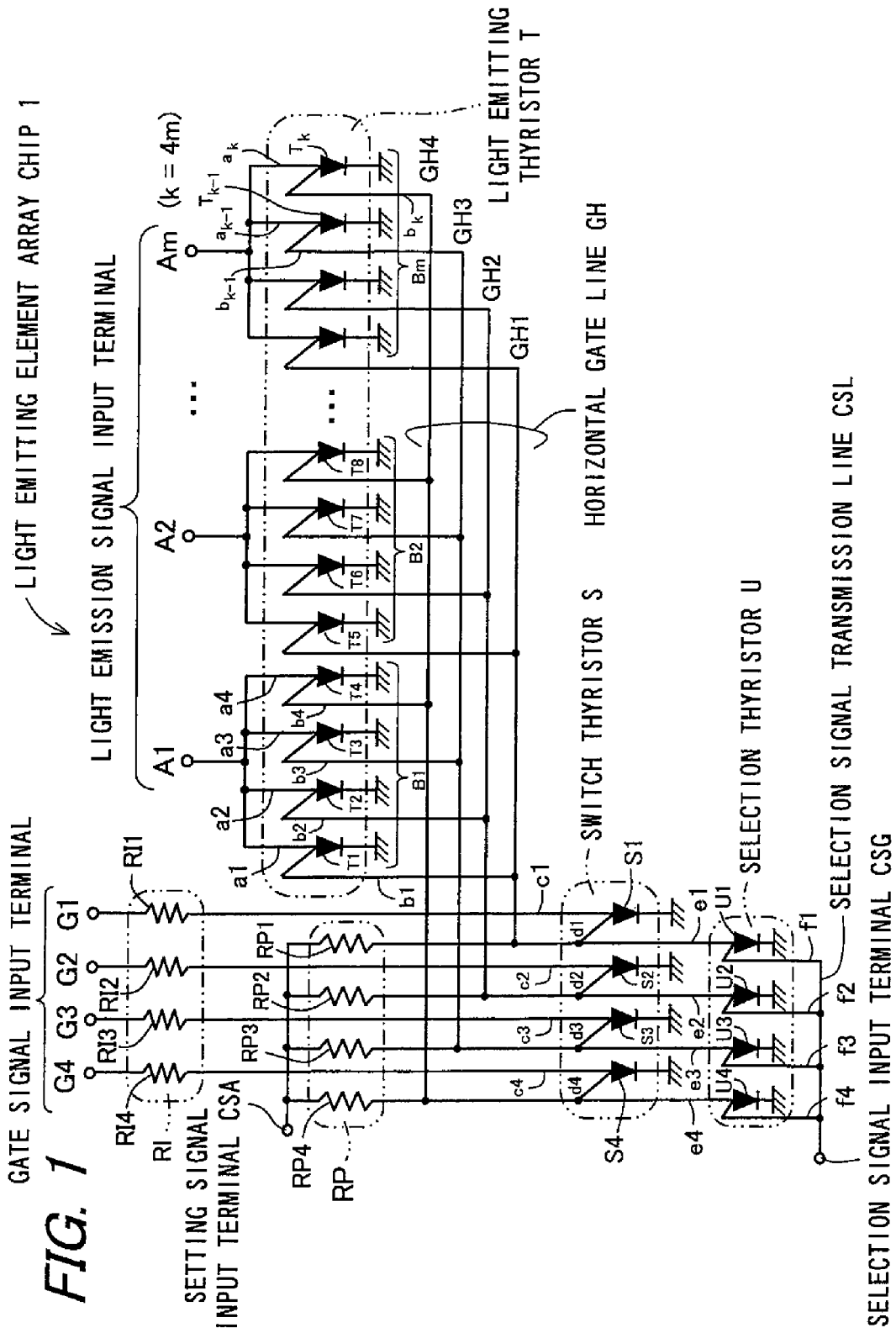
FIG. 1 is an equivalent circuit diagram schematically illustrating a light emitting element array chip according to a first embodiment of the invention.

Now referring to the drawings, preferred embodiments of the invention are described below.

Hereinafter, preferred embodiments of the invention will be described in detail with reference to the accompanying drawings. In the following descriptions, it is described that cathodes of emission thyristors used in a light emitting element array are grounded as a common electrode. Even when anodes of the emission thyristors are grounded as a common electrode, the same logical circuit can be embodied by inverting the polarities of the emission thyristors and diodes, inverting the positive and negative voltages applied to resistors, and inverting the conductive types of gate electrodes of the emission thyristors.

FIG. 1 is an equivalent circuit diagram schematically illustrating a light emitting element array chip 1 according to a first embodiment of the invention.

A light emitting element array chip 1 includes k light emitting elements, (wherein k is a natural number), n switch units, and n horizontal gate lines GH1 to GHn. The respective k light emitting elements are composed of a emission thyristor. The switch units include switch thyristors S1 to Sn including n emission thyristors, selection thyristors U1 to Un including n emission thyristors, and n pull-up resistors RP1 to RPn. In this embodiment, it is assumed that n=4. In the following description, the k light emitting elements may be described as light emitting thyristors T1 to Tk. When the plurality of light emitting thyristors T1 to Tk, the plurality of switch thyristors S1 to Sn, the plurality of selection thyristors U1 to Un, and the plurality of pull-up resistors RP1 to RPn are collectively referred to or when the unspecified ones are mentioned, they may be described as light emitting thyristors T, switch thyristors S, selection thyristors U, and pull-up resistors RP. In this embodiment, the horizontal gate line GH corresponds to a control signal transmission line and the pull-up resistor RP corresponds to the resistor which constitute the switch unit.

Anodes a1 to ak and N-gate electrodes b1 to bk are used as electrodes to control operations of the light emitting thyristors T1 to Tk constituting the light emitting elements. The cathodes of the light emitting thyristors T are grounded as a common electrode. The anodes a1 to ak and the N-gate electrodes b1 to bk may be described as anodes a and N-gate electrodes b, when they are collectively referred to or when the unspecified ones are mentioned. The N-gate electrode b may be described simply as gate electrode b. In this embodiment, the anode a corresponds to the third electrode and the N-gate electrode b corresponds to the second control electrode.

Anodes c1 to c4 and N-gate electrodes d1 to b4 are used as electrodes to control operations of the switch thyristors S1 to S4 of the switch units. The cathodes of the switch thyristors S are grounded as a common electrode. The anodes c1 to c4 and the N-gate electrodes d1 to d4 may be described as anodes c and N-gate electrodes d, when they are collectively referred to or when the unspecified ones are mentioned. The N-gate electrode d may be described simply as gate electrode d. In this embodiment, the anode c corresponds to the first electrode and the N-gate electrode d corresponds to the first control electrode.

The N-gate electrodes d1 to d4 of the switch thyristors S1 to S4 are connected to anodes e1 to e4 of the selection thyristors U1 to U4, ends of the pull-up resistors RP1 to RP4, and the horizontal gate lines GH1 to GH4. Like numbers are attached to the reference numerals of the elements connected to each other. For example, the N-gate electrode d1 of the first switch thyristor S1 is connected to the anode e1 of the first selection thyristor U1, the first pull-up resistor RP1, and the first horizontal gate line GH1. The N-gate electrode $di_4$ of the $i_4$-th switch thyristor $Si_4$ (wherein $1 \leq i_4 \leq n$ and n=4) is connected to the anode $ei_4$ of the $i_4$-th selection thyristor $Ui_4$, the pull-up resistor $RPi_4$, and the horizontal gate line $GHi_4$. The N-gate electrodes f1 to f4 of the selection thyristors U are connected to a selection signal input terminal CSG to which a common selection signal is inputted through one selection signal transmission line CSL and thus are electrically connected to each other. The other ends of the pull-up resistors RP are connected to setting signal input terminals CSA to which a common setting signal and setting signals are inputted. The cathodes of the selection thyristors U are grounded as a common electrode. The horizontal gate lines GH transmit controls signals outputted from the N-gate electrodes d of the switch thyristors S. In this embodiment, the N-gate electrodes f1 to f4 of the selection thyristors U correspond to the second electrode, the selection signal corresponds to the first selection signal, and the selection signal transmission line corresponds to the first selection signal transmission line. A voltage having a high level inputted to the setting signal input terminal CSA is referred to as a setting signal and a voltage of substantial 0 volt is referred to as a reset signal. The anodes e1 to e4 and the N-gate electrodes f1 to f4 of the selection thyristors U1 to U4 may be simply described as anodes e and N-gate electrodes f of the selection thyristors U, when they are collectively referred to or when the unspecified ones are mentioned.

The anodes c1 to c4 of the switch thyristors S are connected to gate signal input terminals G1 to G4, respectively. Preferably, current-limiting resistors RI1 to RI4 are connected between the anodes c1 to c4 of the switch thyristors S and the gate signal imputer terminals G1 to G4. The gate signal input terminals G1 to G4 and the current-limiting resistors RI1 to RI4 may be simply described as gate signal input terminals G and current-limiting resistors RI, when they are collectively referred to or when the unspecified ones are mentioned. In this embodiment, the gate signal corresponds to a second selection signal and the current-limiting resistor RI corresponds to a third resistor connected to the anode or cathode of the switch thyristor.

The light emitting thyristors T used as the light emitting elements are composed of m light emitting element blocks B1 to Bm, each of which is composed of a group of n or less light emitting thyristors T. The plurality of light emitting element blocks B1 to Bm may be simply described as a light emitting element blocks B, when they are collectively referred to or when the unspecified ones are mentioned. The number of light emitting thyristors. T of one light emitting element block B should be n or less. In this embodiment, n=4 and the number of light emitting thyristors T of all the light emitting element blocks is set to n (=4). Accordingly, the relation between the number k of light emitting thyristors T and the number m of light emitting element blocks B is k=4 m. When the light emitting thyristors T are numbered with first to k-th numbers according to an order of from one end to the other end in the arrangement direction of the light emitting thyristors T and the light emitting element blocks are numbered with first to m-th numbers according to the order of from the one end to the other end in the arrangement direction, the $(4i_5-3)$-th to the $4i_5$-th light emitting thyristors T belong to the $i_5$-th light emitting element blocks $Bi_5$ (wherein $1 \leq i_5 \leq m$).

The light emitting element blocks B1 to Bm are provided with light emission signal input terminals A1 to Am, respectively. The light emission signal input terminals A1 to Am may be simply described as light emission signal input terminals A, when they are collectively referred to or when the unspecified ones are mentioned. The light emitting thyristors T of the light emitting element blocks B are electrically connected to each other by connecting the anodes a to a common light emission signal input terminal A of the light emitting element blocks B. The N-gate electrodes b of the light emitting thyristors T of the light emitting element blocks B are connected to different horizontal gate lines GH, respectively. In this embodiment, when the light emitting thyristors T are numbered with first to k-th numbers according to the order of from the one end to the other end in the arrangement direction of the light emitting thyristors T, the light emitting element blocks B are numbered with first to m-th numbers according to the order of from the one end to the other end in the arrangement direction, and the horizontal gate lines are numbered with first to fourth numbers according to the wiring order, the gate electrode of the $(4i_6-3)$-th light emitting thyristor $T4i_6-3$ in the $i_6$-th light emitting element block $Bi_b$ (wherein $1 \leq i_6 \leq m$) is connected to the first horizontal gate line GH1, the gate electrode of the $(4i_6-2)$-th light emitting thyristor $T4i_6-2$ is connected to the second horizontal gate line GH2, the gate electrode of the $(4i_6-1)$-th light emitting thyristor $T4i_6-1$ is connected to the third horizontal gate line GH3, and the gate electrode of the $4i_6$-th light emitting thyristor $T4i_6$ is connected to the fourth horizontal gate line GH4. The anodes a of all the light emitting thyristors T in the $i_6$-th light emitting element block $Bi_b$ (wherein $1 \leq i_6 \leq m$) are connected to a common light emission signal input terminal $Ai_6$.

The configurations and operations of the light emitting thyristors T and the switch thyristors S used in the light emitting element array chip 1 will be described now.

In general, an emission thyristor is a semiconductor element having a PNPN structure in which direct transition P-type semiconductor and N-type semiconductor are alternately stacked and has the same negative resistance characteristic as a reverse blocking triode thyristor. When it is assumed that the semiconductor layers are sequentially a first semiconductor layer (N type), a second semiconductor layer (P type), a third semiconductor layer (N type), and a fourth semiconductor layer (P type) from the cathode side to the anode side, the N-gate electrode means a control electrode disposed in the third semiconductor layer (N type) and the P-gate electrode means a control electrode disposed in the second semiconductor layer (P type). The N-gate electrode is used to ground the cathode as a common electrode and the P-gate electrode is used to ground the anode as a common electrode. Depending on the anode or the cathode used as the common electrode, it is determined which conductive type of gate electrode should be used. Accordingly, when the common electrode is determined, it may be described simply as a gate electrode b. Here, the voltage of a light emission signal means a voltage to be applied across the anode a and the cathode of the light emitting thyristor T with the application of the light emission signal to the anode a. The current of the light emission signal means a current to flow in the anode a of the light emitting thyristor T with the application of the light emission signal. The voltage of a control signal means a voltage to be applied across the N-gate electrode b and the cathode of the light emitting thyristor T with the application of the control signal to the N-gate electrode b. The current of the control signal means a current to flow in the N-gate electrode b with the application of the control signal.

Figure 2:
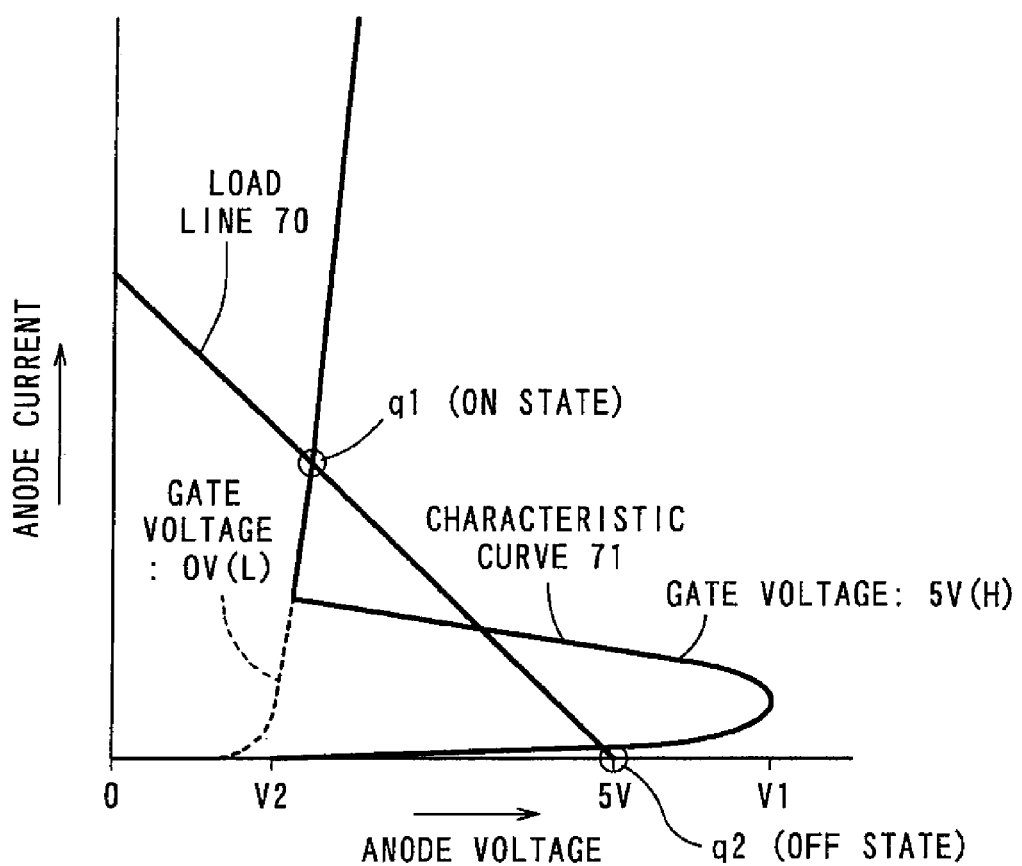
FIG. 2 is a graph illustrating a forward voltage-current characteristic which is a relation between an anode voltage and an anode current of the light emitting thyristor T.

FIG. 2 is a graph illustrating a forward voltage-current characteristic which is a relation between the anode voltage and the anode current of the light emitting thyristor T. The anode voltage represents the potential of the anode when the potential of the cathode is 0 (zero) V and the anode current represents the current flowing in the anode.

In FIG. 2, the horizontal axis represents the anode voltage and the vertical axis represents the anode current. A load line 70 is also shown in FIG. 2. Since the threshold voltage of the light emitting thyristor T decreases with the application of the control signal to the gate electrode b, the operating point is changed from point q2 in the OFF state where a characteristic curve 71 representing the forward voltage-current characteristic and the load line 70 intersect each other to point q1 in the ON state where the characteristic curve 71 and the load line 70 intersect each other, thereby emitting light. At point q1 in the ON state, a main current flows between the anode and the cathode.

The operation of the light emitting thyristor T will be described now with specific numerical values. Here, the voltage of the cathode is 0 V and the potential of 5 V is applied to the anode a when the anode voltage is at a high (H) level, and the potential of 0 V is applied to the anode a when the anode voltage is at a low (L) level. The potential of 5 V is applied to the gate electrode b when the voltage of the gate electrode b is at the high (H) level, and the potential of 0 V is applied to the gate electrode b when the voltage of the gate electrode b is at the low (L) level.

First, when the voltage of the gate electrode b is at the high (H) level, the potential of the gate electrode b is 5 V. Accordingly, in order to allow the anode current to flow, a potential higher than the potential of 5 V of the gate electrode b by the forward voltage drop of a diode formed by the third semiconductor layer (N type) and the fourth semiconductor layer (P type) needs to be applied to the anode a. The forward voltage drop is about 1.5 V when the emission thyristor is formed of GaAs or AlGaAs. Accordingly, when the light emission signal is at the high (H) level, the light emitting thyristor T is in the OFF state of point q2 and thus does not emit light. When the voltage of the gate electrode b is at the low (L) level, the potential of the gate electrode b is 0 V. Accordingly, in order to allow the anode current to flow, a potential higher than the potential of 0 V of the gate electrode b by the forward voltage drop of a diode formed by the third semiconductor layer (N type) and the fourth semiconductor layer (P type) needs to be applied to the anode a. Accordingly, when the anode voltage is at the high (H) level, the light emitting thyristor T is in the ON state of point q1 and thus the anode current flows, thereby emitting light.

The configurations and the operations of the switch thyristor S and the selection thyristor U are similar to those of the light emitting thyristor T.

An operation of a schematic equivalent circuit diagram of the light emitting element array chip 1 shown in FIG. 1 will be described now.

Figure 3:
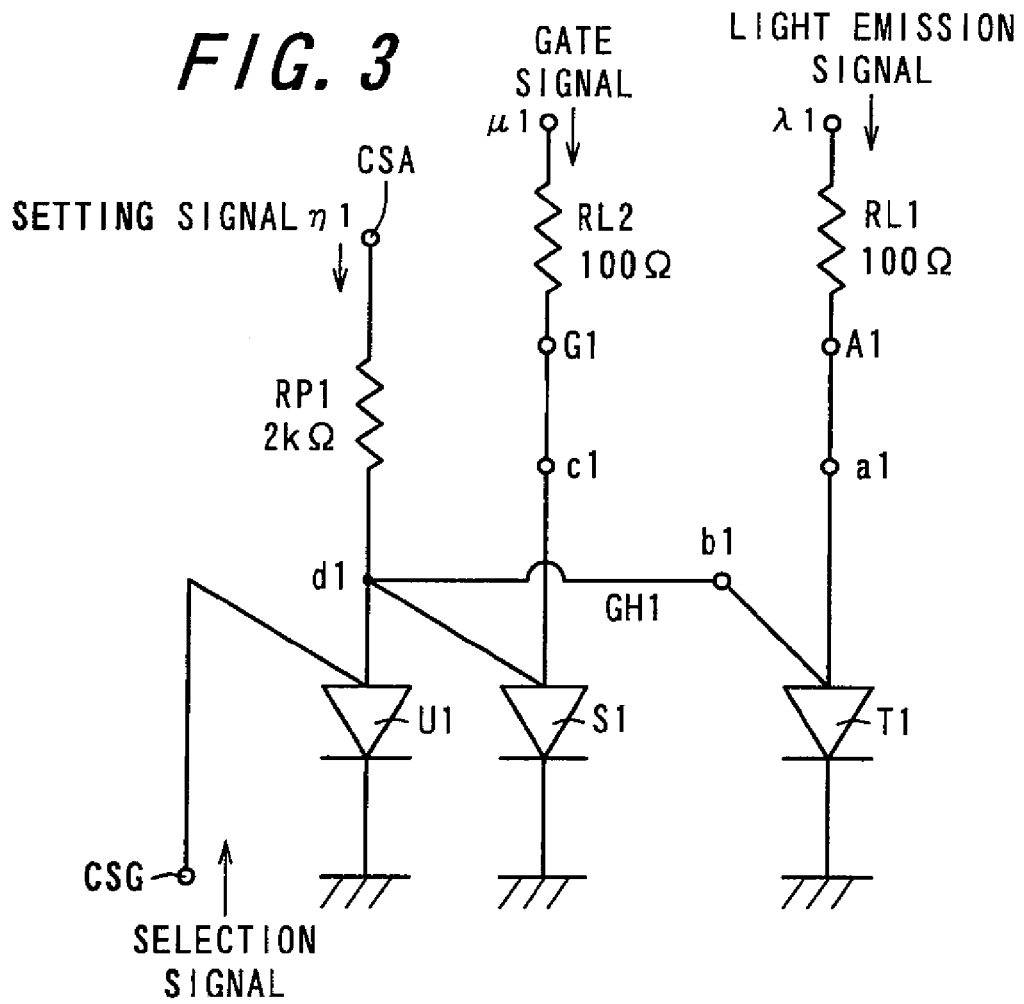
FIG. 3 is a part of the equivalent circuit diagram schematically illustrating a light emitting element array chip of FIG. 1.
Figure 4:
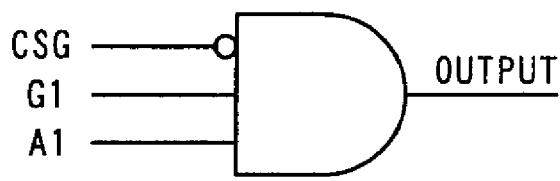
FIG. 4 is a logical circuit diagram in which the equivalent circuit diagram shown in FIG. 3 is illustrated by logic signs.

FIG. 3, which is a part of the equivalent circuit diagram shown in FIG. 1, shows connections of the light emitting thyristor T1, the switch thyristor S1, and the selection thyristor U1 with wiring lines to illustrate an operation of the light emitting element array L1. FIG. 4 is a logical circuit diagram in which the equivalent circuit diagram shown in FIG. 3 is illustrated by logic signs. The components corresponding to each other in FIGS. 3 and 1 will be denoted by the same reference numerals and description thereof will be omitted. In FIG. 3, load resistors RL1 and RL2 having resistance of $100\Omega$ are disposed between the light emission signal input terminal A1 and the light emission signal output terminal $\lambda 1$ and between the gate signal input terminal G1 and the gate signal output terminal $\mu 1$. The resistance of the pull-up resistor RP1 is set to $2 k\Omega$ and 5 V as a setting signal is inputted to the other end of the pull-up resistor RP. Since the current-limiting resistor RI shown in FIG. 1 is exemplified as a preferable configuration, the current-limiting resistor is not used in FIGS. 3 and 5. The basic operation of the light emitting element array chip 1 is constant regardless of the presence of the current-limiting resistor RI.

Figure 5:
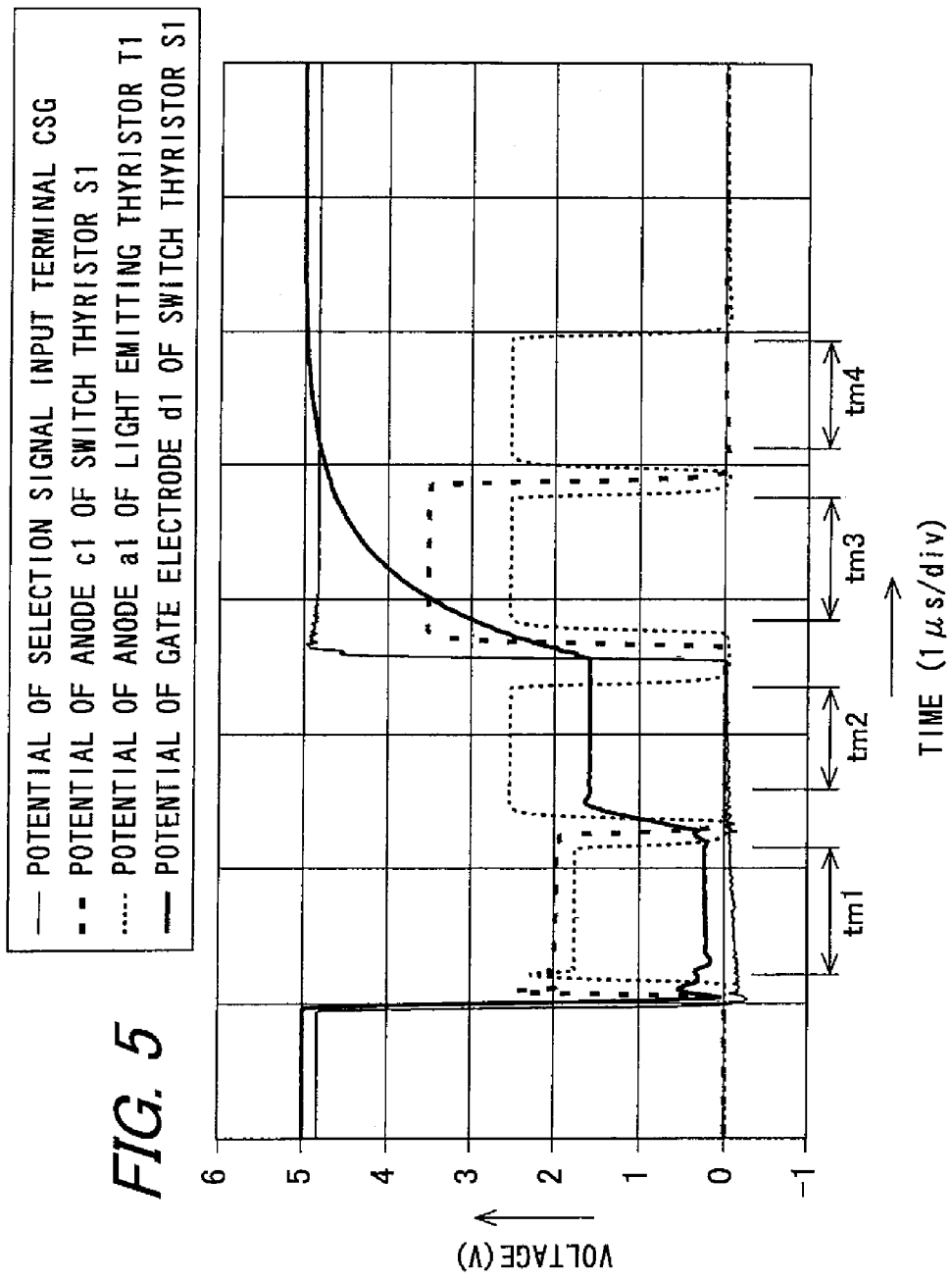
FIG. 5 is a graph illustrating an example of an operating characteristic of the light emitting element array chip according to the first embodiment.

FIG. 5 is a graph illustrating an example of an operating characteristic of the light emitting element array chip 1 according to this embodiment. Here, the horizontal axis represents the time (unit: micro second ($\mu$s)/div) and the vertical axis represents the signal level (unit: volt (V)/div). Regarding relations between FIGS. 3 and 5, in FIG. 5, the thick solid line represents the potential of the gate electrode d1 of the switch thyristor S, the thin solid line represents the potential of the selection signal input terminal CSG, the thick dashed line represents the potential of the anode c1 of the switch thyristor S1, and the thin dashed line represents the potential of the anode a1 of the light emitting thyristor T1. The first light emitting thyristor T1, the first switch thyristor S1, and the first selection thyristor U1 shown in FIG. 3 are measured, but the same result can be obtained from the other elements.

In measuring the operating characteristics shown in FIG. 5, the voltage of 2.5 V is outputted when the voltage of the light emission signal output terminal λ1 is at the high (H) level, and the voltage of 0 V is outputted when the voltage thereof is at the low (L) level. The voltage of 3.5 V is outputted when the voltage of the gate signal output terminal μ1 is at the high (H) level, and the voltage of 0 V is outputted when the voltage thereof is at the low (L) level. The voltage of 5 V is applied to the selection signal input terminal CSG when the voltage of the selection signal output terminal is at the high (H) level, and the voltage of 0 V is applied when the voltage thereof is at the low (L) level. During the measurement, 5 V as the setting signal is applied to the other end of the pull-up resistor RP1. The load resistors RL1 and RL2 and the pull-up resistor as other parameters are set in the same way as shown in FIG. 3. The current-limiting resistor RI is not used.

First, at the time of tm1 shown in FIG. 5, the voltage of the gate signal output terminal p1 connected to the switch thyristor S1 is set to the high level (3.5 V), the voltage of the selection signal input terminal CSG is set to the low level (0 V), and the voltage of the light emission signal output terminal λ1 connected to the light emitting thyristor T1 is set to the high level (2.5 V).

In this case, as represented by the thin solid line, since the selection signal input terminal CSG is about 0 V and the setting signal input terminal CSA is 5 V, the selection thyristor U1 is in the ON state. When the switch thyristor S1 and the light emitting thyristor T1 are in the OFF state, the potential of the gate electrode d1 is about 1.6 V which is the diffusion potential of the selection thyristor U. However, at the time of t1, since the gate signal of the high level (3.5 V) is applied to the anode c1 of the switch thyristor S1, the switch thyristor S1 is changed to the ON state. As a result, the potential of the gate electrode d1 represented by the thick solid line is about 0 V. At this time, since the gate electrode d1 of the switch thyristor S1 and the gate electrode b1 of the light emitting thyristor T1 are connected to each other through the horizontal gate line GH1, the potential of the gate electrode b1 of the light emitting thyristor T1 is about 0 V. This means that the control signal of the low level (0 V) is inputted to the gate electrode b1 of the light emitting thyristor T1 through the horizontal gate line GH1 from the gate electrode d1 of the switch thyristor S1. Since the light emission signal of the high level (2.5 V) is applied to the anode a1 of the light emitting thyristor T1 and this value is greater than about 1.5 V (value obtained by adding about 1.5 V as the forward voltage drop to the potential of 0 V of the gate electrode b1) which is the threshold value, the light emitting thyristor T1 is changed to the ON state and thus emits light. In this way, when the light emitting thyristor T1 is in the ON state, the potential of the anode a1 of the light emitting thyristor T1 represented by the thin dashed line is about 1.8 V which is the driving voltage level of the light emitting thyristor T. The difference from the voltage of the light emission signal output terminal λ1 of the high level (2.5 V) corresponds, to the magnitude of the voltage drop by the load resistor RL1 resulting from the main current flowing from the anode c1 of the light emitting thyristor T to the cathode. The potential of the anode c1 of the switch thyristor S1 represented by the thick dashed line is about 2 V which is the driving voltage level of the switch thyristor S when the switch thyristor S1 is in the ON state. The difference from the voltage of the gate signal output terminal μ1 of the high level (3.5 V) corresponds to the voltage drop by the load resistor RL2.

First, at the time of tm2 shown in FIG. 5, the voltage of the gate signal output terminal p1 connected to the switch thyristor S1 is set to the low level (0 V), the voltage of the selection signal input terminal CSG is set to the low level (0 V), and the voltage of the light emission signal output terminal λ1 connected to the light emitting thyristor T1 is set to the high level (2.5 V).

In this case, as represented by the thin solid line, since the selection signal input terminal CSG is about 0V, the selection thyristor U1 is forwardly biased. However, unlike the time of t1, since the voltage of the gate signal output terminal p1 connected to the anode c1 of the switch thyristor S1 is the low level (0 V), the potential of the anode c1 of the switch thyristor S1 represented by the thick dashed line is 0 V and thus the switch thyristor S1 is in the OFF state. Accordingly, the potential of the gate electrode d1 of the switch thyristor S1 represented by the thick dashed line is about 1.6 V which is the diffusion potential of the ON state of the selection thyristor U and the potential of the gate electrode b1 of the light emitting thyristor T1 connected to the gate electrode d1 is about 1.6 V. The light emission signal of the high level (2.5 V) is applied to the anode a1 of the light emitting thyristor T1, but is changed to the OFF state because the high level is lower than about 3 V (which is a value obtained by adding about 1.5 V as the forward voltage drop to 1.6 V as the potential of the gate electrode b1) which is the threshold voltage of the light emitting thyristor T1. Accordingly, the potential of the anode a1 of the light emitting thyristor T1 represented by the thin dashed line is 2.5 V which is the voltage of the light emission signal output terminal λ1.

First, at the time of tm3 shown in FIG. 5, the voltage of the gate signal output terminal μ1 connected to the switch thyristor S1 is set to the high level (3.5 V), the voltage of the selection signal input terminal CSG is set to the high level (5 V), and the voltage of the light emission signal output terminal λ1 connected to the light emitting thyristor T1 is set to the high level (2.5 V).

In this case, as indicated by the thin solid line, the selection signal input terminal CSG is at about 5 V. Since the potential of the gate electrode d1 of the switch thyristor S1 indicated by the thick solid line is also at about 5 V but is the CR constant in the test result shown in FIG. 5, the gate electrode is in the potential range of 3 to 5 V at the time of tm3. Since the gate signal of the high level (3.5 V) is applied to the anode c1 of the switch thyristor S1 but the potential of the gate electrode d1 is high, the threshold voltage is higher than the voltage level of the gate signal and thus the switch thyristor S1 is changed to the OFF state. Accordingly, the potential of the anode c1 of the switch thyristor S1 indicated by the thick dashed line is at 3.5 V which is the input level of the gate signal. Similarly, since the light emission signal of the high level (2.5 V) is applied to the light emitting thyristor T1 but the potential of the gate electrode b1 connected to the gate electrode d1 of the switch thyristor S1, the light emitting thyristor T1 is changed to the OFF state. Accordingly, potential of the anode a1 of the light emitting thyristor T1 indicated by the thin dashed line is at 2.5 V which is the voltage of the light emission signal output terminal λ1.

Finally, at the time of tm4 shown in FIG. 5, the voltage of the gate signal output terminal p1 connected to the switch thyristor S1 is set to the low level (0 V), the voltage of the selection signal input terminal CSG is set to the high level (5

V), and the voltage of the light emission signal output terminal λ1 connected to the light emitting thyristor T1 is set to the high level (2.5 V).

In this case, as indicated by the thin solid line, the selection signal input terminal CSG is at about 5 V and the gate electrode d1 of the switch thyristor S1 indicated by the thick solid line is at about 5 V. Since the voltage of the gate signal output terminal μ1 connected to the anode c1 of the switch thyristor S1 is the low level (0 V), the potential of the anode c1 of the switch thyristor S1 indicated by the thick dashed line is 0 V and thus the switch thyristor S1 is in the OFF state. On the other hand, since the light emission signal of the high level (2.5 V) is applied to the light emitting thyristor T1 but the potential of the gate electrode b1 connected to the gate electrode d1 of the switch thyristor S1 is 5 V which is higher, the light emitting thyristor T1 is in the OFF state. Accordingly, the potential of the anode a1 of the light emitting thyristor T1 indicated by the thin dashed line is 2.5 V which is the input level of the light emission signal.

As described above, at the time of tm1, when the voltage of the selection signal input terminal CSG is the low level (0 V), the gate signal is applied to the anode c1 of the switch thyristor S1, whereby the potential of the gate electrode d1 of the switch thyristor S1 becomes the low level (0 V). Since the gate electrode b1 of the light emitting thyristor T1 is connected to the gate electrode d1 of the switch thyristor S1 through the horizontal gate line GH1, the potential of the gate electrode b1 of the light emitting thyristor T1 is also 0 V. When the light emission signal is applied to the anode a1 of the light emitting thyristor T1, the light emitting thyristor T1 can be made to emit light.

Truth values of the circuit shown in FIGS. 3 and 4 are listed in Table 1. In Table 1, the light emitting thyristor T1 emits light when the output is at the high (H) level, and the light emitting thyristor T1 is extinguished when the output is at the low (L) level. As can be seen from Table 1, only when the selection signal input terminal CSG is at the low (L) level, the gate signal input terminal G1 is at the high (H) level, and the light emission signal input terminal A1 is at the high (H) level, the light emitting thyristor T1 can be selectively made to emit light.

TABLE 1

| CSG | G1 | A1 | Output |
|---|---|---|---|
| H | H | H | L |
| H | H | L | L |
| H | L | H | L |
| H | L | L | L |
| L | H | H | H |
| L | H | L | L |
| L | L | H | L |
| L | L | L | L |

The same is true in the light emitting element array chip 1 shown in FIG. 1. The gate electrodes d of the switch thyristors S of the light emitting element array chip 1 are connected to the common selection signal input terminal CSG through one selection signal transmission line CSL. Accordingly, when the voltage of the low level is inputted from the common selection signal input terminal CSG, the potentials of the gate electrodes d1 to d4 of the switch thyristors S1 to S4 are at the diffusion potential level (about 1.6 V) of the selection thyristors U1 to U4. In this state, the light emitting element array chip 1 is selected (selected state). In the selected state, when the gate signal is inputted to the anode $ci_7$ of the $i_7$-th switch thyristor $Si_7$ from the $i_7$-th gate signal input terminal $Gi_1$ (wherein $1 \leq i_7 \leq 4$), the $i_7$-th switch thyristor $Si_7$ is changed to the ON state. Then, the voltage of the gate electrode $di_7$ of the $i_7$-th switch thyristor $Si_7$ is about 0 V and thus the voltage of the $i_7$-th horizontal gate line $GHi_7$ connected to the gate electrode $di_7$ and the gate electrode b of the light emitting thyristor T connected to the $i_7$-th horizontal gate line is about 0 V. This means that the control signal of the low level (0 V) is inputted to the gate electrode b of the light emitting thyristor T through the horizontal gate line $GHi_7$ from the gate electrode $di_7$ of the switch thyristor $Si_7$.

By applying the light emission signal to the anode a of the light emitting thyristor T connected to the $i_7$-th horizontal gate line $GHi_7$, it is possible to allow the light emitting thyristor T to selectively emit light.

As described above, when the selection signal of the low level is inputted and the switch thyristors S are in the selected state, the switch thyristor S having the anode c to which the gate signal is inputted among the switch thyristors S is changed to the ON state. When the switch thyristor S is changed to the ON state, the potential of the gate electrode d is 0 V and the potential of the gate electrode b of the light emitting thyristor T connected to the switch thyristor S through the horizontal gate line is 0 V. When the light emission signal is inputted to the anode a of the light emitting thyristor T in this state, the light emitting thyristor is changed to the ON state to emit light. When the selection signal is not inputted (when it is not in the selected state) and the gate signal is inputted to the anode c of the switch thyristor S of the light emitting element array chip 1, the switch thyristor S is not changed to the ON state. Accordingly, even when the light emission signal is applied to the anodes a of the light emitting thyristors T connected to the switch thyristor S through the horizontal gate line GH, the light emitting thyristors T are not made to emit light. In this way, since it can be controlled by the use of the selection signal whether the gate signal is supplied from the switch thyristors S to the light emitting thyristors T, the light emitting device employing the plurality of light emitting element array chips can be time-divisionally driven by sharing the light emission signal and the gate signal with the light emitting element array chips.

In the light emitting element array chip 1 shown in FIG. 1, since the anodes a in the light emitting element blocks B are connected to the common light emission signal input terminal A, the light emitting element array chip 1 can be dynamically driven. In FIG. 1, the light emission signal is inputted to the light emission signal input terminal A disposed every light emitting element block B. While the light emission signal is applied to the anodes a of a1 the light emitting thyristors T in the selected light emitting element block B, the light emitting thyristors T belonging to the block are connected to the different horizontal gate lines GH. Therefore, the light emitting thyristors T can be selectively made to emit light by the use of the gate signal.

Then, since the horizontal gate lines GH can be shared by the plurality of light emitting element blocks B, it is possible to time-divisionally drive the plurality of light emitting element blocks. Even when the number of light emitting thyristors T is great, it is possible to reduce the number of horizontal gate lines GH, thereby reducing the chip size. Since the number of horizontal gate lines GH is reduced, it is possible to simply the configuration in which the number of switch thyristors S is small.

In the light emitting element array chip 1 shown in FIG. 1, preferably, current-limiting resistors RI1 to RI4 are connected between the anodes c1, c2, c3, and c4 of the switch thyristors S and the gate signal input terminals G1, G2, G3, and G4.

In the light emitting device employing the light emitting element arrays, for the purpose of high speed operation, the selection signal is concurrently applied to the plurality of light emitting element array chips 1 to concurrently make the plurality of light emitting element array chips 1 in the selected state. At this time, since the gate signal is shared by the plurality of light emitting element array chips 1 in the selected state, the plurality of switch thyristors S are concurrently switched. In general, when the emission thyristors are switched and changed to the ON state, the main current flows between the anodes and the cathodes, thereby lowering the output voltage of the driving circuit to feed the gate signal. Accordingly, when the gate signals inputted to the anodes c of the plurality of switch thyristors S are different from each other in timing and the switch thyristor S to which the gate signal has been first inputted is switched to allow the main current to flow therein, the switch thyristor S to which the gate signal is lately inputted may be not switched due to the lack of the voltage of the gate signal. Therefore, by applying the gate signal through the current-limiting resistors RI connected to the anodes c of the switch thyristors S, it is possible to suppress the decrease in output voltage of the driving circuit, thereby satisfactorily switching the plurality of switch thyristors.

In the above-mentioned measurement, the setting signal is set to a positive voltage of 5 V. However, when the light emitting element array chip 1 is made to actually operate, the selection thyristor U1 can be satisfactorily made to be in the OFF state by stopping the setting signal and applying 0 V to the input terminal CSA.

The configuration of the light emitting element array chip 1 according to this embodiment will be described specifically now.

Figure 6:
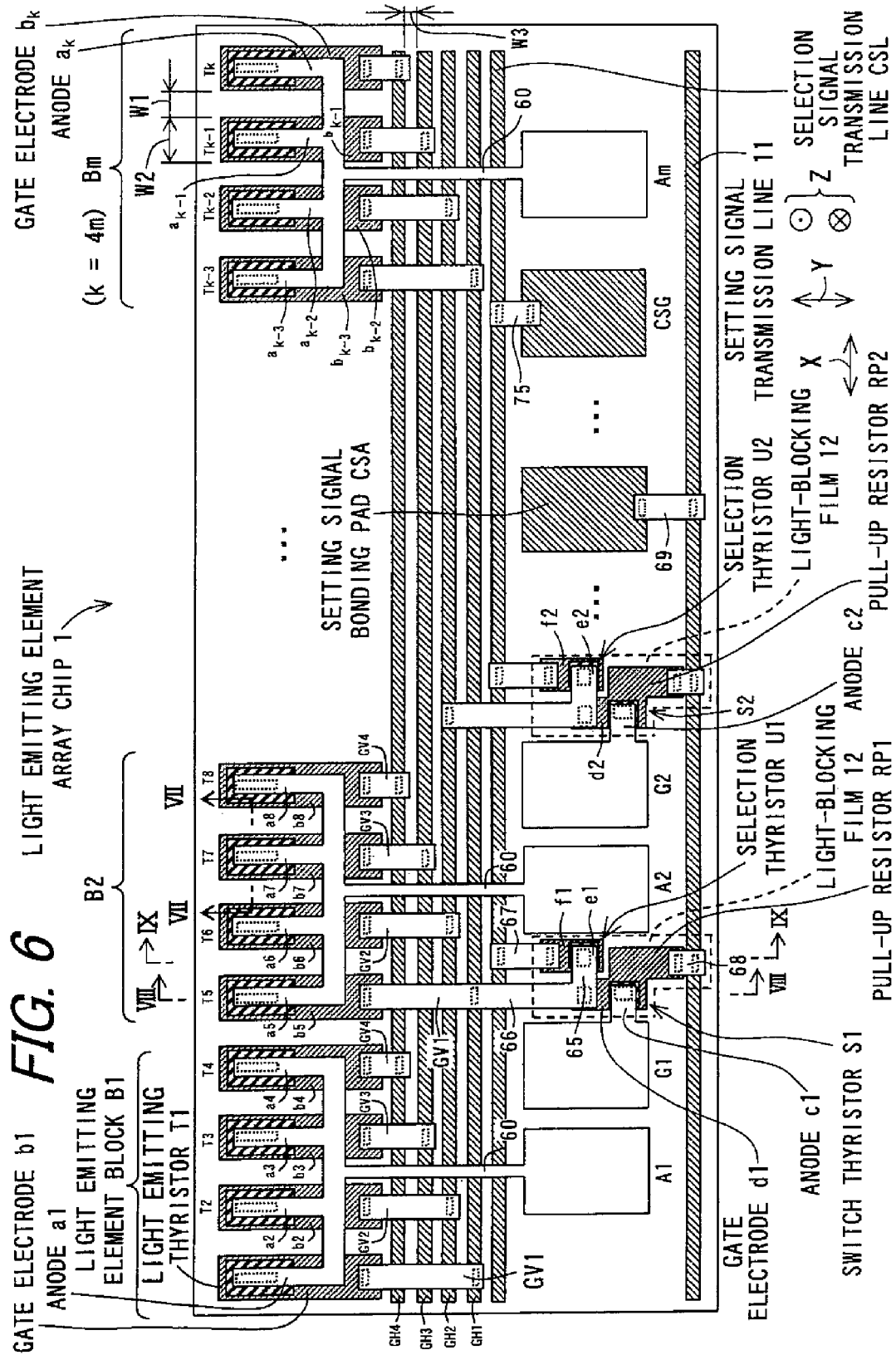
FIG. 6 is a partial plan view illustrating a basic configuration of the light emitting element array chip according to the first embodiment.

FIG. 6 is a partial plan view illustrating a basic configuration of the light emitting element array chip 1 according to the first embodiment. This drawing shows the plan view of the light emitting element array chip I arranged in the state where the light emission direction of the light emitting thyristors T is toward the front of the drawing paper surface. The horizontal gate lines GH1 to GH4, the selection signal transmission line CSL, the setting signal transmission line 11, the setting signal bonding pad CSA, the selection signal bonding pad CSG, the light emitting thyristors T, the switch thyristors S, the pull-up resistors RP, and the selection thyristors U are hatched for the purpose of easy understanding.

The plurality of light emitting thyristors T of the light emitting element array chip 1 are arranged with a gap W1 therebetween. The light emitting thyristors T are exposing light emitting elements. In this embodiment, the light emitting thyristors T are arranged in a line with a constant gap. In the following description, the arrange direction X of the light emitting thyristors T may be described simply as an arrangement direction X. The direction parallel to the light emission direction of the light emitting thyristors T is described as the thickness direction Z and the direction perpendicular to the arrangement direction X and the thickness direction Z is described as a width direction Y. The light emitting thyristors T are formed to emit light having a wavelength of 600 nm to 800 nm.

Since the light emitting thyristor T is formed of an emission thyristor having the PNPN structure, it can be formed with a simple structure in which a P-type semiconductor and an N-type semiconductor are alternately stacked, thereby easily manufacturing the device. As described above, when the light emission signal is applied to the anodes a1 to ak in the state where the threshold voltage is lower than the voltage of the light emission signal by applying the control signal to the gate electrodes b1 to bk, the light emitting thyristors T emit light.

The light emitting thyristors T1 to Tk are classified into the light emitting element blocks B1 to Bm and the anodes a of the light emitting thyristors T belonging to the same light emitting element block B are connected to the bonding pad as the common light emission signal input terminal A. The bonding pad as the light emission signal input terminal A may be simply described as a light emission signal bonding pad A. In this embodiment, the light emission signal bonding pad A corresponds to the third bonding pad. In this embodiment, four light emitting thyristors T corresponding to the number of horizontal gate lines GH form one light emitting element block B. For example, when the light emitting thyristors T are numbered with first to k-th numbers according to the order of from one end to the other end in the arrangement direction X of the light emitting thyristors T and the light emitting element blocks B are numbered with first to m-th numbers according to the order of from the one end to the other end in the arrangement direction, a connecting portion 60 is disposed between the anodes a of all the $(4i_6-3)$-th to $4i_6$-th light emitting thyristors $T(4i_6-3)$ to $T4i_6$ belonging to the $i_6$-th light emitting element block $Bi_6$ and the light emission signal bonding pad $Ai_6$ (wherein $1 \leq i_6 \leq m$) to electrically connect them. The anodes a of the light emitting thyristors T, the light emission signal bonding pad A, and the connecting portion 60 are formed integrally at the same time. In this embodiment, preferably, the light emission signal bonding pad A is disposed opposite to the light emitting thyristors T with the horizontal gate lines GH therebetween in the arrangement direction X of the light emitting thyristors T.

The gap W1 of the light emitting thyristors T in the arrangement direction X and the length W2 of the light emitting thyristors T in the arrangement direction X are determined by the resolution of an image to be formed by an image forming apparatus 87 to be described and to be mounted with the light emitting element array chip 1. For example, when the resolution of the image is 600 dpi (dot per inch), the gap W1 is set to about 24 μm and the length W2 is set to about 18 μm.

The horizontal gate lines GH extend between the one end and the other end in the arrangement direction X of the light emitting element array chip 1. The horizontal gate lines GH are arranged with a gap in the width direction Y. In this embodiment, the horizontal gate line GH4, the horizontal gate line GH3, the horizontal gate line GH2, and the horizontal gate line GH1 are sequentially arranged from the side close to the light emitting thyristors T. In this embodiment, the selection signal transmission line CSL to feed the selection signal to the gate electrodes d of the switch thyristor S is disposed apart from the light emitting thyristors T to be parallel to the horizontal gate line GH1. The selection signal transmission line CSL is connected to the bonding pad as the selection signal input terminal CSG through a connection portion 75. The bonding pad as the selection signal input terminal CSG may be described simply as a selection signal input terminal CSG. In this embodiment, the selection signal bonding pad CSG corresponds to the first bonding pad. The gap W3 between the horizontal gate lines GH and between the horizontal gate line GH1 and the selection signal transmission line CSL is selected as such a distance that a short-circuit does not occur between the neighboring horizontal gate lines GH and between the horizontal gate line GH1 and the selection signal transmission line CSL, for example, 5 μm.

In this embodiment, the gate electrodes b1 to bk of the light emitting thyristors T are formed of the third semiconductor layer 24, and connecting portions GV1, GV2, GV3, and GV4 are formed between the gate electrodes and one of the horizontal gate lines GH1 to GH4. Here, when the light emitting thyristors T are numbered with first to k-th numbers according to the order of from the one end to the other end in the arrangement direction of the light emitting thyristors T and the light emitting element blocks B are numbered with first to m-th numbers according to the order of from the one end to the other end in the arrangement direction, among the ($4i_6$-3)-th to $4i_6$-th light emitting thyristors T belonging to the $i_6$-th light emitting element block $Bi_b$ (wherein $1 \leq i_6 \leq m$) in the arrangement direction, the connecting portion GV1 is formed between the gate electrode of the ($4i_6$-3)-th light emitting thyristor $T4i_6$-3 and the first horizontal gate line GH1, the connecting portion GV2 is formed between the gate electrode of the ($4i_6$-2)-th light emitting thyristor $T4i_6$-2 and the second horizontal gate line GH2, the connecting portion GV3 is formed between the gate electrode of the ($4i_6$-1)-th light emitting thyristor $T4i_6$-1 and the third horizontal gate line GH3, and the connecting portion GV4 is formed between the gate electrode of the $4i_6$-th light emitting thyristor $T4i_6$ and the fourth horizontal gate line GH4. The connecting portion 60 is formed between the anodes a of all the light emitting thyristors T belonging to the $i_6$-th light emitting element block $Bi_6$ and the $i_6$-th light emission signal input terminal $Ai_6$ (wherein $1 \leq i_6 \leq m$) in the arrangement direction. In this way, by connecting the light emitting thyristors T belonging to the same light emitting element block B to the different horizontal gate lines GH, it is possible to dynamically drive the light emitting thyristors T as described above.

The switch thyristor S is preferably disposed in a space between the light emission signal bonding pads A. Since one bonding pad to feed the light emission signal is provided in one light emitting element block B including the plurality of light emitting thyristors T, the space can be generated between the light emission signal bonding pads A and the switch units, etc. can be disposed effectively using the space. The bonding pads as the gate signal input terminals G to feed the gate signal to the anodes c of the switch thyristors S are disposed using the spaces generated between the above-mentioned bonding pads. The bonding pads as the gate signal input terminals G may be described simply as the gate signal bonding pads G. In this embodiment, the gate signal bonding pads G correspond to the second bonding pad. The anodes c and the gate signal bonding pads G are integrally formed. Accordingly, when the switch thyristors S are provided, the total size of the light emitting element array chip can be prevented from increasing therewith, thereby configuring a small-sized light emitting element array chip. The number n of switch thyristors S is equal to the number of horizontal gate lines GH and n=4 in this embodiment. The selection thyristors U are also disposed close to the switch thyristors S using the spaces generated between the bonding pads as the light emission signal input terminals A.

In this embodiment, the gate electrode of the switch thyristor S is formed of the third semiconductor layer 34. Connecting portions 65 are formed between the gate electrodes d of the switch thyristors S and the anodes e of the selection thyristors U and connecting portions 66 are formed between the gate electrodes d and the corresponding horizontal gate lines GH to electrically connect them. The connecting portions 65 connecting the gate electrodes d to the selection thyristors U and the connecting portions 66 connecting the gate electrodes d to the horizontal gate lines GH are integrally formed. The N-gate electrodes f1 of the selection thyristor U is formed of the third semiconductor layer 44 and a connecting portion 67 is formed between the N-gate electrode f1 of the selection thyristor U and the selection signal transmission line CSL.

The pull-up resistor RP is formed integrally with the switch thyristor S using a part of the semiconductor layer forming the switch thyristor S. The pull-up resistor RP is formed using the sheet resistance of the semiconductor layer. A connecting portion 68 is formed between a part of the pull-up resistor RP and the setting signal transmission line 11 and the setting signal is applied to the connecting portion 68 of the pull-up resistor.

The setting signal transmission line 11 is disposed parallel to the horizontal gate lines GH, and is disposed apart from the horizontal gate lines GH with the light emission signal bonding pads A therebetween in this embodiment. The setting signal transmission line 11 is electrically connected to the bonding pad as the setting signal input terminal CSA through a connecting portion 69. The bonding pad as the setting signal input terminal CSA may be described simply as the setting signal bonding pad CSA.

The anodes a of the light emitting thyristors T, the anodes c of the switch thyristors S, the horizontal gate lines GH, the selection signal transmission line CSL, the setting signal transmission line 11, the connecting portions 60 to 69, the light emission signal bonding pads A, the gate signal bonding pads G, the selection signal bonding pad CSG, and the setting signal bonding pad CSA are formed of conductive materials such as metal or alloy. Specifically, the bonding pads are formed of gold (Au), alloy (AuGe) of gold and germanium, alloy (AuZn) of gold and zinc, nickel (Ni), and aluminum (Al).

In the light emitting element array chip 1 shown in FIG. 6, a light-blocking film 12 is disposed as light-blocking means on the surfaces (sides apart from the substrate) of the switch thyristors S. The switch thyristors S and the selection thyristors U emit light at the time of switching, similarly to the light emitting thyristors T, but the light emission of light thereof is not necessary and thus the light-blocking film is used to prevent the emitted light from entering the light emitting thyristors T to changing the threshold value of the light emitting thyristors T. The light-blocking film 12 is formed of a material not transmitting the emitted light to cover the surface. When proper interlayer insulating films are formed, a gold (Au) film used for the horizontal gate lines GH can be suitably used as the interlayer insulating film. It is effective that the switch thyristors S and the light emitting thyristors T are disposed as apart as possible from each other, and as shown in the plan view of FIG. 6, it is also effective that the light emitting thyristors T are disposed on one side of the horizontal gate lines GH and the switch thyristors S are disposed on the other side.

The above-mentioned current-limiting resistor RI may be added in a preferable configuration, but is not used in the plan view of the light emitting element array chip 1 shown in FIG. 6.

The configuration of the light emitting element array chip 1 will be additionally described now in detail.

Figure 7:
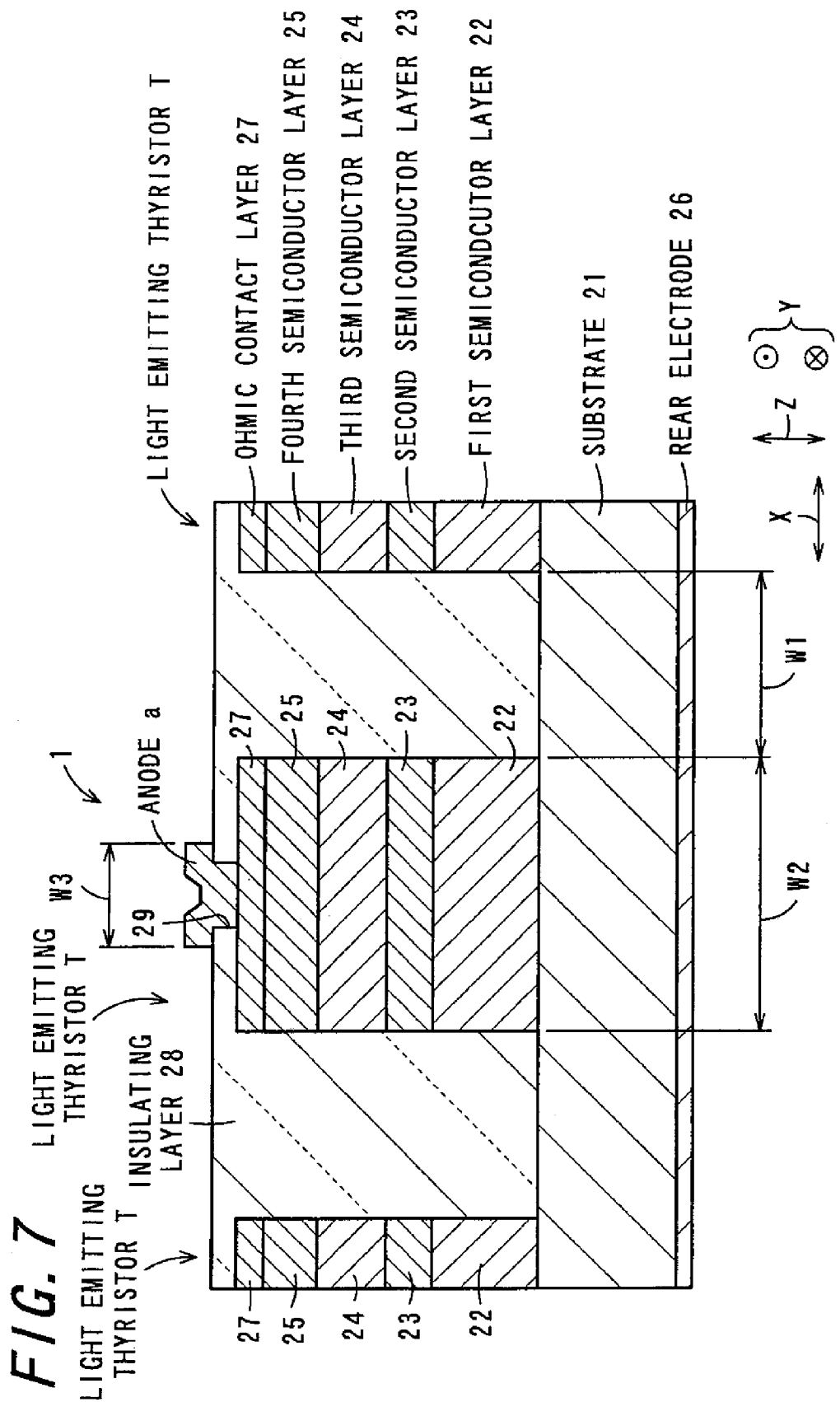
FIG. 7 is a partial sectional view illustrating a basic configuration of the light emitting element array chip as viewed from line VII-VII of FIG. 6.

FIG. 7 is a partial sectional view illustrating a basic configuration of the light emitting element array chip 1 as viewed from line VII-VII of FIG. 6.

The light emitting thyristors T have a structure in which the first semiconductor layer 22, the second semiconductor layer 23, the third semiconductor layer 24, and the fourth semiconductor layer 25, and the ohmic contact layer 27 are sequentially stacked on one surface of the substrate 21 in the thickness direction Z. Here, one conductive type of P type and N type is used in the first semiconductor layer 22 and the third semiconductor layer 24 and the other conductive type is used in the second semiconductor layer 23 and the fourth semiconductor layer 25, whereby a thyristor structure of NPNP or PNPN is formed. The same conductive type of semiconductor as the fourth semiconductor layer 25 is used in the ohmic contact layer 27.

In this embodiment, since the switch thyristor S is formed at the same time as forming the light emitting thyristors T, the layer structures thereof are equal to each other. Specifically, the switch thyristor S are formed by sequentially stacking a first semiconductor layer 32, the second semiconductor layer 33, the third semiconductor layer 34, and the fourth semiconductor layer 35, and the ohmic contact layer 37 on the same surface of the substrate 21 on which the light emitting thyristors T are formed. In the following description, the explanation of the light emitting thyristors T is true in the switch thyristors S.

In this embodiment, the substrate 21 is formed of a semiconductor substrate having the same conductive type as the first semiconductor layer 22. A counter electrode 26 is formed on the entire surface opposite to the surface of the substrate 21 on which the semiconductor layers 22 to 25 are formed in the thickness direction Z. The counter electrode 26 is formed of a conductive material such as metal or alloy. Specifically, the counter electrode 26 is formed of gold (Au), alloy (AuGe) of gold and germanium, and alloy (AuZn) of gold and zinc. The counter electrode 26 is used as a common electrode of the light emitting thyristors T.

In this embodiment, the conductive type of the first semiconductor layer 22 and the third semiconductor layer 24 is the N type, and the conductive type of the second semiconductor layer 23 and the fourth semiconductor layer 25 is the P type. Accordingly, the cathodes of the light emitting thyristors T and the switch thyristors S are connected to the counter electrode 26 as the common electrode, and the N-gate electrode is used as the gate electrodes. When the counter electrode 26 is grounded and thus the cathode potential is made to be 0 V, a positive power source can be used as the power source to apply a voltage or current to the anodes a of the light emitting thyristors T, which it is preferable.

The insulating layer 28 is formed along the surfaces of the light emitting thyristors T and the switch thyristors S and is also formed between the light emitting thyristors T and the switch thyristors S, whereby the light emitting thyristors T and the switch thyristors S are electrically insulated from each other by the insulating layer 28. The insulating layer 28 is formed of a resin material having an electrical insulating property, a light transmitting property, and a flatness property. For example, a resin material such as polyimide and benzocyclobutene (BCB) transmitting 95% or more of the light emitted from the light emitting thyristors T is used.

A through hole 29 is formed in a part of the portion of the insulating layer 28 to cover the surface of the ohmic contact layer 27 (apart from the substrate). A part of the anode a is formed in the through hole 29 to contact with the ohmic contact layer 27. The through hole 29 is formed at the center of the arrangement direction X of the light emitting thyristor T so that the center of the light emitting thyristor T in the width direction Y is exposed from the insulating layer 28. The current from the anode a can be efficiently supplied to the center portion of the light emitting thyristor T to allow the light emitting thyristor T to emit light. In the light emitting thyristor T, light is emitted mainly in the vicinity of the boundary between the third semiconductor layer 24 and the fourth semiconductor layer 25 and in the area close to the third semiconductor layer 24.

The length W3 of the anode a of the light emitting thyristor T in the arrangement direction X is equal to or less than ⅓ of the length W2 in the arrangement direction X of the light emitting thyristors T. The anode a covers a part of the light emitting thyristor T in the light emission direction, but does not block the light emitted from the light emitting thyristor T as much as possible, by selecting the length W3 as described above.

The materials of the substrate 21, the semiconductor layers 22 to 25, and the ohmic contact layer 27 will be further described specifically now.

The substrate 21 is a semiconductor substrate from which crystals can grow and which is made of III-V group compound semiconductor or II-VI group compound semiconductor, and is formed of a semiconductor material such as gallium arsenide (GaAs), Indium phosphide (InP), gallium phosphide (GaP), silicon (Si), and germanium (Ge).

The first semiconductor layer 22 is formed of a semiconductor material such as gallium arsenide (GaAs), aluminum gallium arsenide (AlGaAs), and indium gallium phosphide (InGaP). It is preferable that the carrier density of the first semiconductor layer 22 is about $1 \times 10^{18}$ cm$^{-3}$.

The second semiconductor layer 23 is formed of a semiconductor material such as aluminum gallium arsenide (AlGaAs) and gallium arsenide (GaAs). As the semiconductor material of the second semiconductor layer 23, a material having an energy gap equal to the energy gap of the semiconductor material of the first semiconductor layer 22 or smaller than the energy gap of the semiconductor material of the first semiconductor layer 22 is selected. It is preferable that the carrier density of the second semiconductor layer 23 is about $1 \times 10^{17}$ cm$^{-3}$.

The third semiconductor layer 24 is formed of a semiconductor material such as aluminum gallium arsenide (AlGaAs) and gallium arsenide (GaAs). As the semiconductor material of the third semiconductor layer 24, a material having an energy gap equal to the energy gap of the semiconductor material of the second semiconductor layer 23 or smaller than the energy gap of the semiconductor material of the second semiconductor layer 23 is selected. It is preferable that the carrier density of the third semiconductor layer 24 is about $1 \times 10^{18}$ cm$^{-3}$. By forming the third semiconductor layer 24 out of the semiconductor material such as aluminum gallium arsenide (AlGaAs) and gallium arsenide (GaAs), it is possible to obtain high inner quantum efficiency as a light emitting element.

The fourth semiconductor layer 25 is formed of a semiconductor material such as aluminum gallium arsenide (AlGaAs) and gallium arsenide (GaAs). As the semiconductor material of the fourth semiconductor layer 25, a material having an energy gap equal to the energy gap of the semiconductor material of the second semiconductor layer 23 and the third semiconductor layer 24 or smaller than the energy gap of the semiconductor material of the second semiconductor layer 23 and the third semiconductor layer 24 is selected. It is preferable that the carrier density of the fourth semiconductor layer 25 is about $1 \times 10^{18}$ cm$^{-3}$.

The ohmic contact layer 27 is a semiconductor layer having the same conductive type as the fourth semiconductor layer 25 formed of the semiconductor material such as gallium arsenide (GaAs) and indium gallium phosphide (InGaP) and is formed for ohmic contact with the anode e. It is preferable that the carrier density of the ohmic contact layer 27 is about $1 \times 10^{19}$ cm$^{-3}$ or more.

The first semiconductor layer 22, the second semiconductor layer 23, the third semiconductor layer 24, the fourth semiconductor layer 25, and the ohmic contact layer 27 can be sequentially stacked and formed on the substrate 21 by the use of an epitaxial growth method such as molecular beam epitaxial growth method and a chemical vapor deposition (CVD) method. Thereafter, the light emitting thyristors T and the switch thyristors S are formed by performing a patterning and etching process using photolithography. Accordingly, since the light emitting thyristors T and the switch thyristors S are concurrently formed in a series of manufacturing processes, the semiconductor layers of the switch thyristors S and the light emitting thyristors T have the same layer structure. As a result, both the switch thyristors S and the light emitting thyristors T have the light emitting function and the switch function, but the switch thyristors S use only the switch function. In this way, it is possible to simply manufacture the thyristors having a stable structure with the same structure, thereby reducing the manufacturing cost.

The insulating layer 28 is formed by spin-coating the manufactured semiconductor layers with a resin material such as polyimide, hardening the resultant structures, and then performing a patterning and etching process using photolithography to form through holes 29 and 30 necessary for connection between the electrodes and the light emitting thyristors T.

Figure 8:
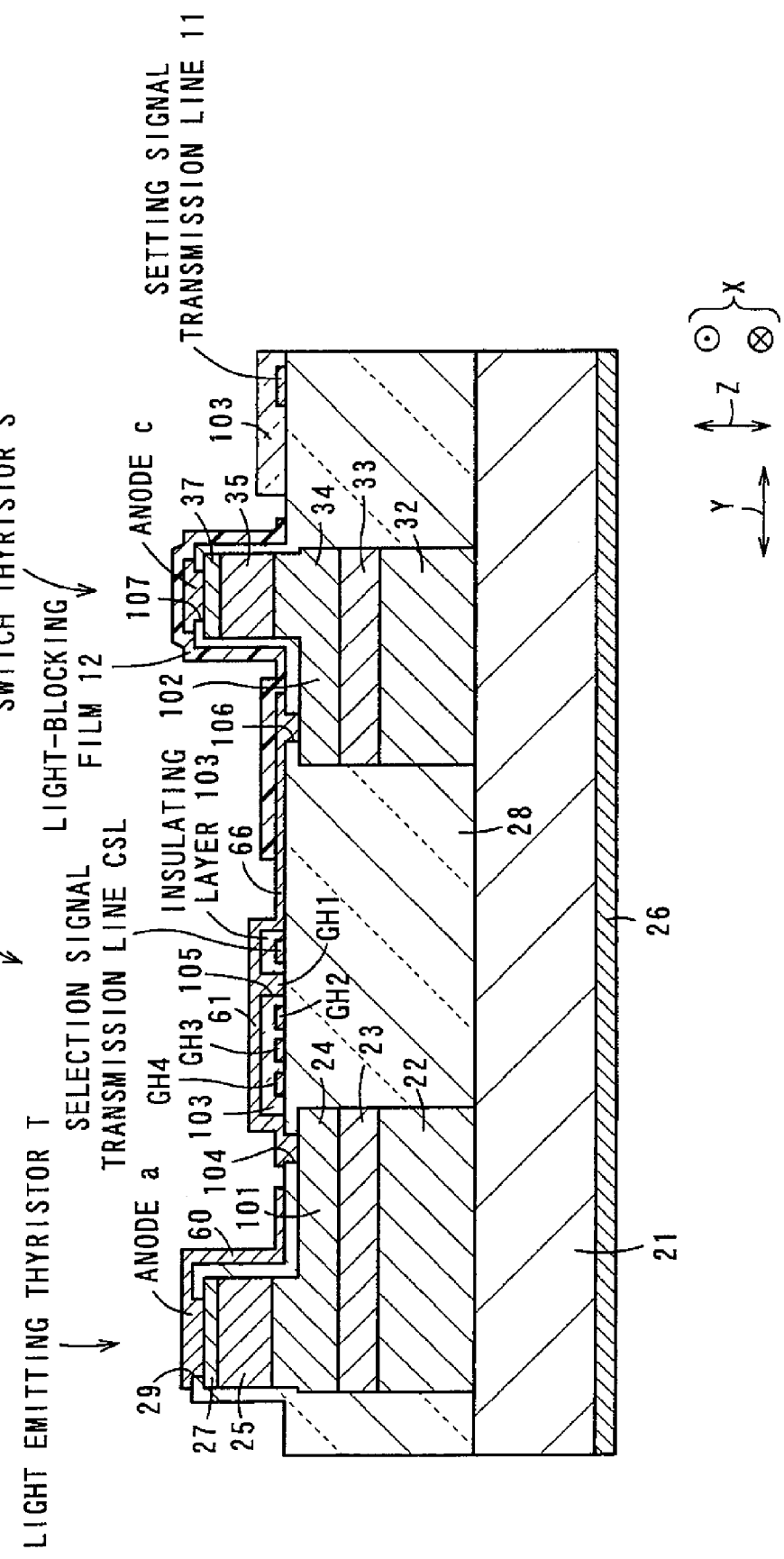
FIG. 8 is a partial sectional view illustrating a basic configuration of the light emitting element array chip as viewed from line VIII-VIII of FIG. 6.

FIG. 8 is a partial sectional view illustrating a basic configuration of the light emitting element array chip 1 as viewed from line VIII-VIII of FIG. 6.

As shown in FIG. 8, in the shape in the width direction Y of the light emitting thyristor T, the ends of the first semiconductor layer 22, the second semiconductor layer 23, and the third semiconductor layer 24 in the light emitting thyristor T close to the horizontal gate line GH protrude toward the horizontal gate line GH more than the ends of the fourth semiconductor layer 25 and the ohmic contact layer 27 close to the horizontal gate line GH to form a connecting portion 101 to the horizontal gate line GH. The length of the connecting portion 101 in the arrangement direction X is equal to the above-mentioned length W2. The portion of the third semiconductor layer 24 constituting the connecting portion 101 is smaller in thickness than the portion on which the fourth semiconductor layer 25 is stacked. This is because the portion should be over-etched so as not to leave the fourth semiconductor layer 25 at the time of exposing the surface of the third semiconductor layer 24 to form the connecting portion 101 in the etching process.

In the shape in the width direction X of the switch thyristor S, similarly, the ends of the first semiconductor layer 32, the second semiconductor layer 33, and the third semiconductor layer 34 in the switch thyristor S close to the horizontal gate line GH protrude toward the horizontal gate line GH more than the ends of the fourth semiconductor layer 35 and the ohmic contact layer 37 close to the horizontal gate line GH to form a connecting portion 102 to the horizontal gate line GH. For the over-etching, the thickness of the portion forming the connecting portion 102 in the third semiconductor layer 34 is set to be smaller than the thickness of the portion on which the fourth semiconductor layer 35 is stacked.

The insulating layer 28 is formed along the surface of the light emitting thyristor T and the switch thyristor S and is also formed between the light emitting thyristor T and the switch thyristor S, whereby the light emitting thyristor T and the switch thyristor S are electrically insulated from each other by the insulating layer 28. The horizontal gate line GH and the selection signal transmission line CSL are formed on the surface of the insulating layer 28 formed between the light emitting thyristor T and the switch thyristor S and an insulating layer 103 is additionally formed along the surfaces thereof. The setting signal transmission line 11 is formed on the surface of the insulating layer 28 apart from the horizontal gate line with the switch thyristor S interposed therebetween, and the insulating layer 103 is additionally formed along the surface.

In the formed insulating layers 28 and 103, through holes 104 and 105 are formed in the portions stacked on the connecting portion 101 of the light emitting thyristor T and the surface (apart from the substrate) of the horizontal gate line GH. The connecting portion GV1 electrically connecting the third semiconductor layer 24 (corresponding to the gate electrode b) of the light emitting thyristor T to the horizontal gate line GH is stacked on the portions of the through holes 104 and 105 and the portions of the insulating layers 28 and 103 interposed between the through holes 104 and 105. Through holes 105 and 106 are formed in the portions of the insulating layers 28 and 103 stacked on the connecting portion 102 of the switch thyristor S and the surface of the horizontal gate line GH (apart from the substrate). The connecting portion 66 electrically connecting the third semiconductor layer 34 (corresponding to the gate electrode d) of the switch thyristor S to the horizontal gate line GH is stacked on the portions of the through holes 105 and 106 and the portions of the insulating layers 28 and 103 interposed between the through holes 105 and 106. As shown in FIG. 8, when the through hole 105 formed in the portion of the insulating layer 103 on which the horizontal gate line GH is stacked is common, the connecting portions GV1 and 66 are integrally formed.

As described above, in the insulating layer 28 stacked on the light emitting thyristor T, the through hole 29 is formed in a part of the portion stacked on the surface (apart from the substrate) of the ohmic contact layer 27. A part of the anode a is formed in the through hole 29 to contact with the ohmic contact layer 27. The anode a is formed integrally with the connecting portion 60 to the light emission signal input terminal A. The connecting portion 60 covers the fourth semiconductor layer 25 of the light emitting thyristor T and a part of the end of the ohmic contact layer 27 close to the horizontal gate line GH, and is stacked on a part of the surface (apart from the substrate) of the insulating layer 28 stacked on the connecting portion 101 disposed in the third semiconductor layer 24. In the insulating layer 28 stacked on the switch thyristor S, the through hole 107 is formed in a part of the portion stacked on the surface (apart from the substrate) of the ohmic contact layer 37. A part of the anode c is formed in the through hole 107 to contact with the ohmic contact layer 37.

The switch thyristor S is covered with the light-blocking film 12. One end in the width direction Y of the light-blocking layer 12 covers the fourth semiconductor layer 35 of the switch thyristor S and the end of the ohmic contact layer 37 opposite to the light emitting thyristor T. The other end in the width direction Y of the light-blocking film 12 covers the connecting portion 102 of the third semiconductor layer 34 of the switch thyristor S and extends to the vicinity of the center portion between the selection signal transmission line CSL and the switch thyristor S.

Figure 9:
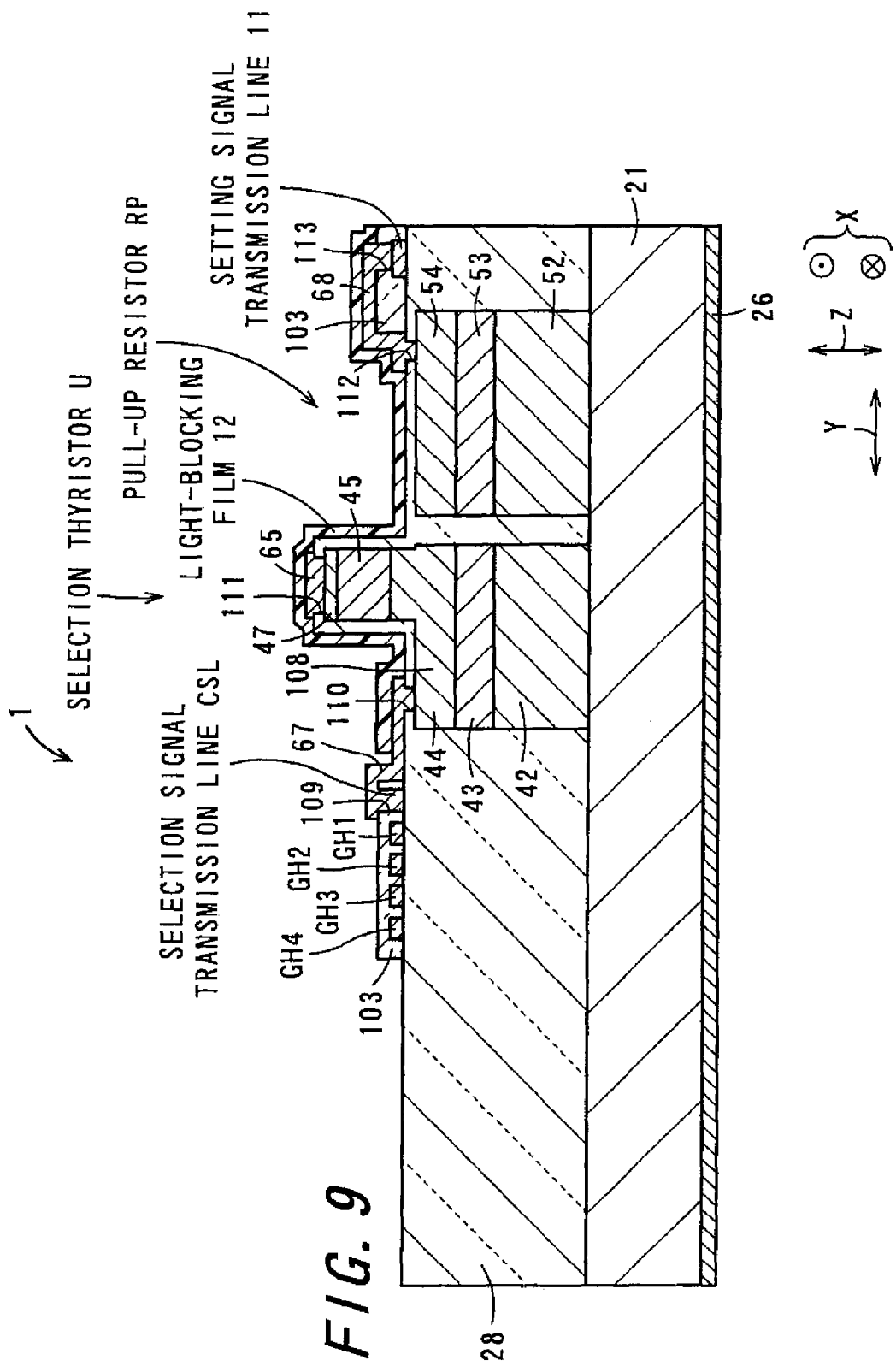
FIG. 9 is a partial sectional view illustrating a basic configuration of the light emitting element array chip as viewed from section line IX-IX of FIG. 6.

FIG. 9 is a partial sectional view illustrating a basic configuration of the light emitting element array chip 1 as viewed from section line IX-IX of FIG. 6.

In this embodiment, since the selection thyristor U and the pull-up resistor RP are formed at the same time as forming the semiconductor layers 22 to 25 and 32 to 35 and the ohmic contact layers 27 and 37 in the light emitting thyristor T and the switch thyristor S, a new manufacturing process is not required. In this embodiment, the pull-up resistor RP is formed using the third semiconductor layer 54 of the semiconductor layers including the first semiconductor layer 52, the second semiconductor layer 53, and the third semiconductor layer 54.

Like this embodiment, when the cathodes of the emission thyristors used in the light emitting element array is grounded in common, it is preferable that the third semiconductor layer 54 of the N type is used as a thin film resistor. The reason is that when a positive voltage is applied as the setting signal to an end of the pull-up resistor RP, a reverse bias voltage is applied to the PN junction formed by the second semiconductor layer 53 of the P type and the third semiconductor layer 54 of the N type and a depletion layer is formed therein, whereby the insulating property between the second semiconductor layer 53 and the third semiconductor layer 54 is secured.

Here, when the first semiconductor layer 52 to the fourth semiconductor layer are sequentially stacked, the fourth semiconductor layer may be used as the thin film resistor. When the cathodes of the emission thyristors are grounded in common, the fourth semiconductor layer is a P-type semiconductor and thus is smaller in mobility than the third semiconductor layer 54 as the N-type semiconductor and higher in resistance than the third semiconductor layer. However, when a forward bias voltage is unintentionally applied across the fourth semiconductor layer and the third semiconductor layer 54, the thyristor formed by the first semiconductor layer 52, the second semiconductor layer 53, the third semiconductor layer 54, and the fourth semiconductor layer is changed to the ON state and thus a latch-up phenomenon may occur. When the latch-up phenomenon occurs, the second semiconductor layer 53 is electrically connected to the third semiconductor layer 54, whereby the insulation between the thin film resistor and the counter electrode 26 is not maintained. When the anodes of the emission thyristors are grounded in common, it is preferable that the thin film resistor is formed using the third semiconductor layer 54 because the third semiconductor layer 54 is the P-type semiconductor.

Similarly to the pull-up resistor RQ, it is preferable that the current-limiting resistor RI not shown in the plan view of the light emitting element array chip 1 of FIG. 6 is formed using the third semiconductor layer.

The ends of the first semiconductor layer 42, the second semiconductor layer 43, and the third semiconductor layer 44 in the selection thyristor U close to the horizontal gate line GH protrude toward the horizontal gate line GH more than the ends of the fourth semiconductor layer 45 and the ohmic contact layer 47 close to the horizontal gate line GH to form a connecting portion 108 to the horizontal gate line GH. In this embodiment, the connecting portion 108 corresponds to the N-gate electrode f of the selection thyristor U. A part of the connecting portion 65, which is stacked on the surface (apart from the substrate) of the ohmic contact layer 47, to the gate electrode d of the switch thyristor S corresponds to the anode of the selection thyristor U. The portion of the third semiconductor layer 44 constituting the connecting portion 108 is smaller in thickness than the portion on which the fourth semiconductor layer 45 is stacked. This is because the portion should be over-etched so as not to leave the fourth semiconductor layer 45 at the time of exposing the surface of the third semiconductor layer 44 to form the connecting portion 108 in the etching process. Since the connecting portion 108 of the selection thyristor U is formed at the same time as forming the connecting portions 101 and 102 of the light emitting thyristor T and the switch thyristor S, a new manufacturing process is not necessary.

The etching process for determining the entire thickness of the first semiconductor layer 52, the second semiconductor layer 53, and the third semiconductor layer 54 constituting the pull-up resistor RP is performed at the same as forming the connecting portions 101, 102, and 108. Accordingly, the thickness of the pull-up resistor RP is equal to the thickness of the connecting portions 101, 102, and 108.

In FIG. 9, the insulating layer 28 is formed along the surfaces of the selection thyristor U and the pull-up resistor RP and is also formed between the selection thyristor U and the pull-up resistor RP, whereby the selection thyristor U and the pull-up resistor RP are electrically insulated from each other by the insulating layer 28. As described above, the horizontal gate line GH, the selection signal transmission line CSL, and the setting signal transmission line 11 are formed on the surface of the insulating layer 28, and the insulating layer 103 is additionally formed along the surfaces thereof.

In the formed insulating layers 28 and 103, the through holes 109 and 110 are formed in the portions stacked on the surface (apart from the substrate) of the connecting portion 108 of the selection signal transmission line CSL and the selection thyristor U to form the connecting portion 67 to electrically connect each other. In the insulating layer 28, a through hole 111 is formed in the portion stacked on the surface (apart from the substrate) of the ohmic contact layer 47 of the selection thyristor U to form the connecting portion 65 to the gate electrode d of the switch thyristor S. In the formed insulating layers 28 and 103, through holes 112 and 113 are formed in the portions stacked on the pull-up resistor RP and the setting signal transmission line 11 to form the connecting portion 68 to electrically connect each other.

In this embodiment, since the third semiconductor layer 44 and the fourth semiconductor layer 45 of the selection thyristor U are formed at the same time as forming the light emitting thyristor T, the selection thyristor U is in the ON state to emit light. Accordingly, in order to block or reduce the light emitted from the selection thyristor U, the light-blocking film 12 to cover the selection thyristor U is formed.

The light-blocking film 12 to cover the pull-up resistor RP is also formed. When ambient light enters the boundary of the pull-up resistor RP, pairs of electrons and holes are generated in the boundaries of the semiconductor layers of the first semiconductor layer 52, the second semiconductor layer 53, and the third semiconductor layer 54 constituting the pull-up resistor RP. Then, similarly to a photo transistor, since carriers are accumulated in the second semiconductor layer 53 and the insulation between the second semiconductor layer 53 and the third semiconductor layer 54 is failed, the carriers originally propagating the third semiconductor layer 54 flows toward the substrate 21 and the operation of the resistor is not stable. Therefore, in order to stabilize the operation of the pull-up resistor RP, the pull-up resistor RP is also covered with the light-blocking film 12. When the current-limiting resistor RI is formed on the substrate 21, it is preferable that it is covered with the light-blocking film 12.

As shown in FIG. 9, one end in the width direction Y of the light-blocking film 12 covers the surface of the insulating layer 28 stacked on the surface of the pull-up resistor RP and extends to the vicinity of the setting signal transmission line 11. The other end in the width direction Y of the light-blocking film 12 covers the insulating layer 28 stacked on the surface of the connecting portion 108 of the selection thyristor U and extends to a part of the surface of the connecting portion 67 between the selection thyristor U and the selection signal transmission line CSL.

Figure 10:
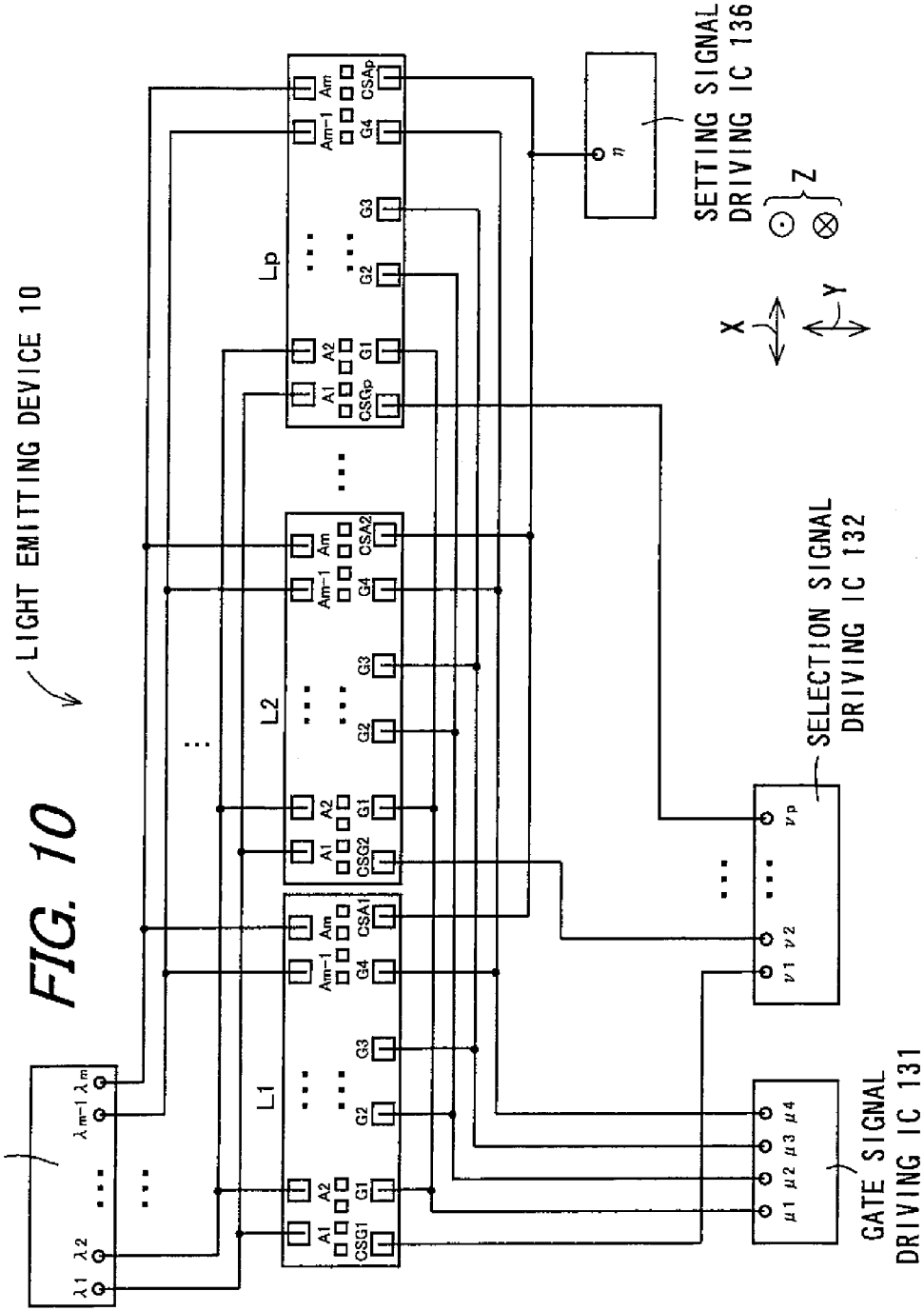
FIG. 10 is a block diagram schematically illustrating a light emitting device according to an embodiment of the invention.

FIG. 10 is a block diagram schematically illustrating a light emitting device 10 according to an embodiment of the invention. The light emitting device 10 includes a plurality of light emitting element array chips L1, L2, . . . , Lp−1, and Lp (wherein p is a positive integer equal to or greater than 2), a light emission signal driving IC (Integrated Circuit) 130 to feed the light emission signal as a driving circuit for the light emitting element array chips 1 to Lp, a gate signal driving IC 131 to feed the gate signal, a selection signal driving IC 132 to feed the selection signal, and a setting signal driving IC 136 to feed the setting signal. The driving ICs output image information under the control of the control means 96 to be described later. The light emitting element array chips 1 to Lp are simply described as the light emitting element array chip L, when they are collectively referred to or when the unspecified ones are mentioned. The light emitting element array chip L may be described simply as the array chip L. In this embodiment, the light emitting element array chip 1 according to the first embodiment shown in FIG. 1 is employed as the array chips L. The selection signal driving IC 132 corresponds to the first driving circuit, the gate signal driving IC 131 corresponds to the second driving circuit, the light emission signal driving IC 130 corresponds to the third driving circuit, and the setting signal driving IC 136 corresponds to the fourth driving circuit.

The light emitting elements T of the array chips L are arranged in a line in the arrangement direction X and the array chips are mounted on a circuit board so that the light emission directions of the light emitting elements T are parallel to each other. However, the circuit board is not shown in FIG. 10. The light emission signal driving IC 130, the gate signal driving IC 131, the selection signal driving IC, and the setting signal driving IC 136 are mounted on the circuit board. Wiring patterns connecting the output terminals of the driving ICs 130 to 132 and 136 to the bonding pads of the array chips L are formed on the circuit board, and the wiring patterns and the bonding pads are connected to each other by bonding wires.

As described above, the light emitting element array chip 1 according to the first embodiment shown in FIGS. 1 and 6 includes m light emission signal bonding pads A, one selection signal bonding pad CSG, one setting signal bonding pad CSA, and four gate signal bonding pads G. In this embodiment in which p array chips are mounted as shown in FIG. 10, when the array chips are numbered with first to p-th numbers according to the order of from the one end to the other end in the arrangement direction X of the light emitting elements T of the respective array chips L, the selection signal bonding pad of the $i_{10}$-th array chip $Li_{10}$ (wherein is described as the selection signal bonding pad $CSGi_{10}$ and is described as the setting signal bonding pad $CSAi_{10}$, of the array chip $Li_{10}$. The selection signal bonding pads CSG1 to CSGp of an unspecified array chip L and the unspecified setting signal bonding pads CSA1 to CSAp may be described simply as the selection signal bonding pad CSG and the setting signal bonding pad CSA.

The light emission signal driving IC 130 includes the same number of (m) light emission signal output terminals $\lambda 1$ to $\lambda m$ as the number of light emission signal bonding pads A1 to Am of the respective array chips L. The light emission signal output terminals $\lambda 1$ to $\lambda m$ may be described simply as the light emission signal output terminals $\lambda$, when they are collectively referred to or the unspecified ones are mentioned. The connection between the light emission signal bonding pads A and the light emission signal output terminals $\lambda$ is made by commonly using a wiring between the different array chips. In this embodiment in which the p array chips are mounted, when the light emission signal bonding pads A1 to Am are numbered with first to m-th numbers, respectively, and the light emission signal output terminals $\lambda 1$ to $\lambda m$ are numbered with first to m-th numbers according to the order of from the one end to the other end in the arrangement direction X of the light emitting elements T of the respective array chips L, the $i_8$-th light emission signal bonding pads $Ai_8$ (wherein $1 \leq i_8 \leq m$) of the p array chips are electrically connected to each other and are further electrically connected to the $i_8$-th light emission signal output terminals $\lambda i_8$.

The gate signal driving IC 131 includes the same number (4) of gate signal output terminals $\mu 1$ to $\mu 4$ as the number of the gate signal bonding pads G1 to G4 of the array chips L. The gate signal output terminals $\mu 1$ to $\mu 4$ may be described simply as the gate signal output terminals $\mu$, when they are collectively referred to or when unspecified ones are mentioned. The connection between the gate signal bonding pads G and the gate signal output terminals $\mu$ is made by commonly using a wiring line between the different array chips. In this embodiment in which the p array chips are mounted, when the gate signal bonding pads G1 to G4 are numbered with first to fourth numbers, respectively, and the gate signal output terminals $\mu 1$ to $\mu 4$ are numbered with first to fourth numbers according to the order of from the one end to the other end in the arrangement direction X of the light emitting elements T of the respective array chips L, the $i_9$-th light emission signal bonding pads $G1_g$ (wherein $1 \leq i_9 \leq 4$) of the p array chips are electrically connected to each other and are further electrically connected to the $i_9$-th gate signal output terminals $\mu i_9$.

The selection signal driving IC 132 includes the same number of (p) selection signal output terminals $v1$ to $vp$ as the number of array chips L. The selection signal output terminals may be described simply as the selection signal output terminals $v$, when they are collectively referred to or when the unspecified ones are mentioned. The connections between the selection signal bonding pads $CSGi_{10}$ and the selection signal output terminals $v$ are individually connected to the respective array chips. In this embodiment in which the p array chips are mounted, when the array chips are numbered with first to p-th numbers, respectively, and the selection signal output terminals $v1$ to $\gamma p$ are numbered with first to p-th numbers according to the order of from the one end to the other end in the arrangement direction X of the light emitting elements T of the respective array chips L, the selection signal bonding pad $CSGi_{10}$ of the $i_{10}$-th array chip L and the $i_{10}$-th selection signal output terminal $vi_{10}$ are electrically connected to each other (wherein $1 \leq i_{10} \leq p$).

The setting signal driving IC 136 includes setting signal output terminals $\eta$. The setting signal bonding pads $CSAi_{10}$ and the selection signal output terminals $v$ are electrically connected to each other.

As described above, since the selection signal bonding pads CSG and the selection signal output terminals $v$ of the array chips L are individually connected, the selection signal driving IC 132 sequentially outputs the selection signal to the selection signal bonding pads CSG of the array chips L to sequentially make the array chips L in the selected state. On the other hand, since the wiring lines of the array chips L and the gate signal driving IC 131 are shared with each other, for example, the gate signal outputted from the $i_9$-th gate signal output terminal $pi_g$ (wherein $1 \leq i_9 \leq 4$) is inputted to the $i_9$-th gate signal bonding pads $Gi_9$ (wherein 1.4) of all the array chips L, and is inputted to the anodes $ci_9$ of the $i_9$-th switch thyristor $Si_9$ of all the array chips L. However, among the $i_9$-th switch thyristor $Si_9$ of the array chips L, only the array chip L in the selected state by the input of the selection signal is switched. Among the light emitting thyristors T connected to $i_9$-th horizontal gate line $GHi_9$ of the array chip L in the selected state, the light emitting thyristors T belonging to the light emitting element block B to which the light emission signal is inputted from the light emission signal driving IC 130 emit light. Since the setting signal is additionally inputted to the setting signal bonding pad CSA, the array chip L in the selected state can be satisfactorily changed to the non-selected state.

In this way, by sequentially switching the array chips L in the selected state, it is possible to stably carry out time-divisional drive in which the gate signal driving IC 131 and the light emission signal driving IC 130 are commonly used among the plurality of light emitting element arrays. Accordingly, it is possible to reduce the number of driving ICs and the number of layers in the circuit board on which the driving ICs are mounted and to reduce the rear of the circuit board on which the light emitting element arrays and the driving ICs are mounted, thereby embodying a small-sized light emitting device which stably operates.

Figure 11:
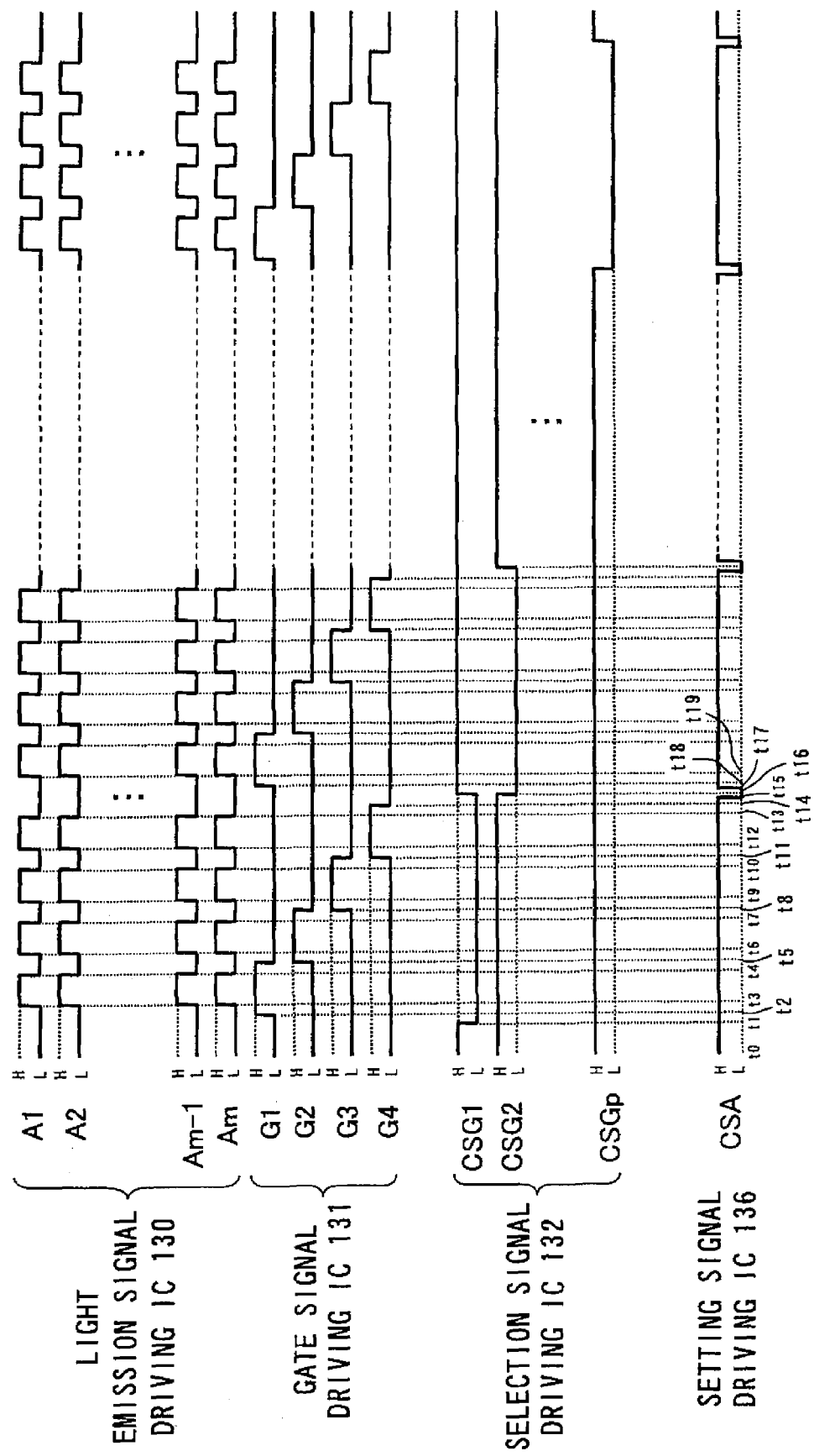
FIG. 11 is a timing chart illustrating an operation of the light emitting device.

FIG. 11 is a timing chart illustrating an operation of the light emitting device 10, where the horizontal axis represents the elapsed time from a reference time and the vertical axis represents the signal level by a magnitude of a voltage or current. In FIG. 11, waveforms of the voltages outputted from the signal output terminals (the light emission signal output terminals λ, the gate signal output terminals μ, the selection signal output terminals ν, and the setting signal output terminals r) of the light emission signal driving IC 130, the gate signal driving IC 131, the selection signal driving IC 132, and the setting signal driving IC 136 are shown. In FIG. 11, the reference numerals of the bonding pads (signal input terminals) connected to the signal output terminals are used as the reference numerals of the output waveforms.

In this embodiment, the light emission signal driving IC 130 outputs a constant current of 5 mA at the high (H) level, and outputs a constant current of 0 mA at the low (L) level. The gate signal driving IC 131 outputs a constant voltage of 5 V at the high (H) level, and outputs a constant voltage of 0 V at the low (L) level. The selection signal driving IC 132 outputs a constant voltage of 5 V at the high (H) level, and outputs a constant voltage of 0 V at the low (L) level. The setting signal driving IC 136 outputs a constant voltage of 5 V at the high (H) level, and outputs a constant voltage of 0 V at the low (L) level.

The operation of the light emitting device 10 will be described with the lapse of time with reference to FIG. 11. At time t0, since the voltage of the selection signal output terminal ν is the high (H) level, no array chip is in the selected state. At time t1, by setting the voltage of the selection signal output terminal ν1 connected to the first array chip L1 to the low (L) level, the first array chip L1 is changed to the selected state. At time t2, the voltage of the high (H) level is applied to the first gate signal input terminals G1 of the array chips L. Then, only the first array chip L1 in the selected state is changed to the ON state by the switching of the first switch thyristor S1, and the potential of the horizontal gate line GH1 connected to the gate electrode d1 of the switch thyristor S1 becomes substantially the low level (0 V). At time t3, the light emission signals are inputted to the light emission signal input terminals λ1 to λm of the array chips. Then, in the first array chip L1 in the selected state, the light emitting thyristor T connected to the first horizontal gate line GH1 emits light. At time t4, since the voltage of the light emission signal output terminal λ returns to the low (L) level, the light emitting thyristor is extinguished. At time t5, the voltage of the gate signal output terminal μ1 connected to the first gate signal input terminal G1 returns to the low (L) level and the voltage of the gate signal output terminal μ2 connected to the second gate signal input terminal G2 becomes the high (H) level. Then, only the first array chip L1 in the selected state is changed to the ON state by the switching of the second switch thyristor S2. At times t6 and t7, the light emission signals are inputted again to the light emission signal input terminals A1 to Am of the array chips. Then, in the first array chip L1 in the selected state, the light emitting thyristor T connected to the second horizontal gate line GH2 emit light. Similarly, at times t8 to t11, since the voltage of the gate signal output terminal μ3 connected to the third gate signal input terminal G3 becomes the high (H) level, the third switch thyristor S3 in the first array chip L1 in the selected state is switched to the ON state. In this state, at times t9 and t10, since the light emission signals are inputted again to the light emission signal input terminals A1 to Am of the array chips, the light emitting thyristor T connected to the third horizontal gate line GH3 in the first array chip L1 in the selected state emits light. At times t11 to t14, since the voltage of the gate signal output terminal μ4 connected to the fourth gate signal input terminal G4 becomes the high (H) level, the fourth switch thyristor S4 in the first array chip L1 in the selected state is switched to the ON state. In this state, at times t12 and t13, since the light emission signals are inputted again to the light emission signal input terminals A1 to Am of the array chips, the light emitting thyristor T connected to the fourth horizontal gate line GH4 in the first array chip L1 in the selected state emit light. At time t15, since the voltage of the setting signal output terminals η connected to the setting signal input terminals CSA of the array chips L returns to the low (L) level from the high (H) level, the selection thyristors U of the first array chip L1 are changed to the OFF state and the selected state of the first array chip L1 is ended. At time t16, the voltage of the selection signal output terminal ν1 connected to the selection signal input terminal CSG1 of the first array chip L1 returns to the high (H) level and the voltage of the selection signal output terminal ν2 connected to the selection signal input terminal CSG2 of the second array chip L2 becomes the low (L) level. In the state where the selection signal input terminal CSG2 of the second array chip L2 is at the low (L) level, at time t17, since the voltage of the setting signal output terminal η connected to the setting signal input terminals CSA of the array chips L returns to the high (H) level from the low (L) level, the second array chip L2 is changed to the selected state.

In the second array chip L2, the light emitting thyristors T can be made to sequentially emit light in a similar manner. That is, at time t18 after the voltage of the setting signal output terminal η returns to the high (H) level, the voltage of the gate signal output terminals μ1 connected to the first gate signal input terminals G1 of the array chips L becomes the high (H) level. At time t19, by inputting the light emission signals to the all the light emission signal input terminals A1 to Am of the array chips L, the light emitting thyristors T connected to the first horizontal gate line GH1 of the second array chip L2 in the selected state emit light. In the state where the voltage of the setting signal output terminals η is the low (L) level, the gate signal and the light emission signal should not be inputted. When the voltage of the setting signal output terminal η is the low (L) level, the voltage of the horizontal gate lines GH of the light emitting element array chips L is the low (L) level. Accordingly, the light emitting thyristors T may emit light in the non-selected state.

In this way, by sequentially applying the selection signals to the array chips from the first array chip to the other array chips to sequentially select the array chips, it is possible to time-divisionally drive the array chips L. By applying the gate signals to the switch thyristors from the first switch thyristor to the other switch thyristors, it is possible to time-divisionally drive each array chip L.

Figure 12:
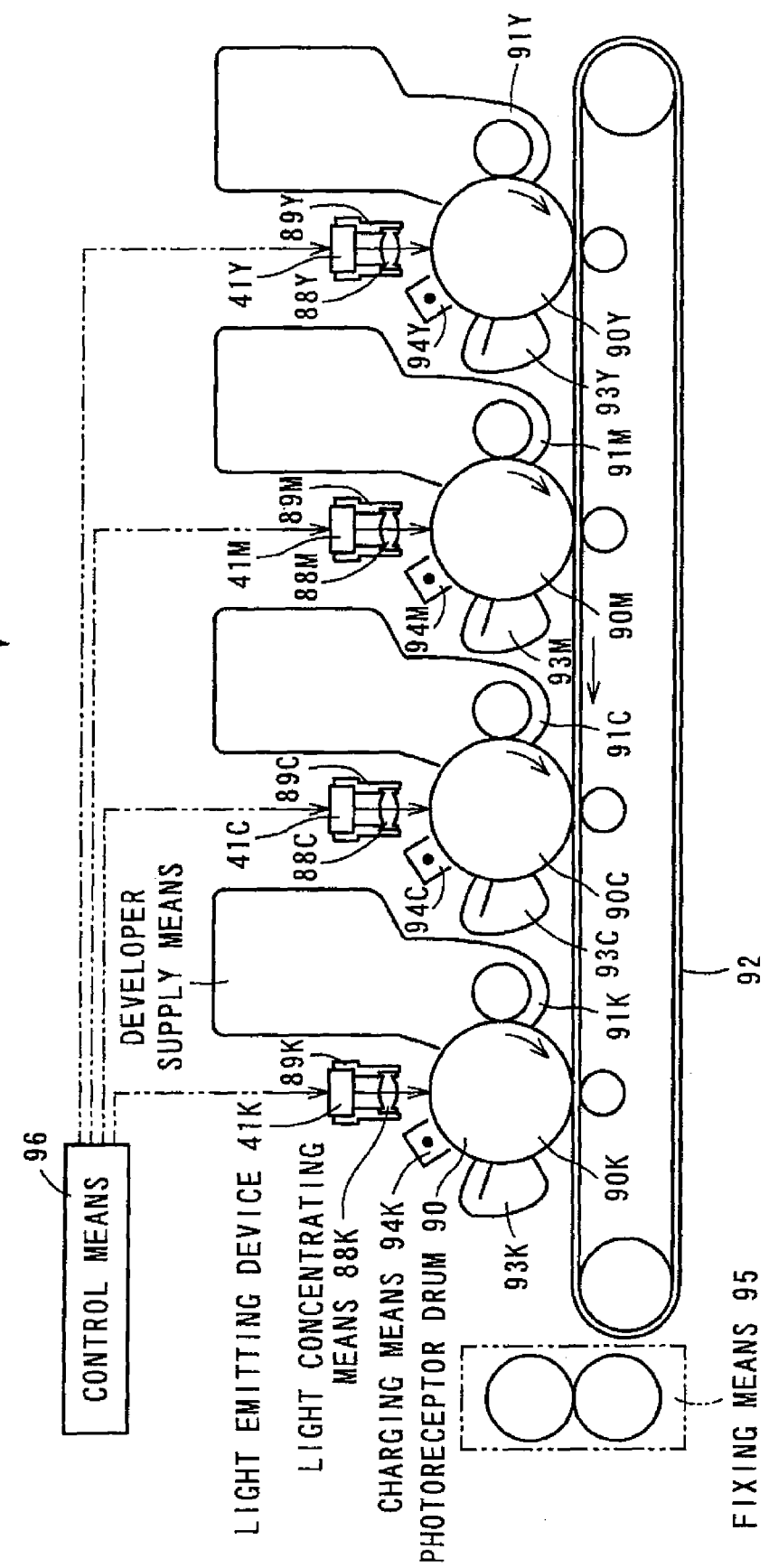
FIG. 12 is a side view illustrating a basic configuration of an image forming apparatus employing the light emitting element array chip.

FIG. 12 is a side view illustrating a basic configuration of an image forming apparatus employing the light emitting device 10 including the light emitting element array chip 1 according to this embodiment.

The image forming apparatus 87 is an electrophotographic image forming apparatus, in which the light emitting devices 10Y, 10M, 10C, and 10K are used as exposure devices for a photoreceptor drum 90. The light emitting devices 10Y, 10M, 10C, and 10K are mounted on the circuit board mounted with the driving ICs (the light emission signal driving IC 130, the gate signal driving IC 131, the selection signal driving IC 132, and the setting signal driving IC 136).

The image forming apparatus 87 employs a tandem scheme in which images of four colors of Y (Yellow), M (Magenta), C (Cyan), and K (Black) are formed, and generally includes four light emitting devices 10Y, 10M, 10C, and 10K, lens arrays 88C, 88M, 88Y, and 88K as light concentrating means, first holders 89C, 89M, 89Y, and 89K to hold a circuit board on which the light emitting devices 10Y, 10M, 10C, and 10K and the driving ICs 130, 131, 132, and 136 are mounted and the lens arrays 88, four photoreceptor drums 90C, 90M, 90Y, and 90K, four developer supply means 91C, 91M, 91Y, and 91K, a transfer belt 92 as transfer means, four cleaners 93C, 93M, 93Y, and 93K, four chargers 94C, 94M, 94Y, and 94K, fixing means 95, and control means 96.

The light emitting devices 10Y, 10M, 10C, and 10K are driven by the driving ICs on the basis of the color image information of the colors. For example, lengths in the arrangement direction X of the four light emitting devices 10Y, 10M, 10C, and 10K are selected, for example, to be in the range of 200 mm to 400 mm.

The light from the light emitting thyristors T of the light emitting devices 10Y, 10M, 10C, and 10K is concentrated and applied on the photoreceptor drums 90C, 90M, 90Y, and 90K through the lens arrays 88. The lens arrays 88 include a plurality of lenses disposed in optical axes of the light emitting elements and the lenses integrally form the lens arrays.

The circuit board mounted with the light emitting devices 10Y, 10M, 10C, and 10K and the lens arrays 88 are held by the first holders 89. The light emitting thyristors T and the lens arrays 88 are positioned by the first holders 89 so that the light emission direction of the light emitting thyristors T is substantially matched with the optical axis direction of the lenses of the lens arrays.

The photoreceptor drums 90C, 90M, 90Y, and 90K are formed by forming a photosensitive layer onto the surface of a cylindrical substrate. Electrostatic latent image forming positions where electrostatic latent images are formed with the light from the light emitting devices 10Y, 10M, 10C, and 10K are set on outer peripheral surfaces thereof.

In the peripheries of the photoreceptor drums 90C, 90M, 90Y, and 90K, toward the downstream in a rotation direction from the electrostatic latent image forming positions, developer supply means 91C, 91M, 91Y, and 91K to feed developers to the exposed photoreceptor drums 90C, 90M, 90Y, and 90K, the transfer belt 92, cleaners 93C, 93M, 93Y, and 93K, and the chargers 94C, 94M, 94Y, and 94K are sequentially arranged. The transfer belt 92 to transfer the images formed on the photoreceptor drums 90 with the developers onto a recording sheet is disposed in common to four photoreceptor drums 90C, 90M, 90Y, and 90K.

The photoreceptor drums 90C, 90M, 90Y, and 90K are held by a second holder (not shown) and the second holder and the first holder 89 are fixed relative to each other. A rotation axis direction of the photoreceptor drums 90C, 90M, 90Y, and 90K is substantially matched with the arrangement direction X of the light emitting devices 10Y, 10M, 10C, and 10K.

The recording sheet is transported by the transfer belt 92 and the recording sheet having images formed thereon with the developers is transported to the fixing means 95. The fixing means 95 fixes the developer transferred to the recording sheet. The photoreceptor drums 90C, 90M, 90Y, and 90K are rotated by rotation driving means.

The control means 96 gives the clock signal and the image information to the driving ICs 130, 131, 312, and 136, and controls the rotation driving means rotationally driving the photoreceptor drums 90C, 90M, 90Y, and 90K, the developer supply means 91C, 91M, 91Y, and 91K, the transfer means 92, the charging means 94C, 94M, 94Y, and 94K, and the fixing means 95.

In the image forming apparatus 87 having the above-mentioned configuration, since it is determined on the basis of the gate signal transmitted through the horizontal gate lines GH connected to the gate electrodes b in which the main current does not flow whether the light emitting elements should be switched to a light emission state or a non-light emission state, it is possible to reduce the width of the gate signal transmission lines formed on the circuit board on which the light emitting devices 10Y, 10M, 10C, and 10K are mounted, thereby reducing the size of the circuit board. Since the main current is not switched depending on the gate signal driving IC (Integrated Circuit), the IC capacity can be reduced, thereby accomplishing the decrease in size and cost.

As described above, in the light emitting element array chip 1 according to this embodiment, the switch thyristors S provided as the switch unit operate so as to give the gate signal to the light emitting thyristors T only at the time selected by the selection signal. Accordingly, when the plurality of light emitting element array chips 1 are arranged and driven, the time-division driving operation can be performed by commonly using the driving ICs and wiring lines to feed the light emission signal and the gate signal without connecting the driving ICs to all the light emitting element array chips 1, thereby obtaining a basic operational advantage that the time-division driving operation can be performed with the small number of driving ICs and wiring lines.

When the plurality of light emitting element blocks B in which the anodes a are used in common to the plurality of light emitting thyristors T are arranged and the plurality of light emitting element blocks B share the horizontal gate lines GH, the plurality of light emitting element blocks B can be time-divisionally driven in one light emitting element array chip 1. As a result, since the number of horizontal gate lines GH to be connected to the driving ICs can be reduced, it is possible to provide a light emitting device that can perform a time-division driving operation with the small number of driving ICs by using the driving ICs having the small number of output ports for the gate signal.

When the bonding pads A, G, and CSG to feed the light emission signal, the gate signal, and the selection signal are arranged in the arrangement direction X of the light emitting elements, one light emission signal bonding pad A is provided for one light emitting element block B and thus a space is formed between the light emission signal bonding pads A provided for the neighboring light emitting element blocks B. Accordingly, the switch thyristors S and the like can be arranged to effectively utilize the space. As a result, in spite of providing the switch thyristors S and the like, it is possible to prevent the increase in size of the light emitting element array chip, thereby providing a small-sized light emitting element array chip.

Since the switch units and the light emitting elements include the emission thyristors, it is possible to configure a logical circuit to select the light emitting element array chip 1 to which the gate signal should be inputted with a simple configuration without using a complex semiconductor device such as a NAND gate or an inverter. Accordingly, it is possible to accomplish the simple design and to simplify the manufacturing processes.

Since the current flowing in the N-gate electrodes f of the selection thyristors U is small, the line width of the selection signal transmission line CSL can be reduced. Accordingly, it is possible to reduce the size of the light emitting element array chip 1.

When the above-mentioned configuration employing the pull-up resistors RP or the selection thyristors U is employed, the voltage of the gate electrodes connected to the selection thyristors U can be stably set to a predetermined value by the pull-up resistors RP. Accordingly, it is possible to stabilize the switching operation of the switch thyristors S and to satisfactorily perform the operation of the AND circuit.

When the current-limiting resistor RI is connected between the gate signal bonding pad G and the anode c of the switch thyristor S and the plurality of switch thyristors S are concurrently switched to the ON state for the purpose of high speed operation, it is possible to stably secure the potential of the anodes c of the switch thyristors S without any decrease in signal voltage of the gate signal at the time of first switching, in spite of the slight difference in switching timing. Accordingly, since the plurality of switch thyristors can be satisfactorily switched, it is possible to drive the plurality of light emitting element array chips 1 at the same time-division timing and thus it is advantageous in high speed operation.

When the semiconductor layers of the switch thyristors S the semiconductor layers of the light emitting thyristors T form the same layers, it is possible to manufacture the light emitting thyristors T and the switch thyristors S at the same time by the use of the same processes. Accordingly, in the configuration according to the invention employing the switch thyristors S in addition to the light emitting thyristors T as the light emitting elements, the manufacturing processes are not complicated, thereby providing a light emitting element array advantageous in manufacturing.

When a metal thin film is formed as light-blocking means on the surface of the switch thyristor S, the light emitted from the switch thyristor S can be prevented from entering the light emitting thyristors T to change the threshold value of the light emitting thyristors T.

By using the third semiconductor layer 54 as the pull-up resistors RP and disposing the light-blocking film 12 to cover the pull-up resistors RP, it is possible to enhance the insulating property of the pull-up resistors RP from the counter electrode 26 and thus to stabilize the operation.

Since the light emitting device has a small size and high reliability in stable operation by employing the light emitting element array chip 1 having the above-mentioned configuration, it is possible to provide an image forming apparatus that can stably form an excellent image.

According to the invention described above, it is possible to provide a light emitting element array that can perform a time-division driving operation with the small number of driving ICs, a small-sized light emitting device employing the light emitting element array, and an image forming apparatus having the light emitting device.

Figure 13:
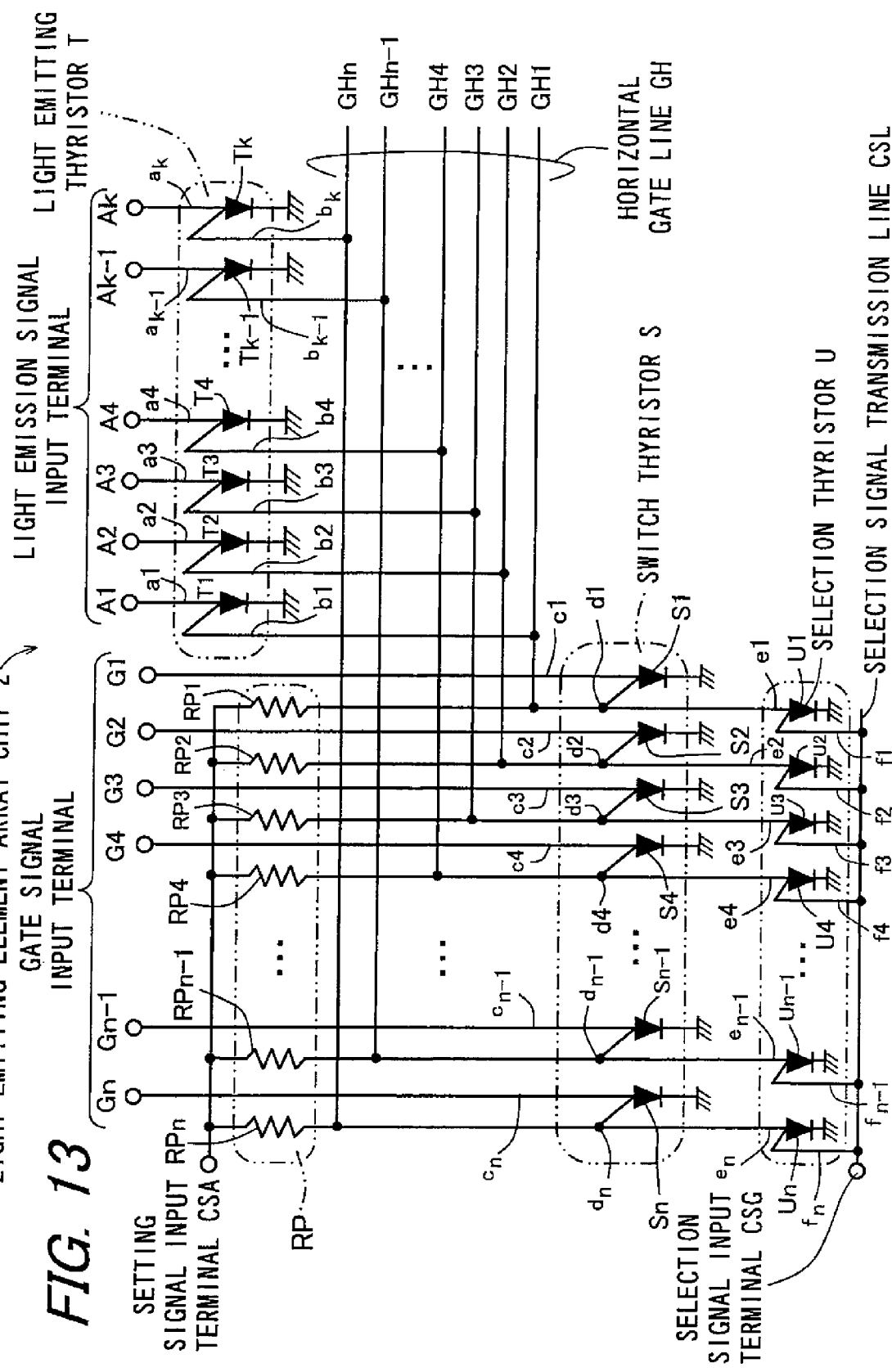
FIG. 13 is an equivalent circuit diagram schematically illustrating a light emitting element array chip as a light emitting element array according to a second embodiment of the invention.

FIG. 13 is an equivalent circuit diagram schematically illustrating a light emitting element array chip 2 as a light emitting element array according to a second embodiment of the invention. The difference in configuration from the light emitting element array chip 1 according to the first embodiment shown in FIG. 1 is that the light emitting element blocks B are not provided, and the other configurations are similar thereto. Accordingly, the common components will be denoted by the same reference numerals and description thereof will be omitted.

Similarly to the first embodiment, the light emitting element array chip 2 according to the second embodiment includes light emitting thyristors T1 to Tk as k light emitting elements, switch thyristors S1 to Sn as n switch units, and n horizontal gate lines GH1 to GHn. The switch units further include n selection thyristors U1 to Un and n pull-up resistors RP1 to RPn. In this, embodiment, the cathodes of the light emitting thyristors T and the switch thyristors S are used as a common electrode. Similarly to the first embodiment, the first selection signal corresponds to a selection signal and the second selection signal corresponds to a gate signal. A voltage of a high level inputted to the setting signal input terminal CSA is referred to as a setting signal and a voltage of about 0 V is referred to as a reset signal. Regarding correspondence between electrodes, the first electrode corresponds to the anodes c of the light emitting thyristors T, the second electrode corresponds to the N-gate electrodes f of the selection thyristors U, the first control electrode corresponds to the N-gate electrodes d of the switch thyristors S, the second control electrode corresponds to the N-gate electrodes b of the light emitting thyristors T, and the third electrode corresponds to the anodes a of the light emitting thyristors T. The N-gate electrodes may be described simply as the gate electrodes b. Regarding correspondence between resistors, the resistor corresponds to the pull-up resistors RP. The current-limiting resistor RI as the third resistor may be added as a preferable configuration, but is not employed in this embodiment. The control signal transmission line corresponds to the horizontal gate lines GH.

As described above, since the light emitting thyristors T of the light emitting element array chip 2 are not classified into the light emitting element blocks B, the anodes a of the light emitting thyristors T are connected to light emission signal input terminals A one on one. For example, in FIG. 13, when the numbering is made according to the order of from the one end to the other end in the arrangement direction of the light emitting thyristors T, the anodes $ai_{15}$ of the $i_{15}$-th light emitting thyristor $Ti_n$ (wherein $1 \leq i_{15} \leq k$) is connected to the $i_{15}$-th light emission signal input terminal $Ai_{15}$. The gate electrodes b of the light emitting thyristors T are connected to one of the horizontal gate lines GH. Since the number n of horizontal gate lines GH is not necessarily equal to the number k of light emitting thyristors T, the gate electrodes b of a plurality of light emitting thyristors T may be connected to a single horizontal gate line GH. In this case, different light emission signals need to be applied to allow the light emitting thyristors T connected to the single horizontal gate line GH to selectively emit light.

The operational advantages of the light emitting element array chip 2 according to the second embodiment are basically equal to those of the light emitting element array chip 1 according to the first embodiment. In the light emitting element array chip 2, the switch thyristors S as the switch units operate to give the gate signal to the light emitting thyristors T only at the time selected by the selection signal. Accordingly, when the plurality of light emitting element array chips 1 are arrange and driven, the driving ICs and the wiring lines to feed the light emission signal and the gate signal can be shared for the time-division driving operation without connecting the driving ICs to all the plurality of light emitting element array chips 1, thereby performing the time-division driving operation with the small number of driving ICs and wiring lines. The other operational advantages are similar, but since the light emitting element blocks B are not provided unlike the light emitting element array chip 1 according to the first embodiment, the time-division driving operation cannot be performed in a single light emitting element array chip 1. Instead, all the emission thyristors in the light emitting element array chip 2 selected by the selection signal can be made to selectively emit light.

Figure 14:
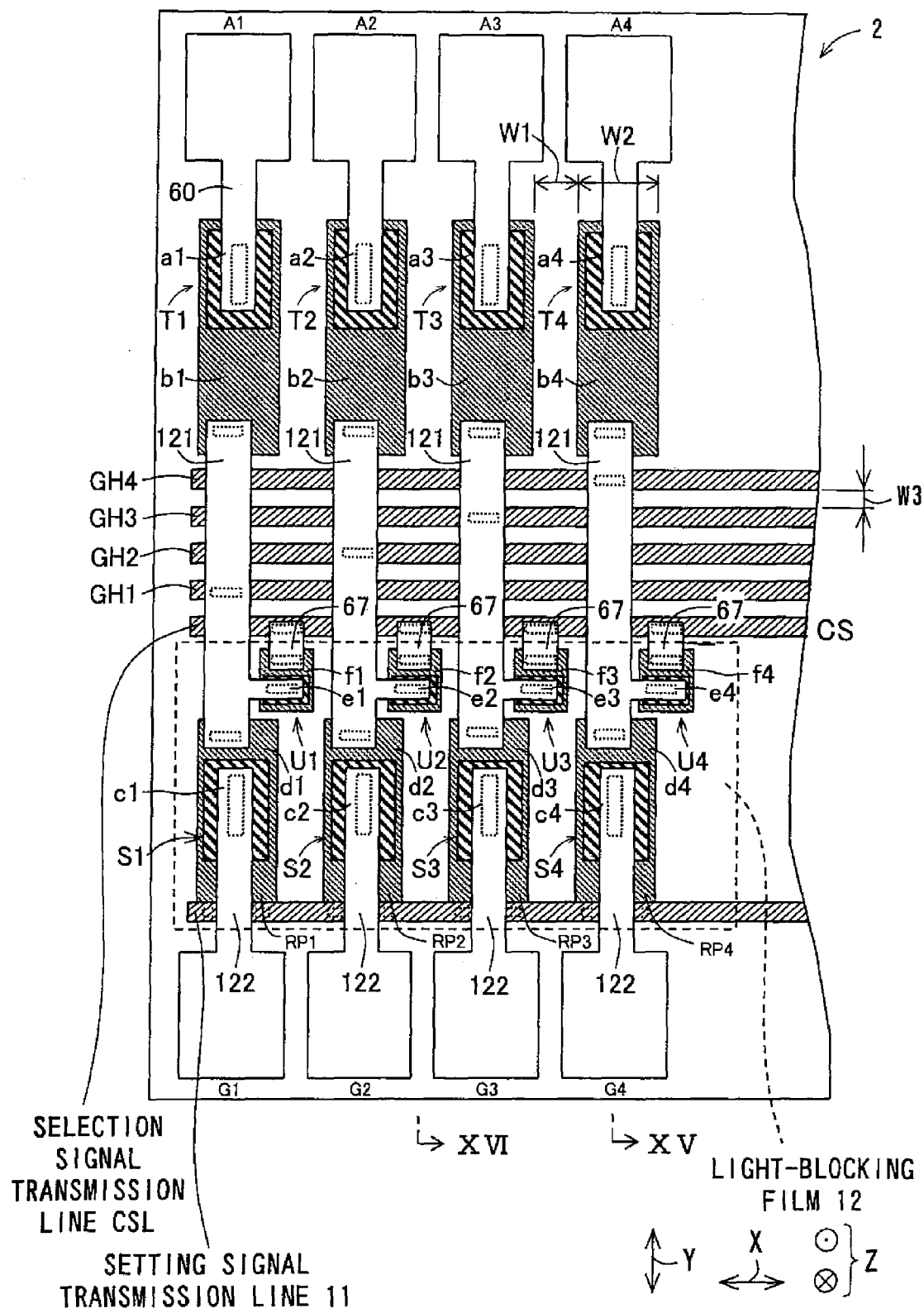
FIG. 14 is a partial plan view illustrating a basic configuration of the light emitting element array chip according to the second embodiment.

FIG. 14 is a partial plan view illustrating a basic configuration of the light emitting element array chip 2 according to the second embodiment. This drawing is a plan view corresponding to the schematic equivalent circuit diagram shown in FIG. 13 where n=k=4. As described above, the difference from the light emitting element array chip 1 according to the first embodiment is that the light emitting element blocks B are not provided in this embodiment. Accordingly, the components common to the light emitting element array chip 1 according to the first embodiment shown in FIG. 6 will be denoted by the same reference numerals and description thereof will be omitted. FIG. 13 shows a plan view of the light emitting element array chip 2 disposed so that the light emission direction of the light emitting thyristors T is perpendicular to the drawing surface and directed to the front side thereof. The horizontal gate lines GH1 to GH4, the selection signal transmission line CSL, the setting signal transmission line 11, the light emitting thyristors T, the switch thyristors S, the pull-up resistors RP, and the selection thyristors U are hatched for the purpose of easy understanding.

The plurality of light emitting thyristors T of the light emitting element array chip 2 are arranged at constant intervals W1 therebetween in a straight line. Hereinafter, the arrangement direction X of the light emitting thyristors T may be described simply as an arrangement direction X. The direction parallel to the light emission direction of the light emitting thyristors T is the thickness direction Z and the direction perpendicular to the arrangement direction X and the thickness direction Z is a width direction Y.

In this embodiment, since the light emitting element blocks B are not provided, the anodes a of the light emitting thyristors T are electrically connected to the light emission signal bonding pads A one on one. The connecting portions 60 electrically connecting the anodes a of the light emitting thyristors T to the light emission signal bonding pads A are formed integrally with the anodes a and the bonding pads A. In this embodiment, the bonding pads are arranged in the arrangement direction X and are disposed opposite to the horizontal gate lines GH with the light emitting thyristors T therebetween.

The horizontal gate lines GH extend in the arrangement direction X along the light emitting element array chip 1 from the one end to the other end in the arrangement direction X of the light emitting element array chip 1. The horizontal gate lines GH are arranged in the width direction Y with a gap therebetween. In this embodiment, the first horizontal gate line GH1, the second horizontal gate line GH2, . . . , and the n-th horizontal gate line GHn are sequentially arranged from the side apart from the light emitting thyristors T. In this embodiment, the selection signal transmission line CSL to feed the selection signal to the gate electrodes d of the switch thyristors S is disposed apart from the light emitting thyristors T so as to be parallel to the horizontal gate lines GH.

The switch thyristors S are arranged in the arrangement direction X and are disposed opposite to the light emitting thyristors T with the horizontal gate lines GH therebetween. The anodes c of the switch thyristors S are electrically connected to the gate signal bonding pads G one on one. The connecting portions 122 electrically connecting the anodes a of the switch thyristors S to the bonding pads G are formed integrally with the anodes a and the gate signal bonding pads G. In this embodiment, the gate signal bonding pads G are arranged in the arrangement direction X and are disposed opposite to the horizontal gate lines GH with the light emitting thyristors T therebetween.

The selection thyristors U are disposed along the arrangement direction X between the selection signal transmission line CSL and the switch thyristors S. The connecting portions 67 are formed between the N-gate electrodes f of the selection thyristors U and the selection signal transmission line CSL to electrically connect them.

When the light emitting thyristors T, the switch thyristors S, and the selection thyristors U are numbered with first to k-th numbers according to the order of from the one end in the arrangement direction X of the light emitting thyristors T, one of the gate electrode $bi_{16}$ of the $i_{16}$-th light emitting thyristor $Ti_{16}$ (wherein $1 \leq i_{16} \leq k$: k=4 in FIG. 14) in the arrangement direction X, the gate electrode d1 of the $i_{16}$-th switch thyristor $Si_{16}$, the anode $ei_{16}$ of the $i_{16}$-th selection thyristor $Ui_{16}$, and the horizontal gate line GH is electrically connected through by the connecting portion 121. The connecting portions 121 and 122 are formed of a conductive material such as metal or alloy, similarly to the connecting portions 60 and 67 used in other portions. Specifically, the connecting portions are formed of gold (Au), alloy (AuGe) of gold and germanium, alloy (AuZn) of gold and zinc, nickel (Ni), and aluminum (Al).

The pull-up resistors RP are formed integrally with the switch thyristors S by using a part of the semiconductor layer constituting the switch thyristor S. The portion of the switch thyristor S used as the pull-up resistor RP is a portion apart from the horizontal gate lines GH with the switch thyristors S therebetween.

The setting signal transmission line 11 is disposed parallel to the horizontal gate lines GH, and is disposed between the switch thyristors S and the gate signal bonding pads G in this embodiment. The position of the setting signal transmission line 11 in the width direction Y overlaps with the positions of the pull-up resistors RP and is disposed close to the end of the pull-up resistors RP on the side of the gate signal input terminals G.

Preferably, the light-blocking film 12 as the light-blocking means is disposed to cover the surfaces (apart from the substrate) of the switch thyristors S and the selection thyristors U. It is effective that the switch thyristors S, the selection thyristors U, and the light emitting thyristors T are disposed as apart as possible from each other and it is also effective for the photosensitivity, as shown in the plan view of FIG. 14, that the light emitting thyristors T are disposed on one side and the switch thyristors S and the selection thyristors U are disposed on the opposite side with the horizontal gate lines GH interposed therebetween.

Figure 15:
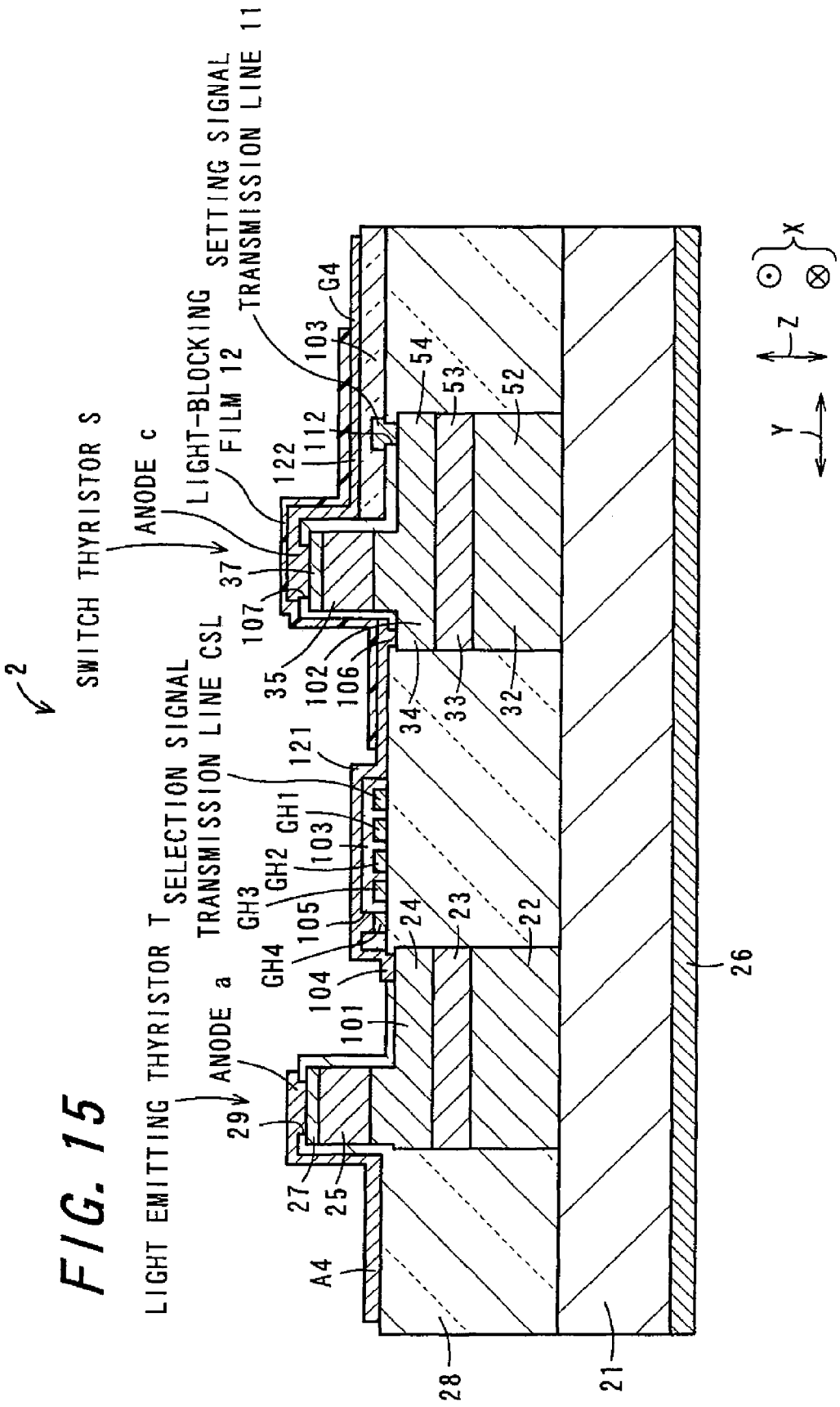
FIG. 15 is a partial sectional view illustrating a basic configuration of the light emitting element array chip according to the second embodiment as viewed from section line XV-XV of FIG. 14.
Figure 16:
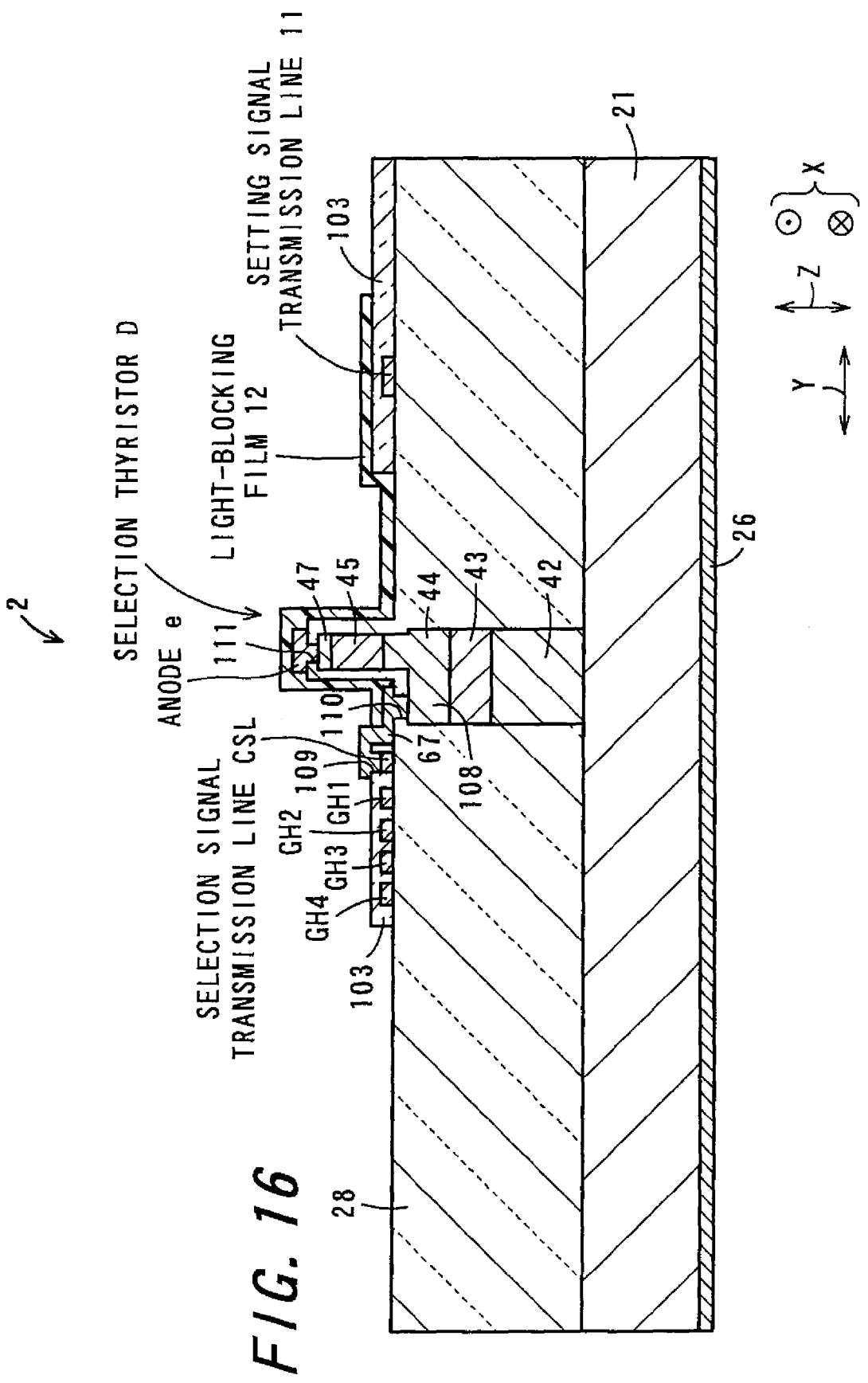
FIG. 16 is a partial sectional view illustrating a basic configuration of the light emitting element array chip according to the second embodiment as viewed from section line XVI-XVI of FIG. 14.

FIG. 15 is a partial sectional view illustrating a basic configuration of the light emitting element array chip 2 according to the second embodiment as viewed from section line XV-XV of FIG. 14, and FIG. 16 is a partial sectional view illustrating a basic configuration of the light emitting element array chip 2 according to the second embodiment as viewed from section line XVI-XVI of FIG. 14.

The basic configuration of the light emitting element array chip 2 according to the second embodiment is similar to the basic configuration of the light emitting element array chip 1 according to the first embodiment shown in FIGS. 8 and 9. The semiconductor materials, the metal materials, and the insulating materials forming the layers are similar thereto and the manufacturing method is also similar thereto. Accordingly, the common components will be denoted by the same reference numerals and repeated description thereof will be omitted.

The manufacturing method and configuration of the light emitting element array chip 2 are roughly described now. The semiconductor layers 22 to 25, 32 to 35, 42 to 45, and 52 to 54 and the ohmic contact layers 27, 37, and 47 forming the light emitting thyristors T, the switch thyristors S, the selection thyristors U, and the pull-up resistors RP are formed at the same time by the use of the same film forming processes. An N-type semiconductor substrate is used as the substrate 21. The N-type first semiconductor layers 22, 32, 42, and 52, the P-type second semiconductor layers 23, 33, 43, and 53, the N-type third semiconductor layers 24, 34, 44, and 54, the P-type fourth semiconductor layers 25, 35, and 45, and the P-type ohmic contact layers 27, 37, and 47 are formed on one surface of the substrate 21. The counter, electrode 26 is formed on the entire opposite surface of the substrate 21 and is used as the cathode of the light emitting thyristors T and the switch thyristors. The shapes of the elements are defined by the patterning and etching processes using photolithography. Parts of the semiconductor layers are etched to form the connecting portions 101, 102, and 108 connecting the horizontal gate lines GH and the selection signal transmission line CSL. The insulating layer 28 insulating the elements and the surfaces of the elements from each other is formed by a spin coating method. Thereafter, through holes 29, 104 to 107, and 109 to 111 are formed at desired positions, and the connecting portions 60, 67, 121, and 122 for electrical connection, the anodes a and c, and the bonding pads A and G are formed. Finally, the light-blocking film 12 to cover the selection thyristors U, the switch thyristors S, and the pull-up resistors RP is formed.

In this embodiment, the method of forming the setting signal transmission line 11 is different from that of the light emitting element array chip 1 according to the first embodiment. Before forming the setting signal transmission line 11, the through hole 112 is formed in the insulating layer 28 stacked on the third semiconductor layer 34 of the pull-up resistors RP and the setting signal transmission line 11 is disposed to stack a part of the setting signal transmission line 11 on the formed through hole 112. By forming the setting signal transmission line 11 and then covering the surface with the insulating layer 103, the electrical insulation between the switch thyristors S and the gate signal bonding pads G is maintained.

Figure 17:
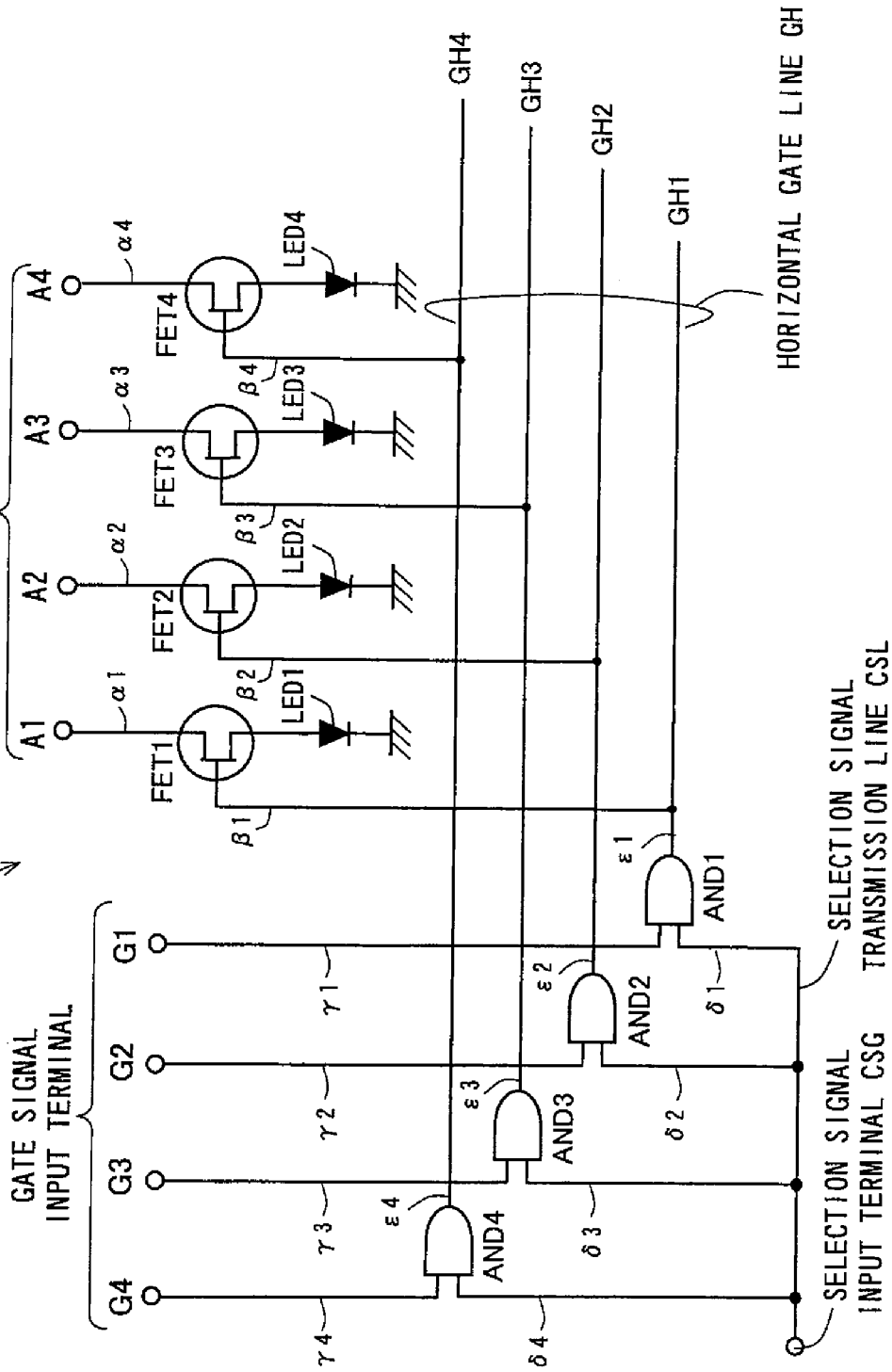
FIG. 17 is an equivalent circuit diagram schematically illustrating s light emitting element array chip as a third embodiment of the invention.

FIG. 17 is an equivalent circuit diagram schematically illustrating s light emitting element array chip 3 as a light emitting element array according to a third embodiment of the invention.

The light emitting element array chip 3 according to the third embodiment shown in FIG. 17 is different from the light emitting element array chip 1 according to the first embodiment shown in FIG. 1 and the light emitting element array chip 2 according to the second embodiment shown in FIG. 13, in that the switch units and the light emitting elements are configured without using the emission thyristors. Since the elements other than the switch units and the light emitting elements are similar to those shown in FIG. 13, the common components will be denoted by the same reference numerals and description thereof will be omitted.

The light emitting element array chip according to the third embodiment shown in FIG. 17 includes n switch units and k light emitting elements. In FIG. 13, n=k=4 is assumed. In the following description, n=k=4 shown in FIG. 13 is assumed and the circuit operations are the same as generally known.

The light emitting elements include field effect transistors FET1 to FET4 and light, emitting diodes LED1 to LED4. The field effect transistor has a source electrode, a drain electrode, and a gate electrode, and the anode of the diode is connected to the source electrode of the field effect transistor. The cathode of the diode is grounded as a common electrode. The drain electrodes α1 to α4 of the field effect transistors correspond to the third electrode and are connected to the light emission signal input terminals A1 to A4, respectively. The gate electrodes β1 to β4 of the field effect transistors correspond to the second control electrode and are connected to one of the horizontal gate lines GH1 to GH4. The drain electrodes of the field effect transistors may be connected to the cathodes of the diodes. In this case, the anodes of the diodes are grounded as the common electrode and the source electrodes of the field effect transistors correspond to the third electrode.

The switch units employ AND circuit elements AND1 to AND4 as the switch unit to output the logical product of two inputs, and can be configured to include circuits as a combination of a NAND circuit element and a NOT circuit element. One-side input terminals γ1 to γ4 of the AND circuit elements AND1 to AND4 are connected to the gate signal input terminals G1 to G4, respectively, and correspond to the second electrode. The other-side input terminals δ1 to δ4 of the AND circuit elements are connected to the common selection signal input terminal CSG and correspond to the first electrode. The output terminals ϵ1 to ϵ4 of the AND circuit elements are connected to the horizontal gate lines GH1 to GH4, respectively, and correspond to the first control electrode.

The AND circuit elements AND1 to AND4 can be configured to include well-known logical circuits (logics) such as GaAs MES-FET ICs, Si TTLs, and CMOSs. The light emitting element array chip 3 can be manufactured by forming the logical circuits, the LEDs, and the field effect transistors on the GsAs or Si substrate.

The operation of the light emitting element array chip 3 shown in FIG. 17 will be described now.

In the light emitting element array chip 3 shown in FIG. 17, a true value (a voltage of the high level) is inputted from the selection signal input terminal CSG and the gate signals are inputted from the gate signal input terminals G1 to G4, respectively, when the potentials of the one-side input terminals (corresponding to the first electrode) δ1 to δ4 of the AND circuit elements AND1 to AND4 are in the high level (i.e., when it is in the selected state). Then, the signals of the high level are outputted from the output terminals (the first control electrode) ϵ1 to ϵ4 of the AND circuit elements AND1 to AND4, respectively. Since the horizontal gate lines GH1 to GH4 are connected to the output terminals (the first control electrode) ϵ1 to ϵ4 of the AND circuit elements AND1 to AND4, respectively, the output signals of the high level are inputted to the gate electrodes β1 to β4 of the field effect transistors FET1 to FET4 connected to the horizontal gate lines GH1 to GH4 through the horizontal gate lines GH1 to GH4. In this state, when the light emission signals of the high level are inputted from the light emission signal input terminals A1 to A4, the light emitting diodes LED1 to LED4 emit light.

In this way, the AND circuit elements AND1 to AND 4 disposed as the switch unit operate to give the gate signal to the light emitting diodes LED1 to LED4 only at the time selected by the selection signal. Accordingly, when the light emitting device is configured to include the plurality of light emitting element array chips 3, the driving ICs and the wiring lines of the driving ICs, the light emission signal input terminals A1 to A4, and the gate signal input terminals G1 to G4 are shared to perform the time-division driving operation without connecting the driving ICs to all the light emitting element array chips 3. Accordingly, it is possible to embody the light emitting device performing the time-division driving operation with the small number of ICs and wiring lines.

Figure 18:
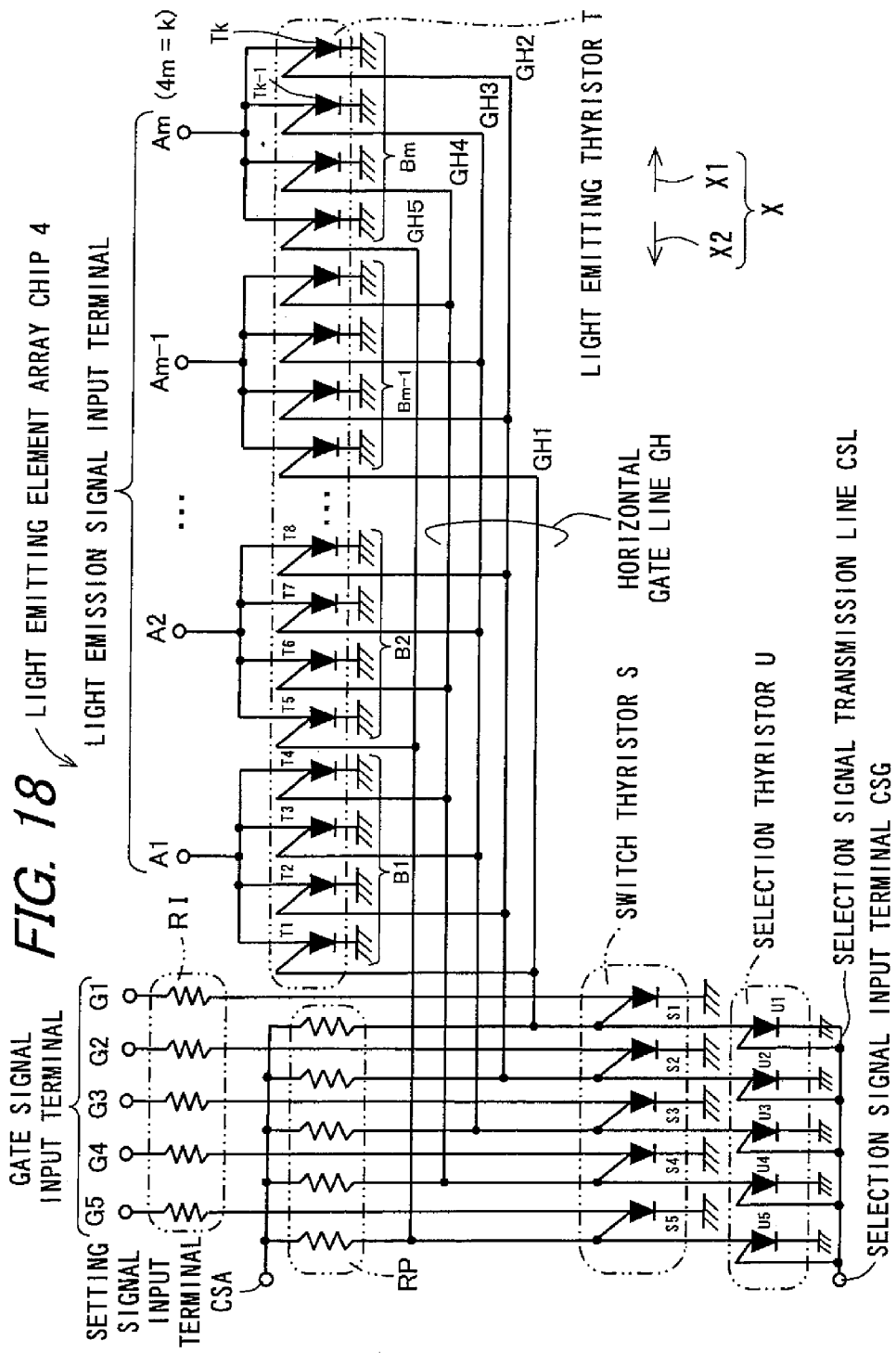
FIG. 18 is an equivalent circuit diagram schematically illustrating a light emitting element array chip as a fourth embodiment of the invention.

FIG. 18 is an equivalent circuit diagram schematically illustrating a light emitting element array chip 4 as a light emitting element array according to a fourth embodiment of the invention. The difference in configuration from the light emitting element array chip 1 according to the first embodiment shown in FIG. 1 is that the number of switch thyristors S is n=5 and the number of horizontal gate lines GH is also n=5 in FIG. 6, but the number of light emitting thyristors T of the respective light emitting element blocks B is n−1=4, which is less by one than n. This embodiment is also directed to the connection between the horizontal gate lines GH and the light emitting thyristors T constituting the light emitting element blocks B. Since the other elements are similar thereto, the common components will be denoted by the same reference numerals and description thereof will be omitted.

In FIG. 18, the direction from the side close to the switch thyristors S to the side apart therefrom in the arrangement direction X of the light emitting thyristors T is defined as an X1 direction and the opposite direction thereof is defined as the X2 direction. The X1 direction and the X2 direction constitute the X direction. Here, the light emitting element blocks are numbered with first to m-th numbers in the X1 direction and the light emitting thyristors T constituting the respective light emitting element blocks are numbered with first to (n−1)-th numbers in the X1 direction. The n horizontal gate lines GH are numbered from first to n-th numbers in a predetermined order.

In this embodiment, in the odd-numbered light emitting element blocks, the $i_1$-th light emitting thyristor T in the light emitting element block is connected to the $j_1$-th horizontal gate line GH$j_1$ so as to satisfy $i_1=j_1$ (wherein and $1 \leq i_1 \leq n-1$ and $1 \leq j_2 \leq n-1$). In the even-numbered light emitting element blocks, the $i_2$-th light emitting thyristor T in the light emitting element block is connected to the $j_2$-th horizontal gate line GH$j_2$ so as to satisfy $i_2+j_2=n+1$ (wherein $1 \leq i_2 \leq n-1$ and $2 \leq j_2 \leq n$). In this case, the light emitting thyristor T adjacent in the X direction to the light emitting thyristor T connected to the first horizontal gate line GH1 is connected to the second horizontal gate line GH2. The light emitting thyristor T adjacent in the X direction to the light emitting thyristor T connected to the $j_3$-th horizontal gate line GH$j_3$ (wherein $2 \leq j_3 \leq n-1$) is connected to one of the ($j_3-1$)-th or ($j_3+1$)-th horizontal gate line. The light emitting thyristor T adjacent in the X direction to the light emitting thyristor T connected to the n-th horizontal gate line GHn is connected to the (n−1)-th horizontal gate line GHn−1. Accordingly, when the gate signal (the second selection signal) is inputted to the switch units of the light emitting element array in the selected state and the control signal is outputted sequentially in a time-division manner from the first horizontal gate line GH1 to the n-th horizontal gate line GHn−1, the difference in timing when the light emitting thyristors T adjacent to each other emit light can be reduced. Since the adjacent light emitting thyristors T are not connected to the same control signal transmission line, it is possible to suppress the adjacent light emitting thyristors T from emitting light at the same time.

When the light emitting device configured to include the light emitting element array according to this embodiment is used as an exposure device exposing a photoreceptor drum, the great difference in timing when the adjacent light emitting thyristors emit light is suppressed, whereby a discontinuous point is not generated at the exposure positions on the photoreceptor drum. Since the concurrent light emission of the adjacent light emitting thyristors T is prevented, the difference in light emission of heat is suppressed when the light emitting thyristors T emit light, thereby making constant the light emission characteristic with the variation in temperature of the light emitting thyristors T. Since the interference of light emitted from the adjacent light emitting thyristors T can be prevented, it is possible to expose the photoreceptor drum with high precision. As a result, in the image forming apparatus employing the light emitting element array according to this embodiment, it is possible to obtain an image with high image quality.

Figure 19:
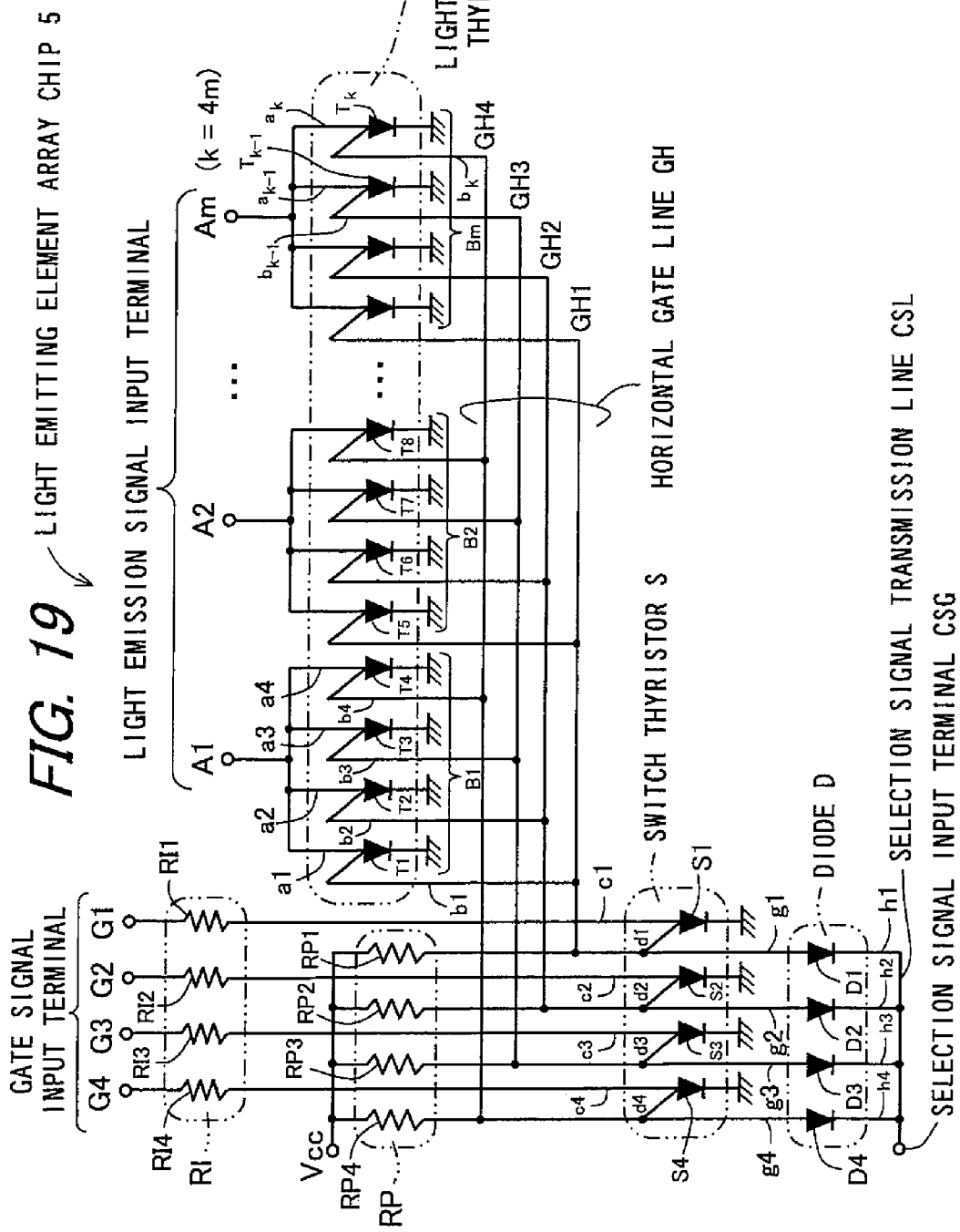
FIG. 19 is an equivalent circuit diagram schematically illustrating a light emitting element array chip according to a fifth embodiment of the invention.
Figure 20:
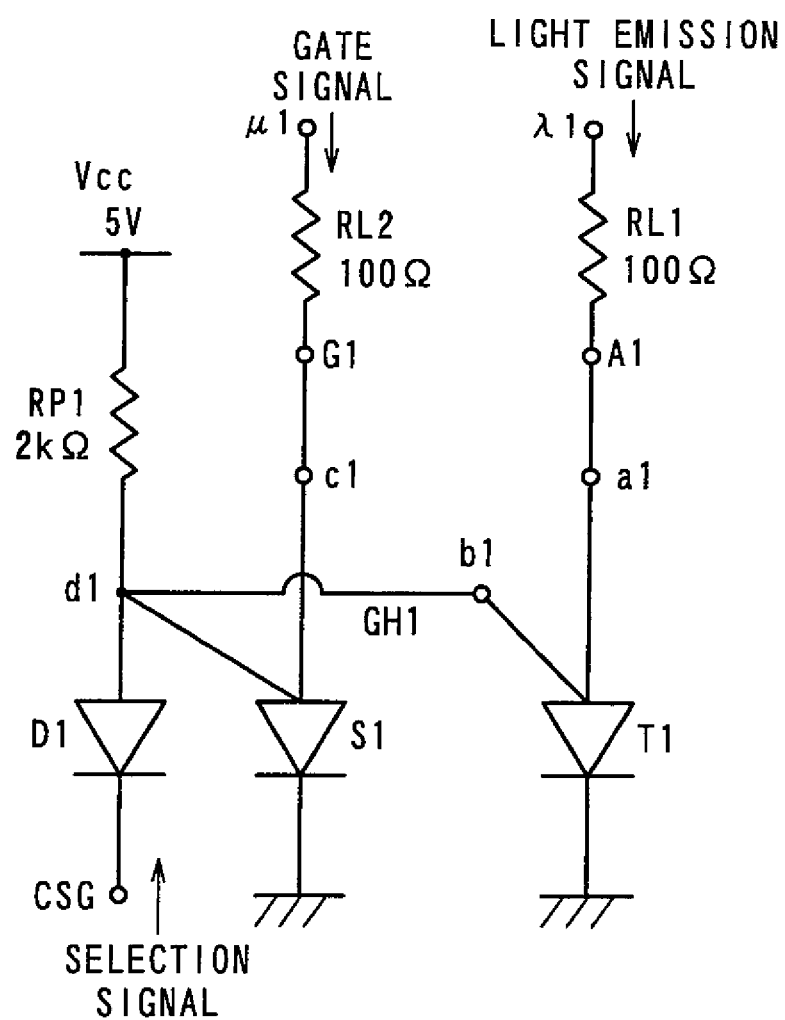
FIG. 20 is a part of the schematic equivalent circuit diagram illustrating the light emitting element array chip shown in FIG. 19.

FIG. 19 is an equivalent circuit diagram schematically illustrating a light emitting element array chip 5 according to a fifth embodiment of the invention. FIG. 20, which is a part of the schematic equivalent circuit diagram illustrating the light emitting element array chip 5 shown in FIG. 19, shows connections of the light emitting thyristor T1, the switch thyristor S1, and the diode D1 with wiring lines. In the light emitting element array chip 5 according to this embodiment, the selection thyristors U of the light emitting element array chip 1 according to the first embodiment is replaced with the diodes D. The setting signal input terminal CSA is connected to a positive constant voltage source (Vcc). That is, the setting signal is constant with the lapse of time. Since the light emitting element array chip 5 according to this embodiment is the same as the light emitting element array 1 according to the first embodiment, the common components will be denoted by the same reference numerals and description thereof will be omitted.

The switch units include n switch thyristors S1 to Sn, n diodes D1 to Dn, and n pull-up resistors RP1 to RPn. In this embodiment, n=4 is assumed. In the following description, the diodes D1 to Dn may be described simply as the diodes D when they are collectively referred to or when the unspecified ones are mentioned.

In this embodiment, the anodes g1 to g4 (described simply as g when they are collectively referred to or when the unspecified ones are mentioned) of the diodes D correspond to the anodes e of the selection thyristors U of the above-mentioned embodiments, and are electrically connected to the N-gate electrodes d of the switch thyristors S and one-side ends of the pull-up resistors RP. In this embodiment, the cathodes h1 to h4 (described simply as h when they are collectively referred to or when the unspecified ones are mentioned) of the diodes D correspond to the N-gate electrodes f of the selection thyristors U of the above-mentioned embodiments and are connected to the selection signal input terminal CSG.

The diodes D do not have the gate electrode f unlike the selection thyristor U and are switched between the ON state and the OFF state only by the potential difference between the anodes g and the cathodes h. Accordingly, even when the setting signal has a constant voltage, the ON state and the OFF state of the diodes D can be switched by applying the selection signal thereto.

Figure 21:
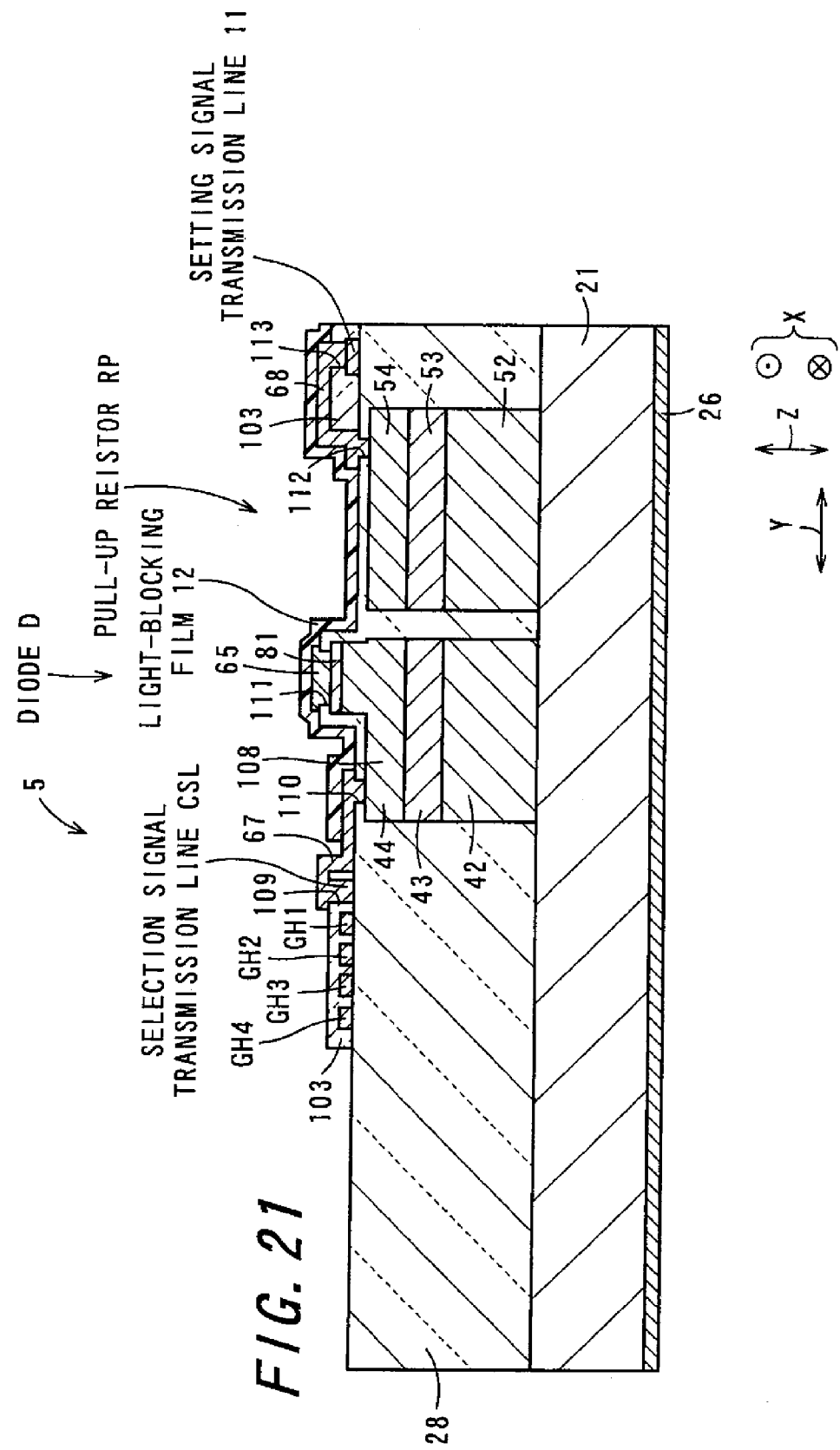
FIG. 21 is a partial sectional view illustrating a basic configuration of the light emitting element array chip.

FIG. 21 is a partial sectional view illustrating a basic configuration of the light emitting element array chip 5. The plan view of the light emitting element array chip 5 according to this embodiment is the same as the plan view shown in FIG. 6, and FIG. 21 corresponds to the sectional view of the light emitting element array chip 5 as viewed from section line IX-IX of FIG. 6.

The diode D has a configuration in which a metal layer 81 is stacked on an end of the third semiconductor layer 44 of the selection thyristor U close to the pull-up resistor RP, instead of the fourth semiconductor layer 45 and the ohmic contact layer 47 of the selection thyristor U. The metal layer 81 is formed of, for example, titanium (Ti). The metal layer 81 and the third semiconductor layer 44 form a Schottky barrier diode.

As shown in FIG. 21, it is preferable that the diode D is covered with the light-blocking film 12 for the same reason as the pull-up resistor RP. It is possible to prevent the insulating property between the second semiconductor layer 43 and the third semiconductor layer 44 due to the excitation of the pairs of electron and hole by external incident light.

Figure 22:
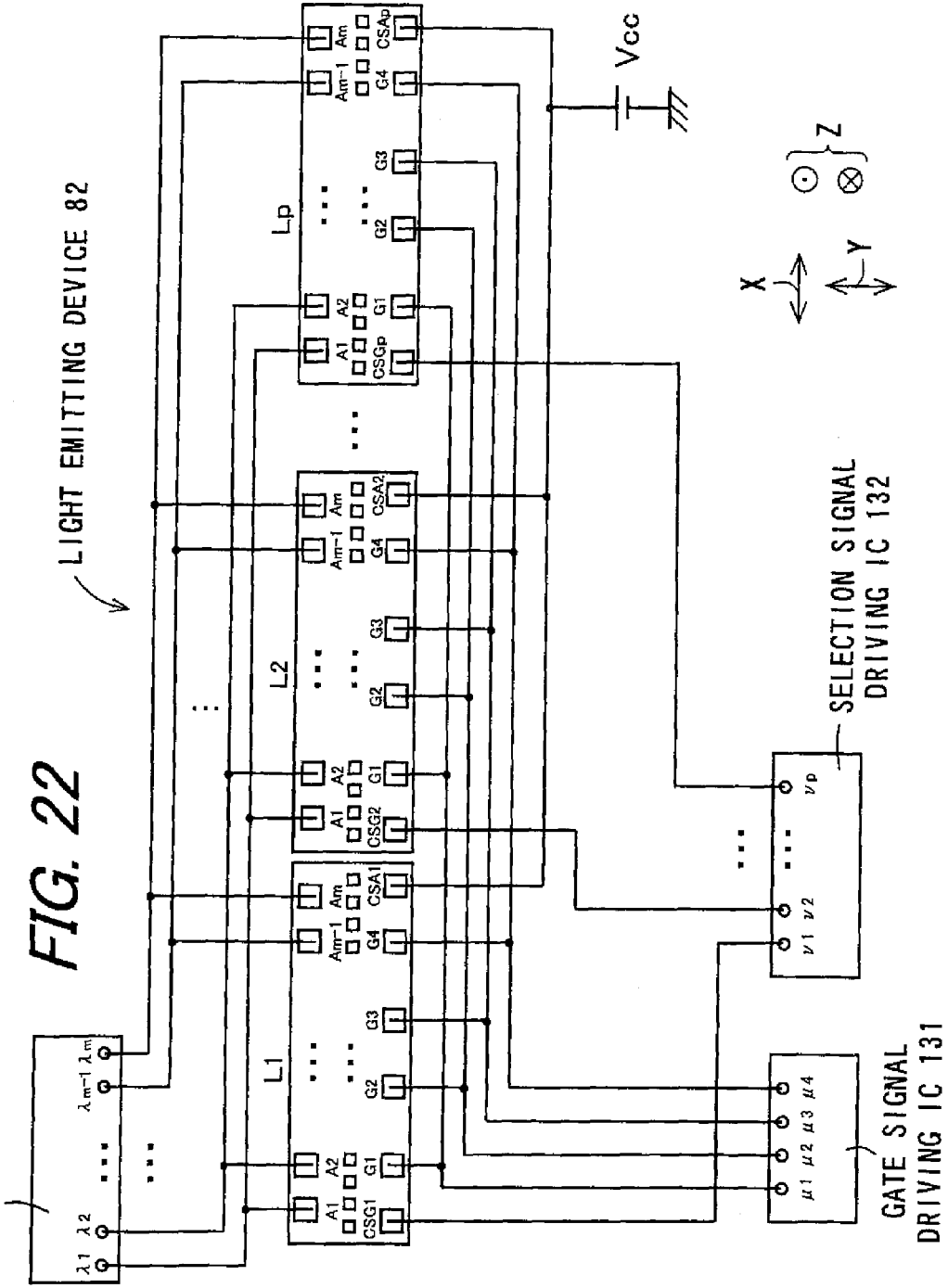
FIG. 22 is a block diagram schematically illustrating a light emitting device according to an embodiment of the invention.

FIG. 22 is a block diagram schematically illustrating a light emitting device 82 according to another embodiment of the invention. Since the light emitting device 82 according to this embodiment has the same structure as the light emitting device 10 according to the first embodiment, the components corresponding to each other will be denoted by the same reference numerals and description thereof will be omitted.

The light emitting device 82 according to this embodiment has a configuration in which the setting signal from the setting signal driving IC 136 of the light emitting device 10 according to the first embodiment is replaced with the positive voltage source (Vcc) and the light emitting element array chip 1 of the light emitting device 10 according to the first embodiment is replaced with the light emitting element array chip 5 according to this embodiment.

Figure 23:
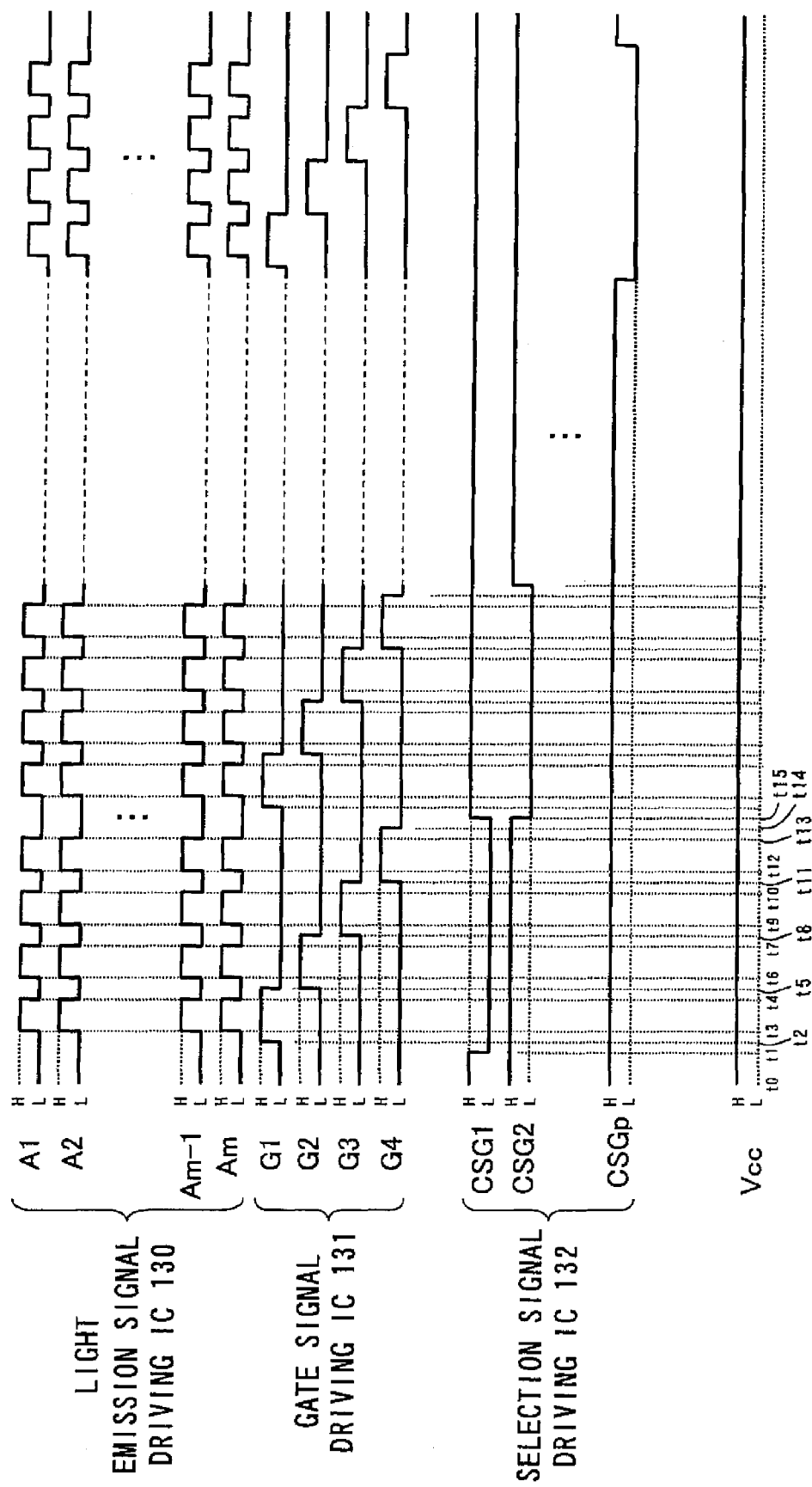
FIG. 23 is a timing chart illustrating an operation of the light emitting device, where the horizontal axis represents the elapsed time from a reference time and the vertical axis represents the signal level by a magnitude of a voltage or current.

FIG. 23 is a timing chart illustrating an operation of the light emitting device 82, where the horizontal axis represents the elapsed time from a reference time and the vertical axis represents the signal level by a magnitude of a voltage or current. In the light emitting device 82 according to this embodiment, since the selection thyristors U of the light emitting device 10 according to the above-mentioned embodiment is replaced with the diodes D, the ON state and the OFF state of the diodes D can be switched only by the selection signal without applying the setting signal.

The light emitting device 82 according to this embodiment operates in the same way as the light emitting device 10 according to the above-mentioned embodiment at times t1 to t14. At time t15, since the selection signal inputted to the selection signal input terminal CSG1 of the first array chip L1 returns to the high (H) level, the selected state of the first array chip L1 is ended. At time t15, since the selection signal inputted to the selection signal input terminal CSG2 of the second array chip L2 becomes the low (L) level, the second array chip L2 becomes the selected state.

In this way, by sequentially applying the selection signal to the array chips from the first array chips to the other array chips to sequentially bring the array chips into the selected state, it is possible to perform the time-division driving operation between the respectively array chips L. By sequentially applying the gate signal to the switch thyristors from the first switch thyristor, it is possible to perform the time-division driving operation in the respective array chips L. In the light emitting element array chip 5 according to this embodiment, the setting signal need not be applied and thus the setting signal driving IC 136 is not necessary, thereby simplifying the configuration.

Figure 24:
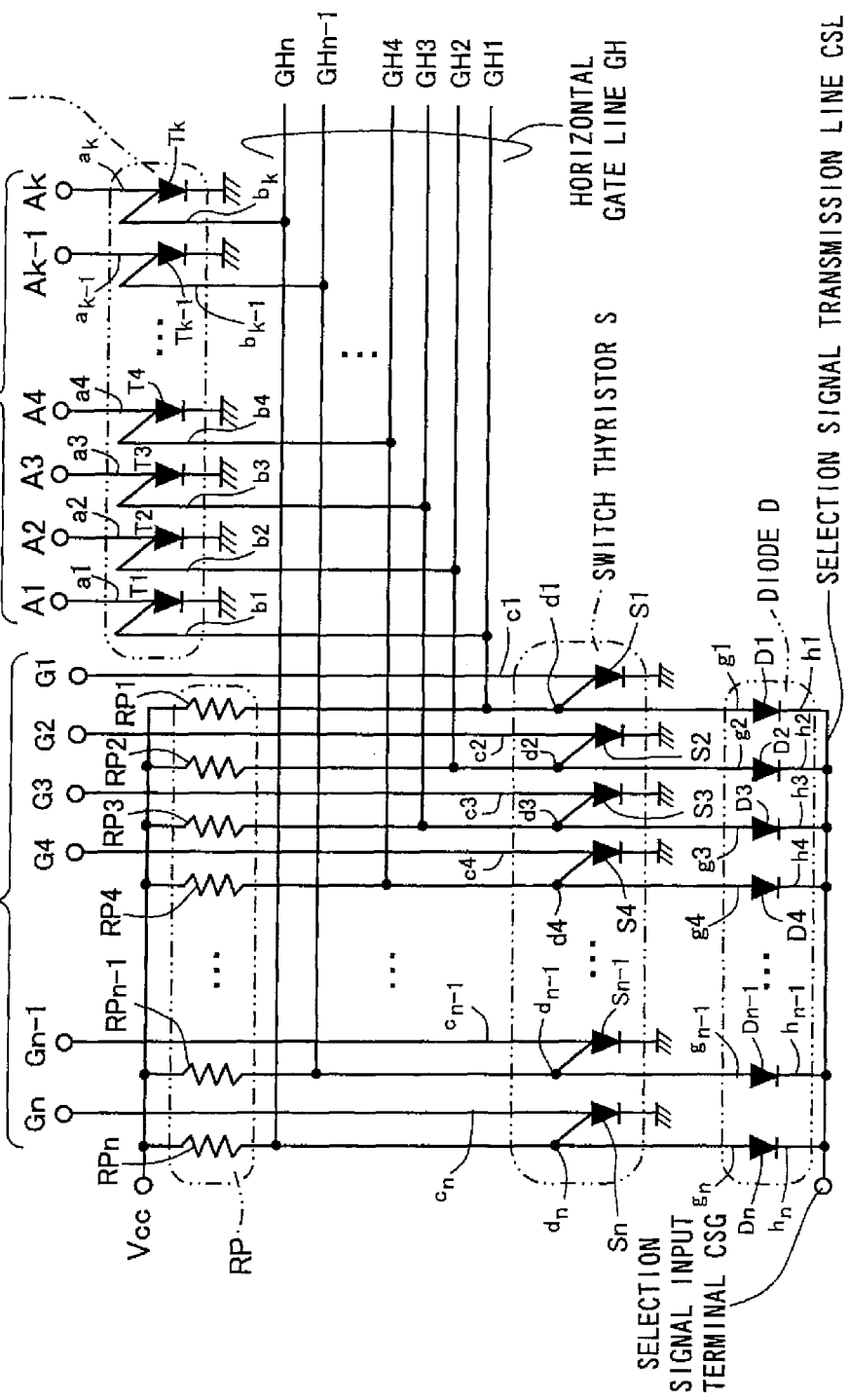
FIG. 24 is an equivalent circuit diagram schematically illustrating a light emitting element array chip according to a sixth embodiment of the invention.

FIG. 24 is an equivalent circuit diagram schematically illustrating a light emitting element array chip 6 according to a sixth embodiment of the invention. In the light emitting element array chip 6 according to this embodiment, the selection thyristors U of the light emitting element array chip 2 according to the second embodiment shown in FIG. 13 is replaced with the diodes D. The setting signal input terminal CSA is connected to a positive constant voltage source (Vcc). That is, the setting signal is constant with the lapse of time. Since the connections of the anodes and the cathodes of the diodes D are the same as those of the light emitting element array chip 5 according to the fifth embodiment shown in FIG. 19, description thereof will be omitted. In this way, when the selection thyristors U are replaced with the diodes D, similarly to the light emitting element array chip 2 according to the second embodiment, it is possible to allow all the emission thyristors in the light emitting element array chip 2 selected by the selection signal to selectively emit light. In the light emitting element array chip 6 according to this embodiment, the setting signal need not be applied and thus the setting signal driving IC 136 is not necessary, thereby simplifying the configuration.

Figure 25:
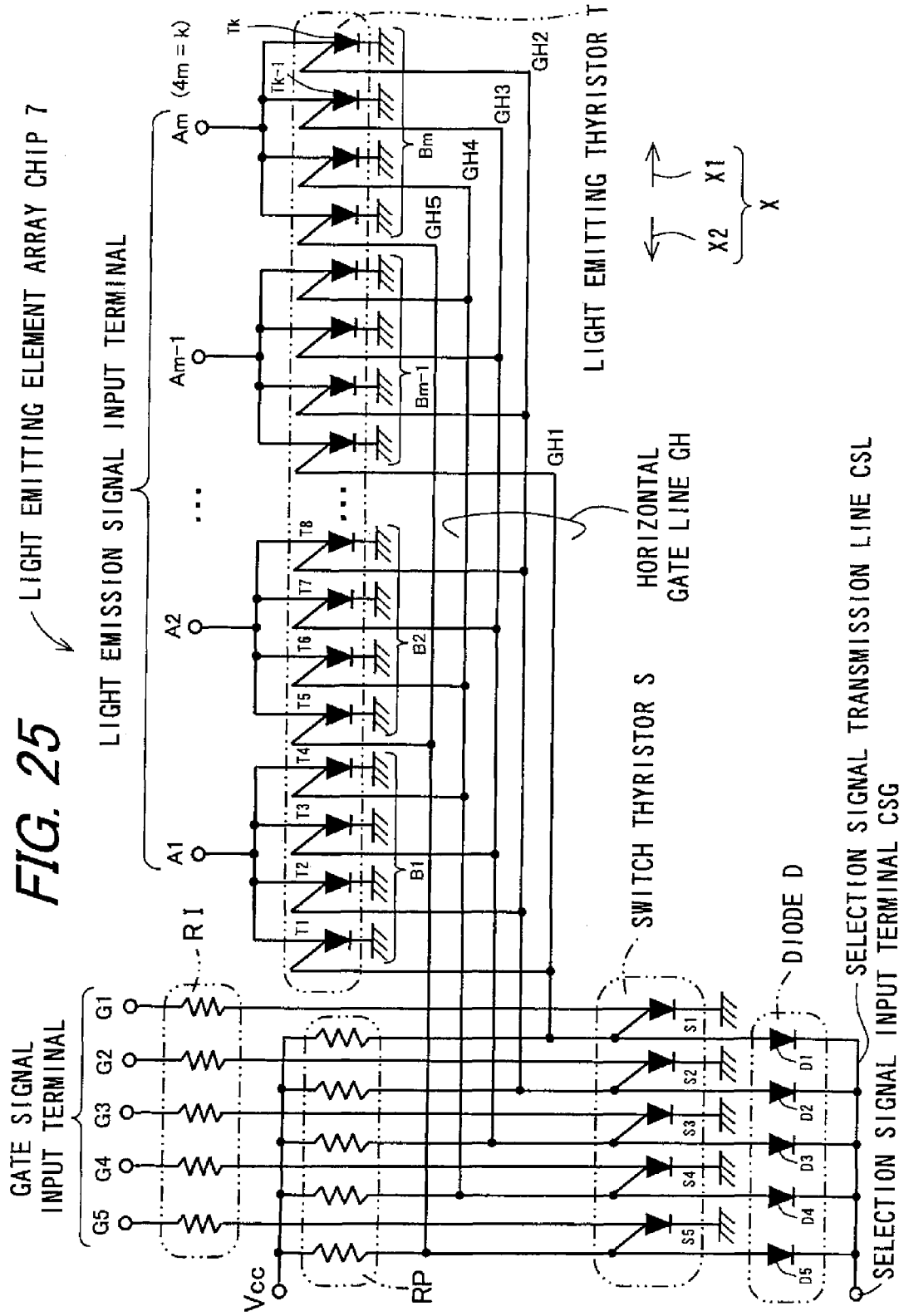
FIG. 25 is an equivalent circuit diagram schematically illustrating a light emitting element array chip according to a seventh embodiment of the invention.

FIG. 25 is an equivalent circuit diagram schematically illustrating a light emitting element array chip 7 according to a seventh embodiment of the invention. In the light emitting element array chip 6 according to this embodiment, the selection thyristors U of the light emitting element array chip 4 according to the fourth embodiment shown in FIG. 13 is replaced with the diodes D. The setting signal input terminal CSA is connected to a positive constant voltage source (Vcc). That is, the setting signal is constant with the lapse of time. Since the connections of the anodes and the cathodes of the diodes D are the same as those of the light emitting element array chip 5 according to the fifth embodiment shown in FIG. 19, description thereof will be omitted.

In the light emitting element array chip 7 according to this embodiment, similarly to the light emitting element array chip 4 according to the fourth embodiment, when the light emitting device employing the light emitting element array according to this embodiment is used as the exposure device exposing a photoreceptor drum, the great difference in light emission timing between the adjacent light emitting thyristors is suppressed. Accordingly, a discontinuous point is not generated at the exposure position on the photoreceptor drum. Since the concurrent light emission of the adjacent light emitting thyristors T is prevented, the difference in light emission of heat is suppressed when the light emitting thyristors T emit light, thereby making constant the light emission characteristic with the variation in temperature of the light emitting thyristors T. Since the interference of light emitted from the adjacent light emitting thyristors T can be prevented, it is possible to expose the photoreceptor drum with high precision. As a result, in the image forming apparatus employing the light emitting element array according to this embodiment, it is possible to obtain an image with high image quality.

Figure 26:
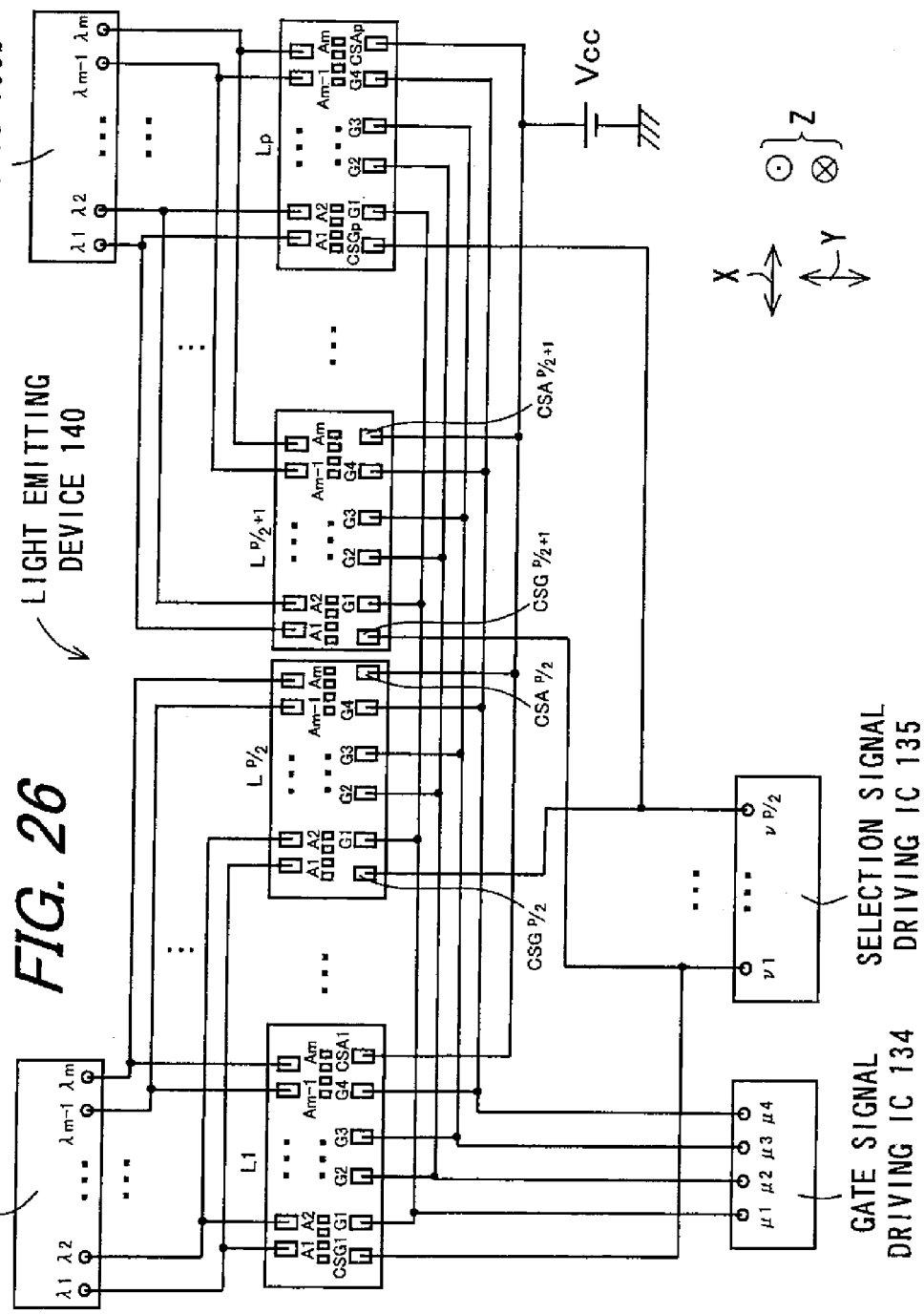
FIG. 26 is a block diagram schematically illustrating a light emitting device according to another embodiment.

FIG. 26 is a block diagram schematically illustrating a light emitting device according to another embodiment of the invention. The light emitting device 140 shown in FIG. 26 is different from the light emitting device 82 shown in FIG. 22, in that the writing speed to the photoreceptor drum due to the light emission of light is enhanced by using two light emission signal driving ICs, for example, when the light emitting device is used for the image forming apparatus. The components common to FIGS. 22 and 26 will be denoted by the same reference numerals and description thereof will be omitted.

The light emitting device 140 according to this embodiment includes a plurality of light emitting element array chips L1, L2, . . . , Lp-1, and Lp (wherein p is a positive even integer), a first light emission signal driving IC (Integrated Circuit) 133a and a second light emission signal driving IC 133b as the driving circuit of the light emitting element array chips 1 to Lp to feed the light emission signal, a gate signal driving IC 134 to feed the gate signal, and a selection signal driving IC 135 to feed the selection signal. The array chips L are mounted on the circuit board, where the light emitting elements T are arranged in a line in the arrangement direction X and the light emission direction of the light emitting elements T is set to be constant. The driving ICs output image information under the control of the above-mentioned control means 96. In this embodiment, the light emitting element array chip 1 according to the first embodiment shown in FIG. 1 is used as the array chips L.

The first light emission signal driving IC 133a and the second light emission signal driving IC 133b have the same number of (m) light emission signal output terminals λ1 to λm as the number of light emission signal bonding pads A1 to Am of the array chips L. When the array chips L are numbered from the one end to the other end in the arrangement direction X, the light emission signal bonding pads A of the first to p/2-th array chips are connected to the light emission signal output terminals λ of the first light emission signal driving IC 133a. The light emission signal bonding pads A of the (p/2+1)-th to p-th array chips L are connected to the second light emission signal driving IC. Specifically, when the light emission signal output terminals λ1 to λm are sequentially numbered with first to m-th numbers, the $i_{12}$-th light emission signal bonding pads $Ai_{12}$ (wherein $1 \leq i_{12} \leq m$) of the first to p/2-th array chips are electrically connected to each other and are electrically connected to the $i_{12}$-th light emission signal output terminal $\lambda i_{12}$ of the first light emission signal driving IC 133a. The $i_{13}$-th light emission signal bonding pads $Ai_n$ (wherein $1 \leq i_{13} \leq m$) of the (p/2+1)-th to p-th array chips are electrically connected to each other and are electrically connected to the $i_{12}$-th light emission signal output terminal $\lambda i_{13}$ of the first light emission signal driving IC 133a.

The gate signal driving IC 134 includes the same number of (4) gate signal output terminals μ1 to μ4 as the gate signal bonding pads G1 to G4 of the array chips L. The gate signal bonding pads G and the gate signal output terminals μ are connected to each other by sharing the wiring lines with different array chips. In this embodiment, when the gate signal bonding pads G1 to G4 are numbered with first to fourth numbers and the gate signal output terminals μ1 to μ4 are numbered with first to fourth numbers according to the order of from the one end to the other end in the arrangement direction X of the light emitting elements T of the respective array chips L, the $i_{13}$-th gate signal bonding pads $G1_n$ (wherein $1 \leq i_{13} \leq 4$) of the p array chips are electrically connected to each other and are electrically connected to the $i_{13}$-th gate signal output terminals $\mu i_{13}$.

The selection signal driving IC 135 includes the selection signal output terminals ν1 to νp/2 corresponding to the half number of (p/2) array chips L. Regarding the connections between the selection signal bonding pads CSG and the gate signal output terminals μ, one selection signal output terminal ν is connected to the selection signal bonding pads CSG of two array chips L. Specifically, when the array chips are numbered with first to p-th numbers and the selection signal output terminals ν1 to νp/2 are numbered with first to p/2-th numbers according to the order of from the one end to the other end in the arrangement direction X of the light emitting elements T of the respective array chips L, the selection signal bonding pad $CSGi_{14}$ of the $i_{14}$-th array chip L (wherein $1 \leq i_{14} \leq p/2$) is connected to the selection signal bonding pad $CSGp/2+i_{14}$ of the (p/2+$i_{14}$)-th array chip L are connected to each other and electrically connected to the $i_{14}$-th selection signal output terminal $\nu i_{14}$.

As described above, since one selection signal output terminal ν is connected to the selection signal bonding pads CSG of two array chips L, the selection signal driving IC 135 outputs the selection signal to the selection signal bonding pads CSG of two array chips L at a time to make two array chips L become the selected state at the same time. One of the array chips L in the selected state is one of the first to p/2-th array chips and the light emission signal is applied to the array chip from the first light emission signal driving IC 133a. The other is one of the (p/2+1)-th to p-th array chips and the light emission signal is applied to the array chip L from the second light emission signal driving IC 133b. Accordingly, since the group of the first to p/2-th array chips and the group of the (p/2+1)-th to p-th array chips can be driven at the same time, it is possible to write image information using the light emission of light at a speed higher two times than that of the configuration shown in FIG. 1.

Figure 27:
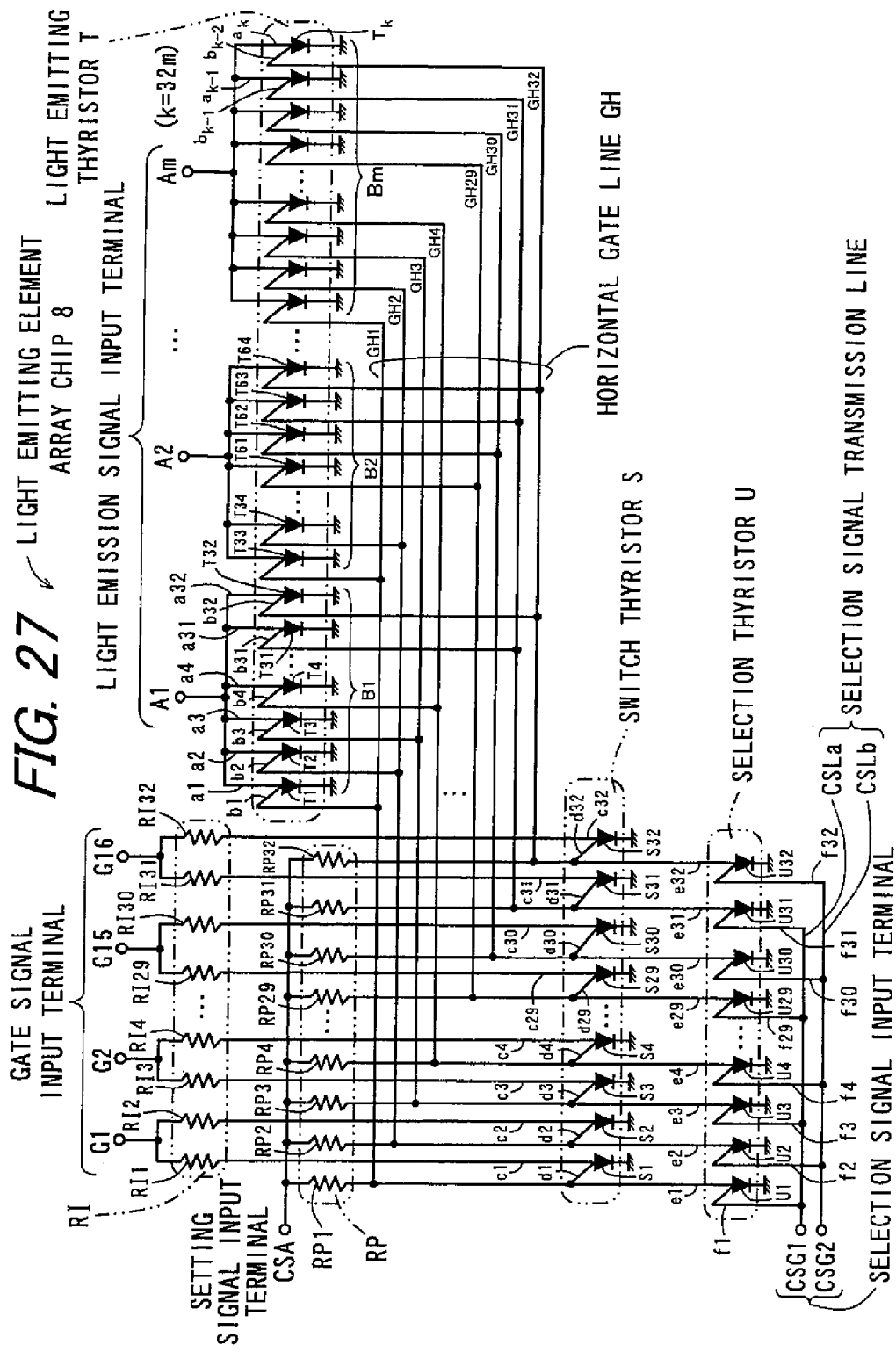
FIG. 27 is an equivalent circuit diagram schematically illustrating a light emitting element array chip according to an eighth embodiment of the invention.

FIG. 27 is an equivalent circuit diagram schematically illustrating a light emitting element array chip 8 according to an eighth embodiment of the invention. Since the light emitting element array chip 8 according to the eighth embodiment has a configuration in which the connections between the switch units of the light emitting element array chip 1 according to the first embodiment shown in FIG. 1 are modified, the common components will be denoted by the same reference numerals as the light emitting element array chip 1 shown in FIG. 1 and detailed description thereof will be omitted.

In the light emitting element array chip 8 shown in FIG. 27, n switch units (wherein n is an integer equal to or greater than 3) are divided into M switch groups (wherein M is an integer equal to or greater than 2) and the respective switch groups include N switch units (wherein N is an integer equal to or greater than 2). In FIG. 27, n=32, M=16, and N=2 are assumed. Similarly to the light emitting element array chip 1 according to the first embodiment shown in FIG. 1, the respective switch units include the pull-up resistors RP, the switch thyristors S, and the selection thyristors U. In FIG. 27, the respective switch groups are configured to include a combination of two switch units. For example, the first switch group includes the pull-up resistor RP1, the switch thyristor S1, and the selection thyristor U1 constituting the first switch unit, and the pull-up resistor RP2, the switch thyristor S2, and the selection thyristor U2 constituting the second switch unit. The $i_{20}$-th switch group (wherein $i_n$ is an integer satisfying $1 \leq i_{20} \leq M$) includes the pull-up resistor $RP2i_{20}-1$, the switch thyristor $S2i_{20}-1$, and the selection thyristor $U2i_{20}-1$ constituting the $(2i_{20}-1)$-th switch unit, and the pull-up resistor $RP2i_{20}$, the switch thyristor $S2i_{20}$, and the selection thyristor $U2i_{20}$ constituting the $2i_{20}$-th switch unit.

In the light emitting element array chip 8 according to this embodiment, M (M=16 in this embodiment) gate signal input terminals G1 to G16 are provided to correspond to the number of switch groups. The anodes c of the switch thyristors S of the respective switch groups are electrically connected to each other through the current-limiting resistors RI and are connected to the corresponding gate signal input terminals G. For example, the anodes $c2i_{20}-1$ and $c2i_{20}$ of the $(2i_{20}-1)$-th and $2i_{20}$-th switch thyristors $S2i_{20}-1$ and $S2i_{20}$ constituting the $i_{20}$-th switch group (wherein $i_{20}$ is an integer satisfying $1 \leq i_{20} \leq M$) are connected to the one-side ends of the current-limiting resistors $RI2i_{20}-1$ and $RI2i_{20}$, respectively, and both the other ends of two current-limiting resistors $RI2i_{20}-1$ and $RI2i_{20}$ are connected to the $i_{20}$-th gate signal input terminal $Gi_{20}$.

In this embodiment, N (N=2 in this embodiment) selection signal input terminals CSG1 and CSG2 (described simply as CSG when they are collectively referred to or when the unspecified ones are mentioned) are provided to correspond to the number of switch units of the respective switch groups. One of the gate electrodes f of two selection thyristors U of the respective switch groups is connected to the first selection signal input terminal CSG1 and the other is connected to the second selection signal input terminal CSG2. For example, in FIG. 27, the gate electrode $f2i_{20}-1$ of the $(2i_{20}-1)$-th selection thyristor $U2i_{20}-1$ of the $i_{20}$-th switch group (wherein $i_{20}$ is an integer satisfying $1 \leq i_{20} \leq M$) is connected to the first selection signal input terminal CSG1, and the gate electrode $f2i_{20}$ of the $2i_{20}$-th selection thyristor $U2i_{20}$ is connected to the second selection signal input terminal CSG2.

In the above-mentioned connection, in order to change the $(2i_{20}-1)$-th odd-numbered switch thyristor $S2i_{20}-1$ (wherein $i_{20}$ is an integer satisfying $1 \leqq i_{20} \leqq M$) to the ON state among the n switch thyristors S (n=32 in this embodiment), the gate signal of the high level is inputted to the $i_{20}$-th gate signal input terminal $Gi_{20}$ corresponding to the switch group to which the switch thyristor $S2i_{20}-1$ belongs, and the selection signal of the low level is inputted to the first selection signal input terminal CSG1 corresponding to the switch thyristor. In order to change the $2i_{20}$-th even-numbered switch thyristor $S2i_{20}$ (wherein $i_{20}$ is an integer satisfying $1 \leqq i_{20} \leqq M$) to the ON state, the gate signal of the high level is inputted to the $i_{20}$-th gate signal input terminal $Gi_{20}$ corresponding to the switch group to which the switch thyristor $S2i_{20}$ belongs, and the gate signal of the low level is inputted to the second selection signal input terminal CSG2 corresponding to the switch thyristor. Accordingly, by time-divisionally sequentially inputting the selection signal of the low level to the N (N=2 in this embodiment) selection signal input terminals CSG and time-divisionally sequentially inputting the gate signal of the high level to the M (M=16 in this embodiment) gate signal input terminals G, the switch thyristors S can be changed to the ON state in the predetermined order.

In the light emitting element array chip 8 according to this embodiment, compared with the light emitting element array chip 1 according to the first embodiment, the number of gate signal input terminals G can be reduced from 32 corresponding to the same number as the number of switch thyristors to 16 corresponding to the half thereof by increasing the number of selection signal input terminals CSG by 1 into 2. In this way, by reducing the number of bonding pads, this embodiment exhibits an excellent operational advantage that the light emitting thyristors T can increase in density.

The advantages of this embodiment will be described with reference to a specific example. For example, in the light emitting element array chip, it is assumed that the number n of the switch thyristors is 32, the number m of light emitting element blocks is 24, and the respective light emitting element blocks include 32 light emitting thyristors T. The light emitting element array chip includes 768 (=24×32) light emitting thyristors T. In order to embody a light emitting device having 2400 dpi (dots per inch) using the light emitting element array chip, the length in the arrangement direction X of the light emitting thyristors T in one light emitting element array chip is about 8.1 mm.

When the switch group is not used like the light emitting element array chip 1 according to the first embodiment, thirty-two bonding pads for the gate signal imputer terminals, one bonding pad for the selection signal input terminal, one bonding pad for the setting signal input terminal, and twenty-four bonding pads for the light emission signal input terminals are required and thus fifty-eight bonding pads in total are required for one chip. In this case, when the bonding pads are arranged in the arrangement direction of the light emitting thyristors T, the pad pitch of the bonding pads is 137 μm. Accordingly, when the minimum size of the bonding pad permitting the wire bonding method is about 100 μm, it is difficult to dispose the switch thyristors S between the bonding pads, like the light emitting element array chip 1 according to the first embodiment.

On the other hand, in the light emitting element array chip 8 according to this embodiment, the number of bonding pads for the gate signal input terminals is reduced to 16 which is the half and the number of selection signal input terminals is enhanced to 2. As a result, since the number of necessary bonding pads is 43 and the pad pitch of the bonding pads is 184 μm, it is possible to dispose the switch thyristors S between the bonding pads, thereby embodying a small-sized and high definition light emitting device.

Figure 28:
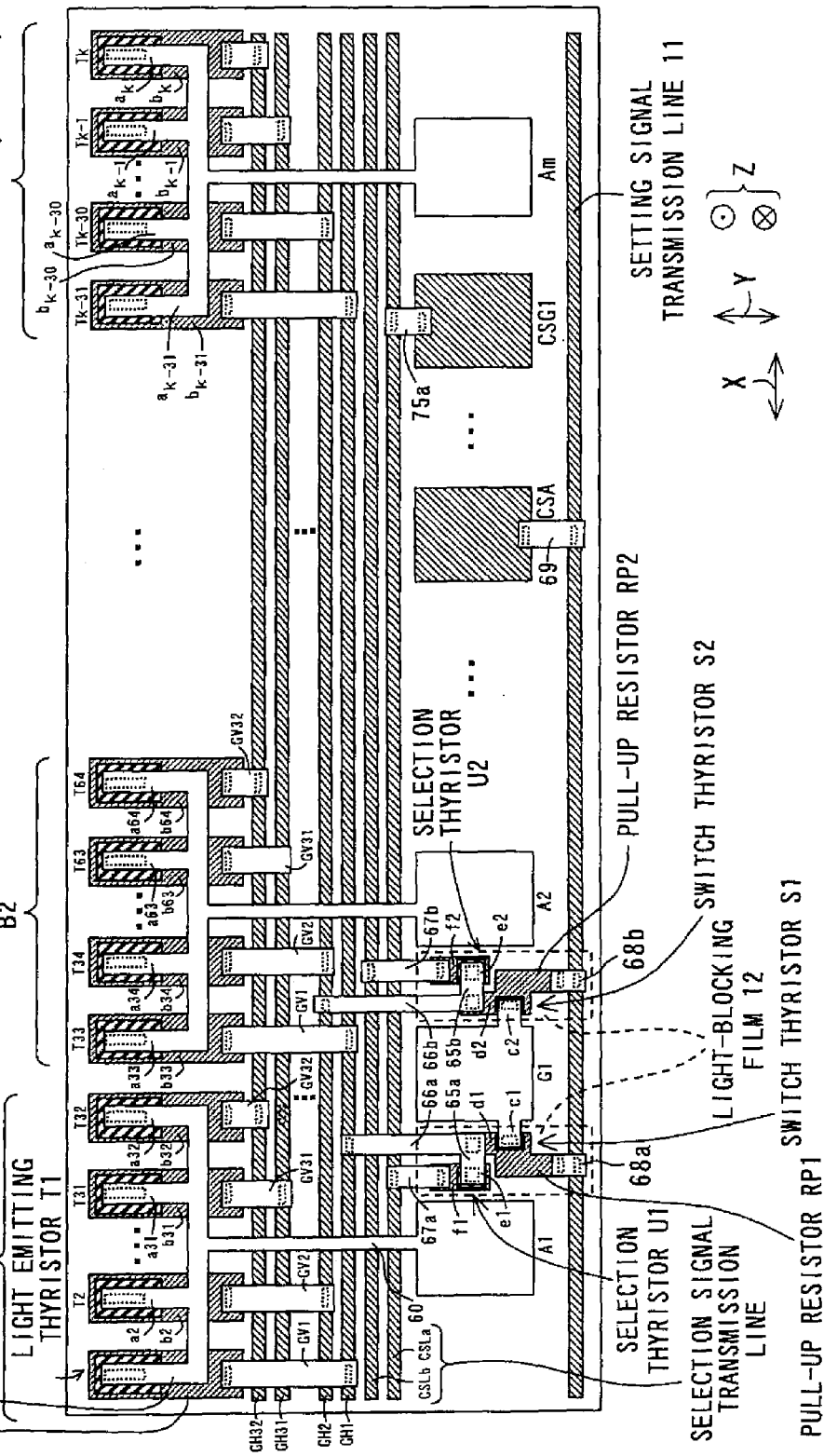
FIG. 28 is a partial plan view illustrating a basic configuration of the light emitting element array chip according to the eighth embodiment.

FIG. 28 is a partial plan view illustrating a basic configuration of the light emitting element array chip 8 according to the eighth embodiment. The plan view of the drawing corresponds to the schematic equivalent circuit diagram shown in FIG. 27. As described above, the difference from the light emitting element array chip 1 according to the first embodiment is that n switch units are classified into switch groups including two switch units and the connections between the switch groups and the gate signal input terminals G and the selection signal input terminals CSG are modified. Since n=32 is assumed in FIG. 28, the number of light emitting thyristors T and the number of horizontal gate lines GH included in the respective light emitting element blocks B are changed to 32. Since the other elements are similar to those of the light emitting element array chip 1 according to the first embodiment shown in FIG. 6, the common components will be denoted by the same reference numerals and description thereof will be omitted. FIG. 28 shows a plan view of the light emitting element array chip 8 disposed so that the light emission direction of the light emitting thyristors T is perpendicular to the drawing surface and directed to the front side thereof. The horizontal gate lines GH1 to GH32, the selection signal transmission lines CSLa and CSLb, the setting signal transmission line 11, the light emitting thyristors T, the switch thyristors S, the pull-up resistors RP, the selection thyristors U, the selection signal bonding pad CSG1, and the setting signal bonding pad CSA are hatched for the purpose of easy understanding.

Specific differences between this embodiment and the first embodiment will be described. In the light emitting element array chip 1 according to the first embodiment shown in FIG. 6, one selection signal transmission line CSL to feed the selection signal to the switch thyristors S is provided. On the contrary, in the light emitting element array chip 8 according to this embodiment shown in FIG. 28, two selection signal transmission lines CSLa and CSLb are disposed adjacent to the horizontal gate line GH1 so as to be parallel to the horizontal gate line GH1. Here, the first selection signal transmission line CSLa is electrically connected to the first selection signal bonding pad CSG1 through the first connecting portion 75a. The same is true in the second selection signal transmission line CSLb (not shown).

In the light emitting element array chip 1 according to the first embodiment shown in FIG. 6, one pull-up resistor RP, one switch thyristor S, and one selection thyristor U are disposed for the respective gate signal bonding pads G. On the contrary, in this embodiment shown in FIG. 28, two are disposed on both sides along the arrangement direction X for the respective gate signal bonding pads G.

The specific connection will be described with reference to the first gate signal bonding pad G1 shown in FIG. 28.

First, the anodes c1 and c2 of the first and second switch thyristors S1 and S2 are formed integrally with the first gate signal bonding pad G1 and thus are electrically connected to each other.

The gate electrodes d1 and d2 of the first and second switch thyristors S1 and S2 are formed of the third semiconductor layer 34. The gate electrode d1 of the first switch thyristor S1 is connected to the anode e1 of the first selection thyristor U1 through a connecting portion 65a and is connected to the first horizontal gate line GH1 through a connecting portion 66a. The connecting portions 65a and 66a are formed integrally with the anode e1 of the first selection thyristor U1. Similarly, the gate electrode d2 of the second switch thyristor S2 is connected to the anode e2 of the second selection thyristor U2 through a connecting portion 65b and is connected to the second horizontal gate line GH2 through a connecting portion 66b. The connecting portions 65b and 66b are formed integrally with the anode e2 of the second selection thyristor U2.

The third semiconductor layer 34 of the first selection thyristor U1 forms the gate electrode f1, which is connected to the first selection signal transmission line CSLa through a connecting portion 67a. The third semiconductor layer 34 of the second selection thyristor U2 forms the gate electrode f2, which is connected to the second selection signal transmission line CSLb through a connecting portion 67b. The third semiconductor layers 34 of the first and second switch thyristors S1 and S2 extend in the direction apart from the horizontal gate line GH1 and serve as the pull-up resistors RP1 and RP2, respectively. In the third semiconductor layers 34 as the pull-up resistors RP1 and RP2, the ends close to the setting signal transmission line 11 are connected to the setting signal transmission line 11 through the connecting portions 68a and 68b, respectively.

Since the specific sectional structure of the chip, the materials of the semiconductor layers, and the manufacturing method of the light emitting element array chip 8 according to this embodiment are similar to the first embodiment and has been described with reference to FIGS. 7 to 9, the specific description thereof will be omitted.

Figure 29:
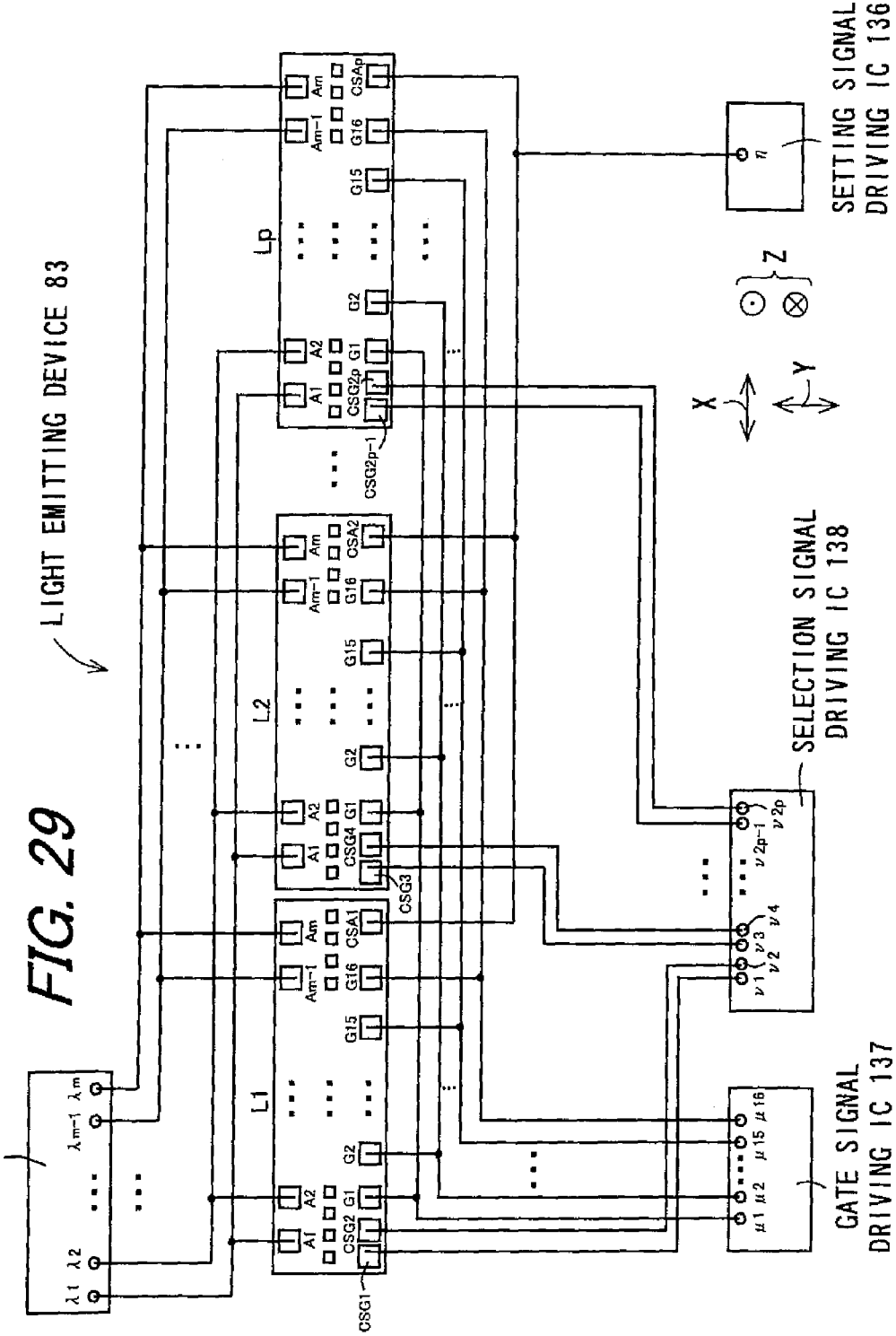
FIG. 29 is a block diagram schematically illustrating a light emitting device employing the light emitting element array chip according to the eighth embodiment shown in FIGS. 27 and 28.

FIG. 29 is a block diagram schematically illustrating a light emitting device 83 employing the light emitting element array chip 8 according to the eighth embodiment shown in FIGS. 27 and 28. The difference from the light emitting device 10 employing the light emitting element array chip 1 according to the first embodiment shown in FIG. 10 is that the respective light emitting element array chips L include two selection signal bonding pads CSG and 16 gate signal input terminals G and that the gate signal driving IC 137 having 16 gate signal output terminals μ and the selection signal driving IC 138 having 2p selection signal output terminals ν are used. Since the other elements are similar to those of the light emitting device 10 shown in FIG. 10, the common components will be denoted by the same reference numerals and description thereof will be omitted.

The gate signal output terminals p of the gate signal driving IC 137 are connected to the corresponding gate signal bonding pads G of the array chips L, and the gate signal bonding pads of the array chips L are connected to each other. This point is similar to the light emitting device 10 shown in FIG. 10. On the other hand, since two selection signal bonding pads CSG are disposed in the respective array chips L, 2p selection signal bonding pads are provided in the light emitting device. The 2p selection signal bonding pads CSG are connected to the 2p selection signal output terminals ν of the selection signal driving IC 138 one on one. Accordingly, the selection signal can be individually applied to the selection signal bonding pads, and the gate signal bonding pads G and the wiring lines of the gate signal driving IC 137 can be shared by the array chips L.

Figure 30:
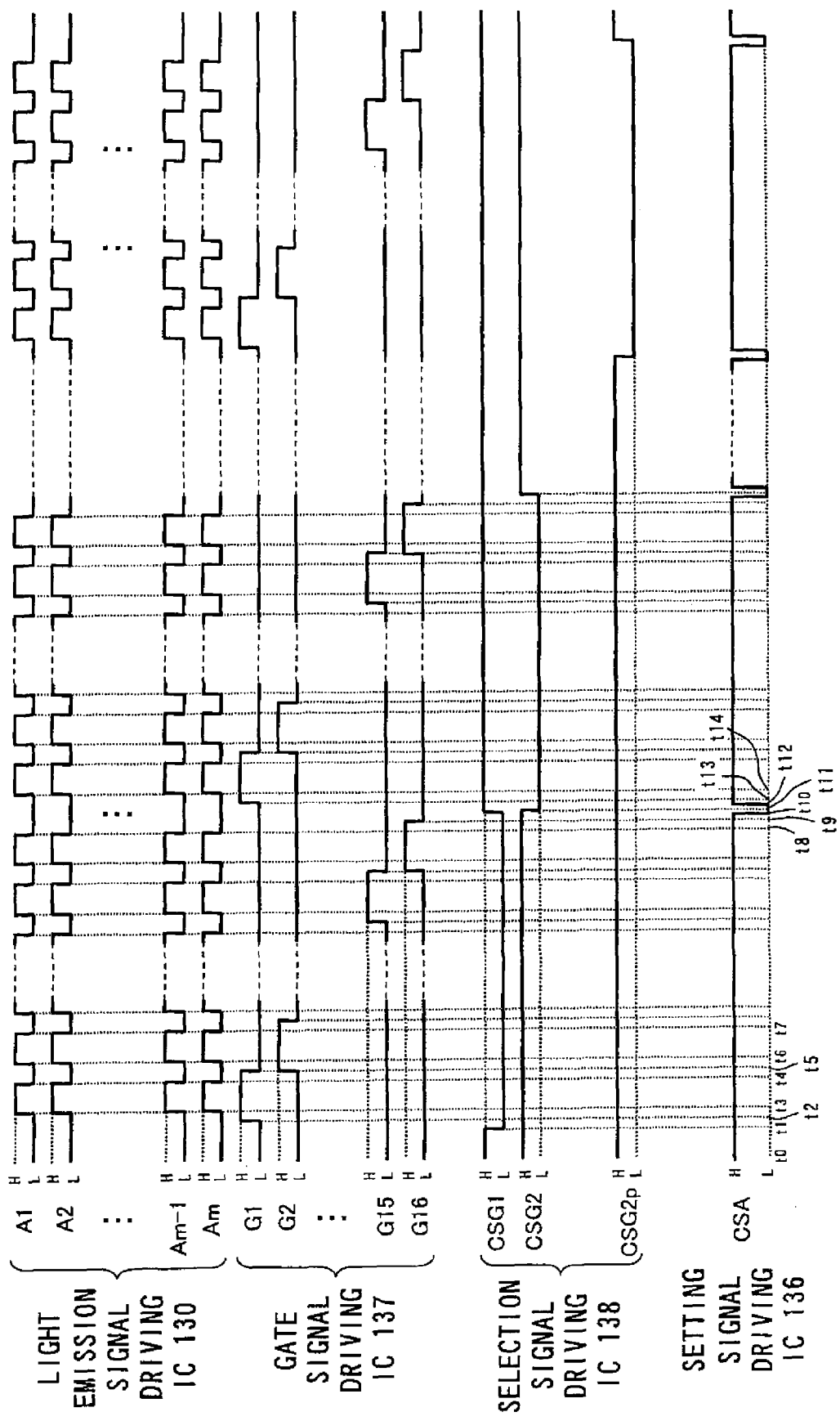
FIG. 30 is a timing chart illustrating an operation of the light emitting device shown in FIG. 29.

FIG. 30 is a timing chart illustrating an operation of the light emitting device 83 shown in FIG. 29, where the horizontal axis represents the elapsed time from a reference time and the vertical axis represents the signal level by a magnitude of a voltage or current. In FIG. 11, waveforms of the voltages outputted from the signal output terminals (the light emission signal output terminals A, the gate signal output terminals μ, the selection signal output terminals ν, and the setting signal output terminals η) of the light emission signal driving IC 130, the gate signal driving IC 137, the selection signal driving IC 138, and the setting signal driving IC 136 are shown. The reference numerals of the bonding pads (signal input terminals) connected to the signal output terminals are used as the reference numerals of the output waveforms.

Here, the magnitudes of the high (H) levels and the low (L) levels of the signals are equal to those of the timing chart of the light emitting device 10 shown in FIG. 11. That is, the light emission signal driving IC 130 outputs a constant current of 5 mA at the high. (H) level, and outputs a constant current of 0 mA at the low (L) level. The gate signal driving IC 137 outputs a constant voltage of 5 V at the high (H) level, and outputs a constant voltage of 0 V at the low (L) level. The selection signal driving IC 138 outputs a constant voltage of 5 V at the high (H) level, and outputs a constant voltage of 0 V at the low (L) level. The setting signal driving IC 136 outputs a constant voltage of 5 V at the high (H) level, and outputs a constant voltage of 0 V at the low (L) level.

The operation of the light emitting device 83 will be described with the lapse of time with reference to FIG. 30. At time to, since the voltage of the selection signal output terminal ν is the high (H) level, no array chip L is in the selected state. At time t1, by setting the voltage of the selection signal output terminal ν1 connected to the first selection signal input terminal CSG1 of the first array chip L1 to the low (L) level, the potential of the gate electrodes d of the odd-numbered switch thyristors S electrically connected to the first selection signal input terminal CSG1 of the first array chip L1 becomes substantially the diffusion potential of the PN junction into the selected state. At time t2, the voltage of the high (H) level is applied to the first gate signal input terminals G1 of the array chips L. Then, the first switch thyristor S1 of the odd-numbered switch thyristors S of the first array chip L1 in the selected state is switched to the ON state, and the potential of the gate electrode d1 of the switch thyristor S1 and the potential of the horizontal gate line GH1 connected to the gate electrode d1 becomes substantially the low level (0 V). At time t3, the light emission signals are inputted to the light emission signal input terminals A1 to Am of the array chips. Then, in the first array chip L1, the light emitting thyristor T connected to the first horizontal gate line GH1 emits light. At time t4, since the voltage of the light emission signal output terminals λ return to the low (L) level, the light emitting thyristor is extinguished. At time t5, the voltage of the gate signal output terminal μ1 connected to the first gate signal input terminal G1 returns to the low (L) level and the voltage of the gate signal output terminal μ2 connected to the second gate signal input terminal G2 becomes the high (H) level. Then, the third switch thyristor S3 of the switch thyristors S the first array chip L1 in the selected state is switched to the ON state. At times t6 and t7, the light emission signals are inputted again to the light emission signal input terminals A1 to Am of the array chips. Then, in the first array chip L1, the light emitting thyristor T connected to the third horizontal gate line GH3 emits light. Subsequently, the light emitting thyristors T connected to the odd-numbered horizontal gate lines GH sequentially emit light in the order of the fifth, seventh, . . . . At time t8, since the voltage of the gate signal output terminal μ16 connected to the sixteenth gate signal input terminal G16 becomes the high (H) level and the voltage of the light emission signal output terminals λ connected to the light emission signal input terminals A1 to Am of the array chips return to the low (L) level, the light emitting thyristor T connected to the thirty-first horizontal gate line GH31 is extinguished. At time t9, the voltage of the gate signal output terminal μ16 connected to the sixteenth gate signal input terminal G16 returns to the low (L) level. In this state, all the switch thyristors S in the first array chip L1 are changed to the OFF state, but the odd-numbered selection thyristors U of the first array chip L1 are maintained in the ON state. Accordingly, in order to change the odd-numbered selection thyristors U to the OFF state, at time t10, the setting signal driving IC 136 is set from the high (H) level to the low (L) level. As a result, the odd-numbered selection thyristors U of the first array chip L1 are changed to the OFF state. At time t11, the voltage of the selection signal output terminal v1 connected to the first selection signal input terminal CSG1 of the first array chip L1 is made to return to the high (H) level and the voltage of the selection signal output terminal v2 connected to the second selection signal input terminal CSG2 is made to be the low (L) level. At time t12, when the voltage of the setting signal output terminal η connected to the setting signal input terminal CSA is made to return to the high (H) level, the even-numbered selection thyristors U connected to the second selection signal input terminal CSG2 of the first array chip L1 is changed to the ON state and the potential of the gate electrodes d of the even-numbered switch thyristors S becomes substantially equal to the diffusion potential of the PN junction into the selected state.

Subsequently, similarly to the case where the odd-numbered switch thyristors become the selected state, by sequentially applying the gate signal to the gate signal input terminals G, the light emitting thyristors T connected to the even-numbered horizontal gate lines GH in the first array chip L1 can be made to sequentially emit light. For example, at time t13, the voltage of the gate signal output terminal μ1 connected to the first gate signal input terminal G1 becomes the high (H) level. At time t14, the light emission signals are inputted to the light emission signal input terminals A1 to Am of the array chips. Then, in the first array chip L1, the light emitting thyristor T connected to the second horizontal gate line GH2 emits light. The same operation is performed in the array chips L subsequent to the second array chip. In this way, by applying the selection signal, the gate signal, and the light emission signal in the predetermined order, the light emitting device 83 can be driven time-divisionally.

In the description with reference to FIG. 30, the voltage of the setting signal output terminal η is changed to the high (H) level at time t12, the voltage of the gate signal output terminal μ1 is changed to the high (H) level at time t13, and the voltage of the light emission signal output terminal λ1 is changed to the high (H) level at time t14. In this way, the rising in voltage of the setting signal output terminal η need to be performed earlier than the rising in voltage of the gate signal output terminal μ and the light emission signal output terminal λ.

As described above, according to the light emitting element array chip 8 of the eighth embodiment, in addition to the operational advantages of the light emitting element array chip 1 according to the first embodiment, since the plurality of switch groups in the respective light emitting element array chip 8 are time-divisionally driven, it is possible to reduce the number of output terminals of the gate signal driving IC 137 to feed the gate signal and the number of wiring lines to connect the output terminals μ of the gate signal driving IC to the gate signal bonding pads G of the respective light emitting element array chips 8, thereby embodying a small-sized light emitting device. Since the number of gate signal bonding pads G in the light emitting element array chip 8 can be reduced, it is possible to embody a small-sized light emitting element with a high degree of integration of the light emitting thyristors T.

Figure 31:
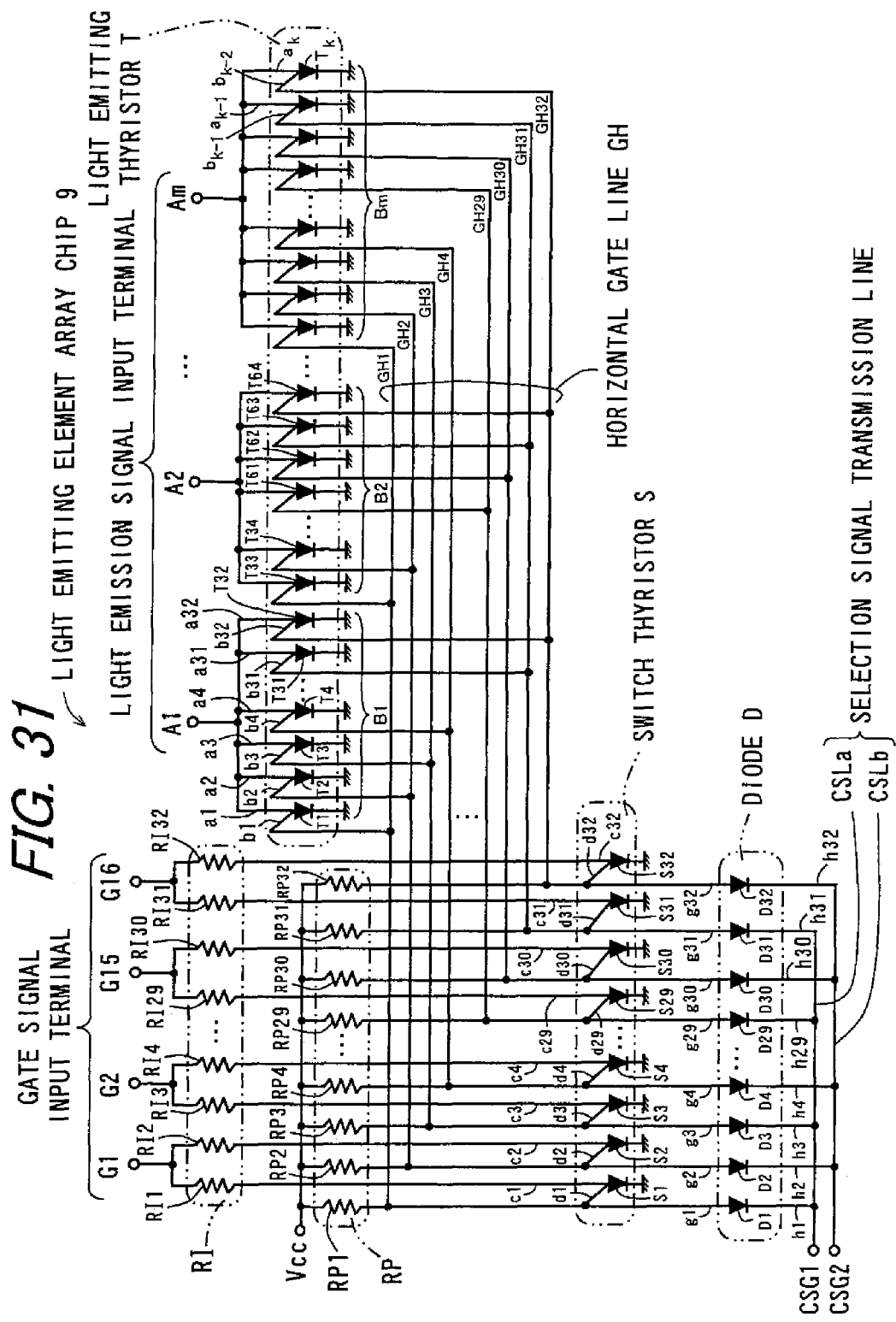
FIG. 31 is an equivalent circuit diagram schematically illustrating a light emitting element array chip according to a ninth embodiment of the invention.

FIG. 31 is an equivalent circuit diagram schematically illustrating a light emitting element array chip 9 according to a ninth embodiment of the invention. In the light emitting element array chip 9 according to this embodiment, the selection thyristors U of the light emitting element array chip 8 according to the eighth embodiment shown in FIG. 27 are replaced with the diodes D. The anodes g of the diodes D correspond to the anodes e of the selection thyristors U of the light emitting element array chip 8 according to the eighth embodiment and are connected to ends of the pull-up resistors RP. The cathodes h of the diodes D correspond to the gate electrodes f of the selection thyristors U of the light emitting element array chip 8 according to the eighth embodiment and are connected to the selection signal input terminals CSG. In this embodiment, the cathodes h of the odd-numbered diodes D are connected to the first selection signal input terminal CSG1 and the cathodes h of the even-numbered diodes D are connected to the second selection signal input terminal CSG2. The setting signal input terminal CSA is connected to a positive constant voltage source (Vcc). That is, the setting signal is constant with the lapse of time. Since the light emitting element array chip 9 according to this embodiment is the same as the light emitting element array 8 according to the eighth embodiment, the common components will be denoted by the same reference numerals and description thereof will be omitted.

As described with reference to the light emitting element array chip 5 according to the fifth embodiment shown in FIG. 19, the diodes D do not have the gate electrode f unlike the selection thyristor U and are switched between the ON state and the OFF state only by the potential difference between the anodes g and the cathodes h. Accordingly, even when the setting signal has a constant voltage, the ON state and the OFF state of the diodes D can be switched by applying the selection signal thereto.

Figure 32:
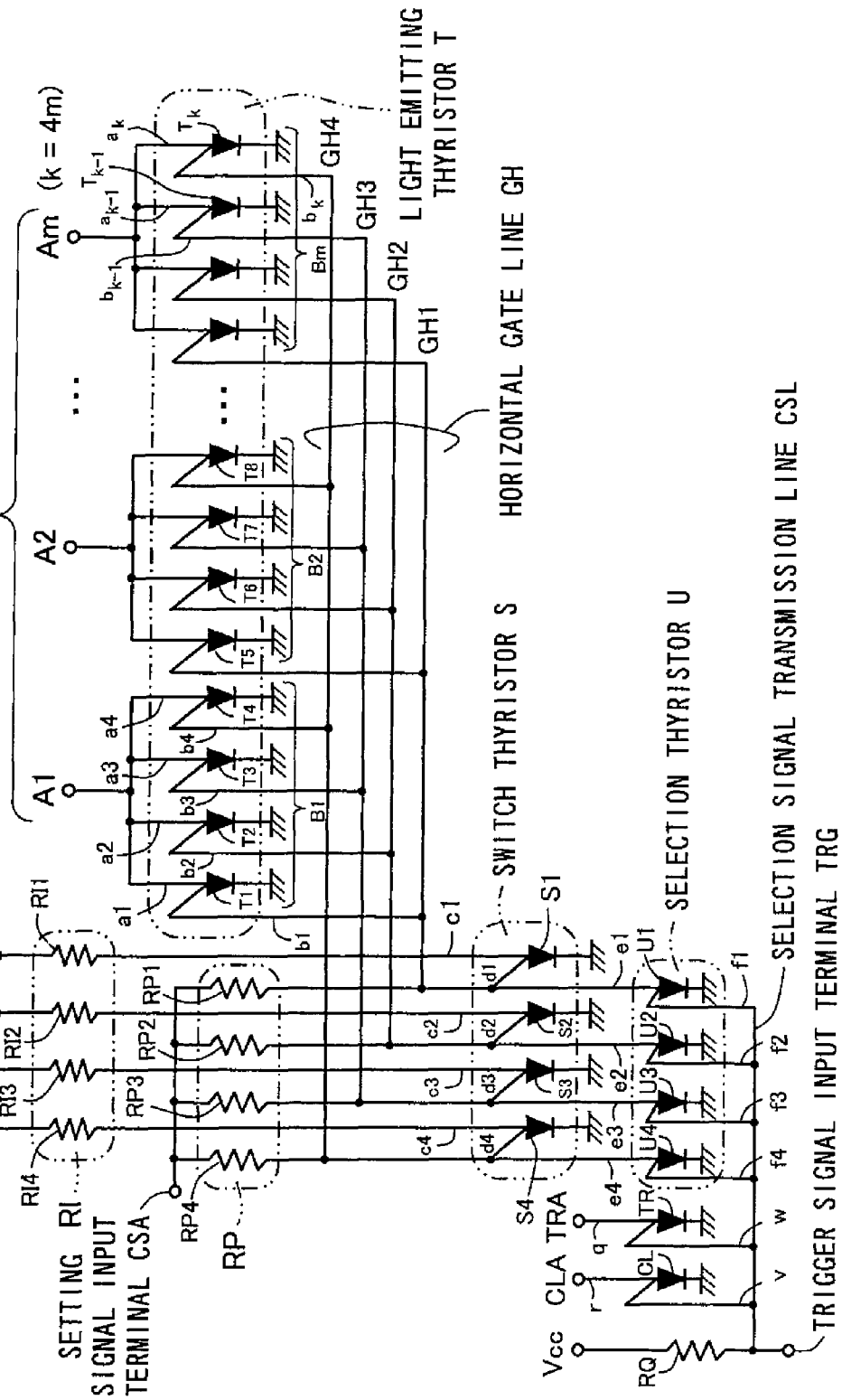
FIG. 32 is an equivalent circuit diagram schematically illustrating a light emitting element array chip according to a tenth embodiment of the invention.

FIG. 32 is an equivalent circuit diagram schematically illustrating a light emitting element array chip 210 according to a tenth embodiment of the invention. The light emitting element array chip 210 according to the tenth embodiment has a configuration in which one second switch unit to transmit a trigger signal is added to the light emitting element array chip 1 according to the first embodiment shown in FIG. 10. Since the other elements are similar to those of the light emitting element array chip 1 according to the first embodiment shown in FIG. 1, the common components will be denoted by the same reference numerals and description thereof will be omitted.

In FIG. 32, the second switch unit includes a clock thyristor CL formed of an emission thyristor, a trigger thyristor TR formed of an emission thyristor, and a second pull-up resistor RQ. The second pull-up resistor RQ corresponds to the second resistor.

In the clock thyristor CL of the second switch unit, the anode r is connected to the clock signal input terminal CLA, the N-gate electrode v is connected to the selection signal transmission line CSL, and the cathode is grounded as a common electrode. The N-gate electrode v may be described simply as the gate electrode v. In the trigger thyristor TR of the second switch unit, the anode q is connected to the trigger signal input terminal TRA, the N-gate electrode w is connected to the selection signal transmission line CSL, and the cathode is grounded as a common electrode. The N-gate electrode w may be described simply as the gate electrode w. In the second pull-up resistor RQ of the second switch unit, one end thereof is connected to the selection signal transmission line CSL and the other end is supplied with a positive voltage Vcc. Here, the selection signal transmission line CSL is used as the transmission line of the selection signal as the first selection signal and is connected to the trigger signal input terminal TRG. The trigger signal input terminal TRG is used to input the input trigger signal.

The operation of the schematic equivalent circuit diagram of the light emitting element array chip 210 shown in FIG. 32 will be described now. The function of the light emitting element array chip 210 can be divided by the second switch unit relevant to the function of transmitting the trigger signal and the switch unit and the light emitting thyristors T relevant to the time-division driving and the light emission of light in the respective light emitting element arrays. The operations of the switch unit and the light emitting thyristors T have been described with reference to FIGS. 3 to 5.

The specific configuration and operation of the second switch unit relevant to the transmission of the trigger signal in the light emitting element array chip 210 shown in FIG. 32 will be described now.

Figure 33:
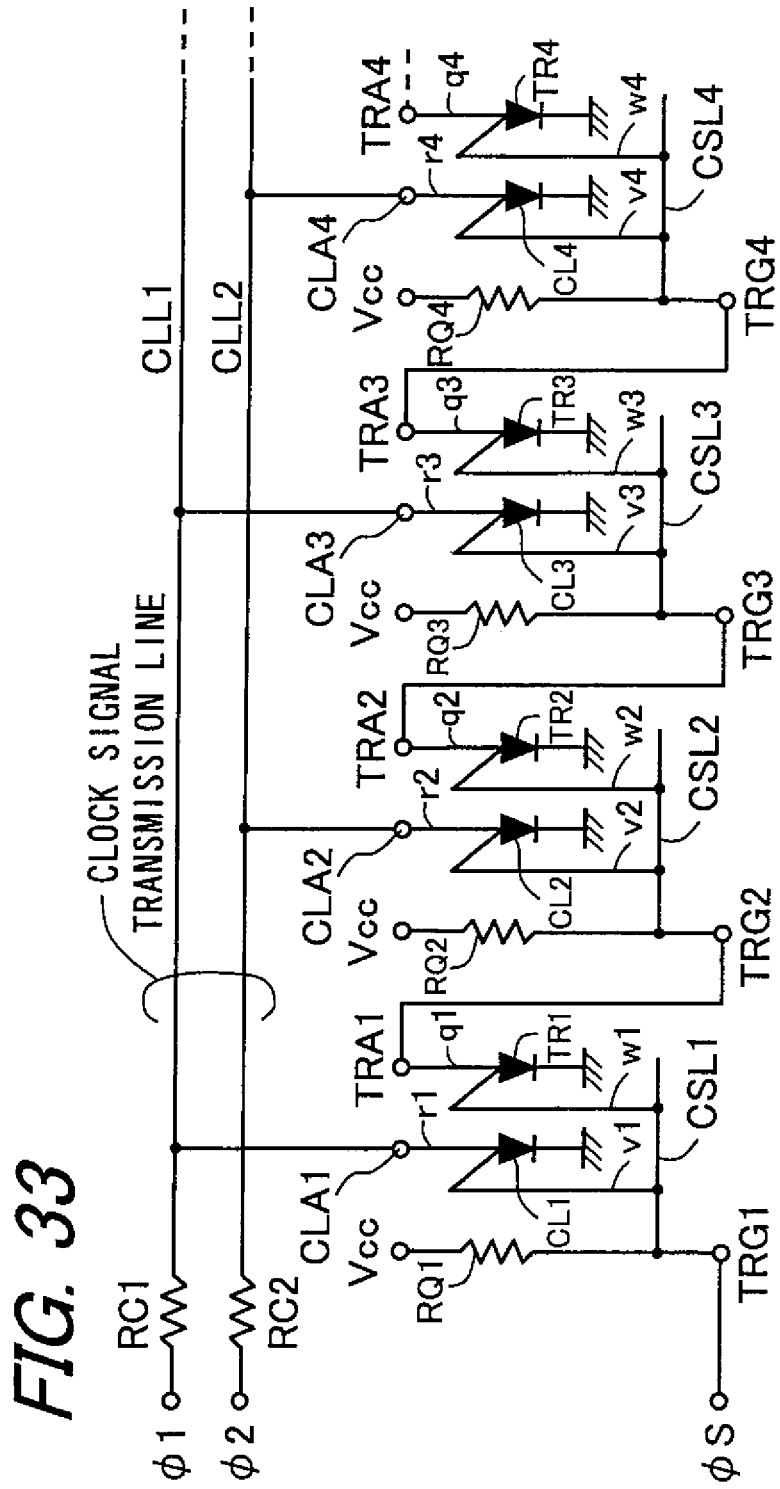
FIG. 33 is an equivalent circuit diagram illustrating the connection between the second switch units of respective light emitting element array chips which configure a light emitting device.

FIG. 33 is an equivalent circuit diagram illustrating the connection between the second switch units of the light emitting element array chips 210 when four or more light emitting element array chips 210 are arranged in a line to configure a light emitting device. Since FIG. 33 shows a part of the equivalent circuit diagram shown in FIG. 32, the common components will be denoted by the same reference numerals and description thereof will be omitted. In FIG. 33, the light emitting element arrays are numbered from the first number in the arrangement direction of the light emitting element arrays, and a specific light emitting element array is identified by attaching a number to the end of the reference numeral. For example, in the $i_{17}$-th light emitting element array chip 1 in the arrangement direction, the $i_{17}$-th clock thyristor is denoted by $CLi_{17}$ (wherein $i_{17}$ is a natural number).

As shown in FIG. 33, when four or more light emitting element array chips 210 are used to configure a light emitting device, a plurality of clock signal transmission lines are disposed to input different-timing clock signals to the adjacent light emitting element array chips 210. In FIG. 33, two clock signal transmission lines CLL1 and CLL2 (simply described as CLL when they are collectively referred to or when an unspecified one is mentioned) is provided. The voltage in which the high (H) level and the low (L) level are inverted is outputted from the output terminals φ1 and φ2 of the diving IC to feed a clock signal to two clock signal transmission lines CLL1 and CLL2. When the voltage of the clock signal output terminals φ1 and φ2 is at the high (H) level, the clock signal is supplied. Load resistors RC1 and RC2 are connected to the clock signal output terminals φ1 and φ2, and the clock signal is supplied to the clock thyristors CL of the light emitting element array chips 210 through the load resistors RC1 and RC2. Here, the anode r1 of the first clock thyristor CL1 is connected to the first clock signal transmission line CLL1 and the anode r2 of the second clock thyristor CL2 is connected to the second clock signal transmission line CLL2. Similarly, the odd-numbered clock thyristors CL in the arrangement direction of the light emitting element arrays are connected to the first clock signal transmission line CLL1, and the even-numbered clock thyristors CL are connected to the second clock signal transmission line CLL2. Accordingly, the anodes r of the clock thyristors CL of the adjacent light emitting element array chips 210 are connected to the different clock signal transmission lines CLL, respectively, and are supplied with different-timing clock signals.

As shown in FIG. 33, the anode q1 of the first trigger thyristor TR1 is connected to the second trigger signal input terminal TRG2, and the anode q2 of the second trigger thyristor TR2 is connected to the third trigger signal input terminal TRG3. Similarly, in the two adjacent light emitting element array chips 210, the anode q of the trigger thyristor TR close to the first light emitting element array chip 210 is connected to the trigger signal input terminal TRG apart therefrom. Accordingly, the anodes q of the trigger thyristors TR of the light emitting element array chips 210 are supplied with a positive voltage Vcc. Since the first trigger signal input terminal TRG1 is connected to the N-gate electrode w1 of the first trigger thyristor TR1 and the second trigger signal input terminal TRG2 is connected to the anode q1 of the first trigger thyristor TR1, the first trigger signal input terminal TRG1 and the second trigger signal input terminal TRG2 are connected through the PN-junction diode including the anode q1 and the N-gate electrode w1 of the first trigger thyristor TR1. Similarly, the second trigger signal input terminal TRG2 and the third trigger signal input terminal TRG3 are connected to each other through the PN-junction diode formed by the anode q2 and the N-gate electrode w2 of the second trigger thyristor TR2. In this way, in the order of the arrangement direction of the light emitting element array chips 210, the $i_{17}$-th trigger signal input terminal $TRGi_{17}$ is connected to the $(i_{17}+1)$-th trigger signal input terminal $TRGi_{17}+1$ through the PN-junction diode formed by the anode $qi_n$ and the N-gate electrode $wi_{17}$ of the $i_{17}$-th trigger thyristor $TRi_{17}$ (wherein $i_{17}$ is a natural number).

In the equivalent circuit diagram shown in FIG. 33, a principle that the input trigger signal inputted to the trigger signal input terminal of the first light emitting element array chip 210 is sequentially transmitted in the arrangement order of the light emitting element array chips 210 will be described now.

Figure 34:
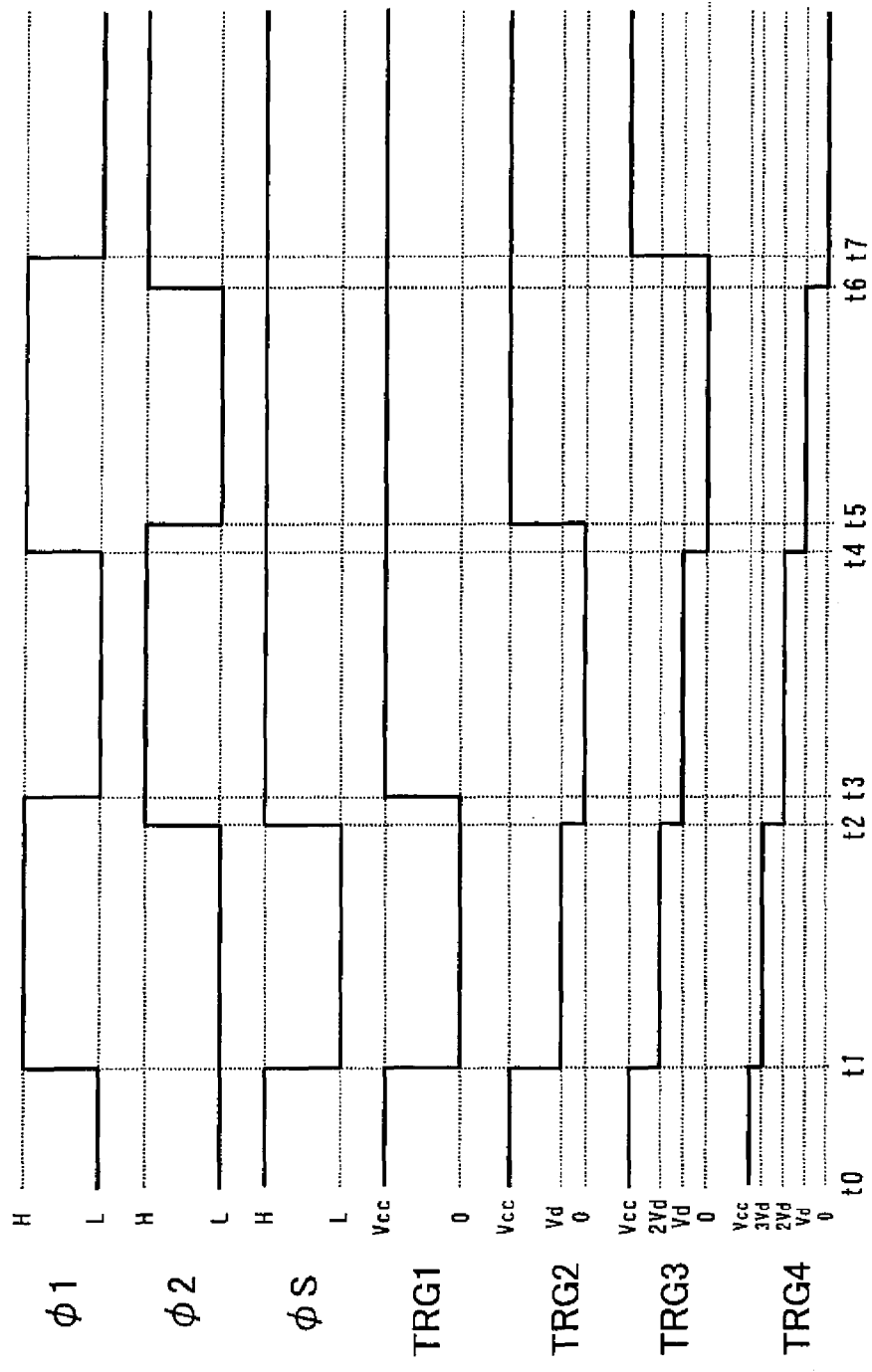
FIG. 34 is a timing chart illustrating an operation of the equivalent circuit diagram shown in FIG. 33.

FIG. 34 is a timing chart illustrating an operation of the equivalent circuit diagram shown in FIG. 33, where the horizontal axis represents the elapsed time from a reference time and the vertical axis represents the signal level by a magnitude of a voltage or current. In FIG. 34, voltage waveforms of the output terminals φ1 and φ2 of the driving IC to feed the clock signals through the clock signal transmission lines CLL1 and CLL2, voltage waveforms of the output terminal φS of the driving IC to feed the input trigger signal to the first trigger signal input terminal TRG1, and voltage waveforms of the trigger signal input terminals TRG1 to TRG4 of the first to fourth light emitting element array chips 210 are shown. The clock signal output terminals φ1 and φ2 and the input trigger signal output terminal φS output a constant voltage of 5 V when they are at the high (H) level, and output a constant voltage of 0 V when they are at the low (L) level.

The operation of the equivalent circuit diagram shown in FIG. 33 will be described with the lapse of time with reference to FIG. 34. At time to, since the clock signal output terminals φ1 and φ2 are at the low (L) level and the input trigger signal output terminal φS is at the high (H) level, the clock thyristors CL of all the light emitting element array chips 210 are in the OFF state. At this time, the voltage of the trigger signal input terminals TRG1 to TRG4 is equal to the positive voltage Vcc applied to the other end of the second pull-up resistor RQ.

At time t1, the voltage of the output terminal φ1 to feed the clock signal to the first clock signal transmission line CLL1 is changed to the high (H) level and the voltage of the input trigger signal output terminal φS is changed to the low (L) level. At this time, the voltage of the high (H) level is applied to the anode r1 of the first clock thyristor CL1 and the voltage of the low (L) level is applied to the gate electrode v1 thereof. This state corresponds to the state where the clock signal is inputted to the anode r1 of the clock thyristor CL1 and the input trigger signal is inputted to the gate electrode v1 thereof. Then, since the first clock thyristor CL1 is changed to the ON state, the potential of the first trigger signal input terminal TRG1 becomes about 0 V. At this time, the first light emitting element array chip 210 is in the selected state. Since the potential of the gate electrode w1 of the first trigger thyristor TR1 is about 0 V, the first trigger thyristor TR1 is also changed to the ON state. Since the first clock thyristor CL1 is in the ON state and thus the main current flows between the anode r1 and the cathode, a voltage drop is generated by the load resistor RC1 connected to the first clock signal output terminal φ1. As a result, the potential of the first clock signal transmission line CLL1 is substantially equal to the driving voltage Vd of the first clock thyristor.

As described above, since the second trigger signal input terminal TRG2 is connected to the first trigger signal input terminal TRG2 through the forwardly-biased PN-junction diode, the potential thereof is equal to the diffusion potential Vd (about 1.5 V) of the PN junction. Since the potential of the third trigger signal input terminal TRG3 is higher by the diffusion potential Vd of the PN junction than the potential of the second trigger signal input terminal TRG2, the potential becomes about 2×Vd. Similarly, the potential of the fourth trigger signal input terminal TRG4 becomes about 3×Vd. Of course, the potential of the trigger signal input terminals TRG is not higher the positive voltage Vcc. In this embodiment, the potential substantially equal to the diffusion potential of the PN junction corresponds to the voltage level of the input trigger signal and the output trigger signal. Accordingly, at time t1, the output trigger signal is outputted from the anode q1 of the first trigger thyristor TR1 and is inputted as the input trigger signal to the gate electrode v2 of the second clock thyristor CL2. Consequently, the trigger signal is transmitted.

At time t2, the voltage of the second clock signal output terminal φ2 becomes the high (H) level and the voltage of the input trigger signal output terminal φS becomes the high (H) level. At this time, since the voltage of the first clock signal output terminal φ1 is the high (H) level, the first clock thyristor CL1 is maintained in the ON state. Accordingly, the potential of the first trigger signal input terminal TRG1 is about 0 V. On the other hand, the second clock thyristor CL2 is changed to the ON state, since the voltage of the high (H) level is applied to the anode r2 and the potential substantially equal to the diffusion potential Vd of the PN junction is applied to the gate electrode v2. Then, since the second trigger signal input terminal TRG2 is connected to the gate electrode v2 of the second clock thyristor CL2 in the ON state, the potential thereof becomes about 0 V. Since the third trigger signal input terminal TRG3 is connected to the second trigger signal input terminal TRG2 through the forwardly biased PN junction, the potential thereof is substantially equal to Vd. The potential of the fourth trigger signal input terminal TRG4 is substantially equal to 2×Vd. At time t2, the clock signal is inputted to the anode r2 of the second clock thyristor CL2 and the input trigger signal is inputted to the gate electrode v2 thereof, which corresponds to the state where the clock thyristor CL2 is changed to the ON state.

Here, at time t2, the potential substantially equal to Vd is applied to the gate electrode v3 of the third clock thyristor CL3, but the third clock thyristor CL3 is not changed to the ON state. As described above, this is because the potential of the first clock signal transmission line CLL1 is dropped to be substantially equal to Vd due to the voltage drop by the load resistor RC1 and thus the potential of the anode r3 of the third clock thyristor CL3 becomes substantially equal to Vd. Since the potential of the anode q1 of the first trigger thyristor TR1 is about 0 V which is substantially equal to the potential of the second trigger signal input terminal TRG2, the first trigger thyristor TR1 is changed to the OFF state. On the other hand, since the potential of the gate electrode w2 of the second trigger thyristor TR2 is about 0 V which is substantially equal to the potential of the second trigger signal input terminal TRG2, the second trigger thyristor TR2 is changed to the ON state.

At time t3, the voltage of the first clock signal output terminal φ1 becomes the low (L) level. At this time, since the voltage of the low (L) level is applied to the anode r1 of the first clock thyristor CLL1, the first clock thyristor CLX is changed to the OFF state. Then, the first trigger signal input terminal TRG1 becomes the positive voltage Vcc applied through the first second pull-up resistor RQ1. Here, in order to satisfactorily transmit the trigger signal, the voltage of the first clock signal output terminal φ2 is changed later than the second clock signal output terminal φ2.

At time t4, the voltage of the first clock signal output terminal φ1 becomes the high (H) level. At this time, since the voltage of the high (H) level is applied to the anode r3 of the third clock thyristor CL3 and the potential of the gate electrode v3 of the third clock thyristor CL3 is maintained to be substantially equal to Vd from time t2, the third clock thyristor CL3 is changed to the ON state. Then, the potential of the third trigger signal input terminal TRG3 connected to the gate electrode v3 of the third clock thyristor CL3 is about 0 V. As described above, the potential of the fourth trigger signal input terminal TRG4 connected to the third trigger signal input terminal TRG3 becomes substantially equal to Vd. Since the potential of the anode q2 of the second trigger thyristor TR2 is about 0 V which is substantially equal to the potential of third trigger signal input terminal TRG3, the second trigger thyristor TR2 is changed to the OFF state. On the other hand, since the potential of the gate electrode w3 of the third trigger thyristor TR3 is 0 V which is substantially equal to the potential of the third trigger signal input terminal TRG3, the third trigger thyristor TR3 is changed to the ON state.

At time t5, the voltage of the second clock signal output terminal φ2 becomes the low (L) level. At this time, since the voltage of the low (L) level is applied to the anode r2 of the second clock thyristor CL2, the second clock thyristor CL2 is changed to the OFF state. Then, the potential of the second trigger signal input terminal TRG2 becomes the positive voltage Vcc applied through the second pull-up resistor RQ2.

Similarly, at time t6, the fourth clock thyristor CL4 is changed to the ON state and becomes the selected state. At time t7, the third clock thyristor CL3 is changed to the OFF state and thus is not in the selected state.

In this way, by sequentially transmitting the trigger signal in the arrangement direction of the light emitting element array chips 210 and applying the clock signal to be matched with the timing, a logical circuit in which the light emitting array chips 210 are sequentially selected in the order of the arrangement direction is embodied. In this embodiment, the plurality of light emitting element array chips 210 can be sequentially selected in the arrangement direction by the use of three signal output terminals of the input trigger signal output terminal φS and the clock signal output terminals φ1 and φ2, and thus the time-division driving operation can be performed between the plurality of light emitting element array chips. Accordingly, it is possible to embody a light emitting device including the small number of driving ICs and wiring lines.

The configuration of the light emitting element array chip 210 according to this embodiment will be described specifically now.

Figure 35:
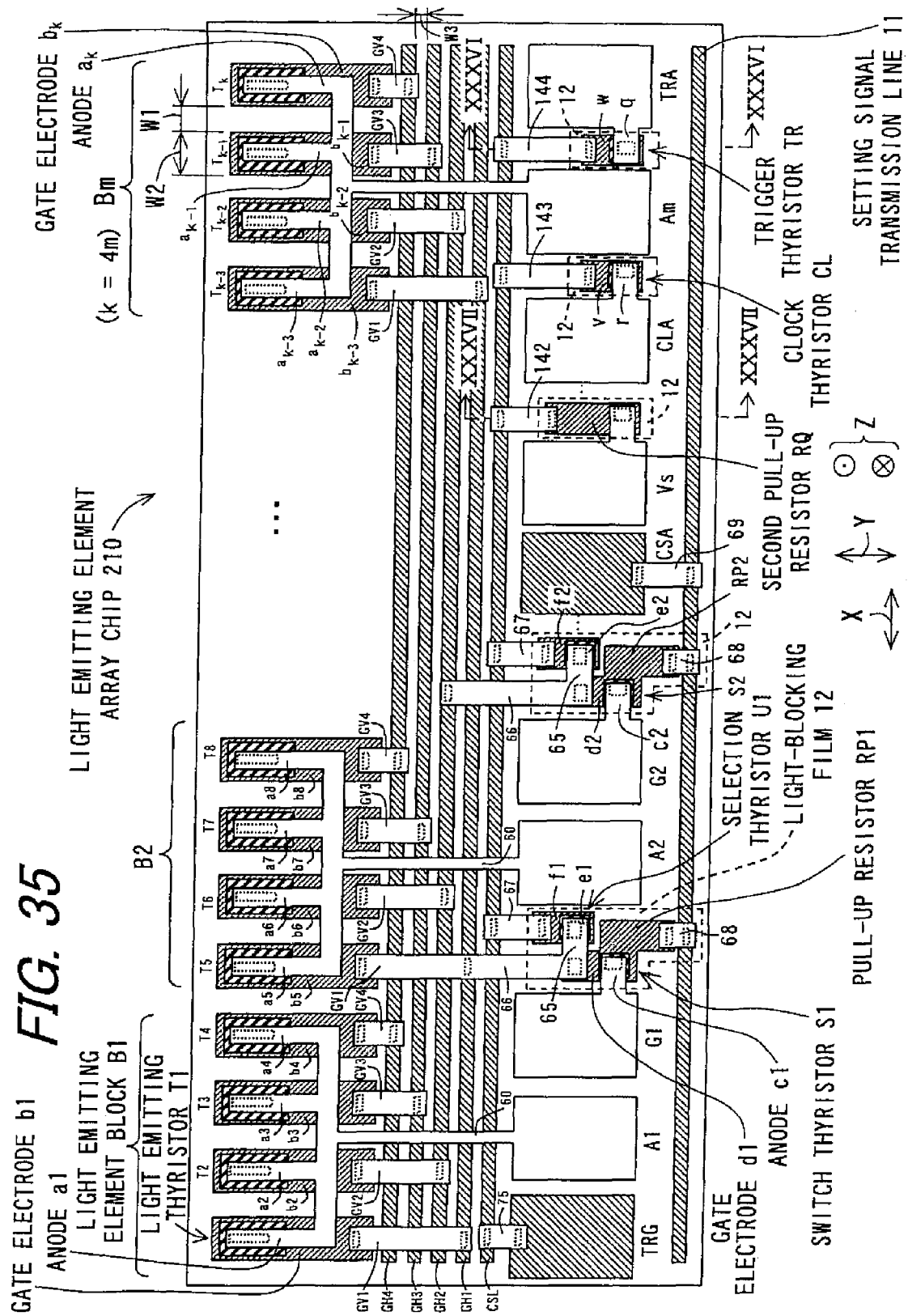
FIG. 35 is a partial plan view illustrating a basic configuration of the light emitting element array chip according to the tenth embodiment.

FIG. 35 is a partial plan view illustrating a basic configuration of the light emitting element array chip 210 according to the tenth embodiment. The difference in basic configuration from the light emitting element array chip 1 according to the first embodiment shown in FIG. 10 is that a configuration relevant to the second switch unit is added thereto. Since the other elements are similar to those of the basic configuration of the light emitting element array chip 1 according to the first embodiment shown in FIG. 10, the common components will be denoted by the same reference numerals and description thereof will be omitted. This drawing shows the plan view of the light emitting element array chip 210 arranged in the state where the light emission direction of the light emitting thyristors T is toward the front of the drawing paper surface. The horizontal gate lines GH1 to GH4, the selection signal transmission line CSL, the setting signal transmission line 11, the setting signal bonding pad CSA, the input trigger signal bonding pads TRG, the light emitting thyristors T, the switch thyristors S, the second pull-up resistors RQ, the pull-up resistors RP, and the selection thyristors U, the clock thyristor CL, and the trigger thyristor TR are hatched for the purpose of easy understanding.

It is preferable that the bonding pads as the trigger signal output terminals TRA to output the output trigger signal from the trigger thyristors TR are disposed at the end opposite to the input trigger signal bonding pads TRG in the arrangement direction X so as to facilitate the connection for the transmission of the trigger signal between the adjacent light emitting element array chips 210. The bonding pads as the trigger signal output terminals TRA may be described simply as the output trigger signal bonding pads TRA. The trigger thyristors TR are disposed close to the output trigger signal bonding pads TRA. The anodes q of the trigger thyristors TR are formed integrally with the output trigger signal bonding pads TRA. The gate electrodes w of the trigger thyristors TR are formed of the third semiconductor layer 154 and are connected to the selection signal transmission line CSL through the connecting portion 144.

The clock thyristors CL and the bonding pads (clock signal bonding pads CLA) as the clock signal input terminals CLA are disposed between the plurality of light emission signal bonding pads A, and this configuration is the same as the configuration of the trigger thyristors TR and the output trigger signal bonding pads TRA. Specifically, the anodes r of the clock thyristors CL and the clock signal bonding pads CLA are integrally formed, and the third semiconductor layer used as the gate electrodes v are connected to the selection signal transmission line CLS through the connecting portions 143.

The second pull-up resistor RQ uses the sheet resistance of the semiconductor film, is formed between the plurality of light emission signal bonding pads A out of parts of the semiconductor layers of the thyristors. An end of the second pull-up resistor RQ is connected to the selection signal transmission line CSL through the connecting portion 142, and the other end of the second pull-up resistor RQ is connected to the power source bonding pad Vs to apply the positive voltage Vcc.

Here, the anodes r of the clock thyristors, the anodes q of the trigger thyristors, the connecting portions 142 to 144, the input trigger signal bonding pads TRG, the output trigger signal bonding pads TRA, the power source bonding pad Vs, and the clock signal bonding pad CLA are formed of conductive materials such as metal and alloy. Specifically, they are formed of gold (Au), alloy (AuGe) of gold and germanium, alloy (AuZn) of gold and zinc, nickel (Ni), and aluminum (Al).

In the light emitting element array chip 210 shown in FIG. 35, preferably, the light-blocking film 12 as the light-blocking means is disposed on the surfaces (apart from the substrate) of the clock thyristors CL and the trigger thyristors TR. The clock thyristors CL and the trigger thyristors TR emit light at the time of switching, similarly to the light emitting thyristors T, but the light emission of light thereof is not necessary and thus the light-blocking film is used to prevent the emitted light from entering the light emitting thyristors T to changing the threshold value of the light emitting thyristors T. The light-blocking film 12 is formed of a material not transmitting the emitted light to cover the surface. When proper interlayer insulating films are formed, a gold (Au) film used for the horizontal gate lines GH can be suitably used. It is effective that the clock thyristors CL, the trigger thyristors TR, and the light emitting thyristors T are disposed as apart as possible from each other, and as shown in the plan view of FIG. 35, it is also effective that the light emitting thyristors T are disposed one side of the horizontal gate lines GH and the clock thyristors CL and the trigger thyristors TR are disposed on the other side.

The current-limiting resistor RI may be added as a preferable configuration, but is not used in the plan view of the light emitting element array chip 210 shown in FIG. 35.

The configuration of the light emitting array chip 210 different from the light emitting element array chip 1 according to the first embodiment will be described in more detail.

Figure 36:
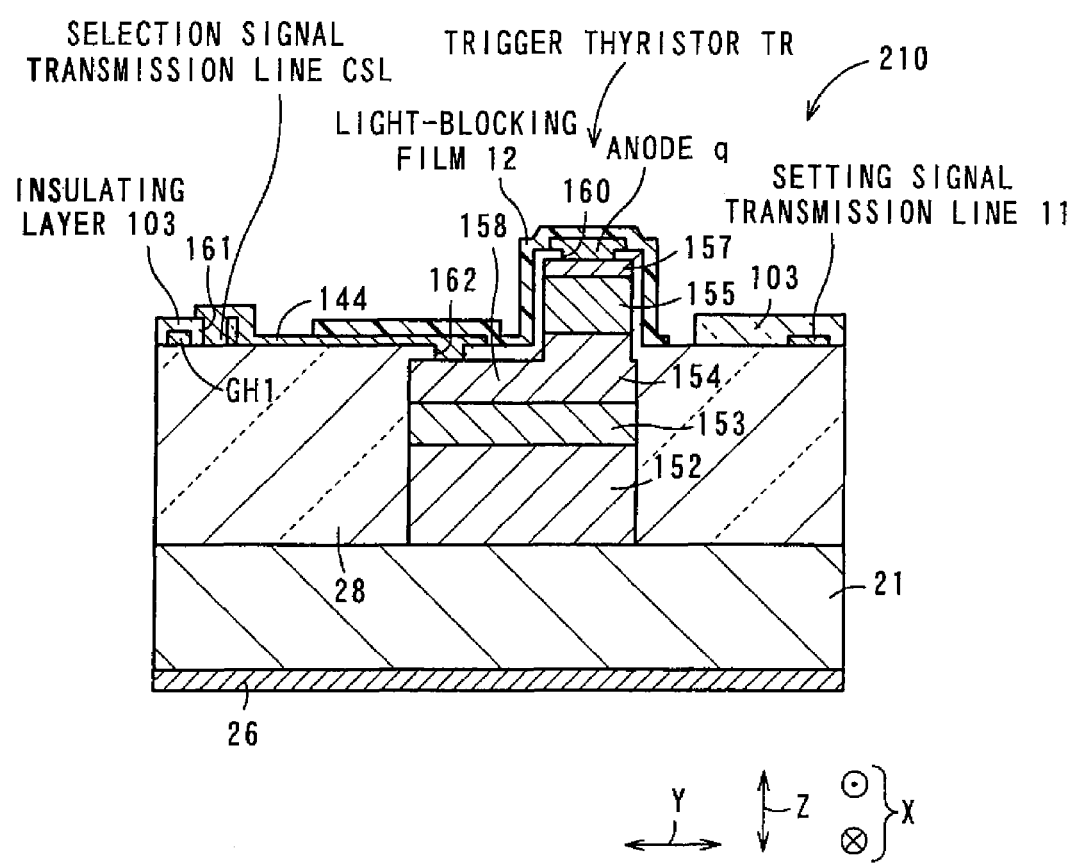
FIG. 36 is a partial sectional view illustrating a basic configuration of the light emitting element array chip as viewed from section line XXXVI-XXXVI of FIG. 35.

FIG. 36 is a partial sectional view illustrating a basic configuration of the light emitting element array chip 210 as viewed from section line XXXVI-XXXVI of FIG. 35.

In this embodiment, since the trigger thyristors TR are formed at the same time as forming the semiconductor layers 22 to 25 and 32 to 35 and the ohmic contact layers 27 and 37 constituting the light emitting thyristors T and the switch thyristors S, a new manufacturing process is not required. The ends Of the first semiconductor layer 152, the second semiconductor layer 153, and the third semiconductor layer 154 of the trigger thyristor TR close to the horizontal gate line GH protrude toward the horizontal gate line GH more than the ends of the fourth semiconductor layer 155 and the ohmic contact layer 157 close to the horizontal gate line GH to form the connecting portion 158 to the horizontal gate line GH. In this embodiment, the connecting portion 158 corresponds to the gate electrodes w of the trigger thyristors TR. Since the connecting portion 158 of the trigger thyristors TR is formed at the same time as forming the connecting portions 101 and 102 of the light emitting thyristors T and the switch thyristors S, any new manufacturing process is not required.

In FIG. 36, the insulating layer 28 is formed to cover the surfaces of the substrate 21 and the trigger thyristors TR. As described above, the horizontal gate lines GH, the selection signal transmission line CSL, and the setting signal transmission line 11 are formed on the surface of the insulating layer 28 and the insulating layer 103 is formed along the surfaces thereof. In the insulating layers 28 and 103, through holes 161 and 162 are formed in the portions stacked on the surfaces (apart from the substrate) of the connecting portions 158 of the trigger thyristors TR and the selection signal transmission line CSL, thereby forming the connecting portions 144 electrically connecting them. In the insulating layer 28, through holes 160 are formed in the portions stacked on the surfaces (apart from the substrate) of the ohmic contact layer 47 of the trigger thyristors TR and the anodes q are formed. The light-blocking film 12 to cover the trigger thyristors TR is formed to block or reduce the light emitted from the trigger thyristors TR in the ON state. One end in the width direction Y of the light-blocking film 12 covers the ends of the trigger thyristors TR close to the setting signal transmission line 11, and the other end in the width direction Y of the light-blocking film 12 extends to a part of the connecting portion 67 between the selection thyristors U and the selection signal transmission line CSL to cover the insulating layer 28 stacked on the surfaces of the connecting portions 108 of the selection thyristors U.

Since the configuration of the clock thyristors CL is similar to the trigger thyristors TR shown in FIG. 36, description thereof will be omitted.

Figure 37:
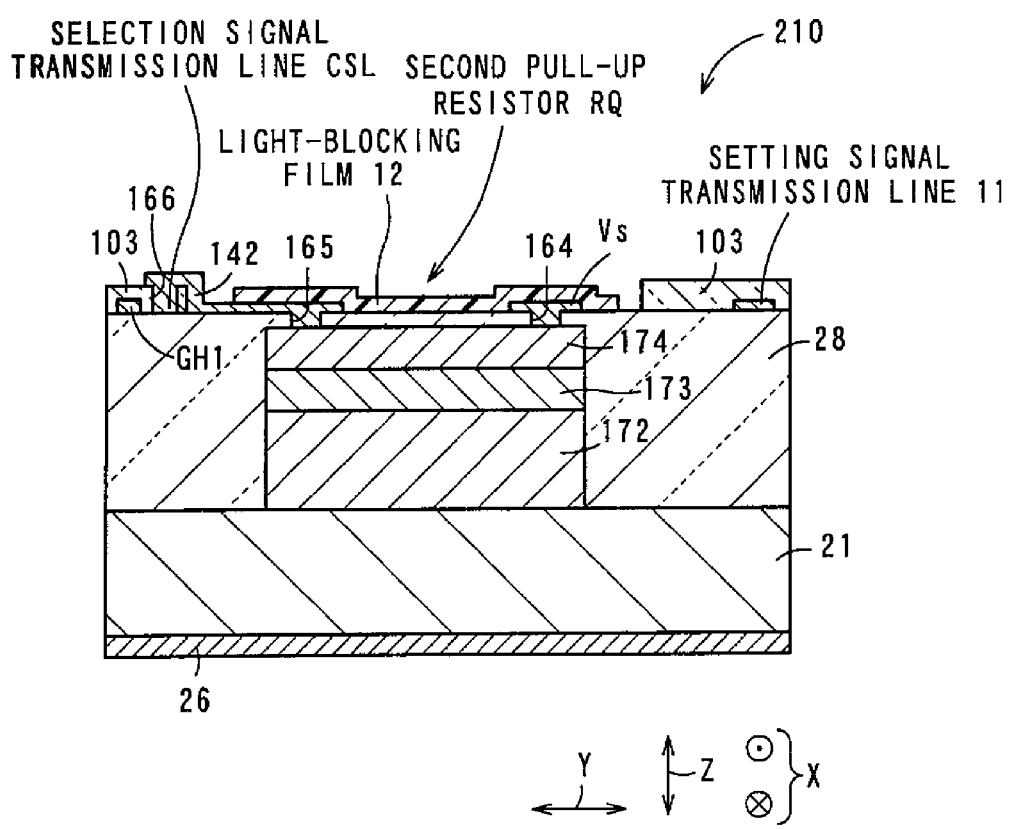
FIG. 37 is a partial sectional view illustrating a basic configuration of the light emitting element array chip as viewed from sectional line XXXVII-XXXVII of FIG. 35.
Figure 38:
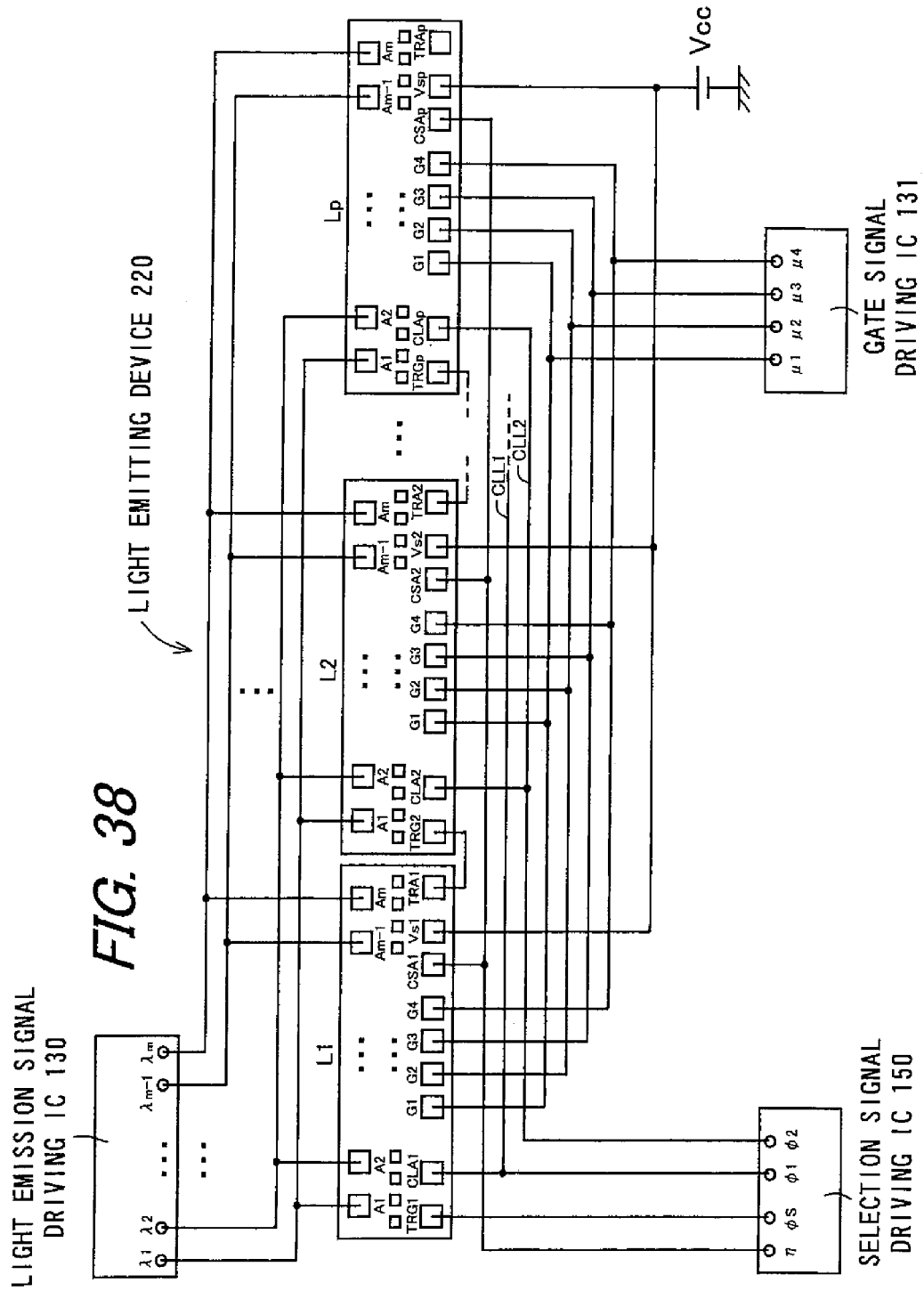
FIG. 38 is a block circuit diagram schematically illustrating a light emitting device according to another embodiment of the invention.

FIG. 37 is a partial sectional view illustrating a basic configuration of the light emitting element array chip 210 as viewed from sectional line XXXVII-XXXVII of FIG. 38.

Similarly to the above-mentioned pull-up resistor RP, in this embodiment, among the semiconductor films including the first semiconductor layer 172, the second semiconductor layer 173, and the third semiconductor layer 174, the second pull-up resistor RQ is formed of the third semiconductor layer 174. The etching process for determining the entire thickness of the first semiconductor layer 172, the second semiconductor layer 173, and the third semiconductor layer 174 constituting the second pull-up resistor RQ is performed at the same time as forming the connecting portions 101, 102, 108, and 158. Accordingly, the thickness of the second pull-up resistor RQ is equal to the thickness of the connecting portion 101, 102, 108, and 158.

In FIG. 37, the insulating layer 28 is formed to cover the surfaces of the substrate 21 and the second pull-up resistor RQ. As described above, the horizontal gate lines GH, the selection signal transmission line CSL, and the setting signal transmission line 11 are formed on the surface of the insulating layer 28, and the insulating layer 103 is formed along the surfaces thereof. In the insulating layers 28 and 103, the through holes 165 and 166 are formed in the portions stacked on the surface (apart from the substrate) of the selection signal transmission line CSL and the portion stacked on the surface (apart from the substrate) of the end of the second pull-up resistor RQ close to the selection signal transmission line CSL to form the connecting portion 142 electrically connecting them. In the insulating layer 28 stacked on the second pull-up resistor RQ, the through holes 164 are formed in the portion apart from the selection signal transmission line CSL, and a part of the power source bonding pad Vs covers the through holes 164.

Similarly to the pull-up resistor RP, the light-blocking film 12 to cover the second pull-up resistor RQ is also formed. As shown in FIG. 37, the light-blocking film 12 is additionally stacked on the surfaces of the insulating layer 28 stacked on the surface of the second pull-up resistor RQ, a part of the connecting portion 142 to the selection signal transmission line CSL, and a part of the power source bonding pad to cover one end in the width direction Y of the second pull-up resistor RQ to the other end.

FIG. 38 is a block circuit diagram schematically illustrating a light emitting device 220 according to an embodiment of the invention. In the light emitting device 200 shown in FIG. 38, the selection signal driving IC 132 and the setting signal driving IC 136 in the light emitting device 10 shown in FIG. 10 are replaced with the selection signal driving IC 150 having a different configuration. In FIG. 38, the light emitting element array chip 210 according to the tenth embodiment shown in FIGS. 32 and 35 is used as the light emitting element array chips L1 to Lp. Since the other elements are similar to the light emitting device 10 shown in FIG. 10, the common components will be denoted by the same reference numerals and description thereof will be omitted.

The selection signal driving IC 132 includes one setting signal output terminal η, one input trigger signal output terminal φS, and two clock signal output terminals φ1 and φ2. The setting signal output terminal η is commonly connected between the setting signal bonding pads CSA1 to CSAp of the light emitting element array chips L1 to Lp. The input trigger signal output terminal 0 is connected to the input trigger signal bonding pad TRG1 of the first light emitting element array chip L1. The two clock signal output terminals φ1 and φ2 are connected to two clock signal transmission lines CLL1 and CLL2, respectively. The clock signal bonding pads CLA of the adjacent light emitting element array chips L are connected to the different clock signal transmission lines CLL1 and CLL2. Specifically, in this embodiment in which p array chips are mounted (where p is an even integer equal to or greater than 4), when the array chips L are numbered with first to p-th numbers according to the order of according to the order of from the one end to the other end in the arrangement direction X of the light emitting elements T of the respective array chips L, the clock signal bonding pad $CLA2i_1-1$ of the $(2i_{18}-1)$-th odd-numbered array chip L (wherein $1 \leq i_{18} \leq p/2$) is electrically connected to the first clock signal bonding pad CLL1, and the clock signal bonding pad $CLA2i_{18}$ of the $2i_{18}$-th even-numbered array chip L (wherein $1 \leq i_{18} \leq p/2$) is electrically connected to the second clock signal bonding pad CLL2.

As described with reference to FIG. 33, the output trigger signal bonding pad $TRAi_{19}$ of the $i_{19}$-th light emitting element array chip $Li_{19}$ (wherein $1 \leq i_{19} \leq p-1$) is electrically connected to the $(i_{19}-1)$-th input trigger signal bonding pad $TRG i_{19}+1$ adjacent thereto in the arrangement direction of the light emitting element array chips L. Accordingly, it is possible to sequentially transmit the output trigger signal as an input trigger signal adjacent thereto in the arrangement direction in synchronization with the clock signal. Accordingly, the light emitting element array chips can be sequentially made to be in the selected state in the order of arrangement of the light emitting element array chips L from the first light emitting element array chip L1 in synchronization with the clock signal.

In this way, by sequentially switching the array chips L in the selected state, it is possible to stably carry out time-divisional drive in which the gate signal driving IC 131 and the light emission signal driving IC 130 are commonly used among the plurality of light emitting element arrays. Accordingly, it is possible to reduce the number of driving ICs and the number of layers in the circuit board on which the driving ICs are mounted and to reduce the rear of the circuit board on which the light emitting element arrays and the driving ICs are mounted, thereby embodying a small-sized light emitting device which stably operates.

Figure 39:
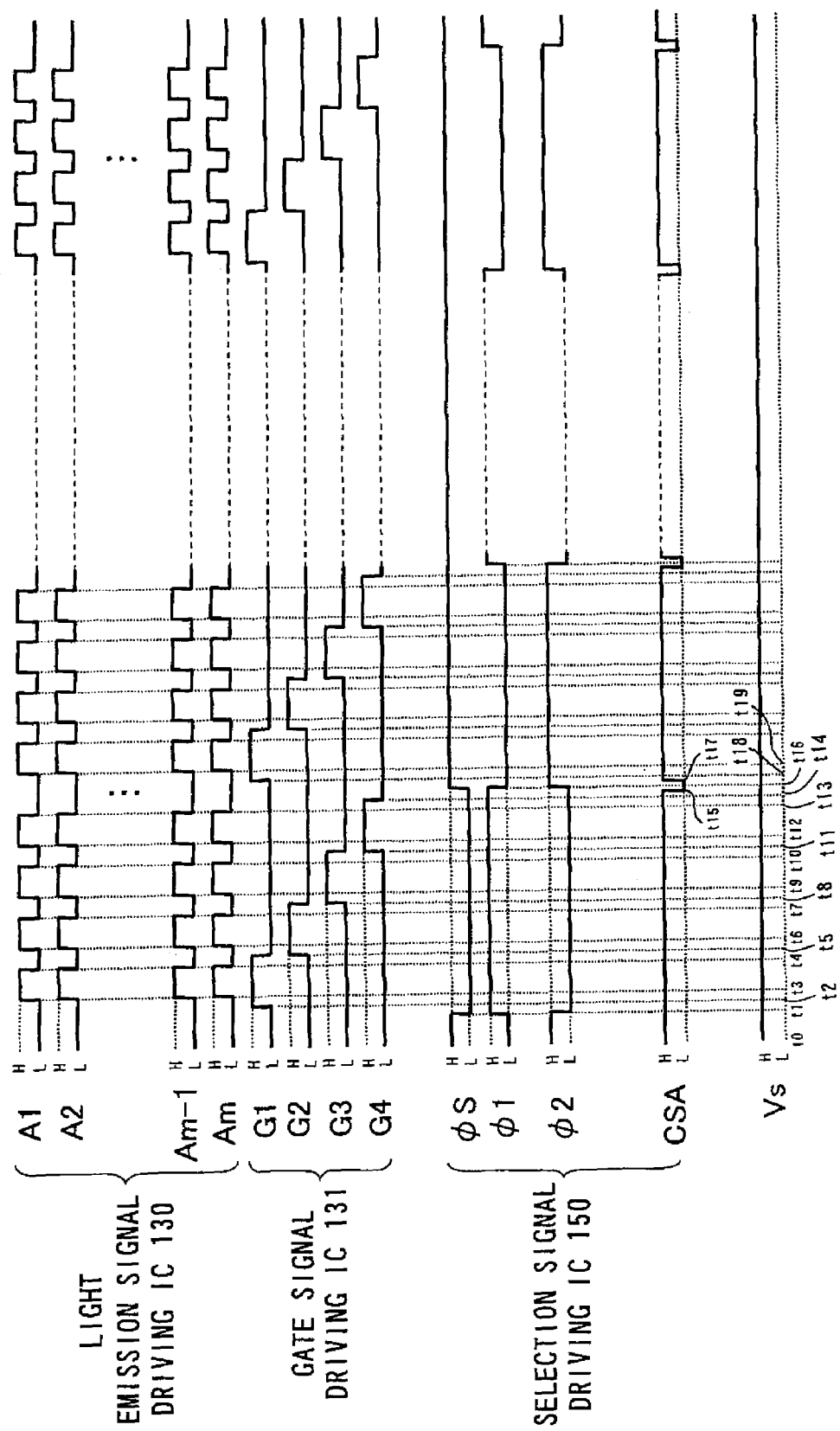
FIG. 39 is a timing chart illustrating an operation of the light emitting device.

FIG. 39 is a timing chart illustrating an operation of the light emitting device 220, where the horizontal axis represents the elapsed time from a reference time and the vertical axis represents the signal level by a magnitude of a voltage or current of the output terminals of the driving ICs 130 to 132. In FIG. 39, voltage or current waveforms outputted from the signal output terminals (the light emission signal output terminals λ, the gate signal output terminals μ, the input trigger signal output terminals φS, the clock signal output terminals φ1 and φ2, and the setting signal output terminal η) of the light emission signal driving IC 130, the gate signal driving IC 131, and the selection signal driving IC 150 are shown. In FIG. 15, the reference numerals of the bonding pads (signal input terminals) connected to the signal output terminals may be used as the reference numerals of the output waveforms.

In this embodiment, the light emission signal driving IC 130 outputs a constant current of 5 mA at the high (H) level, and outputs a constant current of 0 mA at the low (L) level. The gate signal driving IC 131 outputs a constant voltage of 5 V at the high (H) level, and outputs a constant voltage of 0 V at the low (L) level. The selection signal driving IC 150 outputs a constant voltage of 5 V at the high (H) level, and outputs a constant voltage of 0 V at the low (L) level.

The operation of the light emitting device 220 will be described with the lapse of time with reference to FIG. 39. At time to, since the voltage of the input trigger signal output terminal φS is the high (H) level and the voltage of the first clock signal output terminal φ1 is the low (L) level, the first array chip L1 is not in the selected state. At time t1, by setting the voltage of the input trigger signal output terminal φS inputted to the first array chip L1 to the low (L) level and setting the voltage of the first clock signal output terminal φ1 to the high (H) level, the first array chip L1 is changed to the selected state and the output trigger signal outputted from the first array chip L1 is inputted as the input trigger signal of the second array chip L2. At time t2, the voltage of the high (H) level is applied to the first gate signal input terminals G1 of the array chips L. Then, only the first array chip L1 in the selected state is changed to the ON state by the switching of the first switch thyristor S1, and the potential of the horizontal gate line GH1 connected to the gate electrode d1 of the switch thyristor S1 becomes substantially the low level (0 V). At time t3, the light emission signals are inputted to the light emission signal input terminals A1 to Am of the array chips. Then, in the first array chip L1 in the selected state, the light emitting thyristor T connected to the first horizontal gate line GH1 emits light. At time t4, since the voltage of the light emission signal returns to the low (L) level, the light emitting thyristor is extinguished. At time t5, the voltage of the gate signal output terminal μ1 connected to the first gate signal input terminal G1 returns to the low (L) level and the voltage of the gate signal output terminal μ2 connected to the second gate signal input terminal G2 becomes the high (H) level. Then, only the first array chip L1 in the selected state is changed to the ON state by the switching of the second switch thyristor S2. At times t6 and t7, the light emission signals are inputted again to the light emission signal input terminals A1 to Am of the array chips. Then, in the first array chip L1 in the selected state, the light emitting thyristor T connected to the second horizontal gate line GH2 emit light. Similarly, at time t8 to t11, since the voltage of the gate signal output terminal μ3 connected to the third gate signal input terminal G3 becomes the high (H) level, the third switch thyristor S3 in the first array chip L1 in the selected state is switched to the ON state. In this state, at times t9 and t10, since the light emission signals are inputted again to the light emission signal input terminals A1 to Am of the array chips, the light emitting thyristor T connected to the third horizontal gate line GH3 in the first array chip L1 in the selected state emits light. At times t11 to t14, since the voltage of the fourth gate signal output terminal μ4 connected to the fourth gate signal input terminal G4 becomes the high (H) level, the fourth switch thyristor S4 in the first array chip L1 in the selected state is switched to the ON state. In this state, at times t12 and t13, since the light emission signals are inputted again to the light emission signal input terminals A1 to Am of the array chips, the light emitting thyristor T connected to the fourth horizontal gate line GH4 in the first array chip L1 in the selected state emit light. At time t15, since the voltage of the setting signal output terminals r connected to the setting signal input terminals CSA of the array chips L returns to the low (L) level, the selection thyristors U of the first array chip L1 are changed to the OFF state. At time t16, the voltage of the input trigger signal output terminal φS connected to the trigger signal input terminal TRG1 of the first array chip L1 returns to the high (H) level, the voltage of the first clock signal output terminal φ1 connected to the clock signal input terminal CLA1 of the first array chip L1 becomes the low (L) level, and the voltage of the second clock signal output terminal φ2 connected to the clock signal input terminal CLA2 of the second array chip L2 becomes the high (H) level. Then, the first array chip L1 is not in the selected state and the second array chip L2 to which the input trigger signal is inputted at time t1 is in the selected state. As described with reference to FIG. 7, in order to satisfactorily switch the selected state from the first array chip L1 to the second array chip L2, the rising of the voltage of the second clock signal output terminal φ2 connected to the second array chip L2 to be in the selected state in the next time is made to occur earlier than the falling of the voltage of the first clock signal output terminal φ2.

In the second array chip L2, the light emitting thyristors T can be made to sequentially emit light in a similar manner. That is, at time t18 after the voltage of the setting signal output terminal η connected to the setting signal input terminal CSA returns to the low (L) level from the high (H) level, the voltage of the gate signal output terminal μ1 connected to the first gate signal input terminal G1 of the respective array chips L becomes the high (H) level. At time t19, by inputting the light emission signals to the all the light emission signal input terminals λ1 to λm of the respective array chips L, the light emitting thyristor T connected to the first horizontal gate line GH1 of the second array chip L2 in the selected state emits light. In the state where the voltage of the setting signal output terminal η connected to the setting signal input terminal CSA is the low (L) level, the gate signal and the light emission signal should not be inputted. When the voltage of the setting signal output terminal η is the low (L) level, the voltage of the horizontal gate lines GH of the light emitting element array chips L is the low (L) level and thus the light emitting thyristor T emits light in the non-selected state.

In this way, by sequentially setting the array chips to the selected state in the arrangement direction of the array chips L, it is possible to perform the time-division driving operation in the unit of the array chips L. By applying the gate signal to the switch thyristors sequentially from the first switch thyristor, it is possible to perform the time-division driving operation in the respective array chips L.

As described above, in the light emitting element array chip 210 according to this embodiment, only the light emitting element array chip 1 in the selected state with input of the clock signal and the input trigger signal operates to give the gate signal to the light emitting thyristors T. Accordingly, when the light emitting array chips 1 are arranged and driven, it is possible to perform the time-division driving operation by commonly using the driving ICs and the wiring lines to feed the light emission signal and the gate signal without connecting the driving ICs to all the light emitting element array chips 1 and thus there is a basic operational advantage that it is possible to perform the time-division driving operation with the small number of driving ICs and wiring lines. When the plurality of light emitting element array chips 1 are driven and the input trigger signal is inputted from the adjacent light emitting element array chip 1 in the selected state, it is possible to sequentially select the light emitting element arrays 1 in the order of arrangement thereof in synchronization with the clock signal, by only adding the driving IC and the wiring line to feed two or more clock signals and one input trigger signal. The components common to the light emitting element array chip 1 according to the first embodiment exhibit the same operational advantages as the light emitting element array chip 1 according to the first embodiment.

Figure 40:
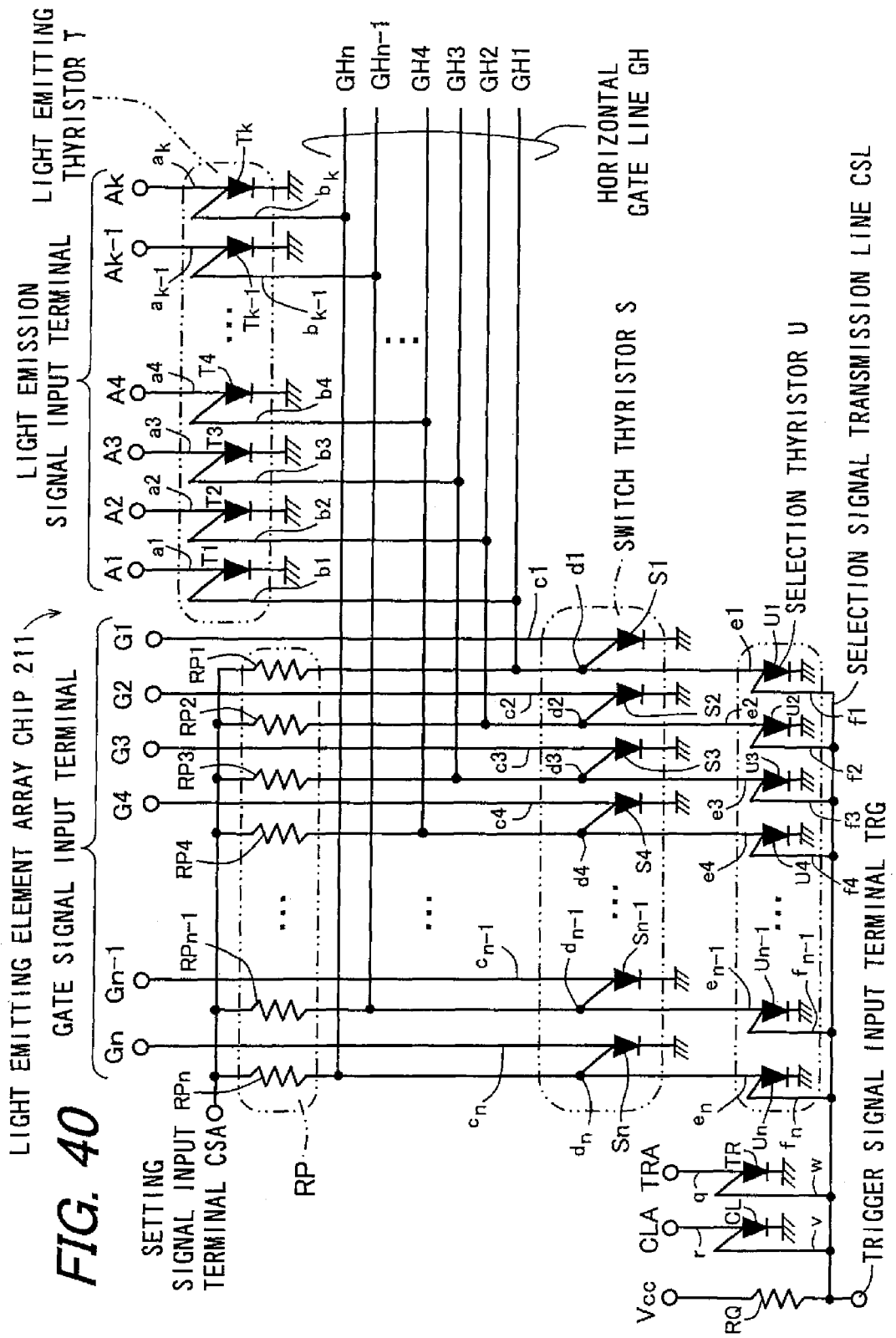
FIG. 40 is an equivalent circuit diagram schematically illustrating a light emitting element array chip as a light emitting element array according to an eleventh embodiment of the invention.

FIG. 40 is an equivalent circuit diagram schematically illustrating a light emitting element array chip 211 as a light emitting element array according to an eleventh embodiment of the invention. The light emitting element array chip 211 according to this embodiment has a configuration in which the second switch unit of the light emitting element array chip 210 according to the tenth embodiment shown in FIG. 32 is added to the light emitting element array chip 2 according to the second embodiment shown in FIG. 13. Accordingly, similarly to the light emitting element array chip 2 according to the second embodiment shown in FIG. 13, the light emitting thyristors T are not classified into the light emitting element blocks B. In FIG. 40, the components common to FIGS. 13 and 32 will be denoted by the same reference numerals and detailed description thereof will be omitted.

The operational advantages of the light emitting element array chip 211 according to the eleventh embodiment are basically equal to those of the light emitting element array chip 210 according to the tenth embodiment. In the light emitting element array chip 211, the switch thyristors S disposed as the switch unit operate to give the gate signal to the light emitting thyristors T only at the time selected by the clock signal and the input trigger signal. Accordingly, when the light emitting array chips 211 are arranged and driven, it is possible to perform the time-division driving operation by commonly using the driving ICs and the wiring lines to feed the light emission signal and the gate signal without connecting the driving ICs to all the light emitting element array chips 211, thereby realizing the time-division driving operation with the small number of driving ICs and wiring lines. When the plurality of light emitting element array chips 211 are driven and the input trigger signal is inputted from the adjacent light emitting element array chip 211 in the selected state, it is possible to time-divisionally drive the array chips, by only adding the driving IC and the wiring line to feed two or more clock signals and one input trigger signal. Similarly to the other operational advantages, since the light emitting element blocks 13 are not provided unlike the light emitting element array chip 210 according to the tenth embodiment, the time-division driving operation cannot be performed in a single light emitting element array chip 211. Instead, all the light emitting thyristors in the light emitting element array chip 211 selected by the selection signal can be selectively made to emit light.

Figure 41:
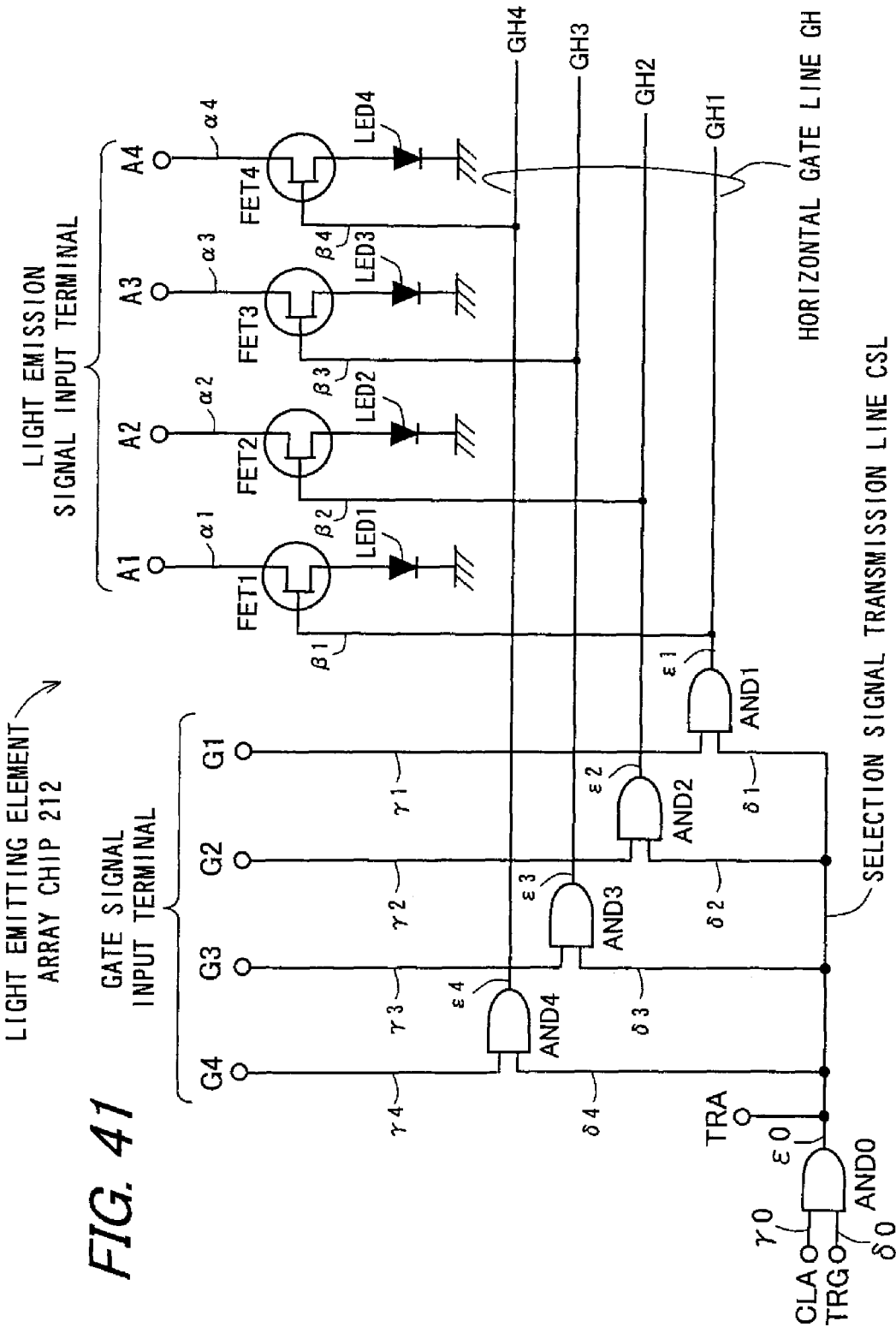
FIG. 41 is an equivalent circuit diagram schematically illustrating a light emitting element array chip as a twelfth embodiment of the invention.

FIG. 41 is an equivalent circuit diagram schematically illustrating a light emitting element array chip 212 as a light emitting element array according to a twelfth embodiment of the invention.

In the light emitting element array chip 212 according to the twelfth embodiment shown in FIG. 41, similarly to the light emitting element array chip 3 according to the third embodiment shown in FIG. 17, the light emitting element array chip is configured not using the emission thyristors. Since the elements other than the second switch unit used to transmit the trigger signal are the same as shown in FIG. 17, the common components will be denoted by the same reference numerals and description thereof will be omitted.

In FIG. 12, the second switch unit is an AND circuit element AND0 to output a logical product of two inputs, and is configured to include a circuit in which a NAND circuit element and a NOT circuit element are combined. One input terminal ν0 of the AND circuit element AND0 is connected to the clock signal input terminal CLA and the other input terminal δ0 is connected to the trigger signal input terminal TRG. The output terminal ε0 of the AND circuit element AND0 is connected to the selection signal transmission line CSL. The selection signal transmission line CSL is connected to the trigger signal output terminal TRA.

The operation of the light emitting element array chip 212 shown in FIG. 41 will be described now.

In the light emitting element array chip 212 shown in FIG. 41, when a true value (voltage of the high level) is inputted from the trigger signal input terminal TRG and a true value (voltage of the high level) is inputted from the clock signal input terminal CLA, a true value (voltage of the high level) is outputted from the output terminal ε0 of the AND circuit element AND0 constituting the second switch unit and the potential of the selection signal transmission line CSL becomes the high level. This state corresponds to the selected state. In the selected state, the voltage of the high level is outputted from the trigger signal output terminal TRA connected to the selection signal transmission line CSL and is used as the input trigger signal of the adjacent light emitting element array chip 3.

In the selected state, the voltages of the high level are inputted to the input terminals δ1 to δ4 of the AND circuit elements AND1 to AND4 constituting the second switch units connected to the selection signal transmission line CSL, respectively. At this time, when the gate signals of the high level are inputted from the gate signal input terminals G1 to G4, respectively, the AND circuit elements AND1 to AND4 output signals of the high level from the output terminals (the first control electrode) ε1 to ε4, respectively. Since the horizontal gate lines GH1 to GH4 are connected to the output terminals (the first control electrode) ε1 to ε4 of the AND circuit elements AND1 to AND4, respectively, the output signals of the high level are transmitted through the horizontal gate lines GH1 to GH4 and are inputted to the gate electrodes β1 to β4 of the field effect transistors FET1 to FET4 connected to the horizontal gate lines GH1 to GH4, respectively. When the light emission signals of the high level are inputted from the light emission signal input terminals A1 to A4 in this state, the light emitting diodes LED1 to LED4 emit light.

In this way, the AND circuit elements AND1 to AND4 disposed as the switch unit operate to give the gate signal to the light emitting diodes LED1 to LED4 only at the time selected by the clock signal and the input trigger signal. Accordingly, when a light emitting device is configured to include the plurality of light emitting element array chips 212, it is possible to embody the time-division driving operation by commonly using the driving ICs and the wiring lines between the driving ICs, the light emission signal input terminals A1 to A4, and the gate signal input terminals G1 to G4 without connecting the driving ICs to all the light emitting element array chips 212, thereby embodying the light emitting device performing the time-division driving operation with the small number of ICs and wiring lines.

Figure 42:
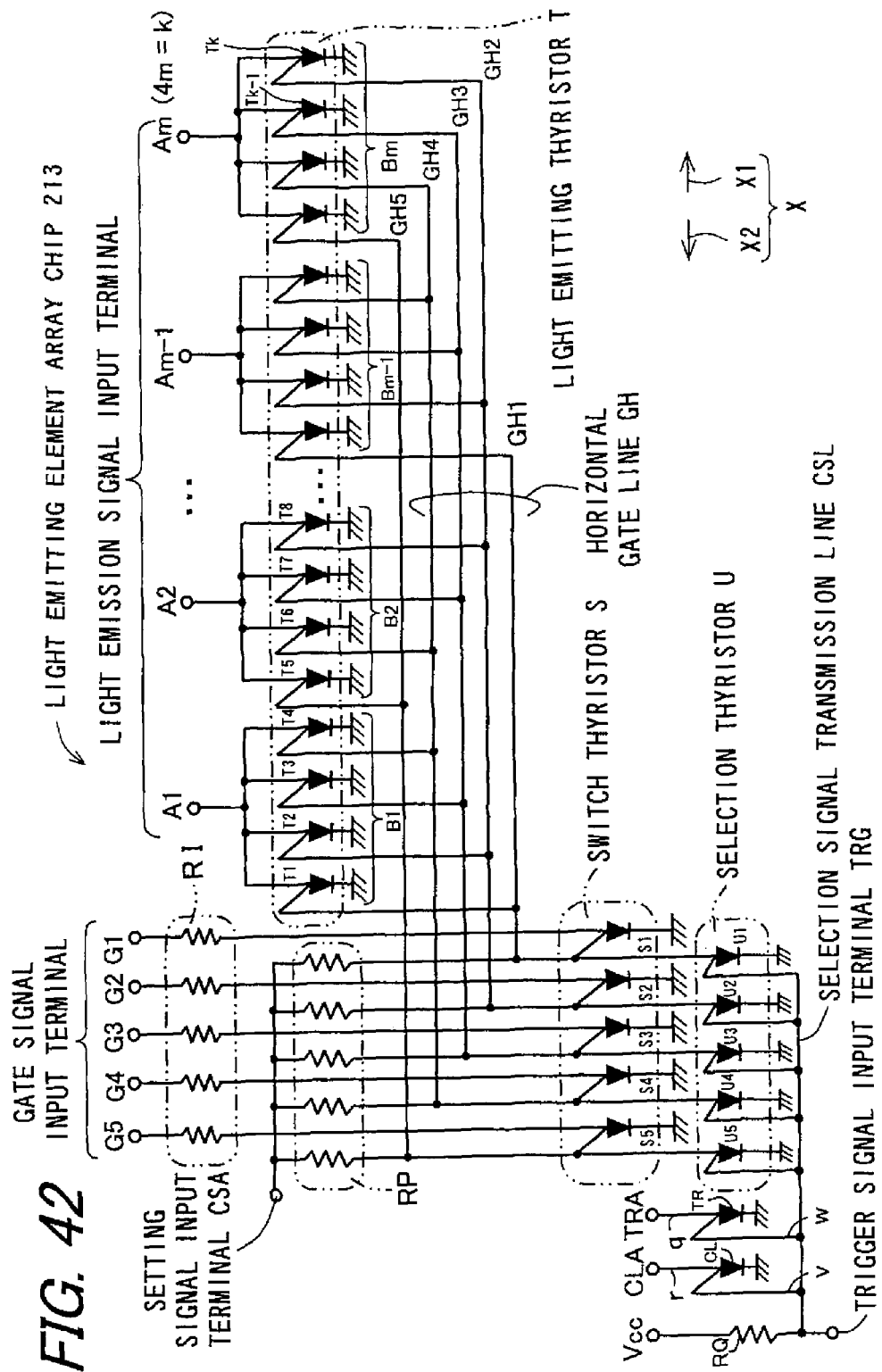
FIG. 42 is an equivalent circuit diagram schematically illustrating a light emitting element array chip as a thirteenth embodiment of the invention.

FIG. 42 is an equivalent circuit diagram schematically illustrating a light emitting element array chip 213 as a light emitting element array according to a thirteenth embodiment of the invention. The light emitting element array chip 213 according to this embodiment has a configuration in which the second switch unit of the light emitting element array chip 210 according to the tenth embodiment shown in FIG. 32 is added to the light emitting element array chip 4 according to the fourth embodiment shown in FIG. 18. Accordingly, similarly to the light emitting element array chip 4 according to the fourth embodiment shown in FIG. 18, this embodiment is directed to the number of switch thyristors S being n=5 but the number of light emitting thyristors T of the light emitting element block B being n−1=4 smaller by 1 than the number of switch thyristors. This embodiment is also directed to the connections between the horizontal gate lines GH and the light emitting thyristors T of the light emitting element block B. In FIG. 42, the components common to FIGS. 18 and 32 will be denoted by the same reference numerals and description thereof will be omitted.

As described with reference to FIG. 18, when the light emitting device employing the light emitting element array chip 213 according to this embodiment is used as an exposure device exposing a photoreceptor drum, the great difference in light emission timing between the adjacent light emitting thyristors is prevented. The concurrent light emission of the adjacent light emitting thyristors T is also prevented. As a result, the image forming apparatus employing the light emitting element array chip 213 according to this embodiment can provide a printed image with excellent image quality.

Figure 43:
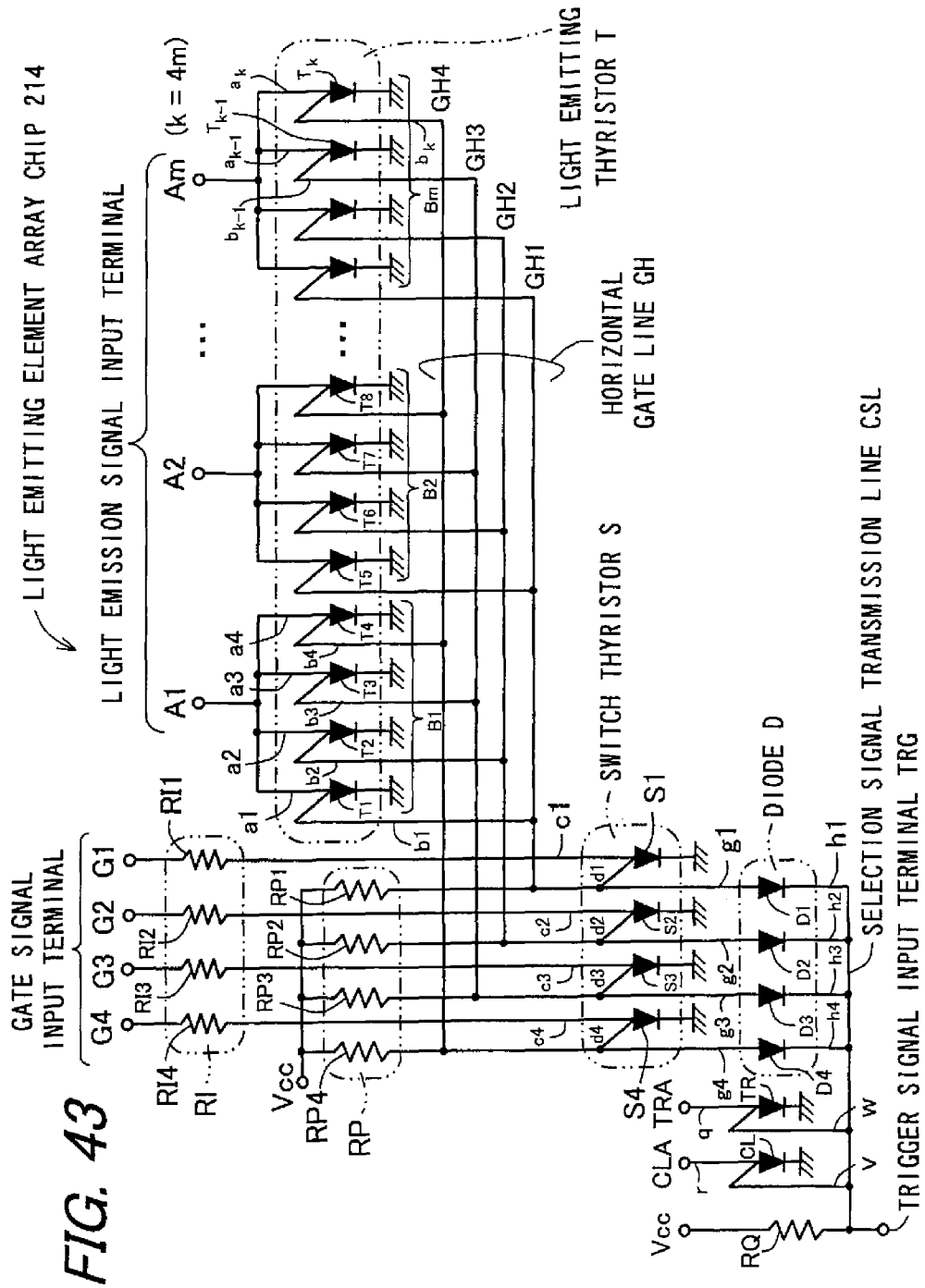
FIG. 43 is an equivalent circuit diagram schematically illustrating a light emitting element array chip as a fourteenth embodiment of the invention.

FIG. 43 is an equivalent circuit diagram schematically illustrating a light emitting element array chip 214 as a light emitting element array according to a fourteenth embodiment of the invention. The light emitting element array chip 214 according to this embodiment has a configuration in which the second switch unit of the light emitting element array chip 210 according to the tenth embodiment shown in FIG. 32 is added to the light emitting element array chip 5 according to the fifth embodiment shown in FIG. 19. Accordingly, similarly to the light emitting element array chip 5 according to the fifth embodiment shown in FIG. 19, this embodiment is directed to the selection thyristors U constituting the switch unit being replaced with the diodes D. In FIG. 43, the components common to FIGS. 19 and 32 will be denoted by the same reference numerals and description thereof will be omitted.

The diodes D used in the light emitting element array chip 214 according to this embodiment do not have the gate electrodes f unlike the selection thyristors U and are switched between the ON state and the OFF state only by the potential difference between the anodes g and the cathodes h. Accordingly, even when the setting signal has a constant voltage, the ON state and the OFF state of the diodes D can be switched by applying the selection signal thereto.

Figure 44:
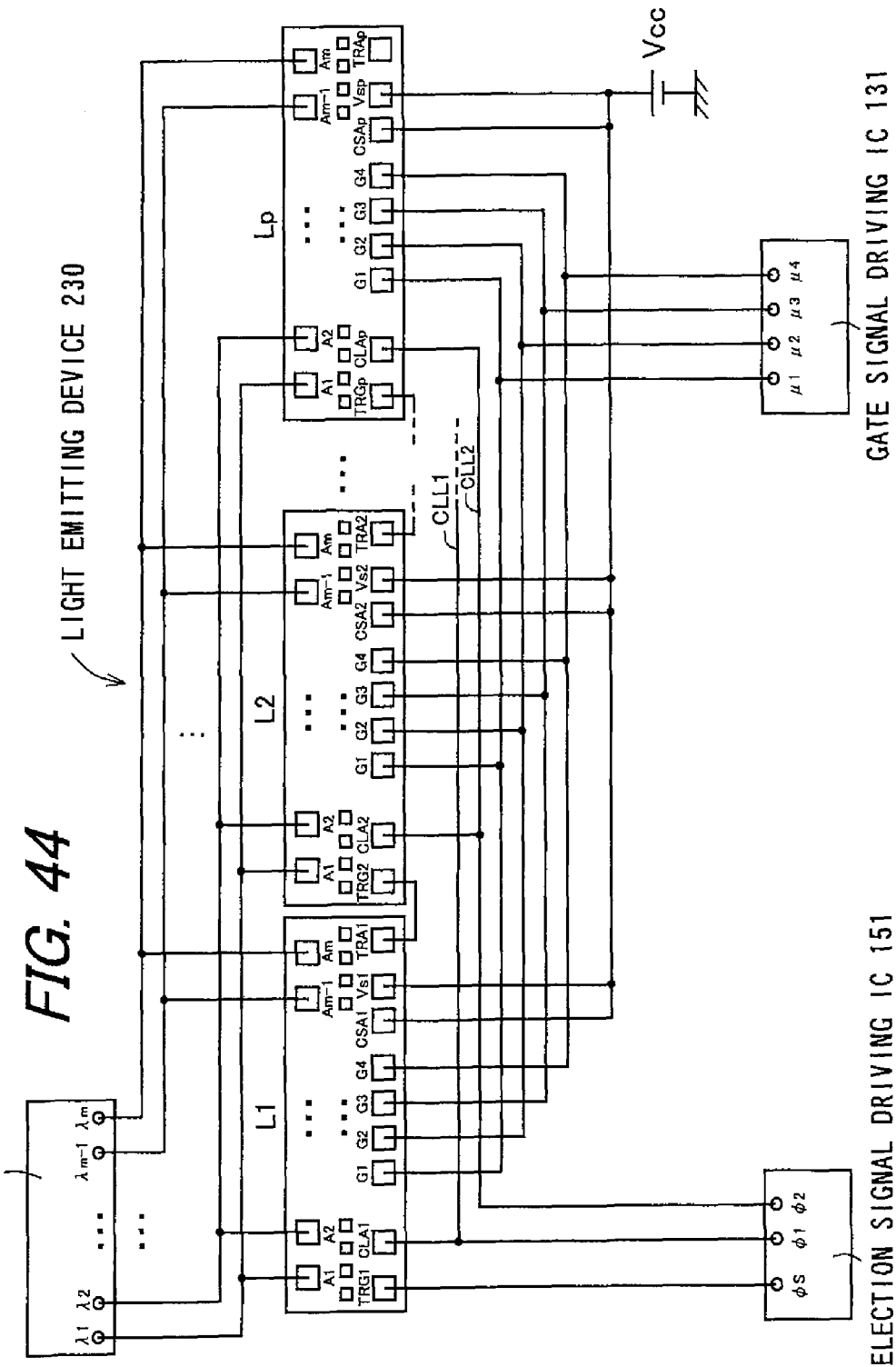
FIG. 44 is a block diagram schematically illustrating a light emitting device according to an embodiment of the invention.

FIG. 44 is a block diagram schematically illustrating a light emitting device 230 according to another embodiment of the invention. Since the light emitting device 230 according to this embodiment has the same structure as the light emitting device 220 shown in FIG. 38, the common components will be denoted by the same reference numerals and description thereof will be omitted.

In the light emitting device 230 according to this embodiment, the connections between the setting signal output terminals η and the setting signal bonding pads CSA in the light emitting device 220 shown in FIG. 38 are replaced with the connections between the positive voltage source (Vcc) and the setting signal bonding pads CSA and the light emitting element array chip 210 according to the tenth embodiment is replaced with the light emitting element array chip 214 according to the fourteenth embodiment.

Figure 45:
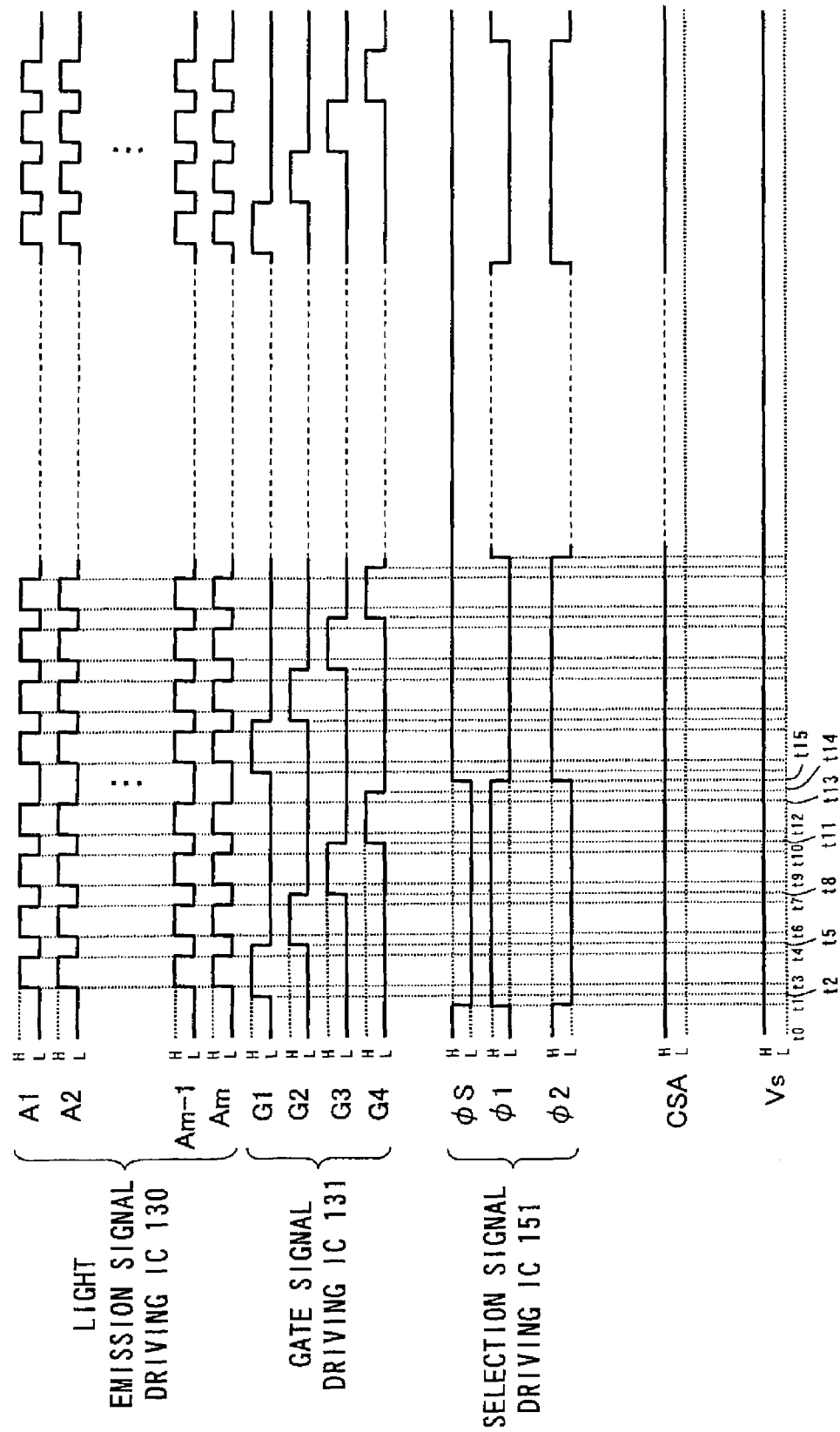
FIG. 45 is a timing chart illustrating an operation of the light emitting device, where the horizontal axis represents the elapsed time from a reference time and the vertical axis represents the signal level by a magnitude of a voltage or current.

FIG. 45 is a timing chart illustrating an operation of the light emitting device 230, where the horizontal axis represents the elapsed time from a reference time and the vertical axis represents the signal level by a magnitude of a voltage or current. In the light emitting device 230 according to this embodiment, since the selection thyristors U of the light emitting element array chip 210 used in the light emitting device 10 shown in FIG. 38 is replaced with the diodes D, the setting signal need not be applied to the setting signal bonding pads CSA, but a constant voltage of the high (H) level is applied thereto.

The light emitting device 230 according to this embodiment performs the same operations as the light emitting device 220 shown in FIG. 39 at times t1 to t14. At time t15, the voltage of the input trigger signal output terminal φS connected to the trigger signal input terminal TRG1 of the first array chip L1 returns to the high (H) level, the voltage of the first clock signal output terminal φ1 connected to the clock signal input terminal CLA1 of the first array chip L1 becomes the low (L) level, and the voltage of the second clock signal output terminal φ2 connected to the clock signal input terminal CLA2 of the second array chip L2 becomes the high (H) level. Then, the first array chip L1 is not in the selected state and the second array chip L2 to which the input trigger signal is inputted at time t1 is changed to the selected state. As described with reference to FIG. 34, in order to satisfactorily switch the selected state from the first array chip L1 to the second array chip L2, the rising in voltage of the second clock signal output terminal φ2 connected to the second array chip L2 to be next in the selected state should be made to occur earlier than the falling in voltage of the first clock signal output terminal φ2.

In this way, by sequentially switching the array chips L to the selected state, it is possible to perform the time-division driving operation on the respective array chips L. By sequentially applying the gate signal to the switch thyristors from the first switch thyristor, it is possible to perform the time-division driving operation in a single array chip L. The light emitting device 230 according to this embodiment does not require a setting signal, thereby simplifying the configuration.

Figure 46:
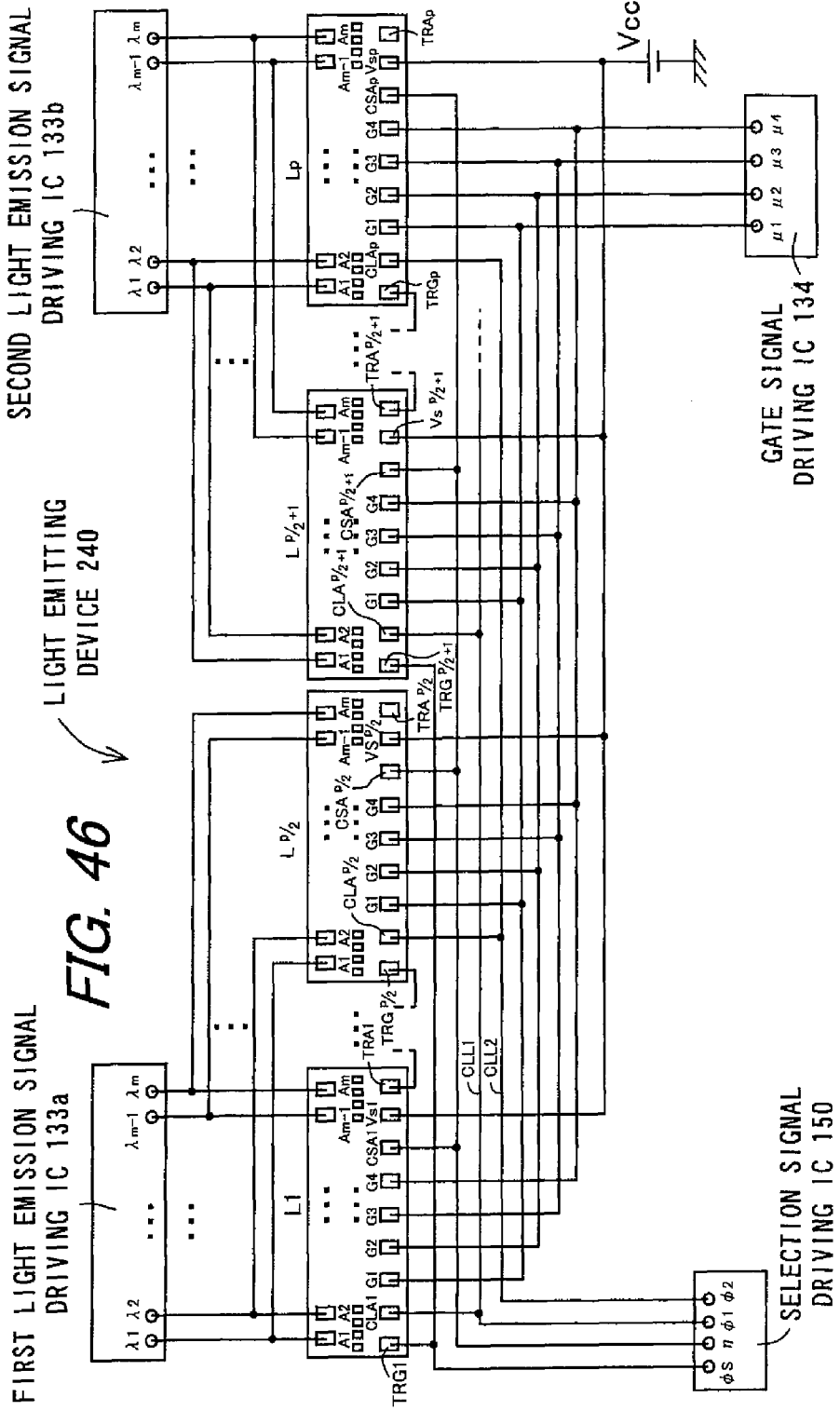
FIG. 46 is a block diagram schematically illustrating a light emitting device according to another embodiment.

FIG. 46 is a block diagram schematically illustrating a light emitting device according to another embodiment of the invention. The light emitting device 240 shown in FIG. 46 is different from the light emitting device 220 shown in FIG. 38, in that the writing speed to a photoreceptor drum by light emission is improved, for example, when it is employed by the image forming apparatus, by employing two light emission signal driving ICs. The configuration employing two light emission signal driving ICs is similar to the light emitting device 140 shown in FIG. 26. The light emitting device 240 shown in FIG. 46 is different from the light emitting device 140 shown in FIG. 26, in that the light emitting device 240 shown in FIG. 46 employs the light emitting element array chip 210 according to the tenth embodiment having the second switch unit as the array chips L1 to Lp. The configuration of the selection signal driving IC 150 is also different therefrom. Since the other configurations are equal to each other, the components common to FIGS. 26 and 46 will be denoted by the same reference numerals and description thereof will be omitted.

The selection signal driving IC 151 includes one setting signal output terminal η, one input trigger signal output terminal φS, and two clock signal output terminals φ1 and φ2. The setting, signal output terminal η is commonly connected between the setting signal bonding pads CSA1 to CSAp of the light emitting element array chips L1 to Lp. The input trigger signal output terminal φS is connected to the input trigger signal bonding pad TRG1 of the first light emitting element array chip L1 of the light emitting element array chips L and the input trigger signal bonding pad TRGp/2+1 of the (p/2+1)-th light emitting element array chip Lp/2+1. The two clock signal output terminals φ1 and φ2 are connected to two clock signal transmission lines CLL1 and CLL2, respectively. The clock signal bonding pads CLA of the adjacent light emitting element array chips L are connected to the different clock signal transmission lines CLL1 and CLL2. Specifically, in this embodiment in which p array chips are mounted (wherein p is an even integer equal to or greater than 4), when the array chips are numbered with first to p-th numbers according to the order of according to the order of from the one end to the other end in the arrangement direction X of the light emitting elements T of the respective array chips L, the clock signal bonding pad $CLA2i_1-1$ of the $(2i_{18}-1)$-th odd-numbered array chip L ($1 \leq i_{18} \leq p/2$) is electrically connected to the first clock signal bonding pad CLL1, and the clock signal bonding pad $CLA2i_{18}$ of the $2i_{18}$-th even-numbered array chip L ($1 \leq i_{18} \leq p/2$) is electrically connected to the second clock signal bonding pad CLL2.

In this way, since one input trigger signal output terminal φS is connected to the input trigger signal bonding pads TRG of the first and (p/2+1)-th array chips L and the clock signal bonding pads CLA of the first and (p/2+1)-th array chips L are connected to the first clock signal transmission line CLL1, the first and (p/2+1)-th array chips L are substantially concurrently selected in synchronization with the clock signal. In this selected state, the output trigger signal outputted from the first array chip L1 is inputted as the input trigger signal of the adjacent second array chip L2, and the output trigger signal outputted from the (p/2+1)-th array chip Lp/2+1 is inputted as the input trigger signal of the (p/2+2)-th array chip Lp/2+2. At the next time, when the clock signal of the high level is given to the second clock signal transmission line CLL2, the second and (p/2+2)-th array chips L are selected. Since the first array chip L1 to the p/2-th array chip Lp/2 are sequentially selected and the (p/2+1)-th array chip Lp/2+1 to the p-th array chip Lp are sequentially selected at the same time. Here, the group of the first to p/2-th array chips L and the group of the (p/2+1)-th to p-th array chips L can be independently driven using the first and second light emission signal driving ICs 133a and 133b, it is possible to write image information using the light emission of light at the speed higher twice than that of the configuration shown in Fig. The invention may be embodied in other specific forms without departing from the spirit or essential characteristics thereof.

The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A light emitting element array comprising:
   (a) one first selection signal transmission line for transmitting a first selection signal;
   (b) n switch units connected to the first selection signal transmission line (wherein n is an integer equal to or greater than 2), for outputting a control signal when both a second selection signal and the first selection signal from the first selection signal transmission line are inputted;
   (c) n control signal transmission lines connected to the n switch units, respectively, for transmitting the control signal; and
   (d) a plurality of light emitting elements each connected to any one of the n control signal transmission lines, for emitting light when both a light emission signal and the control signal from the connected control signal transmission line are inputted,
   wherein each of the control signal transmission lines is connected to at least any one of the light emitting elements.

2. The light emitting element array of claim 1, wherein the light emitting elements are divided into a plurality of light emitting element blocks each of which is composed of n or less light emitting elements, and
   each of the light emitting element blocks has the light emitting elements which are connected to different control signal transmission lines, respectively, and to which light a common light emission signal is inputted.

3. The light emitting element array of claim 2, wherein the plurality of light emitting elements are arranged in a line,
   the respective light emitting element blocks are composed of n−1 light emitting elements (wherein n is an integer equal to or greater than 4),
   the light emitting element blocks are divided into odd-numbered light emitting element blocks and even-numbered light emitting element blocks, the odd-numbered light emitting element blocks which are numbered according to an order of from one end to the other end in the arrangement direction of the light emitting elements have an $i_1$-th light emitting element which is numbered according to the order of from one end to the other end in the arrangement direction, and is connected to a $j_1$-th control signal transmission line so as to satisfy $i_1 = j_1$ (wherein $i_1$ is an integer equal to or greater than 1 and equal to or less than n−1 and $j_1$ is an integer equal to or greater than 1 and equal to or less than n−1), and the even-numbered light emitting element blocks which are numbered according to an order of from one end to the other end in the arrangement direction of the light emitting elements have an $i_2$-th light emitting element numbered according to the order of from one end to the other end in the arrangement direction is connected to a $j_2$-th control signal transmission line so as to satisfy $i_2 + j_2 = n+1$ (wherein $i_2$ is an integer equal to or greater than 1 and equal to or less than n−1 and $j_2$ is an integer equal to or greater than 2 and equal to or less than n).

4. The light emitting element array of claim 2, further comprising a second switch unit connected to the first selection signal transmission line, for outputting an output trigger signal and outputting a first selection signal to the first selection signal transmission line when both a clock signal and an input trigger signal are inputted.

5. The light emitting element array of claim 2, further comprising a substrate and bonding pads disposed on one surface of the substrate,
   wherein the light emitting elements are arranged substantially in a straight line on the one surface of the substrate,
   the n control signal transmission lines and the first selection signal transmission line are disposed on the one surface of the substrate along the arrangement direction of the light emitting elements,
   the bonding pads are arranged at intervals therebetween along the arrangement direction of the light emitting elements,
   the bonding pads include:
      a first selection signal bonding pad connected to the first selection signal transmission line, for inputting the first selection signal;
      second selection signal bonding pads connected to the switch units, respectively, for inputting the second selection signal; and
      light emission signal bonding pads connected to the light emitting elements in each of the light emitting element blocks and disposed to feed the light emission signal to each of the light emitting element blocks, a number of the light emission signal bonding pads being smaller than that of the light emitting elements, and
   the switch units are disposed between the adjacent bonding pads.

6. The light emitting element array of claim 4, further comprising a substrate and bonding pads disposed on one surface of the substrate,
   wherein the light emitting elements are arranged substantially in a straight line on the one surface of the substrate,
   the n control signal transmission lines and the first selection signal transmission line are disposed on the one surface of the substrate along the arrangement direction of the light emitting elements,
   the bonding pads are arranged at intervals therebetween along the arrangement direction of the light emitting elements, the bonding pads include:
an input trigger signal bonding pad connected to the second switch unit, for inputting the input trigger signal;
a clock signal bonding pad connected to the second switch unit, for inputting the clock signal;
an output trigger signal bonding pad connected to the second switch unit, for outputting the output trigger signal;
second selection signal bonding pads connected to the switch units, respectively, for inputting the second selection signal; and
light emission signal bonding pads connected to the light emitting elements in the respective light emitting element blocks and disposed to feed the light emission signal to the respective light emitting element blocks, a number of the light emission signal bonding pads being smaller than that of the light emitting elements, and
wherein the switch units and the second switch unit are disposed between the adjacent bonding pads.

7. The light emitting element array of claim 6, wherein the input trigger signal bonding pad is disposed at one end portion of the substrate along the arrangement direction of the light emitting elements, and
the output trigger signal bonding pad is disposed at the other end portion of the substrate along the arrangement direction of the light emitting elements.

8. The light emitting element array of claim 2, wherein the respective switch units include a diode and a switch thyristor formed of an emission thyristor, and gate electrodes of the switch thyristors of the switch units are individually connected to the control signal transmission lines and are connected to the first selection signal transmission line through the diodes;
the respective light emitting elements include a light emitting thyristor formed of an emission thyristor, and a gate electrode of the light emitting thyristor is connected to any one of the control signal transmission lines,
ones of anodes and cathodes of the switch thyristor and the light emitting thyristor are grounded in common and the second selection signal and the light emission signal are respectively inputted to the other electrodes of the anodes and the cathodes of the switch thyristor and the light emitting thyristor, and
the switch thyristor outputs a voltage between the gate electrode and the ground as the control signal to the control signal transmission line, when the switch thyristor is changed to an ON state with input of the second selection signal in the state where the first selection signal is inputted to the gate electrode to lower a threshold value through the diode which is forwardly biased.

9. The light emitting element array of claim 8, wherein the respective switch units further include a resistor, one end of which is connected to the gate electrode of the corresponding switch thyristor, and to the other end of which a constant voltage is applied so that the corresponding diode is forwardly biased.

10. The light emitting element array of claim 2, wherein the respective switch units include a selection thyristor formed of an emission thyristor and a switch thyristor formed of an emission thyristor, an anode of the selection thyristor is connected to a gate electrode of the switch thyristor, a gate electrode of the selection thyristor is connected to the first selection signal transmission line, and the gate electrodes of the switch thyristors are respectively connected to the control signal transmission lines,
the respective light emitting elements include a light emitting thyristor formed of an emission thyristor, a gate electrode of which is connected to any one of the control signal transmission lines,
ones of anodes and cathodes of the selection thyristor, the switch thyristor, and the light emitting thyristor are grounded as a common electrode, the second selection signal and the light emission signal are inputted to the other of the anodes and the cathodes of the switch thyristor and the light emitting thyristor, and a forward voltage is applied as a setting signal to the other electrode of the selection thyristor in synchronization with the first selection signal, and
when the switch thyristor is changed to an ON state with input of the second selection signal in the state where the threshold voltage is lowered by inputting to the gate electrode a voltage between the anode and the cathode of the selection thyristor changed to an ON state with input of the first selection signal, the switch thyristor outputs a voltage between the gate electrode and the ground as the control signal to the control signal transmission line.

11. The light emitting element array of claim 10, wherein the switch units further include a resistor, one end of the resistor is connected to the gate electrode of a corresponding switch thyristor, and a setting signal is inputted to the other end of the resistor so as to bias between an anode and a cathode of the corresponding selection thyristor.

12. The light emitting element array of claim 4, wherein the second switch unit includes a clock thyristor formed of an emission thyristor and a trigger thyristor formed of an emission thyristor, and the respective gate electrodes of the thyristors are connected to the first selection signal transmission line,
the respective switch units include a diode and a switch thyristor formed of an emission thyristor, gate electrodes of the switch thyristors of the switch units are individually connected to the control signal transmission line and are connected to the first selection signal transmission line through the diodes,
the respective light emitting elements include a light emitting thyristor formed of an emission thyristor and a gate electrode of the light emitting thyristor is connected to any one of the control signal transmission lines,
ones of anodes and cathodes of the clock thyristor, the trigger thyristor, the switch thyristor and the light emitting thyristor are grounded in common, and the clock signal, a second selection signal and the light emission signal are respectively inputted to the other electrodes of the anodes and the cathodes of the clock thyristor, the switch thyristor, and the light emitting thyristor,
the clock thyristor outputs a voltage between the gate electrode and the ground as the first selection signal to the first selection signal transmission line when the clock thyristor is changed to an ON state with input of the clock signal in the state where the threshold voltage is lowered with input of the input trigger signal to the gate electrode thereof,
the trigger thyristor outputs a voltage between the anode and the cathode as the output trigger signal when the clock thyristor is in the ON state, and
the switch thyristor outputs the voltage between the gate electrode and the ground as the control signal to the control signal transmission line, when the switch thyristor is changed to the ON state with input of the second selection signal in the state where the threshold voltage is lowered with input of the first selection signal to the gate electrode thereof through the forwardly biased diode.

13. The light emitting element array of claim 12, wherein the respective switch units further include a resistor, one end of which is connected to the gate electrode of the switch thyristor, and the other end of which is supplied with a constant voltage so that the diode is forwardly biased, and the second switch unit further includes a second resistor, one end of which is connected to the first selection signal transmission line, and the other end of which is supplied with a positive constant voltage when the cathodes of the respective emission thyristors are grounded in common and with a negative constant voltage when the anodes of the respective emission thyristors are grounded in common.

14. The light emitting element array of claim 4, wherein the second switch unit includes a clock thyristor formed of an emission thyristor and a trigger thyristor formed of an emission thyristor and gate electrodes of the thyristors are connected to the first selection signal transmission line, the respective switch units include a selection thyristor formed of an emission thyristor and a switch thyristor formed of an emission thyristor, an anode of the selection thyristor is connected to a gate electrode of the switch thyristor, a gate electrode of the selection thyristor is connected to the first selection signal transmission line, a gate electrode of the switch thyristor is individually connected to the control signal transmission line, the respective light emitting elements include a light emitting thyristor formed of an emission thyristor, a gate electrode of which is connected to any one of the control signal transmission lines, ones of anodes and cathodes of the clock thyristor, the trigger thyristor, the switch thyristor and light emitting thyristor are grounded in common, the clock signal, the second selection signal and the light emission signal are inputted to the other electrodes of the anodes and the cathodes of the clock thyristor, the switch thyristor, and the light emitting thyristor, respectively, and a forward voltage is applied as a setting signal to the other electrode of the selection thyristor in synchronization with the clock signal, the clock thyristor outputs the voltage between the gate electrode and the ground as the first selection signal to the first selection signal transmission line when the clock thyristor is changed to an ON state with input of the clock signal in the state where the threshold voltage is lowered with input of the input trigger signal to the gate electrodes thereof, the trigger thyristors output the voltage between the anode and the cathode as the output trigger signal when the clock thyristors are in the ON state, and the switch thyristors output the voltage between the gate electrode and the ground as the control signal to the control signal transmission line, when the switch thyristors are changed to the ON state with input of the second selection signal in the state where the threshold voltage is lowered with input of voltage between the anode and the cathode of the selection thyristor, which is changed to the ON state with input of the first selection signal, to the gate electrodes thereof.

15. The light emitting element array of claim 14, wherein the respective switch units further include a resistor, one end of which is connected to the gate electrode of the switch thyristor, the other end of which is fed with the setting signal so that the voltage between the anode and the cathode of the selection thyristor is forwardly biased, and the second switch unit further includes a second resistor, one end of which is connected to the first selection signal transmission line, and the other end of which is fed with a positive constant voltage when the cathodes of the emission thyristors are grounded in common and with a negative constant voltage when the anodes of the emission thyristors are grounded in common.

16. The light emitting element array of claim 10, wherein the second selection signal inputted to the switch thyristors is fed through a third resistor connected to the anode or cathode of the switch thyristor.

17. The light emitting element array of claim 10, wherein the respective switch units, the second switch unit, and the respective light emitting elements are constituted by an emission thyristor having the same layer structure.

18. The light emitting element array of claim 10, further comprising light-blocking means or light-reducing means for blocking or reducing the light emitted from the emission thyristors constituting the switch units and the second switch unit.

19. The light emitting element array of claim 11, wherein semiconductor films are obtained by stacking a semiconductor layer having one conductive type of P type and N type, a second semiconductor layer having the other conductive type thereof, and a third semiconductor layer having the one conductive type in this order from a side close to the substrate, and the resistor is constituted by the third semiconductor layer.

20. The light emitting element array of claim 19, wherein light-blocking means or light-reducing means for covering the resistor is provided to block or reduce the light entering the resistor.

21. The light emitting element array of claim 15, wherein semiconductor films are obtained by stacking a semiconductor layer having one conductive type of P type and N type, a second semiconductor layer having the other conductive type thereof, and a third semiconductor layer having the one conductive type in this order from the side close to the substrate, and the first and second resistors are constituted by the third semiconductor layer.

22. The light emitting element array of claim 21, wherein light-blocking means or light-reducing means for covering the first and second resistors is provided to block or reduce the light entering the first and second resistors.

23. A light emitting device comprising:
a light emitting element array group in which a plurality of the light emitting element arrays of claim 2 are arranged in a line;
a first selection signal driving circuit connected to the first selection signal transmission line in the respective light emitting element arrays, for individually feeding a first selection signal distinct among the light emitting element arrays;
a second selection signal driving circuit individually connected to the respective switch units of the respective light emitting element arrays, for feeding the second selection signal common to the light emitting element arrays, to the respective switch units; and
a light emission signal driving circuit individually connected to the respective light emitting element blocks of the respective light emitting element arrays, for feeding the light emission signal common to the light emitting element arrays, to the respective light emitting element blocks.

24. A light emitting device comprising:
a light emitting element array group in which a plurality of the light emitting element arrays of claim 4 are arranged in a line;
a plurality of clock signal transmission lines connected to at least one of the light emitting element arrays, for feeding the clock signal;
an input trigger signal driving circuit connected to the second switch unit of a light emitting element array disposed at one end in the arrangement direction of the light emitting element arrays in the light emitting element array group, for feeding the input trigger signal to the second switch unit;
a clock signal driving circuit connected to the plurality of clock signal transmission lines, for individually feeding the clock signal to the clock signal transmission lines;
a second selection signal driving circuit individually connected to the respective switch units of the respective light emitting element arrays, for feeding the second selection signal common to the light emitting element arrays, to the respective switch units; and
a light emission signal driving circuit individually connected to the respective light emitting element blocks of the respective light emitting element arrays, for feeding the light emission signal common to the light emitting element arrays, to the respective light emitting element blocks,
wherein the output trigger signal of the light emitting element array disposed at the one end in the arrangement direction of the light emitting element arrays in the light emitting element array group is inputted as the input trigger signal to a light emitting element array adjacently disposed on the other end side in the arrangement, and
the adjacent light emitting element arrays disposed along the arrangement direction are individually connected to the plurality of clock signal transmission lines.

25. A light emitting device comprising:
a light emitting element array group in which a plurality of the light emitting element arrays of claim 10 are arranged in a line;
a first selection signal driving circuit connected to the first selection signal transmission line in the respective light emitting element arrays, for individually feeding a first selection signal distinct among the light emitting element arrays;
a setting signal driving circuit connected in common to the other electrodes of the anodes and the cathodes of the selection thyristors of the respective switch units of the respective light emitting element arrays, for feeding the setting signal common to the light emitting element arrays;
a second selection signal driving circuit individually connected to the respective switch units of the respective light emitting element arrays, for feeding the second selection signal common to the light emitting element arrays, to the respective switch units; and
a light emission signal driving circuit individually connected to the respective light emitting element blocks of the respective light emitting element arrays, for feeding the light emission signal common to the light emitting element arrays, to the respective light emitting element blocks.

26. The light emitting device of claim 25, wherein the setting signal driving circuit feeds the setting signal after feeding a signal having substantially a same potential as a potential of the common electrode when the first selection signal driving circuit changes the light emitting element array as a supply destination of the first selection signal, and
the second selection signal driving circuit and the light emission signal driving circuit feed the second selection signal and the light emission signal, respectively, after the setting signal driving circuit starts feeding the setting signal.

27. An image forming apparatus comprising:
the light emitting device of claim 23;
light concentrating means for concentrating light from the light emitting elements of the light emitting device on a photoreceptor drum;
developer supply means for supplying a developer to the photoreceptor drum on which the light from the light emitting device is concentrated by the light concentrating means so that the photoreceptor drum is exposed to the light;
transfer means for transferring an image formed on the photoreceptor drum by the developer onto a recording sheet; and
fixing means for fixing the developer transferred onto the recording sheet,
wherein the first selection signal driving circuit, the second selection signal driving circuit, and the light emission signal driving circuit supply the first selection signal, the second selection signal, and the light emission signal, respectively, based on image information.

28. An image forming apparatus comprising:
the light emitting device of claim 24;
light concentrating means for concentrating light from the light emitting elements of the light emitting device on a photoreceptor drum;
developer supply means for supplying a developer to the photoreceptor drum on which the light from the light emitting device is concentrated by the light concentrating means and which is exposed to the light;
transfer means for transferring an image formed on the photoreceptor drum by the developer onto a recording sheet; and
fixing means for fixing the developer transferred onto the recording sheet,
wherein the input trigger signal driving circuit, the clock signal driving circuit, the second selection signal driving circuit, and the light emission signal driving circuit supply the input trigger signal, the clock signal, the second selection signal, and the light emission signal, respectively, based on image information.

29. An image forming apparatus comprising:
the light emitting device of claim 25;
light concentrating means or concentrating light from the light emitting elements of the light emitting device on a photoreceptor drum;
developer supply means for supplying a developer to the photoreceptor drum on which the light from the light emitting device is concentrated by the light concentrating means so that the photoreceptor drum is exposed to the light;
transfer means for transferring an image formed on the photoreceptor drum by the developer onto a recording sheet; and
fixing means for fixing the developer transferred onto the recording sheet,
wherein the first selection signal driving circuit, the setting signal driving circuit, the second selection signal driving circuit, and the light emission signal driving circuit supply the first selection signal, the setting signal, the second selection signal, and the light emission signal, respectively, based on image information.

30. A light emitting element array comprising:
(a) a plurality of first selection signal transmission lines for transmitting a first selection signal;
(b) n switch units connected to any one of the first selection signal transmission lines (wherein n is an integer equal to or greater than 3), for outputting a control signal when both a second selection signal and the first selection signal from the first selection signal transmission line are inputted;
(c) n control signal transmission lines connected to the n switch units, respectively, for transmitting the control signal; and
(d) a plurality of light emitting elements connected to one of the n control signal transmission lines, for emitting light when both a light emission signal and the control signal from the connected control signal transmission line are inputted,
wherein at least one of the light emitting elements is connected to the respective control signal transmission lines,
at least one of the light emitting elements is connected to the respective control signal transmission lines,
the n switch units are grouped into a plurality of switch groups each including less than n switch units,
switch units of the respective switch groups are individually connected to different first selection signal transmission lines, and the second selection signal are commonly inputted to the switch units,
at least one switch unit is connected to the first selection signal transmission lines, and
at least one of the first selection signal transmission lines is connected in common to the switch units.

31. The light emitting element array of claim 30, wherein the n switch units are grouped into M switch groups (wherein M is an integer equal to or greater than 2), and
the respective switch groups include N switch units (wherein N is an integer equal to or greater than 2 and n=M×N).

32. The light emitting element array of claim 30, wherein the plurality of light emitting elements are grouped into a plurality of light emitting element blocks including n or less light emitting elements, and
the plurality of light emitting elements in the light emitting element blocks are individually connected to the control signal transmission lines, respectively, and the light emission signal is commonly inputted to the plurality of light emitting elements.

33. A light emitting element array comprising:
(a) n switch units (wherein n is an integer equal to or greater than 2) each having a first electrode, a second electrode, and a first control electrode to which a control signal is outputted when a first signal is inputted to the first electrode and a second signal is inputted to the second electrode;
(b) n control signal transmission lines individually connected to the first control electrode; and
(c) a plurality of light emitting elements each having a third electrode and a second control electrode connected to one of the n control signal transmission lines, for emitting light when a third signal is inputted to the third electrode and a control signal is inputted to the second control electrode,
wherein the second control electrode of at least one light emitting element of the light emitting elements is connected to the respective control signal transmission lines,
the first electrodes of the n switch units are connected to each other,
the light emitting elements are divided into a plurality of light emitting element blocks each of which is composed of n or less light emitting elements, and
the respective second control electrodes of the light emitting elements in the light emitting element blocks are individually connected to the respective control signal transmission lines which are different from each other, and of which respective third electrodes are electrically connected to each other.

34. The light emitting element array of claim 33, wherein the switch units and the light emitting elements are configured to include an emission thyristor in which a cathode or anode is used a common electrode, and the switch units are configured to further include a diode and a resistor,
(a) when the cathode is used as the common electrode,
an N-gate electrode of the emission thyristor of the respective switch units is connected to the anode of the diode and one end of the resistor,
a positive voltage to the common electrode is supplied to the other end of the resistor,
the first electrode is a cathode of the diode,
the second electrode is an anode of the emission thyristor constituting the switch unit,
the third electrode is an anode of the emission thyristor constituting the light emitting elements,
the first control electrode is an N-gate electrode of the emission thyristor constituting the switch unit, and
the second control electrode is an N-gate electrode of the emission thyristor constituting the light emitting element, and
(b) when the anodes are used as the common electrode,
the P-gate electrode of the emission thyristor of the respective switch units is connected to the cathode of the diode and one end of the resistor,
a negative voltage to the common electrode is supplied to the other end of the resistor,
the first electrode is an anode of the diode,
the second electrode is a cathode of the emission thyristor constituting the switch unit,
the third electrode is a cathode of the emission thyristor constituting the light emitting element,
the first control electrode is a P-gate electrode of the emission thyristor constituting the switch unit, and
the second control electrode is a P-gate electrode of the emission thyristor constituting the light emitting element.

35. The light emitting element array of claim 33, wherein the switch units each include a switch thyristor formed of an emission thyristor, a selection thyristor formed of an emission thyristor, and a resistor,
the light emitting element is formed of an emission thyristor,
the switch thyristor uses the cathodes or anodes of the selection thyristors and the light emitting elements as a common electrode,
(a) when the cathodes are used as the common electrode,
the N-gate electrode of the switch thyristor is connected to the anode of the selection diode and one end of the resistor,
the other ends of the respective resistors of the switch units are electrically connected to each other and a positive voltage is applied as a fourth signal to the common electrode in synchronization with the first signal, the first electrode is an N-gate electrode of the selection thyristor, the second electrode is an anode of the switch thyristor, the third electrode is an anode of the light emitting element, the first control electrode is an N-gate electrode of the switch thyristor, and the second control electrode is an N-gate electrode of the light emitting element, and (b) when the anodes are used as the common electrode, the P-gate electrode of the switch thyristor is connected to the cathode of the selection thyristor and one end of the resistor, the other ends of the resistors disposed in the switch units are electrically connected to each other and a negative voltage is applied as the fourth signal to the common electrode in synchronization with the first signal, the first electrode is a P-gate electrode of the selection thyristor, the second electrode is a cathode of the switch thyristor, the third electrode is a cathode of the light emitting element, the first control electrode is a P-gate electrode of the switch thyristor, and the second control electrode is a P-gate electrode of the light emitting elements.

* * * * *